US012713770B2

(12) United States Patent
Kusunoki et al.

(10) Patent No.: US 12,713,770 B2
(45) Date of Patent: Aug. 18, 2026

(54) SEMICONDUCTOR DEVICE, DISPLAY APPARATUS, AND DRIVING METHOD OF SEMICONDUCTOR DEVICE

(71) Applicant: Semiconductor Energy Laboratory Co., Ltd., Atsugi (JP)

(72) Inventors: Koji Kusunoki, Isehara (JP); Hideaki Shishido, Atsugi (JP); Susumu Kawashima, Atsugi (JP); Motoharu Saito, Atsugi (JP); Tomoaki Atsumi, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/517,122

(22) Filed: Nov. 22, 2023

(65) Prior Publication Data

US 2024/0188330 A1 Jun. 6, 2024

(30) Foreign Application Priority Data

Dec. 1, 2022 (JP) ................................ 2022-192744
Mar. 15, 2023 (JP) ................................ 2023-041008
May 12, 2023 (JP) ................................ 2023-079277

(51) Int. Cl.
*H10K 59/121* (2023.01)
*G09G 3/3233* (2016.01)
*H10K 59/124* (2023.01)

(52) U.S. Cl.
CPC ....... *H10K 59/1213* (2023.02); *G09G 3/3233* (2013.01); *H10K 59/124* (2023.02); *G09G 2300/0465* (2013.01); *G09G 2300/0819* (2013.01); *G09G 2300/0852* (2013.01); *G09G 2310/08* (2013.01); *G09G 2330/021* (2013.01)

(58) Field of Classification Search
CPC .. H10K 59/1213; H10K 59/124; H10K 50/00; H10K 59/00; H10K 59/1216; G09G 3/3233; G09G 2300/0465; G09G 2300/0819; G09G 2300/0852;
(Continued)

(56) References Cited

U.S. PATENT DOCUMENTS 6,710,548 B2 3/2004 Kimura
7,399,991 B2 7/2008 Seo et al.
(Continued)

FOREIGN PATENT DOCUMENTS

JP 2002-324673 A 11/2002
JP 2015-132816 A 7/2015
WO WO-2009/087746 7/2009

*Primary Examiner* — Amy Onyekaba
(74) *Attorney, Agent, or Firm* — Eric J. Robinson; Robinson Intellectual Property Law Office, P.C.

(57) ABSTRACT

A novel semiconductor device is provided. A gate of a second transistor is electrically connected to one of a source and a drain of a first transistor and one of a source and a drain of a third transistor. Aback gate of the second transistor is electrically connected to one of a source and a drain of a fourth transistor and one terminal of a first capacitor. One of a source and a drain of the second transistor is electrically connected to the other of the source and the drain of the third transistor, the other terminal of the first capacitor, and one terminal of a light-emitting element. A semiconductor layer in each of the first, third, and fourth transistors is partly in an opening formed in an insulating layer.

13 Claims, 57 Drawing Sheets

(58) Field of Classification Search
CPC ......... G09G 2310/08; G09G 2330/021; G09G 2300/043; G09G 2300/0842; H10D 30/6755
See application file for complete search history.

(56) References Cited

U.S. PATENT DOCUMENTS

| | | | | |
|---|---|---|---|---|
| 9,230,996 | B2 * | 1/2016 | Miyake ................ | H10D 86/431 |
| 9,552,767 | B2 | 1/2017 | Miyake et al. | |
| 11,417,273 | B2 * | 8/2022 | Toyotaka ............. | G09G 3/3233 |
| 11,508,307 | B2 * | 11/2022 | Takahashi ............. | H10W 90/00 |
| 2010/0053041 | A1 | 3/2010 | Abe et al. | |
| 2010/0259527 | A1 | 10/2010 | Odawara et al. | |
| 2015/0171156 | A1 * | 6/2015 | Miyake ................ | H10D 86/481 257/43 |
| 2019/0355308 | A1 | 11/2019 | Verschueren et al. | |
| 2020/0194471 | A1 * | 6/2020 | Miyake ................ | H10D 86/481 |
| 2020/0327855 | A1 | 10/2020 | Lin et al. | |
| 2021/0327865 | A1 * | 10/2021 | Yamazaki ............. | H10W 90/00 |
| 2022/0173174 | A1 * | 6/2022 | Hatsumi .............. | G09G 3/3208 |
| 2022/0238836 | A1 * | 7/2022 | Okazaki ................. | H10K 50/11 |
| 2022/0320184 | A1 * | 10/2022 | Okazaki ................. | H10K 59/38 |
| 2022/0366845 | A1 * | 11/2022 | Kimura ................ | G09G 3/3225 |
| 2023/0354643 | A1 | 11/2023 | Sato et al. | |
| 2023/0369344 | A1 | 11/2023 | Kusunoki et al. | |

* cited by examiner

FIG. 12A
40
44
41[1,1]
46
41[1,n]
43
42
45
41[m,1]
41[m,n]
FIG. 12B
40A
44
46
45
43
42
41
FIG. 12C
40B
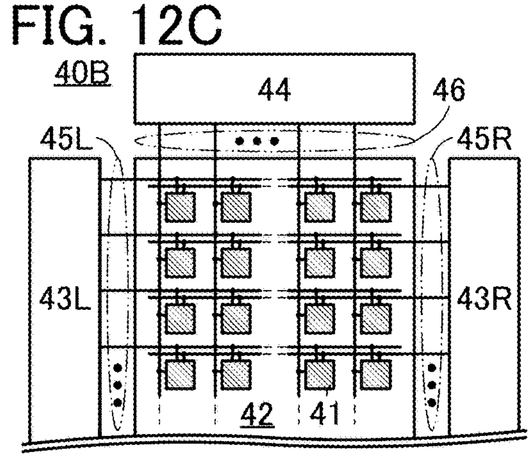
FIG. 12D
40C
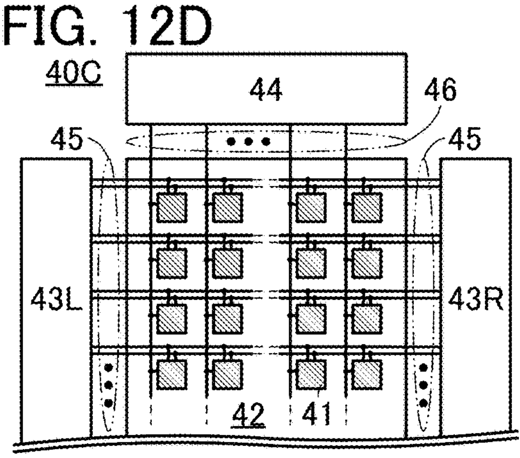
FIG. 12E
40D
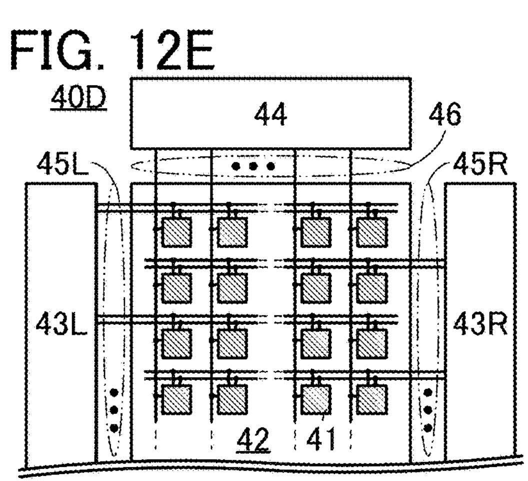

FIG. 16A
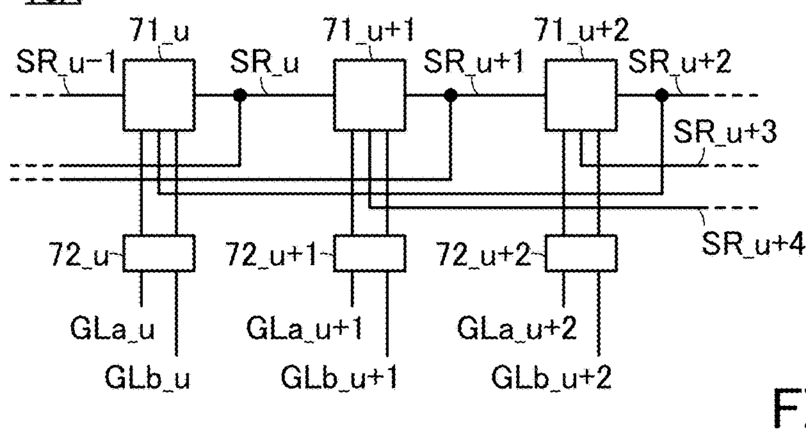
FIG. 16C
FIG. 16B
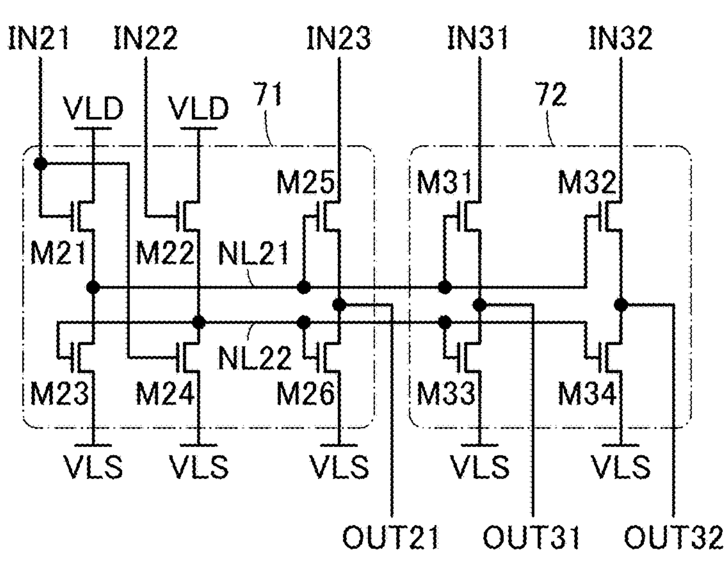
FIG. 16D
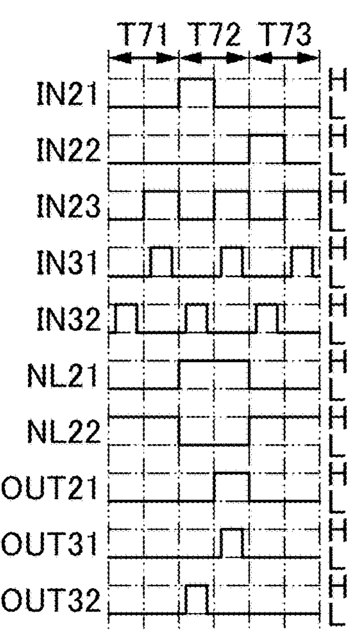
FIG. 16E
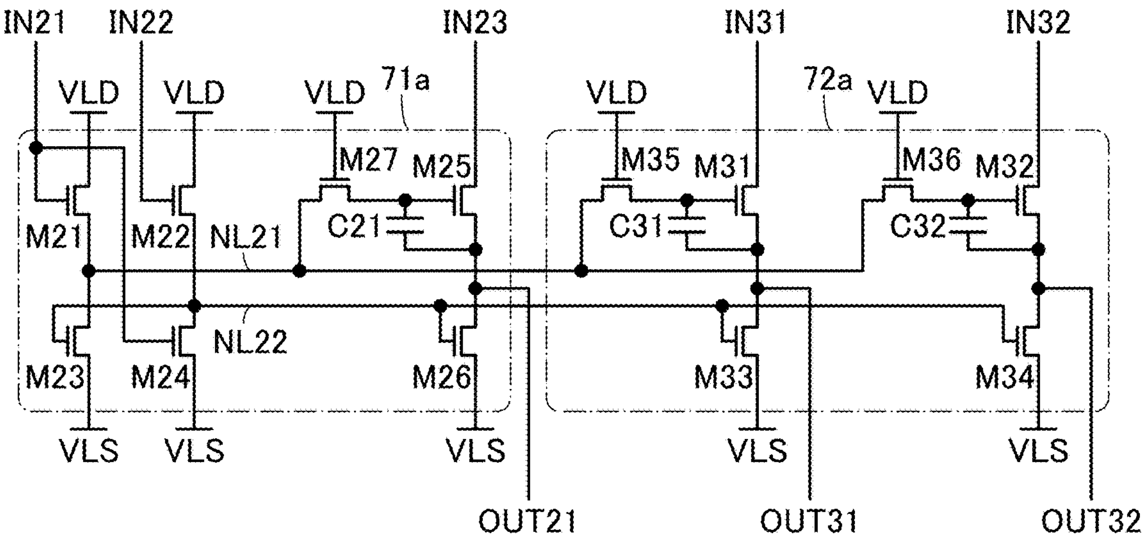

FIG. 17A
70B
71_u
71_u+1
71_u+2
SR_u−1
SR_u
SR_u+1
SR_u+2
SR_u+3
SR_u+4
73_u
73_u+1
73_u+2
GLc_u
GLc_u+1
GLc_u+2
FIG. 17C
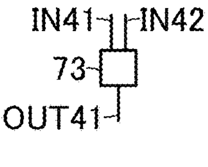
FIG. 17B
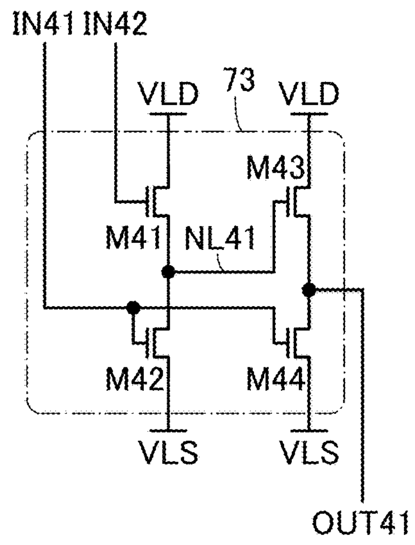
FIG. 17D
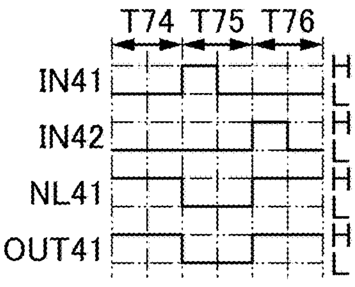
FIG. 17E
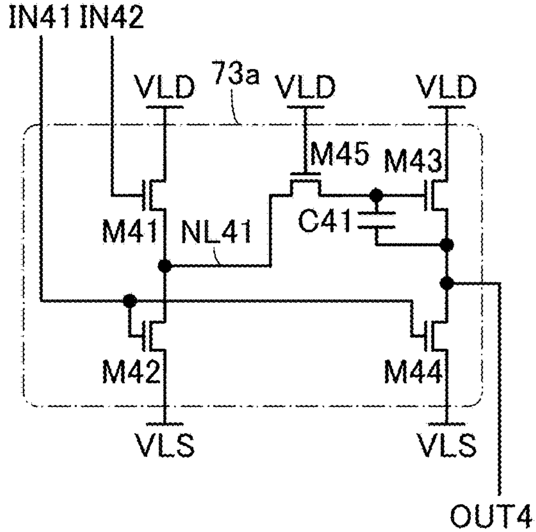

FIG. 18A
80
SL_1
SL_2
SL_n/2
SMP1
SMP2
81_1
81_2
81_n/2
DL_1
DL_2
DL_3
DL_4
DL_n−1
DL_n
FIG. 18C
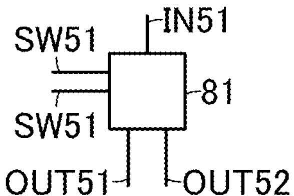
FIG. 18B
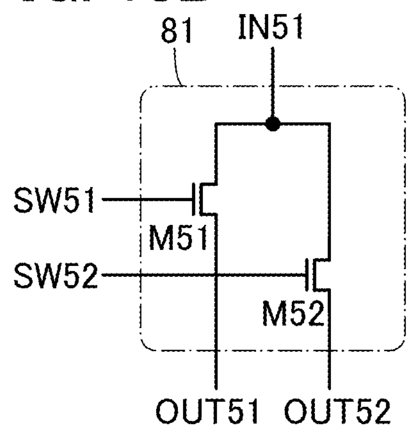

TrA
G
S
D
Tr1
Tr2

TrB
G
S
D
Tr1
Tr2
Tr3

TrC
G
S
D
Tr1
Tr2
Tr3
Tr4
Tr5
Tr6

100

B2
112b
W100
141,143
A1
A2
D141
108
112a
104
B1

100

FIG. 22A
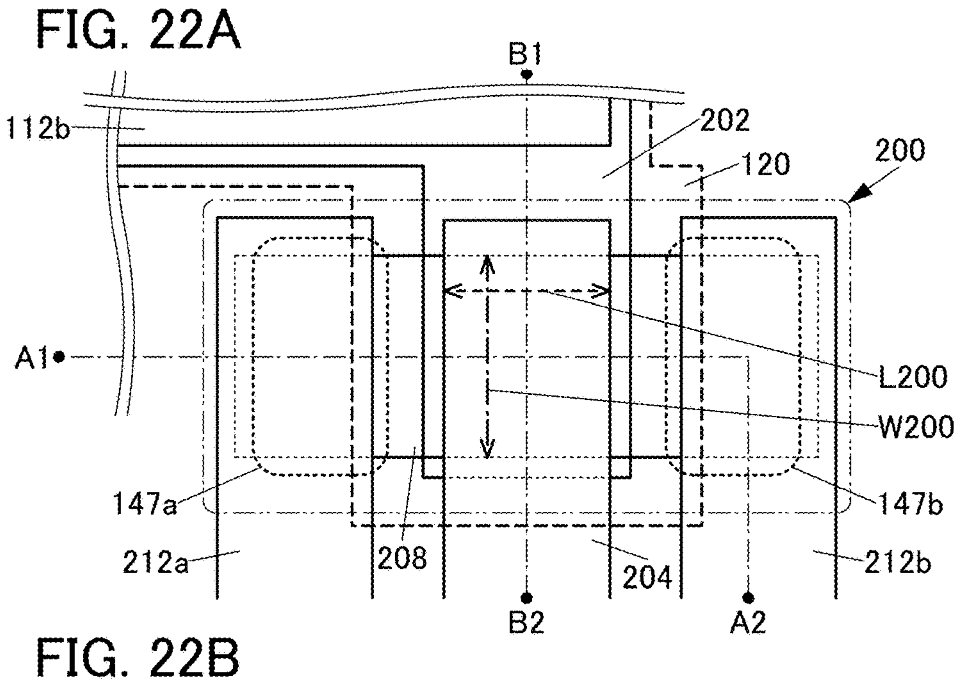
FIG. 22B
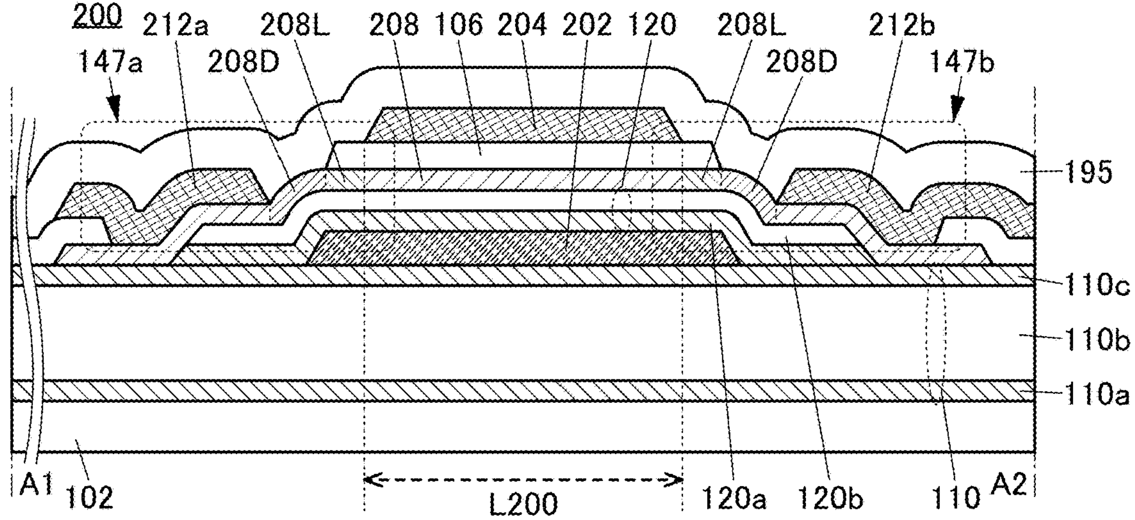
FIG. 22C
120 202 208 106 204 200
195
110c
110b
110a
B1 112b 150 W200 120a 120b 110 B2

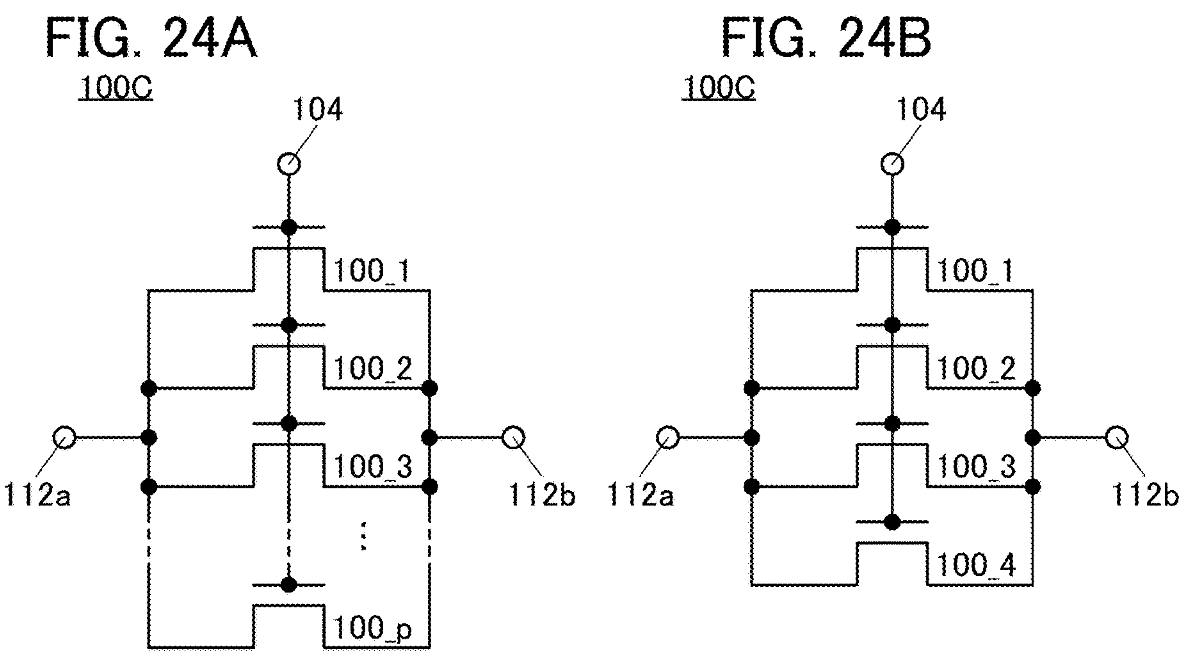
FIG. 24A
100C
104
100_1
100_2
100_3
100_p
112a
112b
FIG. 24B
100C
104
100_1
100_2
100_3
100_4
112a
112b
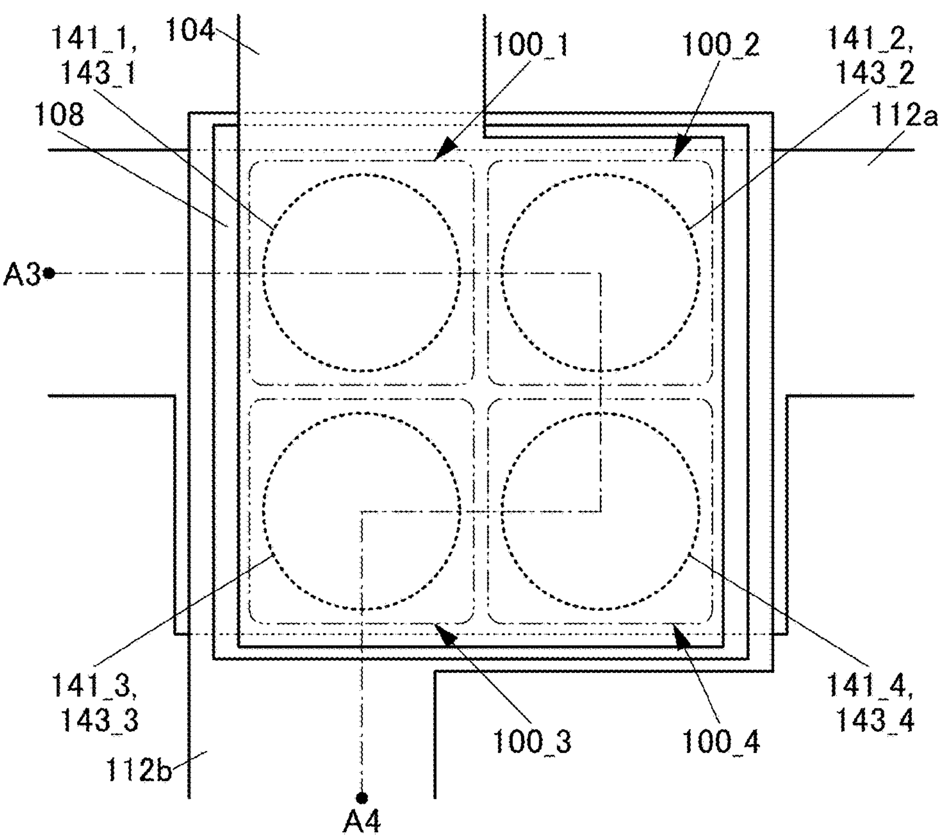
FIG. 24C
100C
141_1,
143_1
104
100_1
100_2
141_2,
143_2
108
112a
A3
141_3,
143_3
112b
100_3
100_4
141_4,
143_4
A4

ANO_2
212b
147b
106
M12
204
147a
212a
SL
C11
112b
188
120a
120b
120
208
202
112aB
112aA
G5
G6

G2
M15
G1
112aA
G4
M12
G6
C12
230
C11
G5
M14
M13
112aB
(VL1)
G3
M11
M16
112a

G2
M15
G1
120
202
G4
M12
G6
C12
185
230
C11
G5
M14
M13
G3
M11
M16

G2
M15
G1
141C,
143C
112bB
112q
G4
141q,
143q
M12
G6
C12
230
C11
G5
112bA
M14
M13
141A,
143A
141B,
143B
G3
141,
143
141D,
143D
112b
M11
M16
112bC
112p
141p,143p 50A
164
162
140
R
113R
113G
G
113B
B
131
152
117
142
237
111R
130R
115
111G
130G
237
131
130B
111B
242
172
166
197
165
205D
195
205R
235
110c
212a
204
106
212b
112a
104
112b
207B
123
195
110a
110b
208
120
202
207G
108
106
205G
151
110

50B
132R
R
113
132G
G
132B
B
130R
111R
115
111G
130G
131
237
117
111B
130B
152
142

FIG. 39A
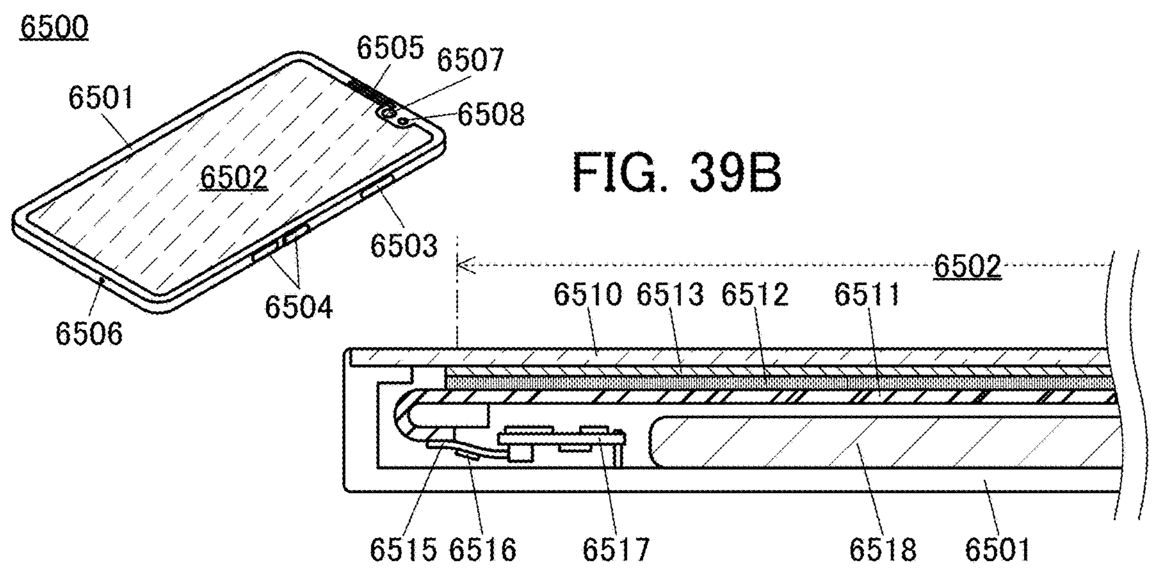
FIG. 39B
FIG. 39C
FIG. 39D
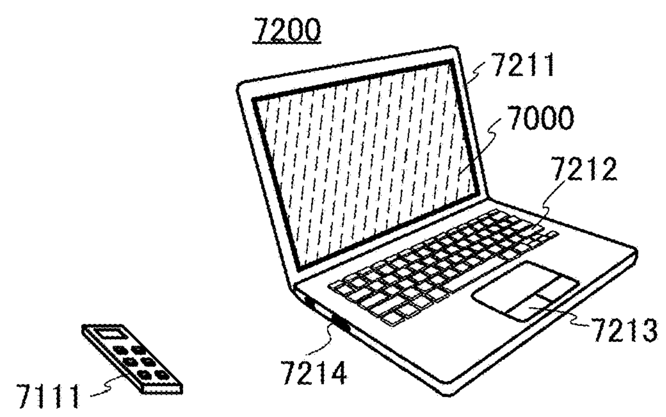
FIG. 39E
FIG. 39F
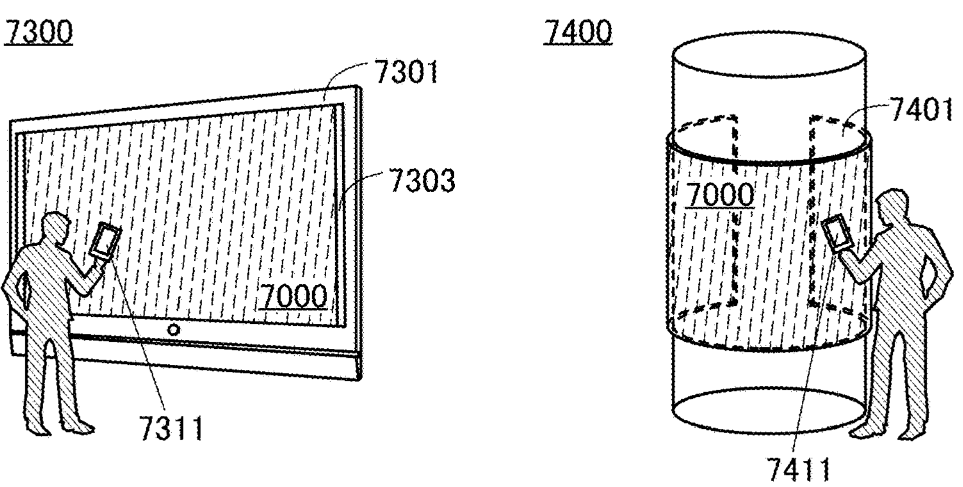

FIG. 40A
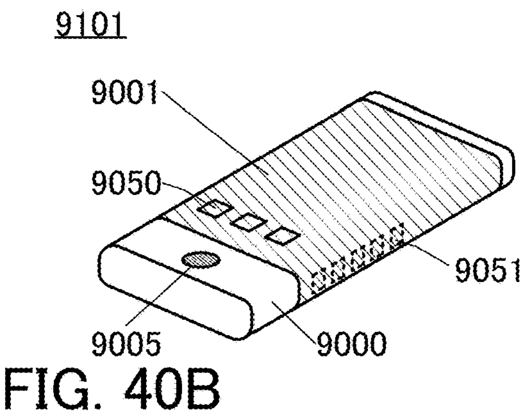
FIG. 40B
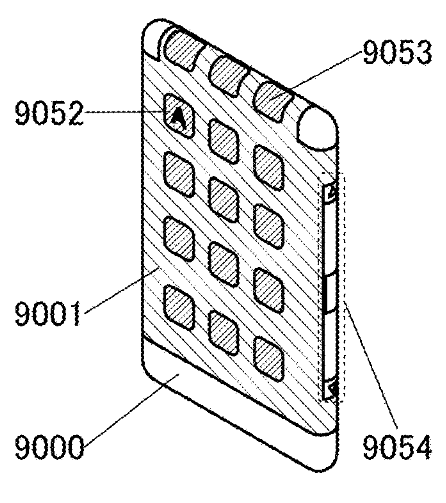
FIG. 40C
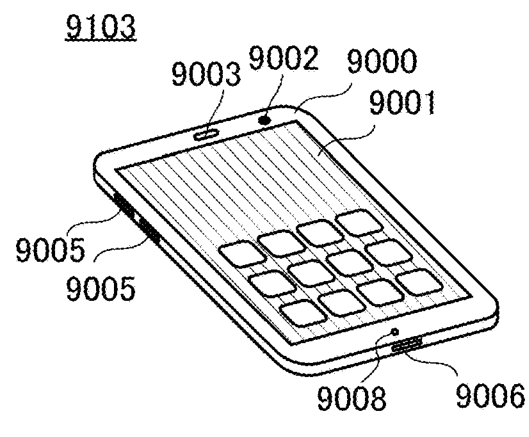
FIG. 40D
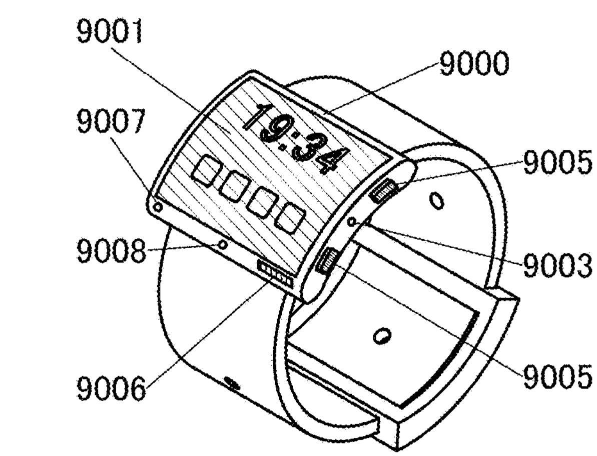
FIG. 40E
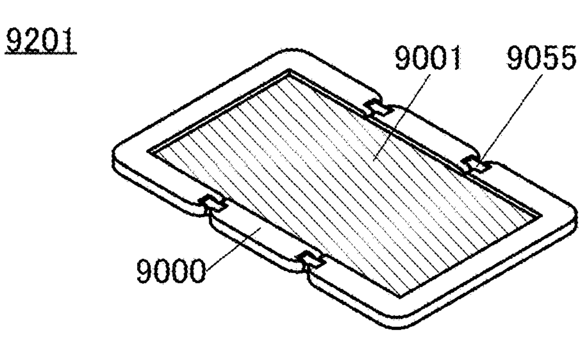
FIG. 40F
9201
9001
9055
9000
FIG. 40G
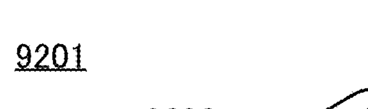
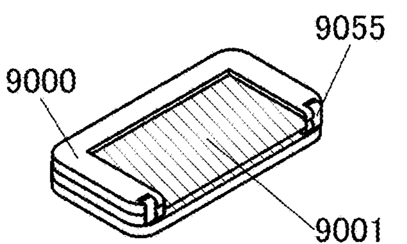

SEMICONDUCTOR DEVICE, DISPLAY APPARATUS, AND DRIVING METHOD OF SEMICONDUCTOR DEVICE

BACKGROUND OF THE INVENTION

1. Field of the Invention

One embodiment of the present invention relates to a semiconductor device, a display apparatus, and a driving method of a semiconductor device.

Note that one embodiment of the present invention is not limited to the above technical field. The technical field of one embodiment of the invention disclosed in this specification and the like relates to an object, a method, a driving method, or a manufacturing method. One embodiment of the present invention relates to a process, a machine, manufacture, or a composition of matter. Specific examples of the technical field of one embodiment of the present invention include a semiconductor device, a display apparatus, a light-emitting device, a power storage device, an optical device, an imaging device, a lighting device, an arithmetic device, a control device, a memory device, an input device, an output device, an input/output device, a signal processing unit, an arithmetic processing device, an electronic computer, an electronic device, a method of driving any of them, and a method of manufacturing any of them.

2. Description of the Related Art

For example, display apparatuses applicable for XR such as VR (virtual reality) and AR (augmented reality) have been required. Specifically, such display apparatuses have been desired to have a high resolution, high color reproducibility, and the like so as to offer enhanced realistic feeling and an enhanced sense of immersion, for example.

Examples of the apparatuses that can be used as such display apparatuses include a liquid crystal display apparatus and a light-emitting apparatus including a light-emitting element such as an organic electroluminescent (EL) element (also referred to as an organic light-emitting diode (OLED)) or a light-emitting diode (LED).

For example, an organic EL element has a structure where a layer containing a light-emitting organic compound is interposed between a pair of electrodes. Voltage application between the electrodes causes current flow through the layer, which allows the light-emitting organic compound to emit light. A display apparatus including such an organic EL element needs no backlight which is necessary for a liquid crystal display apparatus, for example, and thus can have advantages such as thinness, lightweight, high contrast, and low power consumption. Furthermore, an organic EL element is capable of high-speed operation and achieves a display apparatus that can suitably display a fast-moving image. Patent Document 1, for example, discloses an example of a display apparatus using an organic EL element.

Patent Document 2 discloses a circuit configuration of a pixel circuit controlling the emission intensity of an organic EL element, in which threshold voltage variation among transistors in the respective pixels is corrected to improve the display quality of a display apparatus.

REFERENCES

[Patent Document 1] Japanese Published Patent Application No. 2002-324673

[Patent Document 2] Japanese Published Patent Application No. 2015-132816

SUMMARY OF THE INVENTION

An object of one embodiment of the present invention is to provide a high-resolution semiconductor device or display apparatus. Another object is to provide a miniaturized semiconductor device or display apparatus. Another object is to provide a semiconductor device or display apparatus with excellent display quality. Another object is to provide a semiconductor device or display apparatus with low power consumption. Another object is to provide a highly reliable semiconductor device or display apparatus. Another object is to provide a novel semiconductor device or display apparatus. Another object is to provide a driving method of a semiconductor device and a driving method of a display apparatus, each of which can improve display quality. Another object is to provide a driving method of a semiconductor device and a driving method of a display apparatus, each of which can reduce power consumption. Another object is to provide a driving method of a semiconductor device and a driving method of a display apparatus, each of which can improve reliability. Another object is to provide a novel driving method of a semiconductor device and a novel driving method of a display apparatus.

Note that the description of the above objects does not preclude the existence of other objects. In one embodiment of the present invention, there is no need to achieve all the above objects. Objects other than these objects will be apparent from the descriptions of the specification, the drawings, the claims, and the like, and objects other than these objects can be derived from the descriptions of the specification, the drawings, the claims, and the like.

(1) One embodiment of the present invention is a semiconductor device including a first transistor, a second transistor, a third transistor, a fourth transistor, a first capacitor, a light-emitting element, and an insulating layer. A gate of the second transistor is electrically connected to one of a source and a drain of the first transistor and one of a source and a drain of the third transistor. The second transistor includes a back gate and the back gate is electrically connected to one of a source and a drain of the fourth transistor and one terminal of the first capacitor. One of a source and a drain of the second transistor is electrically connected to the other of the source and the drain of the third transistor, the other terminal of the first capacitor, and one terminal of the light-emitting element. The first transistor includes a first semiconductor layer, and part of the first semiconductor layer is in a first opening in the insulating layer. The third transistor includes a second semiconductor layer, and part of the second semiconductor layer is in a second opening in the insulating layer. The fourth transistor includes a third semiconductor layer, and part of the third semiconductor layer is in a third opening in the insulating layer.

(2) In the above (1), the first semiconductor layer, the second semiconductor layer, and the third semiconductor layer may each include an oxide semiconductor.

(3) In the above (2), the second transistor may include a fourth semiconductor layer, and the fourth semiconductor layer may be over the insulating layer.

(4) In the above (3), the fourth semiconductor layer may be formed in a step that is the same as a step in which the first semiconductor layer, the second semiconductor layer, and the third semiconductor layer are formed.

(5) In the above (4), the semiconductor device may further include a second capacitor, a fifth transistor, and a sixth transistor. The gate of the second transistor may be electrically connected to one terminal of the second capacitor. The one of the source and the drain of the second transistor may be electrically connected to the other terminal of the second capacitor, one of a source and a drain of the fifth transistor, and one of a source and a drain of the sixth transistor. The other of the source and the drain of the fifth transistor may be electrically connected to the one terminal of the light-emitting element.

(6) One embodiment of the present invention is a display apparatus including the semiconductor device according to any one of the above (1) to (5) and a driver circuit. The driver circuit includes a seventh transistor and an eighth transistor. The seventh transistor includes a fifth semiconductor layer, and part of the fifth semiconductor layer is in a fourth opening in the insulating layer. The eighth transistor includes a sixth semiconductor layer, and part of the sixth semiconductor layer is in a fifth opening in the insulating layer. The driver circuit is configured to output a potential turning on or off the first transistor through the seventh transistor and to output a potential turning on or off the fourth transistor through the eighth transistor.

(7) In the above (6), the driver circuit may be configured to output a potential turning on the fourth transistor less frequently than a potential turning on the first transistor.

(8) One embodiment of the present invention is a driving method of a semiconductor device. The semiconductor device includes a first transistor, a second transistor, a fourth transistor, and a light-emitting element. A gate of the second transistor is electrically connected to one of a source and a drain of the first transistor. The second transistor includes a back gate, and the back gate is electrically connected to one of a source and a drain of the fourth transistor. The second transistor is configured to control the amount of current flowing through the light-emitting element in accordance with a potential supplied to the gate and to change a threshold voltage of the second transistor in accordance with a potential supplied to the back gate. A frequency of turning on the fourth transistor is lower than a frequency of turning on the first transistor.

(9) In the above (8), the semiconductor device may further include an insulating layer. The first transistor may include a first semiconductor layer, and part of the first semiconductor layer may be in a first opening in the insulating layer. The fourth transistor may include a third semiconductor layer, and part of the third semiconductor layer may be in a third opening in the insulating layer.

(10) In the above (9), the first semiconductor layer and the third semiconductor layer may each include an oxide semiconductor.

(11) In the above (10), the second transistor may include a fourth semiconductor layer, and the fourth semiconductor layer may be over the insulating layer.

(12) In the above (11), the fourth semiconductor layer may be formed in a step that is the same as a step in which the first semiconductor layer and the third semiconductor layer are formed.

One embodiment of the present invention can provide a high-resolution semiconductor device or display apparatus. Another embodiment can provide a miniaturized semiconductor device or display apparatus. Another embodiment can provide a semiconductor device or display apparatus with excellent display quality. Another embodiment can provide a semiconductor device or display apparatus with low power consumption. Another embodiment can provide a highly reliable semiconductor device or display apparatus. Another embodiment can provide a novel semiconductor device or display apparatus. Another embodiment can provide a driving method of a semiconductor device and a driving method of a display apparatus, each of which can improve display quality. Another embodiment can provide a driving method of a semiconductor device and a driving method of a display apparatus, each of which can reduce power consumption. Another embodiment can provide a driving method of a semiconductor device and a driving method of a display apparatus, each of which can improve reliability. Another embodiment can provide a novel driving method of a semiconductor device and a novel driving method of a display apparatus.

The effects listed above do not preclude the existence of other effects. One embodiment of the present invention does not necessarily achieve all the effects. Effects other than these will be apparent from and can be derived from the description of the specification, the drawings, the claims, or the like.

BRIEF DESCRIPTION OF THE DRAWINGS

FIGS. 12A to 12E are block diagrams each showing a configuration example of a display apparatus.

FIGS. 16A to 16C and 16E are circuit diagrams showing a configuration example of a semiconductor device. FIG. 16D is a timing chart showing an operation example of the semiconductor device.

FIGS. 17A to 17C and 17E are circuit diagrams showing a configuration example of a semiconductor device. FIG. 17D is a timing chart showing an operation example of the semiconductor device.

FIGS. 18A to 18C are circuit diagrams showing a configuration example of a semiconductor device.

FIG. 22A is a top view showing a configuration example of a semiconductor device. FIGS. 22B and 22C are cross-sectional views showing a structure example of the semiconductor device.

FIGS. 24A and 24B are circuit diagrams showing a configuration example of a semiconductor device. FIG. 24C is a top view showing a configuration example of the semiconductor device.

FIG. 27 is a cross-sectional view showing a structure example of a semiconductor device.

FIG. 32 is a cross-sectional view showing a layout example of a pixel.

FIGS. 39A to 39F each show an example of an electronic device.

FIGS. 40A to 40G illustrate examples of electronic devices.

DETAILED DESCRIPTION OF THE INVENTION

Figure 1:
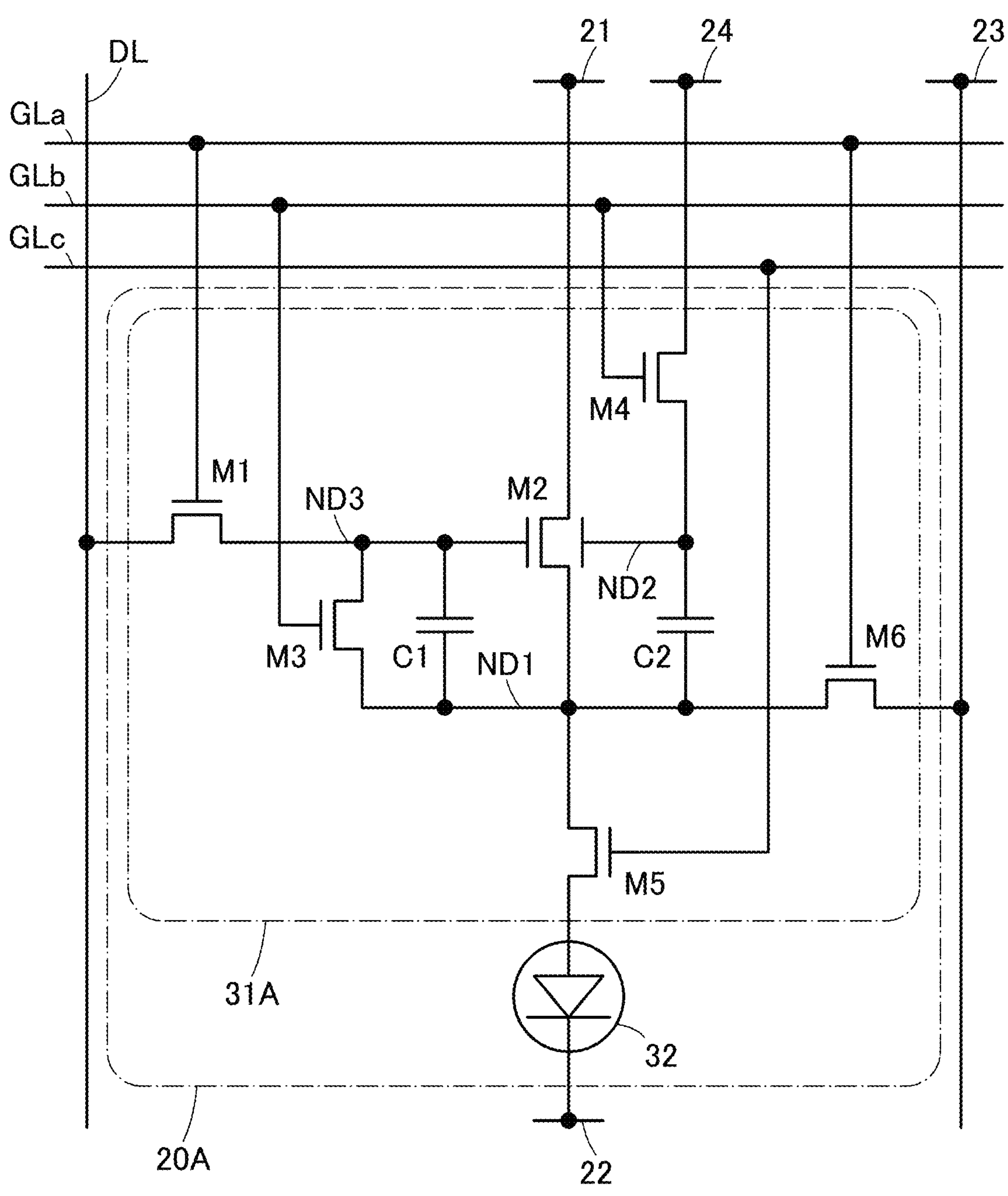
FIG. 1 is a circuit diagram showing a configuration example of a semiconductor device.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit including a semiconductor element, a chip with an integrated circuit, an electronic component including a packaged chip, and an electronic device provided with an electronic component are examples of a semiconductor device. For example, a display apparatus, a light-emitting apparatus, a power storage device, an optical device, an imaging device, a lighting device, an arithmetic device, a control device, a memory device, an input device, an output device, an input/output device, a signal processing device, an electronic computer, an electronic device, and the like themselves might be semiconductor devices, or might include semiconductor devices.

Hereinafter, embodiments will be described with reference to the drawings. However, embodiments can be implemented with various modes. It is readily appreciated by those skilled in the art that various changes and modifications are possible without departing from the spirit and the scope of the present invention. Thus, one embodiment pf the present invention should not be interpreted as being limited to the description of the embodiments.

In this specification and the like, one embodiment of the present invention can be constituted with an appropriate combination of a structure shown in one embodiment and any of the structures shown in the other embodiments. In addition, in the case where a plurality of structure examples are described in one embodiment, the structure examples can be combined as appropriate to constitute one embodiment.

Note that in drawings illustrating the embodiments, the same portions or portions having similar functions are denoted by the same reference numerals in different drawings and the description of such portions is not repeated in some cases. In drawings, for example, the same hatching pattern is used for portions having similar functions, and the portions are not denoted by specific reference numerals in some cases. Moreover, some components may be omitted in a perspective view, a top view, and the like for easy understanding of the diagrams. In drawings, some hidden lines and the like might be omitted. In drawings, hatching or the like is omitted in some cases.

In the drawings, the size, the layer thickness, or the region is sometimes exaggerated for clarity. Accordingly, embodiments of the present invention are not limited to the size, aspect ratio, or the like shown in the drawings. Note that the drawings are schematic views showing ideal examples, and embodiments of the present invention are not limited to shapes or values shown in the drawings, for example. For example, in the actual manufacturing process, a layer, a resist mask, or the like might be unintentionally reduced in size by treatment such as etching, which is not illustrated in the drawings in some cases for easy understanding. For example, in the actual circuit operation, a fluctuation in voltage, current, or the like might be caused by noise, difference in timing, or the like, which is not illustrated in some cases for easy understanding.

In this specification, drawings, and the like, components are classified on the basis of the functions and shown as components independent of each other in some cases. However, in an actual circuit or the like, it may be difficult to separate components on the basis of the functions, so that one component may be associated with a plurality of functions or several components may be associated with one function. Accordingly, the component is not limited to that described in this specification, drawings, and the like and can be explained with another term as appropriate depending on the situation.

In this specification, drawings, and the like, when a plurality of components are denoted by the same reference numerals, and, particularly when they need to be distinguished from each other, an identification sign such as "A," "b," "_1," "[n]," or "[m,n]" is sometimes added to the reference numerals, for example. When matters common to a plurality of components with identification signs are described or they need to be distinguished from each other, no identification sign is added in some cases.

In this specification and the like, a "conduction state" or an "on state" of a transistor refers to a state where a source and a drain of the transistor can be regarded as being electrically short-circuited, a state where current can be made to flow between the source and the drain, or the like. The "conduction state" or the "on state" refers to the state of an n-channel transistor where the voltage between its gate and source is higher than the threshold voltage or the state of a p-channel transistor where the voltage between its gate and source is lower than the threshold voltage, for example, in some cases. Furthermore, a "non-conductive state," a "cutoff state," or a "cutoff state," of a transistor refers to a state in which the source and the drain of the transistor can be regarded as being electrically disconnected. The "non-conductive state," the "cutoff state," or the "cutoff state" refers to the state of an n-channel transistor where the voltage between its gate and source is lower than the threshold voltage or the state of a p-channel transistor where the voltage between its gate and source is higher than the threshold voltage, for example, in some cases.

In this specification and the like, "gate voltage" refers to the voltage between a gate and a source, "drain voltage" refers to the voltage between a drain and a source, and "back gate voltage" refers to the voltage between a back gate and a source in some cases. In addition, "drain current" refers to the current flowing between the drain and the source in some cases. The terms "high gate voltage," "high drain voltage," "high back gate voltage," and the like of an n-channel transistor can be replaced with the terms "low gate voltage," "low drain voltage," and "low back gate voltage," and the like of a p-channel transistor, respectively, as appropriate in some cases. The terms "low gate voltage," "low drain voltage," "low back gate voltage," and the like of an n-channel transistor can be replaced with the terms "high gate voltage," "high drain voltage," and "high back gate voltage," and the like of a p-channel transistor, respectively, as appropriate in some cases.

In this specification and the like, "off-state current" of a transistor refers to a drain current of the transistor in the off state unless otherwise specified. Note that off-state current and current that flows between a gate and a source or a drain (also referred to as a gate leakage current) are each referred to as leakage current in some times in this specification and the like.

Embodiment 1

A semiconductor device of one embodiment of the present invention is described with reference to drawings. In addition, a display apparatus of one embodiment of the present invention is described with reference to drawings. The semiconductor device can be used for part of the display apparatus, for example.

<Configuration Example of Semiconductor Device>

FIG. 1 is a circuit diagram showing a configuration example of a semiconductor device of one embodiment of the present invention.

As illustrated in FIG. 1, a semiconductor device 20A includes a pixel circuit 31A and a light-emitting element 32. The pixel circuit 31A includes a transistor M1, a transistor M2, a transistor M3, a transistor M4, a transistor M5, a transistor M6, a capacitor C1, and a capacitor C2.

A gate of the transistor M1 is electrically connected to a wiring GLa. One of a source and a drain of the transistor M1 is electrically connected to a gate of the transistor M2. The other of the source and the drain of the transistor M1 is electrically connected to a wiring DL. The transistor M1 has a function of establishing or breaking electrical continuity (a switching function) between the gate of the transistor M2 and the wiring DL.

The gate of the transistor M2 is electrically connected to one terminal of the capacitor C1. One of a source and a drain of the transistor M2 is electrically connected to the other terminal of the capacitor CL. The other of the source and the drain of the transistor M2 is electrically connected to a wiring 21. The transistor M2 has aback gate. A back gate of the transistor M2 is electrically connected to one terminal of the capacitor C2. The other terminal of the capacitor C2 is electrically connected to the one of the source and the drain of the transistor M2.

A gate of the transistor M3 is electrically connected to the wiring GLb. One of a source and a drain of the transistor M3 is electrically connected to one terminal of the capacitor C1. The other of the source and the drain of the transistor M3 is electrically connected to other terminal of the capacitor CL. The transistor M3 has a function of establishing or breaking electrical continuity (a switching function) between the gate of the transistor M2 and the one of the source and the drain of the transistor M2.

A gate of the transistor M4 is electrically connected to the wiring GLb. One of a source and a drain of the transistor M4 is electrically connected to the one terminal of the capacitor C2. The other of the source and the drain of the transistor M4 is electrically connected to a wiring 24. The transistor M4 has a function of establishing or breaking electrical continuity (a switching function) between the one terminal of the capacitor C2 and the wiring 24.

A gate of the transistor M5 is electrically connected to a wiring GLc. One of a source and a drain of the transistor M5 is electrically connected to the one of the source and the drain of the transistor M2. The other of the source and the drain of the transistor M5 is electrically connected to one terminal (e.g., an anode terminal) of the light-emitting element 32. The transistor M5 has a function of establishing or breaking electrical continuity (a switching function) between the one of the source and the drain of the transistor M2 and the one terminal of the light-emitting element 32.

A gate of the transistor M6 is electrically connected to the wiring GLa. One of a source and a drain of the transistor M6 is electrically connected to the one of the source and the drain of the transistor M2. The other of the source and the drain of the transistor M6 is electrically connected to a wiring 23. The transistor M6 has a function of establishing or breaking electrical continuity (a switching function) between the one of the source and the drain of the transistor M2 and the wiring 23.

The other terminal (for example, a cathode terminal) of the light-emitting element 32 is electrically connected to a wiring 22.

The light-emitting element 32 emits light with a luminance corresponding to the amount of current flowing through the light-emitting element 32. Examples of an element that can be used as the light-emitting element 32 include a variety of elements such as electroluminescence (EL) elements (e.g., EL elements containing an organic substance and an inorganic substance, organic EL elements, and inorganic EL elements), light-emitting diodes (LEDs), micro LEDs, (e.g., LEDs that include light-emitting regions having an area of 10000 $\mu m^2$ or less), organic light-emitting diodes (OLEDs), quantum-dot light-emitting diodes (QLEDs), and electron emitter elements.

The transistor M2 is capable of varying drain current in accordance with the potential supplied to the gate. Thus, in the pixel circuit 31A, the transistor M2 has a function of controlling the amount of current flowing through the light-emitting element 32. In other words, the transistor M2 has a function of controlling the emission intensity of the light-emitting element 32. In this specification and the like, a transistor that functions like the transistor M2 is sometimes referred to as "driving transistor."

Furthermore, the transistor M2 is capable of varying its threshold voltage in accordance with the potential supplied to the back gate. Thus, the pixel circuit 31A is capable of correcting the threshold voltage of the transistor M2 in accordance with the potential supplied to the back gate of the transistor M2 (a node ND2). In other words, in the display apparatus including the pixel circuits 31A, variation in the threshold voltage of the transistor M2 among the pixel circuits 31A can be corrected. In this specification and the like, a pixel circuit that is capable of correcting the threshold voltage of a driving transistor (transistor M2) like the pixel circuit 31A is also referred to as a pixel circuit incorporating "internal correction circuit." Incorporating an internal correction circuit leads to higher display quality of the display apparatus.

A node ND1 sometimes refers to a region where the one of the source and the drain of the transistor M2, the other of the source and the drain of the transistor M3, the one of the source and the drain of the transistor M5, the one of the source and the drain of the transistor M6, the other terminal of the capacitor C1, and the other terminal of the capacitor C2 are electrically connected to one another.

The node ND2 sometimes refers to a region where the back gate of the transistor M2, the one of the source and the drain of the transistor M4, and the one terminal of the capacitor C2 are electrically connected to one another.

A node ND3 sometimes refers to a region where the gate of the transistor M2, the one of the source and the drain of the transistor M1, the one of the source and the drain of the transistor M3, and the one terminal of the capacitor C1 are electrically connected to one another.

The capacitor C1 has a function of retaining a potential difference (voltage) between the gate of the transistor M2 and the one of the source and the drain of the transistor M2 when the node ND3 is in a floating state, for example.

The capacitor C2 has a function of retaining a potential difference (voltage) between the one of the source and drain of the transistor M2 and the back gate of the transistor M2 when the node ND2 is in a floating state, for example.

The wirings GLa, GLb, and GLc are referred to as, for example, gate lines, scan lines, or selection lines in some cases. The wiring DL is referred to as, for example, a source line, a data line, or a signal line in some cases.

Unless otherwise specified, the transistors included in the pixel circuit 31A (transistors M1 to M6) are each an enhancement (normally-off) n-channel transistor in this specification and the like. Hence, the threshold voltage (sometimes referred to as "$V_{th}$") is assumed to be higher than 0 V.

Note that one embodiment of the present invention is not limited to the above. The pixel circuit 31A can be formed using any of various transistors.

For example, some or all of the transistors included in the pixel circuit 31A may be p-channel transistors.

As the transistors included in the pixel circuit 31A, transistors including any of a variety of semiconductors can be used. For example, a transistor including a single crystal semiconductor, a polycrystalline semiconductor, a microcrystalline semiconductor, or an amorphous semiconductor in a channel formation region can be used. Examples of the variety of semiconductors that can be used include compound semiconductors (e.g., silicon germanium and gallium arsenide) and oxide semiconductors in addition to semiconductors including mainly a single element (e.g., silicon and germanium).

As the transistors included in the pixel circuit 31A, any of a variety of transistors can be used. For example, a MOS field-effect transistor, a junction field-effect transistor, a bipolar transistor, or the like can be employed.

As the transistors included in the pixel circuit 31A, transistors with various structures can be used. For example, a planar type, a staggered type, a FIN-type, a Tri-Gate type, a top-gate type, a bottom-gate type, a dual-gate type (where gates are arranged at both sides of (e.g., above and below) the channel formation region), or the like can be used. As each transistor included in the pixel circuit 31A, a vertical transistor, in which at least part of a semiconductor including the channel formation region is provided along the side surface of an insulating layer in the opening formed in the insulating layer, is preferably used.

In a vertical transistor, the source electrode and the drain electrode are positioned at different heights, which causes current flow in the height direction (also referred to as the vertical direction, the depth direction in the top view, or the direction perpendicular to the formation surface) in the channel formation region of the semiconductor. In other words, the channel length direction includes a height component.

In a vertical transistor, the source region, the channel formation region, and the drain region can at least party overlap with one another in the top view, enabling a smaller occupied area (footprint). Such a transistor further enables the reduced channel length and the increased channel width, reducing the on-state resistance (increasing the on-state current). With the use of a vertical transistor in a pixel circuit, for example, the resolution (also referred to as pixel density) of a display apparatus using the pixel circuit can be increased. Furthermore, as pixel arrangement, a PenTile arrangement can be replaced with a stripe arrangement without decreasing the resolution of the display apparatus, for example. In addition, an internal correction circuit can be incorporated without decreasing the resolution of the display apparatus, for example.

In one embodiment of the present invention, vertical transistors are preferably used as some or all of the transistors included in the pixel circuit 31A. Vertical transistors are preferably used as the transistors serving as switches (transistors M1 and M3 to M6), in particular.

As the driving transistor (transistor M2), a transistor with favorable saturation (with a small change in drain current with respect to drain voltage in the saturation region) is preferably used. For example, a transistor with a large channel length is used.

In one embodiment of the present invention, transistors each including an oxide semiconductor in a channel formation region (OS transistors) are preferably used as the transistors included in the pixel circuit 31A.

An OS transistor features an extremely low off-state current because the band gap of the oxide semiconductor where the channel is formed is 2 eV or more. The off-state current per micrometer of channel width of an OS transistor can be lower than or equal to 1 aA ($1\times10^{-18}$ A), lower than or equal to 1 zA ($1\times10^{-21}$ A), or lower than or equal to 1 yA ($1\times10^{-24}$ A) in a room-temperature environment. Note that the off-state current per micrometer of channel width of a transistor including silicon in the channel formation region (a Si transistor) is higher than or equal to 1 fA ($1\times10^{-15}$ A) and lower than or equal to 1 pA ($1\times10^{-12}$ A) in a room-temperature environment. The off-state current of an OS transistor is therefore lower than that of a Si transistor by approximately ten orders of magnitude.

Thus, when OS transistors are used as the transistors serving as switches (transistors M1 and M3 to M6) among the transistors included in the pixel circuit 31A, for example, electric charges accumulated in the capacitors C1 and C2 can be retained for a long period.

Accordingly, in the case of displaying a still image for which rewriting every frame is not required, the display apparatus using the pixel circuit can continue displaying the image even after the operation of a peripheral driver circuit that drives the pixel circuit is stopped, for example. In this specification and the like, a driving method in which the operation of the peripheral driver circuit is stopped during displaying a still image is also referred to as "idling stop driving." The idling stop driving contributes to the reduced power consumption of the display apparatus.

In the display apparatus using the pixel circuit, the potential supplied to the back gate of the driving transistor can be retained for along period, for example. Accordingly, even when the operation of correcting the threshold voltage of the driving transistor is performed not every frame but every few frames or every few seconds, for example, the display quality of the display apparatus can be improved.

The off-state current of an OS transistor hardly increases even in a high temperature environment. Specifically, the off-state current hardly increases even at an environment temperature higher than or equal to room temperature and lower than or equal to 200° C. Furthermore, the on-state current of an OS transistor hardly decreases even in a high-temperature environment. By contrast, the on-state current of a Si transistor decreases in a high-temperature environment. That is, an OS transistor has a higher on-state current than a Si transistor in a high-temperature environment. Furthermore, even at an environment temperature higher than or equal to 125° C. and lower than or equal to 150° C., an OS transistor is capable of favorable switching operation owing to its high ratio of on-state current to off-state current. Accordingly, a semiconductor device including an OS transistor achieves stable operation and high reliability even in a high temperature environment. This means that the use of OS transistors as the transistors included in the pixel circuit 31A leads to the high reliability of the display apparatus using the pixel circuit.

An OS transistor has a high breakdown voltage between the source and the drain (also referred to as drain breakdown voltage). Accordingly, a semiconductor device including an OS transistor achieves stable operation and high reliability even in high-voltage driving. Specifically, for example, with the use of OS transistors as the transistors M2 and M5 among the transistors included in the pixel circuit 31A, the operation of the pixel circuit 31A can be stabilized even when the difference (voltage) between the potential supplied to the wiring 21 (also referred to as an anode potential) and the potential supplied to the wiring 22 (also referred to as a cathode potential) is large. Thus, the reliability of the display apparatus using the pixel circuit can be improved.

In one embodiment of the present invention, the structure of the pixel circuit 31A is not limited to the structure using OS transistors, and a structure using a plurality of kinds of transistors formed using different semiconductor materials may be employed. For example, the pixel circuit 31A may be formed of an OS transistor and a transistor including low-temperature polysilicon (LTPS) in a channel formation region (an LTPS transistor). The LTPS transistor has high field-effect mobility and excellent frequency characteristics. A structure in which an LTPS transistor and an OS transistor are used in combination is referred to as LTPO in some cases.

For example, OS transistors can be used as the transistors serving as switches (transistors M1 and M3 to M6) and an LTPS transistor can be used as the driving transistor (transistor M2) among the transistors included in the pixel circuit 31A. When the pixel circuit 31A employs LTPO (i.e., including both an LTPS transistor and an OS transistor), the display apparatus using the pixel circuit can achieve reduced power consumption and improved drive capability.

In the case where the pixel circuits 31A are each formed with a plurality of kinds of transistors including different semiconductor materials, the transistors may be provided in different layers for each kind of transistor. For example, in the case where the pixel circuits 31A are each formed with a Si transistor and an OS transistor, a layer including the Si transistor and a layer including the OS transistor may be provided to overlap with each other. Such a structure can reduce the area occupied by the pixel circuit 31A.

In one embodiment of the present invention, vertical OS transistors are used as the transistors serving as switches (transistors M1 and M3 to M6) and a dual-gate type OS transistor is used as the driving transistor (transistor M2), among the transistors included in the pixel circuit 31A in the semiconductor device 20A. Refer to Embodiment 2 described later for a specific structure example of such a semiconductor device including both a vertical transistor and a dual-gate type transistor.

<Operation Example of Semiconductor Device>

Next, an operation of the semiconductor device 20A is explained.

In this specification and the like, a potential difference (voltage) between the gate and source of a transistor is referred to as "gate voltage" in some cases. This leads to the equation: the gate voltage of a transistor=the gate potential of the transistor−the source potential of the transistor. In addition, a potential difference (voltage) between the back gate and source of a transistor is referred to as "back gate voltage" in some cases. This leads to the equation: the back gate voltage of a transistor=the back gate potential of the transistor−the source potential of the transistor.

Figure 2:
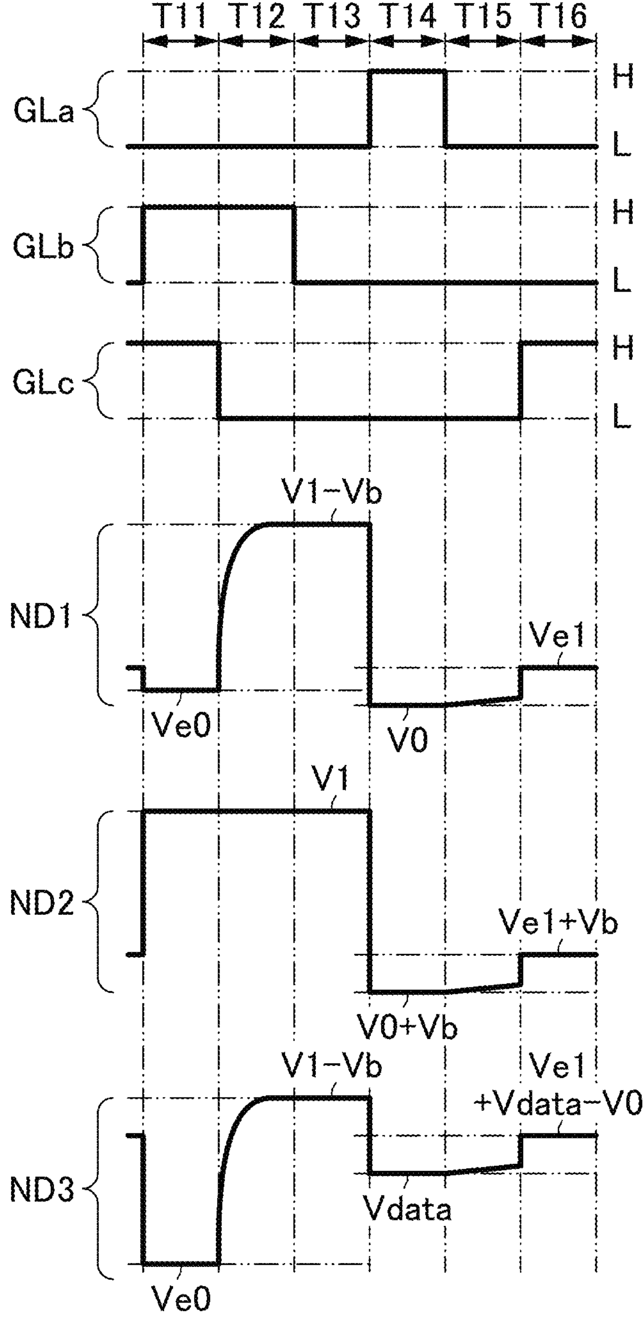
FIG. 2 is a timing chart showing an operation example of a semiconductor device.
Figure 3:
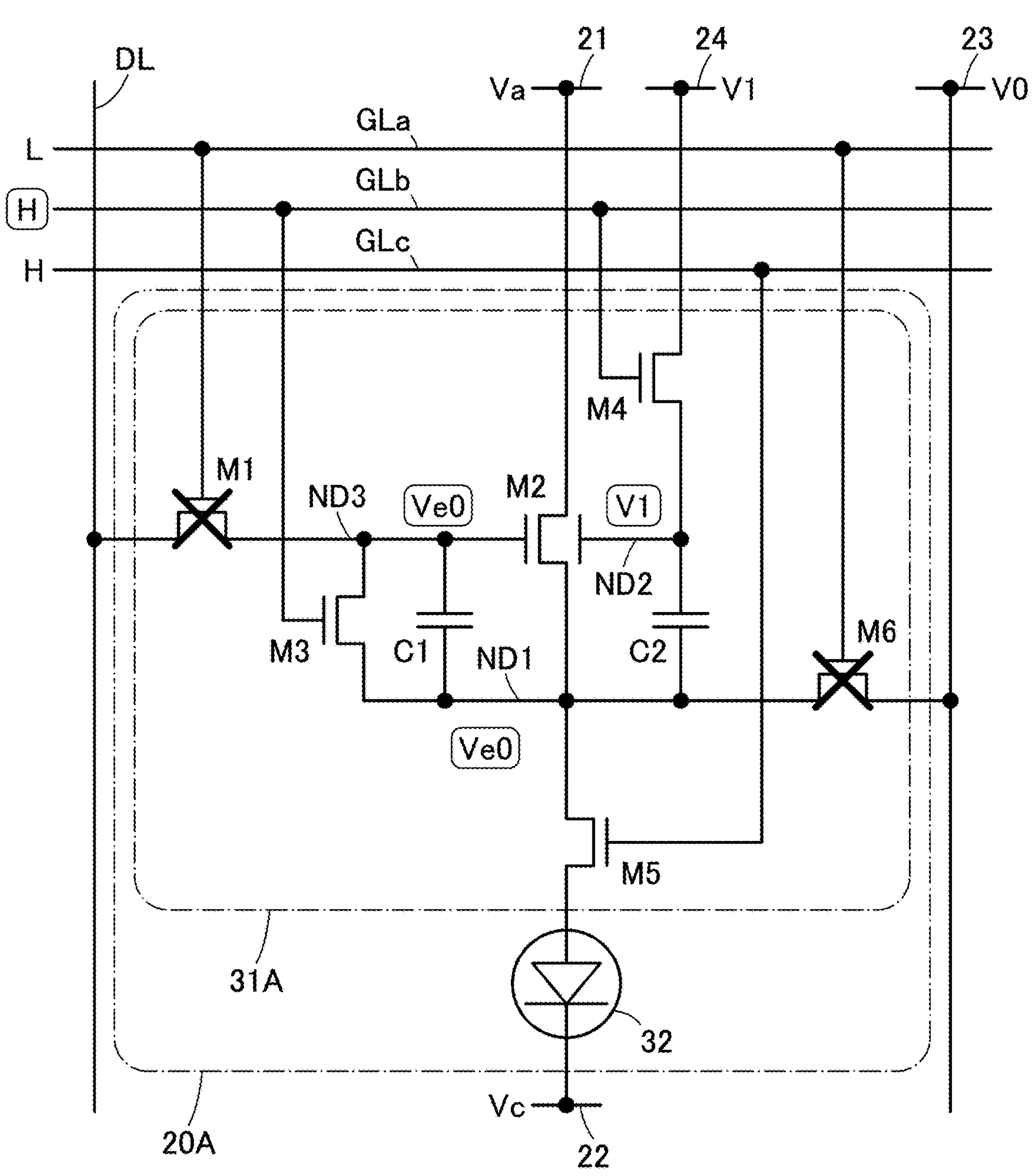
FIG. 3 is a circuit diagram showing an operation example of a semiconductor device.
Figure 4:
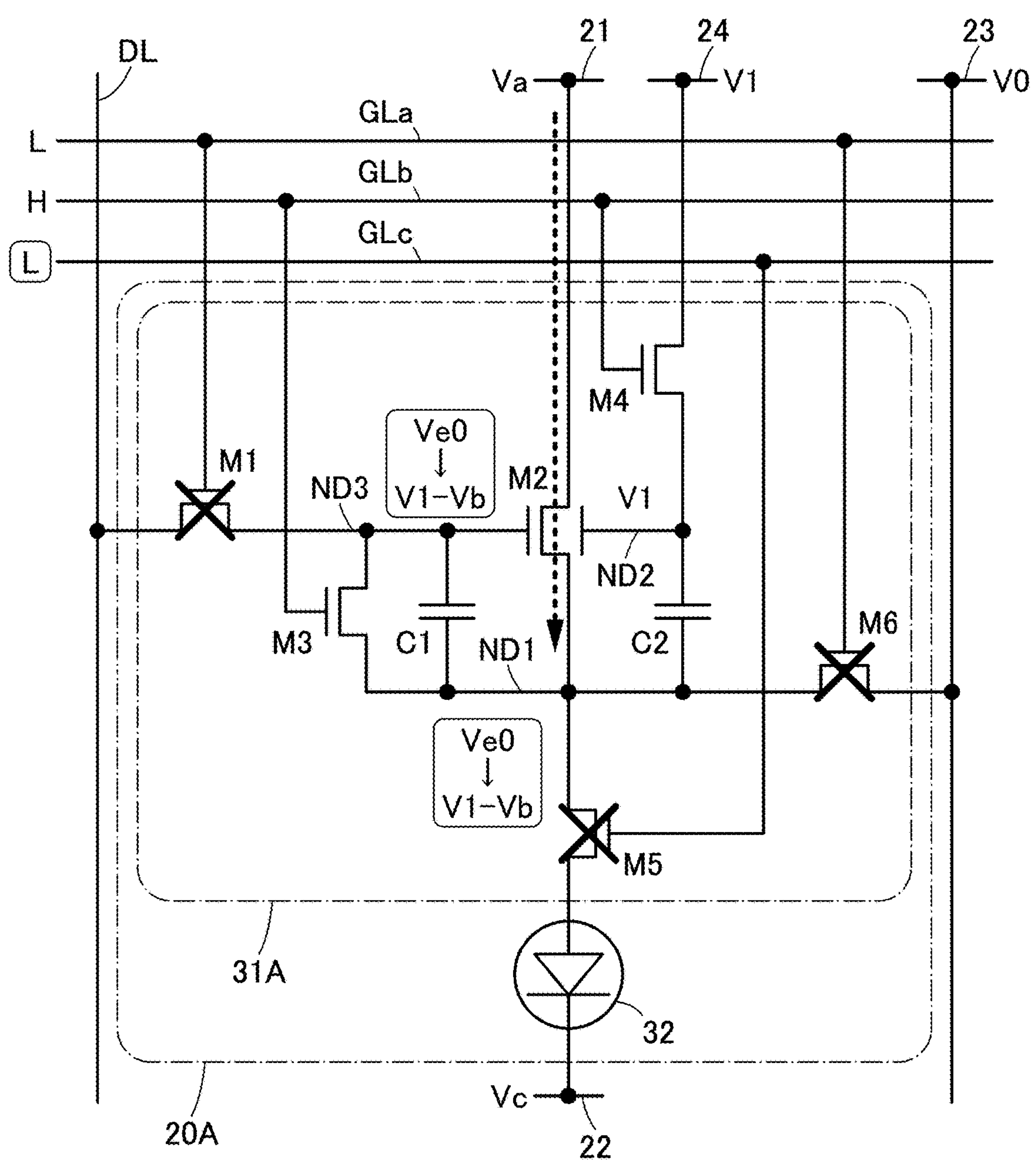
FIG. 4 is a circuit diagram showing an operation example of a semiconductor device.
Figure 5:
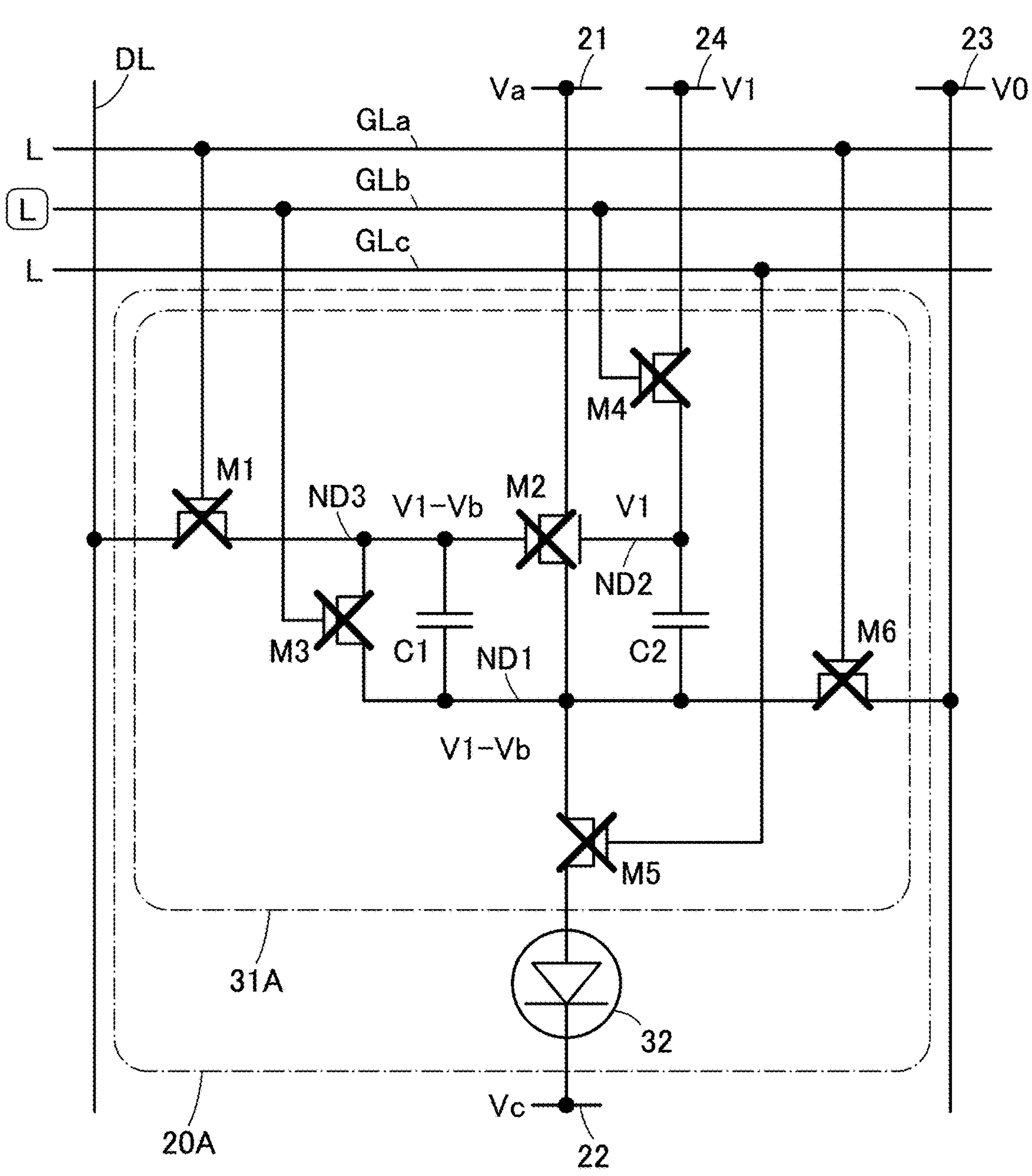
FIG. 5 is a circuit diagram showing an operation example of a semiconductor device.
Figure 6:
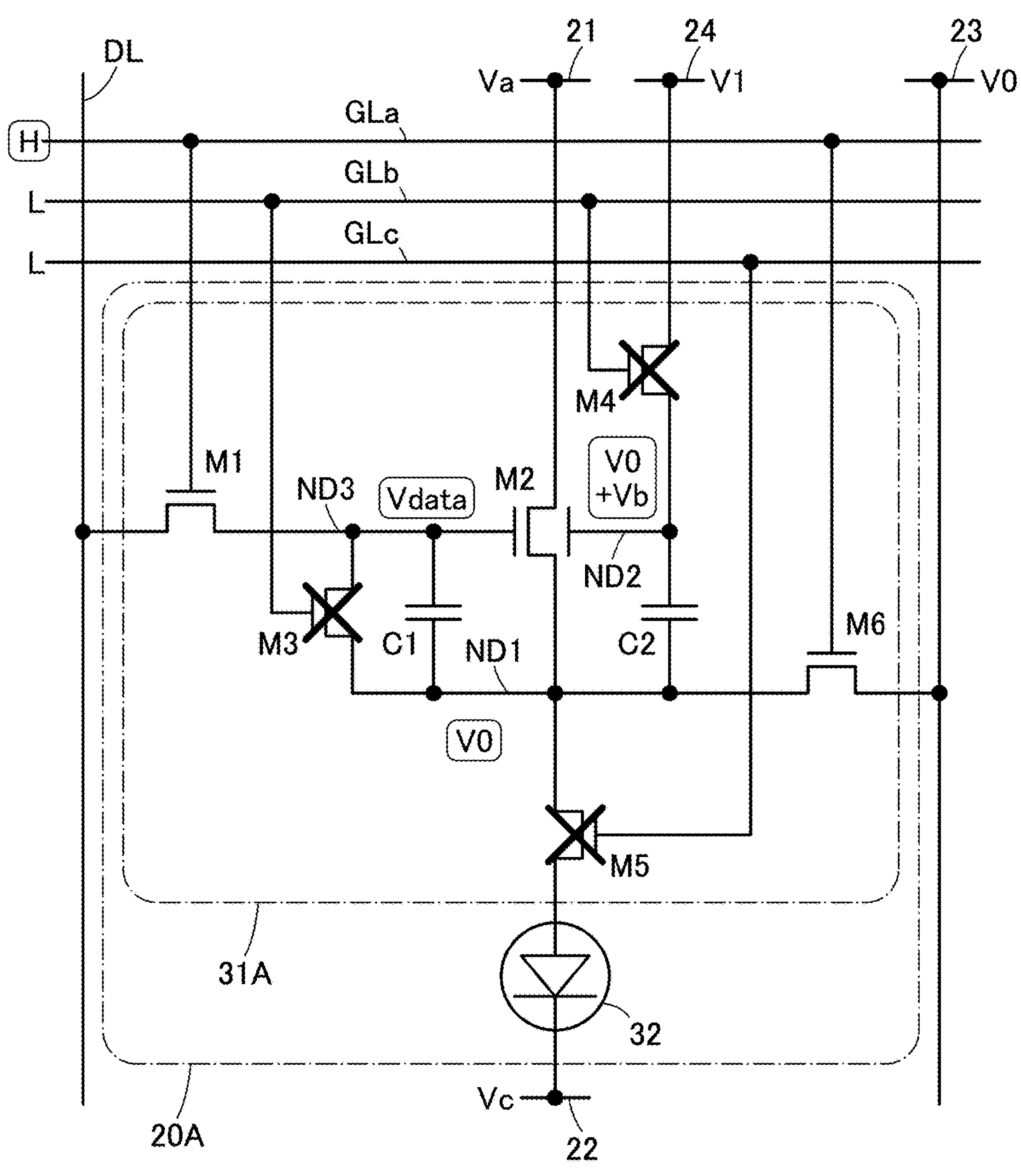
FIG. 6 is a circuit diagram showing an operation example of a semiconductor device.
Figure 7:
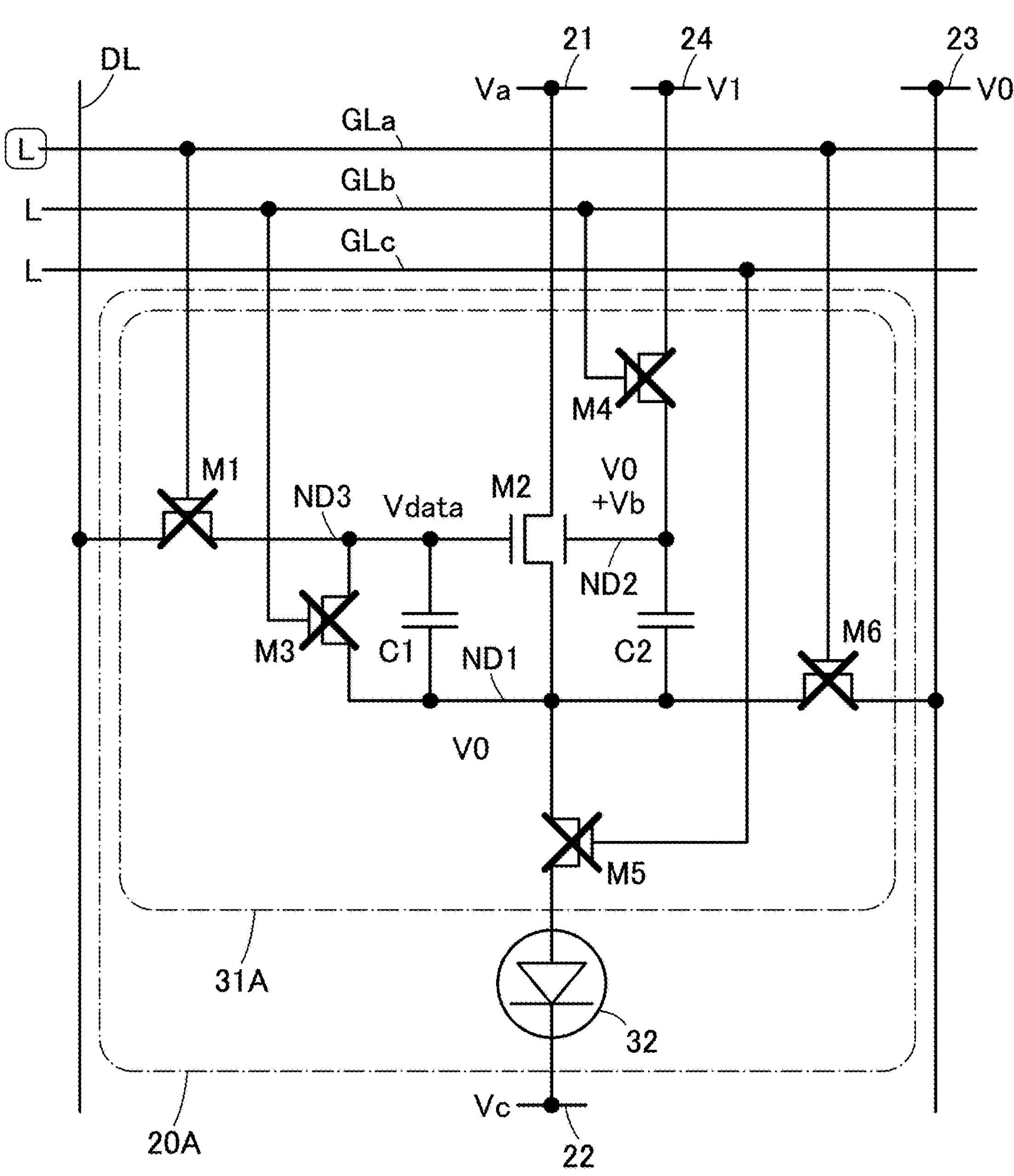
FIG. 7 is a circuit diagram showing an operation example of a semiconductor device.

FIG. 2 is a timing chart showing an operation example of the semiconductor device 20A. FIG. 3, FIG. 4, FIG. 5, FIG. 6, FIG. 7, and FIG. 8 are circuit diagrams each illustrating an example of the semiconductor device 20A.

In the following description of the operation, a data potential Vdata is supplied to the wiring DL. A potential Va is supplied to the wiring 21, a potential Vc is supplied to the wiring 22, a potential V0 is supplied to the wiring 23, and a potential V1 is supplied to the wiring 24. A potential H or a potential L is supplied to each of the wirings GLa, GLb, and GLc. The potential H is a potential higher than the potential L. The difference between the potentials H and L is preferably greater than the threshold voltage of a transistor, for example. Here, when the potential His input to the gate of a transistor included in the semiconductor device 20A, the transistor is turned on (brought into a conduction state). When the potential L is input to the gate of a transistor included in the semiconductor device 20A, the transistor is turned off (brought into a non-conduction state).

The potential Va is an anode potential and the potential Vc is a cathode potential. When the potential V0 is supplied to the gate of the transistor M2, the transistor M2 can be turned off, for example. When the potential V1 is supplied to the back gate of the transistor M2, the threshold voltage can be reduced (also referred to as shifted in the negative direction) until the transistor M2 becomes normally on, for example. The potential V0 is, for example, 0 V or the potential L. The potential V1 is, for example, higher than the potential V0 and lower than the potential H.

Figure 8:
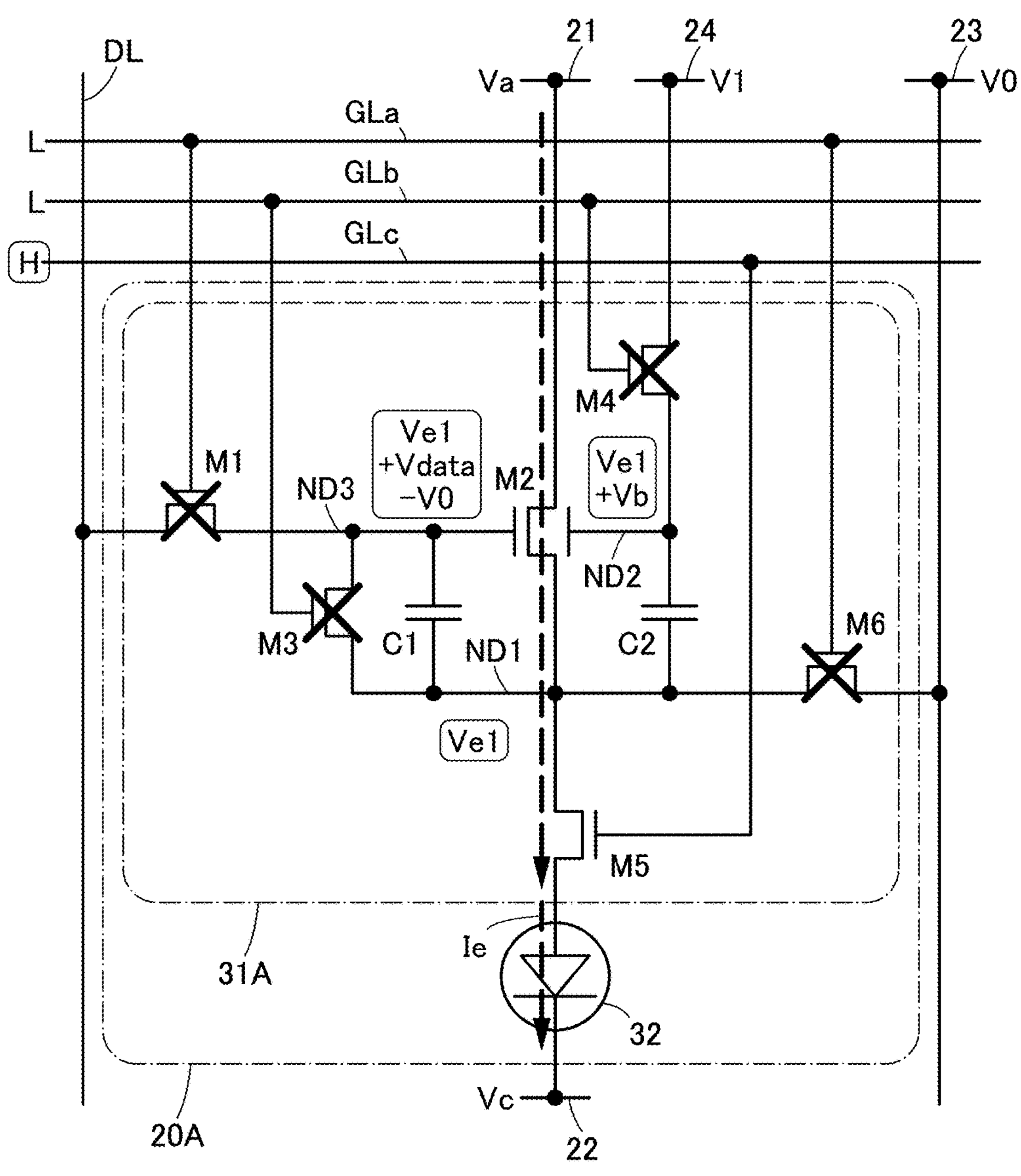
FIG. 8 is a circuit diagram showing an operation example of a semiconductor device.

In the semiconductor device 20A, the emission intensity of the light-emitting element 32 is controlled by the amount of current Ie flowing through the light-emitting element 32. Note that the current Ie is indicated by a dashed line arrow in FIG. 8 showing the light emission period of the light-emitting element 32. The pixel circuit 31A is configured to control the amount of current Ie in accordance with the data potential Vdata supplied from the wiring DL.

The timing chart in FIG. 2 shows the potentials (H or L) supplied to the wirings GLa, GLb, and GLc in the operation periods (Periods T11 to T16). In addition, changes in the potentials of the nodes ND1, ND2, and ND3 are shown.

In this specification, drawings, and the like, loads on a wiring (parasitic capacitance and parasitic resistance), for example, sometimes generate a rise time and a fall time at the time of potential change. Such a time is, for example, longer than 0 seconds and is shorter than 1000 nanoseconds, shorter than 100 nanoseconds, shorter than 10 nanoseconds, or shorter than 1 nanosecond.

Although two different operations appear to occur at the same timing in the timing chart, for example, the operations do not necessarily occur at exactly the same timing. The operations can sometimes be considered to occur at the same timing even though a signal delay of a wiring or the like causes a slight time lag between the operations, for example. The time lag is, for example, longer than 0 seconds and is shorter than 1000 nanoseconds, shorter than 100 nanoseconds, shorter than 10 nanoseconds, or shorter than 1 nanosecond. Accordingly, for example, "the same timing" can be replaced with "substantially the same timing," "roughly the same timing," "practically the same timing," or the like as appropriate. This means that "the same timing" sometimes indicates "the same timing or roughly the same timing," for example.

The plurality of wirings are not necessarily supplied with the same potential H or the same potential L. The potentials supplied to the wirings may be different from each other in consideration of the threshold voltage of the transistor supplied with the potential, for example.

The lengths of the periods in the timing chart may be different from each other though the lengths of the periods appear the same. For example, although the lengths of the periods (Periods T11 to T16) appear the same in the timing chart in FIG. 2 for easy understanding, the lengths of the periods may be different from each other.

In FIG. 3, FIG. 4, FIG. 5, FIG. 6, FIG. 7, and FIG. 8, a symbol showing a potential (also referred to as a potential symbol) such as "H," "L," "V0," or "V1" is sometimes shown adjacent to a wiring or a node. For easy understanding of change in the potential of a wiring or a node, a potential symbol of the wiring or node whose potential has changed is sometimes enclosed. Furthermore, a symbol "x" is sometimes written on a transistor in an off state.

[Correction of Threshold Voltage ($V_{th}$ Correction Operation) of Driving Transistor]

Through the operation in Periods T11 to T13 in FIG. 2, voltage for correction of the threshold voltage of the transistor M2 is obtained and the voltage is retained in the capacitor C2.

The current Ie flowing through the light-emitting element 32 depends mainly on the data potential Vdata and the threshold voltage of the transistor M2. Accordingly, in the display apparatus including the pixel circuits 31A, even when the data potentials Vdata supplied to the pixel circuits 31A are the same, variation in the threshold voltages of the transistors M2 included in the pixel circuits 31A makes different currents Ie flow through the pixel circuits 31A. Thus, the variation in the threshold voltages of the transistors M2 is a factor in reducing the display quality.

In view of this, correction is made such that the threshold voltages of the transistors M2 in the pixel circuits 31A are equal, thereby reducing the variation in current Ie. In a correction method described as an example here, the potential supplied to the back gate of the transistor M2 is changed to make the threshold voltage of the transistor M2 become 0 V (or its neighborhood).

Immediately before Period T11, the potential L is supplied to the wirings GLa and GLb and the potential His supplied to the wiring GLc. Consequently, the transistors M1, M3, M4, and M6 are turned off and the transistor M5 is turned on. Note that in the following description of the operation, unless otherwise specified, the potentials of the wirings in the immediately preceding period are held.

In Period T11, a reset (initialization) operation is performed. Specifically, the potential H is supplied to the wiring GLb. Then, the transistors M3 and M4 are turned on (see FIG. 3).

Consequently, the potential of the node ND1 becomes a potential Ve0. The potential of the node ND3 also becomes the potential Ve0 through the transistor M3. Here, the potential Ve0 is higher than the potential Vc by a voltage drop in the light-emitting element 32. The potential V1 is supplied to the node ND2 through the transistor M4. Application of "the potential V1—the potential Ve0" as the back gate voltage of the transistor M2 brings the transistor M2 into a normally-on state.

In Period T12, the potential L is supplied to the wiring GLc. Then, the transistor M5 is turned off (see FIG. 4).

Immediately after the transistor M5 is turned off, the transistor M2 is in a normally-on state because "the potential V1—the potential Ve0" is applied as the back gate voltage of the transistor M2. Consequently, electric charge is supplied from the wiring 21 to the node ND1 through the transistor M2 (indicated by the dotted line arrow in FIG. 4). This allows the potential of the node ND1 to increase over time. Since the transistor M3 is in an on state, the potential of the node ND3 similarly increases. As the potential of the node ND1 gradually increases, the back gate voltage of the transistor M2 gradually decreases. In other words, the threshold voltage of the transistor M2 gradually increases (also referred to as shifts in the positive direction). Then, when the threshold voltage of the transistor M2 is as close to 0 V as possible, the transistor M2 is turned off to stop the increase in the potential of the node ND1. In this case, the back gate voltage at which the threshold voltage of the transistor M2 can be regarded as 0 V is referred to as a correction voltage Vb. Thus, when the increase in the potential of the node ND1 stops, the potential of the node ND1 becomes "the potential V1−the correction voltage Vb."

In Period T13, the potential L is supplied to the wiring GLb. Then, the transistor M3 and M4 are turned off (see FIG. 5).

Consequently, the nodes ND2 and ND3 are brought into a floating state, and electric charges supplied to the nodes are retained. In other words, application of the correction voltage Vb obtained as the back gate voltage of the transistor M2 in Period T12 is maintained.

Through the operation in Periods T11 to T13, correction is performed such that the threshold voltage of the transistor M2 can be regarded as 0 V and the state subjected to correction can be maintained. Note that in this specification and the like, such a correction method is sometimes referred to as "internal correction."

[Writing of Display Data (Data Writing Operation)]

In Periods T14 and T15 shown in FIG. 2, an operation of writing the data potential Vdata to the pixel circuit 31A is performed.

In Period T14, the potential H is supplied to the wiring GLa. Then, the transistors M1 and M6 are turned on (see FIG. 6).

Consequently, the data potential Vdata is supplied to the node ND3, and the potential V0 is supplied to the node ND1. In other words, "the data potential Vdata−the potential V0" is applied as the gate voltage of the transistor M2.

The node ND2 is in a floating state, and the node ND1 is capacitively coupled to the node ND2 by the capacitor C2. Consequently, when the potential of the node ND1 changes to the potential V0, the potential of the node ND2 also changes to "the potential V0+the correction voltage Vb." Thus, while maintaining the state in which the correction voltage Vb is applied as the back gate voltage of the transistor M2 and correction is performed such that the threshold voltage of the transistor M2 can be regarded as 0 V, the data potential Vdata can be written.

In Period T15, the potential L is supplied to the wiring GLa. Then, the transistors M1 and M6 are turned off (see FIG. 7).

Consequently, the node ND3 is brought into a floating state, and electric charges in the node ND3 are retained. Supply of electric charge from the wiring 21 to the node ND1 through the transistor M2 gradually increases the potential of the node ND1.

The node ND3 is in a floating state, and the node ND1 is capacitively coupled to the node ND3 by the capacitor C1. Accordingly, in accordance with the increase in the potential of the node ND1, the potential of the node ND3 also increases. In other words, the state in which "the data potential Vdata−the potential V0" is applied as the gate voltage of the transistor M2 is maintained. Similarly, the node ND2 is in a floating state, and the node ND1 is capacitively coupled to the node ND2 by the capacitor C2. Accordingly, in accordance with the increase in the potential of the node ND1, the potential of the node ND2 also increases. In other words, the state in which the correction voltage Vb is applied as the back gate voltage of the transistor M2 is maintained.

[Light Emission of Light-Emitting Element (Light Emission Operation)]

In Period T16 shown in FIG. 2, an operation of making the light-emitting element 32 emit light is performed.

In Period T16, the potential H is supplied to the wiring GLc. Then, the transistor M5 is turned on (see FIG. 8).

Consequently, current flows from the wiring 21 to the wiring 22 through the transistors M2 and M5 and the light-emitting element 32 (indicated by the dashed line arrow in FIG. 8). That is, the current Ie flows through the light-emitting element 32, and the light-emitting element 32 emits light with emission intensity corresponding to the current Ie.

The flow of the current Ie from the wiring 21 to the wiring 22 causes a voltage drop in the light-emitting element 32, which changes the potential of the node ND1 to a potential Vel. Since the nodes ND2 and ND3 are each in a floating state, as in the description of Period T15, the potentials of the nodes ND2 and ND3 also change in accordance with the change in the potential of the node ND1. In other words, the state in which "the data potential Vdata−the potential V0" is applied as the gate voltage of the transistor M2 is maintained. Furthermore, the state in which the correction voltage Vb is applied as the back gate voltage of the transistor M2 is maintained.

The operation in Period T16 may be performed at the same timing as the operation in Period T15. Specifically, supplying the potential L to the wiring GLa and supplying the potential H to the wiring GLc may be performed at the same timing.

In one embodiment of the present invention, through the $V_{th}$ correction operation (Periods T11 to T13) described above, correction can be performed in the semiconductor device 20A such that the threshold voltage of the transistor M2 can be regarded as 0 V. When an OS transistor that features an extremely low off-state current is used as the transistor M4, the state in which correction is performed such that the threshold voltage of the transistor M2 can be regarded as 0 V (i.e., the correction voltage Vb is applied as the back gate voltage of the transistor M2) can be maintained for a long period.

In the semiconductor device 20A, the amount of the current Ie flowing through the light-emitting element 32 is proportional to the square of "the gate voltage of the transistor M2—the threshold voltage of the transistor M2." Accordingly, when correction is performed such that the threshold voltage of the transistor M2 can be regarded as 0 V, the current Ie has an amount proportional to the square of "the data potential Vdata−the potential V0." That is, the current Ie has an amount that does not depend on the threshold voltage of the transistor M2. Accordingly, flow of the current Ie that does not depend on the threshold voltage of the transistor M2 can be maintained for a long period.

Thus, in accordance with one embodiment of the present invention, in the semiconductor device 20A, the frequency of the $V_{th}$ correction operation (Periods T11 to T13) described above can be lower than the frequency of the data writing operation and the light emission operation (Periods T14 to T16). For example, in the semiconductor device 20A, even when the data writing and light emission operations are repeated more than once for each $V_{th}$ correction operation, the state in which correction is performed such that the threshold voltage of the transistor M2 can be regarded as 0 V can be maintained. Thus, the improved display quality and reduced power consumption of the display apparatus using the semiconductor device can be achieved.

One embodiment of the present invention is not limited to the aforementioned configuration example of the semiconductor device.

Figure 9:
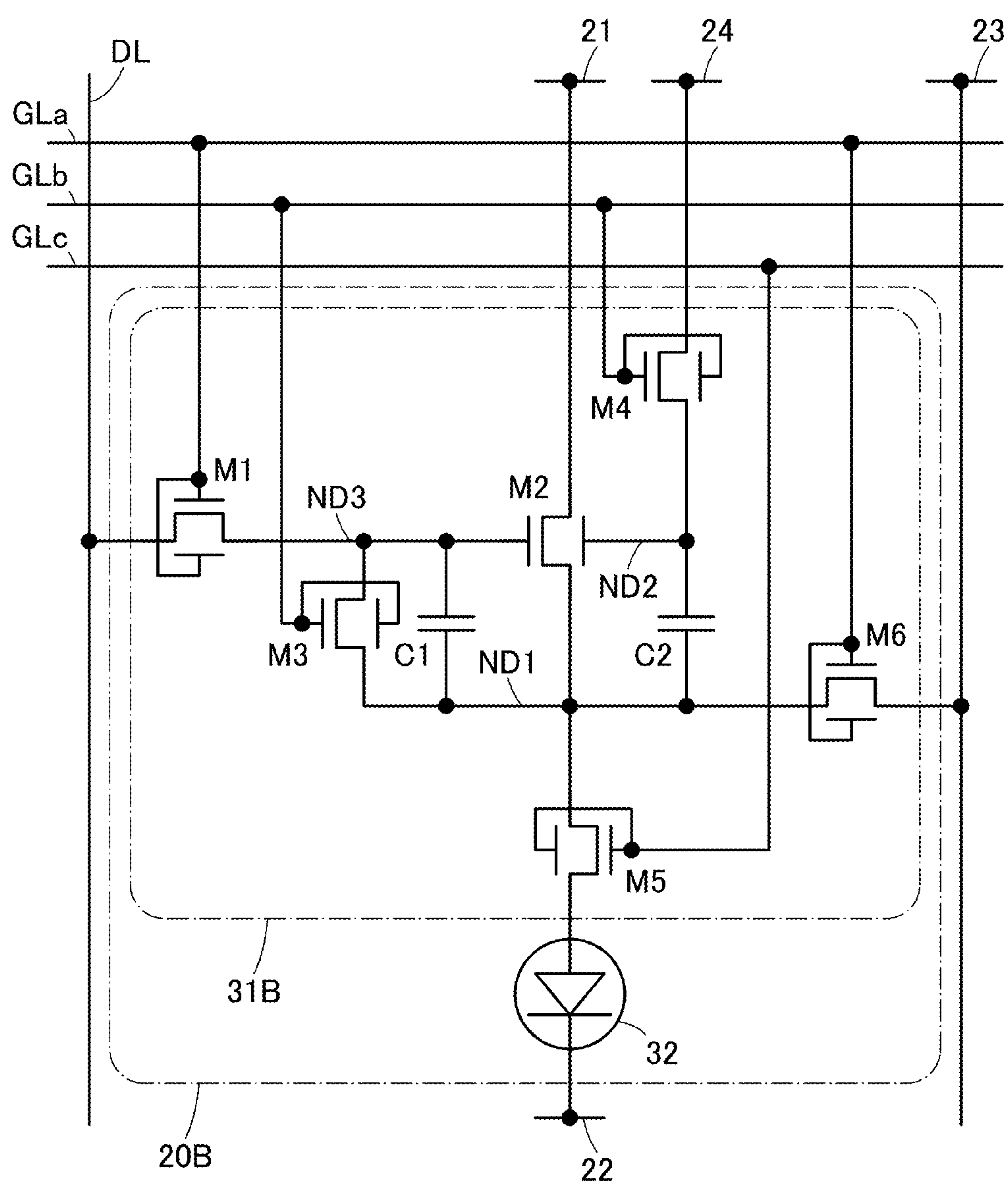
FIG. 9 is a circuit diagram showing a configuration example of a semiconductor device.

FIG. 9 is a circuit diagram showing a semiconductor device 20B, which is a modification example of the semiconductor device 20A. The semiconductor device 20B includes a pixel circuit 31B instead of the pixel circuit 31A. The pixel circuit 31B is different from the pixel circuit 31A in that the transistors M1 and M3 to M6 each have a back gate. In each of the transistors M1 and M3 to M6 in the semiconductor device 20B, the back gate is electrically connected to the gate. Accordingly, the same potential as the potential of the gate is supplied to the back gate of a transistor including the back gate, whereby the on-state resistance can be reduced.

The potential that can be supplied to the back gate of the transistor including the back gate is not limited to the same potential as the potential of the gate. When the same potential as the potential of the source is supplied to the back gate, for example, an electric field generated outside the transistor is unlikely to affect the channel formation region, and consequently stable electrical characteristics and high reliability can be provided. For example, when a given potential is supplied to the back gate, the threshold voltage can be changed. Note that the potential supplied to the back gate is not limited to a fixed potential. The same potential may be supplied to the back gates of transistors or the potentials supplied to the back gates may differ between the transistors.

Figure 10:
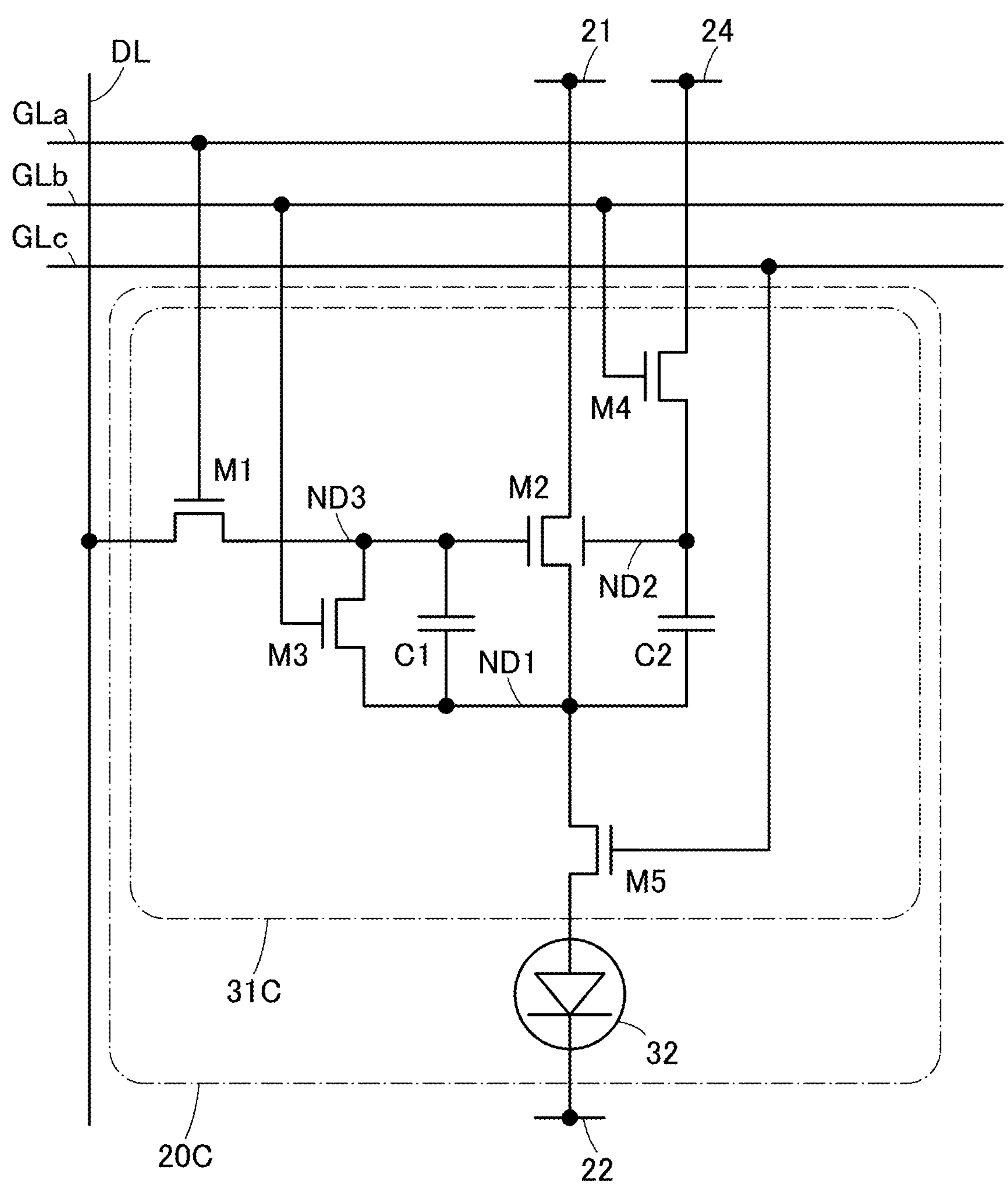
FIG. 10 is a circuit diagram showing a configuration example of a semiconductor device.

FIG. 10 is a circuit diagram showing a semiconductor device 20C, which is a modification example of the semiconductor device 20A. The semiconductor device 20C includes a pixel circuit 31C instead of the pixel circuit 31A. The pixel circuit 31C is different from the pixel circuit 31A in including no transistor M6. In data writing in the operation of the semiconductor device 20C, for example, the transistor M5 is turned on to increase the potential of the node ND1 by a voltage drop in the light-emitting element 32. The wiring 23, as well as the transistor M6, is not necessarily included in the semiconductor device 20C. This leads to a reduced area occupied by the pixel circuit 31C.

Figure 11:
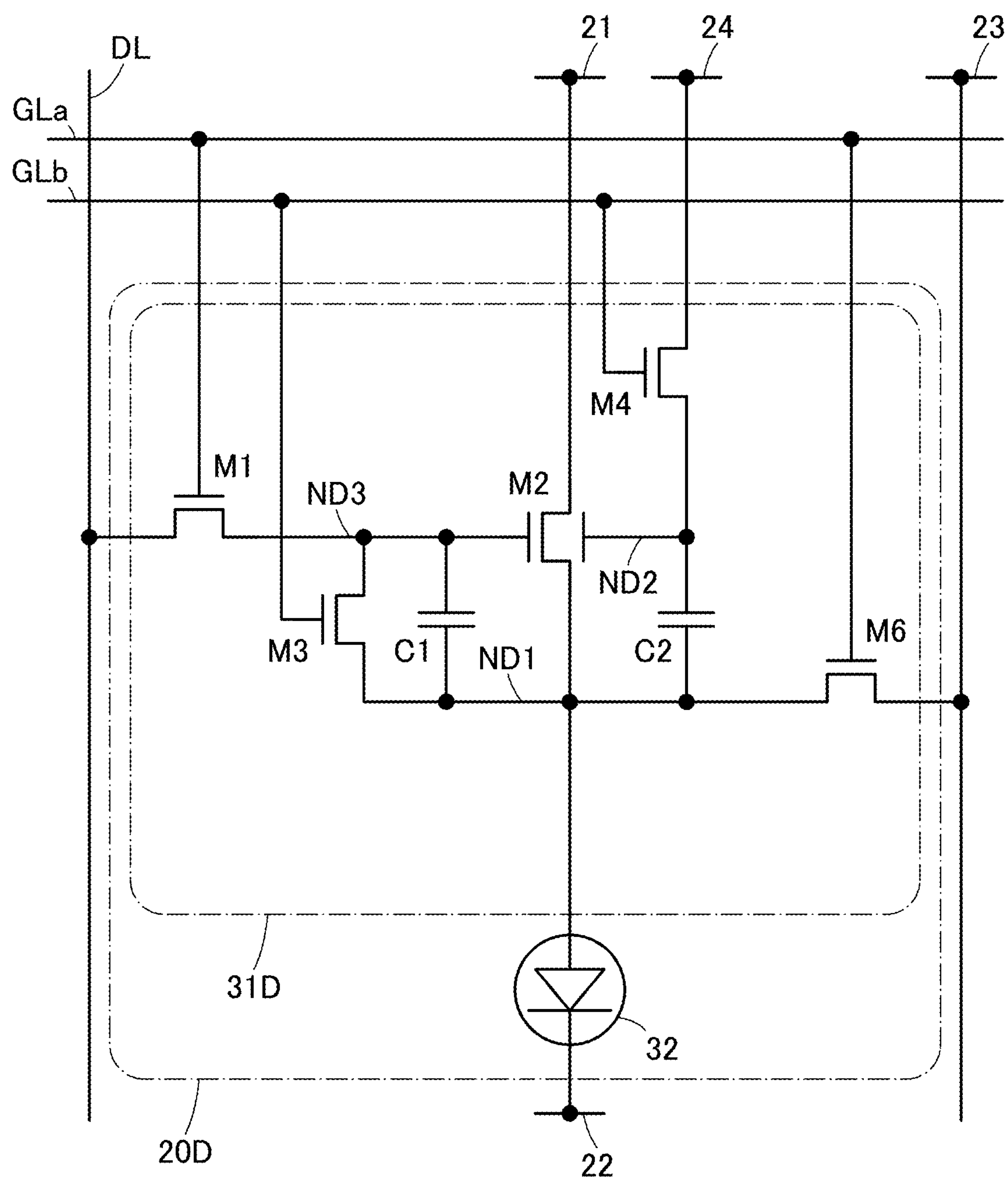
FIG. 11 is a circuit diagram showing a configuration example of a semiconductor device.

FIG. 11 is a circuit diagram showing a semiconductor device 20D, which is a modification example of the semiconductor device 20A. The semiconductor device 20D includes a pixel circuit 31D instead of the pixel circuit 31A. The pixel circuit 31D is different from the pixel circuit 31A in including no transistor M5. Thus the one of the source and the drain of the transistor M2 is electrically connected to the one electrode of the light-emitting element 32. The potential Va is supplied to the wiring 22 in the $V_{th}$ correction operation of the operation of the semiconductor device 20D, for example, to prevent current flow through the light-emitting element 32. The wiring GLc, as well as the transistor M5, is not necessarily included in the semiconductor device 20D. This leads to a reduced area occupied by the pixel circuit 31D.

<Configuration Examples of Display Apparatuses>

FIGS. 12A to 12E are block diagrams each illustrating a configuration example of a display apparatus of one embodiment of the present invention.

As illustrated in FIG. 12A, a display apparatus 40 includes a display portion 42, a first driver circuit portion 43, and a second driver circuit portion 44. For example, the display portion 42 includes a plurality of pixels 41 arranged in a matrix of m rows and n columns (m and n are each an integer greater than or equal to 2). In FIG. 12A, the pixel 41 placed in the first row and the first column is denoted as a pixel 41[1,1], the pixel 41 placed in a first row and an n-th column is denoted as a pixel 41[1,n], the pixel 41 placed in an m-th row and a first column is denoted as a pixel 41[*m*,1], and the pixel 41 placed in an m-th row and an n-th column is denoted as a pixel 41[*m,n*]. Note that the pixel 41 placed in a u-th row and a v-th column is denoted as a pixel 41[*u,v*] (u is an integer greater than or equal to 1 and less than or equal to m and v is an integer greater than or equal to 1 and less than or equal to n) in some cases. As the pixel 41, the semiconductor device 20A described above can be used.

The display apparatus 40 includes m wirings 45 which are arranged parallel or substantially parallel to each other and whose potentials are controlled by a circuit included in the first driver circuit portion 43. The potential of one wiring 45 is supplied to n pixels 41 arranged in the row direction. Note that a plurality of wirings may form one wiring 45 depending on the configuration of the pixel 41. In a display apparatus 40A illustrated in FIG. 12B, two wirings form one wiring 45. For example, in the case where the semiconductor device 20A is used as the pixel 41, one wiring 45 can correspond to the wirings GLa, GLb, and GLc.

The display apparatus 40 includes n wirings 46 which are arranged parallel or substantially parallel to each other and whose potentials are controlled by a circuit included in the second driver circuit portion 44. The potential of one wiring 46 is supplied to n pixels 41 arranged in the column direction. Note that a plurality of wirings may form one wiring 46 depending on the configuration of the pixel 41. For example, in the case where the semiconductor device 20A is used as the pixel 41, one wiring 46 can correspond to the wiring DL.

The circuit included in the first driver circuit portion 43 serves as, for example, a scan line driver circuit (sometimes referred to as a gate line driver circuit, a gate driver, a scan driver, or a row driver). In other words, the circuit has a function of, for example, outputting the potential (potential H or L) supplied to the wirings GLa, GLb, and GLc in the semiconductor device 20A.

The circuit included in the second driver circuit portion 44 serves as, for example, a signal line driver circuit (sometimes referred to as a source line driver circuit, a source driver, a data driver, or a column driver). In other words, the circuit has a function of, for example, outputting the data potential Vdata supplied to the wiring DL in the semiconductor device 20A. For example, the circuit may have a function of converting data of an image (image data) to be displayed on the display apparatus 40 into the data potential Vdata (digital-to-analog conversion).

In the semiconductor device 20A in the display apparatus 40, current flowing through the transistor M2 or current flowing through the light-emitting element 32 can be output to the wiring 23 through the transistor M6. The wiring 23 here is referred to as a monitor line in some cases. The current output to the wiring 23 can be output to the outside of the display apparatus 40 after being subjected to conversion into an analog voltage (current-to-voltage conversion) or into a digital signal (analog-to-digital conversion) in the second driver circuit portion 44, for example. The analog voltage or the digital signal can be used for image data correction in the outside of the display apparatus 40 (also referred to as external correction), for example.

In this specification and the like, circuits included in the first driver circuit portion 43 and the second driver circuit portion 44 are collectively referred to as a "peripheral driver circuit" in some cases.

The peripheral driver circuit can be formed with a variety of constituent circuits. Examples of the constituent circuits include a shift register circuit, a flip-flop circuit, a latch circuit, a buffer circuit, an inverter circuit, and a level shifter circuit. Other examples include a multiplexer circuit, a demultiplexer circuit, a source follower circuit, a source-grounded amplifier circuit, a sample-and-hold circuit, and a switch circuit (such as a transmission gate or an analog switch). Other examples include a current-to-voltage converter circuit, an analog-to-digital converter circuit, a digital-to-analog converter circuit, an operational amplifier circuit, a comparator circuit, a pass transistor logic circuit, an encoder circuit, a decoder circuit, and a gate circuit (such as an AND circuit, an OR circuit, or a NOT circuit). Other examples include circuits combining these circuits. Note that these constituent circuits can be formed with, for example, a transistor, a capacitor, and the like.

In one embodiment of the present invention, various transistors can be used as transistors included in the peripheral driver circuit as in the semiconductor device 20A described above. For example, a transistor having the same structure as the transistor included in the pixel 41 can be used as some or all of the transistors included in the peripheral driver circuit. Specifically, for example, an OS transistor having the same structure as the transistor included in the semiconductor device 20A is preferably used. In particular, a vertical OS transistor having the same structure as the transistors M1 and M3 to M6 is preferably used.

The use of vertical OS transistors as some or all of the transistors included in the peripheral driver circuit can reduce the area occupied by a buffer circuit included in the gate driver, for example. Accordingly, the display apparatus can have a narrower bezel, for example. Furthermore, for example, the area occupied by a demultiplexer included in the source driver can be reduced. This leads to the higher resolution and definition of the display apparatus.

Note that, for example, Si transistors may be used as some or all of the transistors included in the peripheral driver circuit. Both OS transistors and Si transistors may be used, for example. A Si transistor has higher operation speed than an OS transistor. The gate of an n-channel transistor and the gate of a p-channel transistor are electrically connected to each other, for example, to form a CMOS circuit (for example, a circuit where the transistors operate complementarily, a CMOS logic gate, or a CMOS logic circuit).

In one embodiment of the present invention, any of a variety of configurations can be employed for modification examples of the display apparatus 40. For example, as illustrated in FIGS. 12C to 12E, a first driver circuit portion 43L and a first driver circuit portion 43R can be arranged to face each other across the display portion 42.

A display apparatus 40B illustrated in FIG. 12C includes m wirings 45L whose potentials are controlled by the circuit included in the first driver circuit portion 43L and m wirings 45R whose potentials are controlled by the circuit included in the first driver circuit portion 43R. The potentials of one wiring 45L and one wiring 45R are supplied to n pixels 41 arranged in the row direction.

For example, in the case where the semiconductor device 20A is used as the pixel 41, one wiring 45L can correspond to the wirings GLa and GLb, GLc and one wiring 45R can correspond to the wiring GLc. In that case, for example, the circuit included in the first driver circuit portion 43L has a function of outputting the potentials supplied to the wirings GLa and GLb and the circuit included in the first driver circuit portion 43R has a function of outputting the potential supplied to the wiring GLc.

A display apparatus 40C illustrated in FIG. 12D includes m wirings 45 whose potentials are controlled by both the circuit included in the first driver circuit portion 43L and the circuit included in the first driver circuit portion 43R. The potential of one wiring 45 is supplied to n pixels 41 arranged in the row direction. Such a configuration reduces substantial loads on the wiring (parasitic capacitance and parasitic resistance) to a quarter of the load on the wiring of the display apparatus 40 illustrated in FIG. 12B. Accordingly, the display apparatus can achieve higher speed, resolution, and definition, a narrower bezel, and a larger screen, for example.

A display apparatus 40D illustrated in FIG. 12E includes m/2 wirings 45L whose potentials are controlled by the circuit included in the first driver circuit portion 43L and m/2 wirings 45R whose potentials are controlled by the circuit included in the first driver circuit portion 43R. The potential of one wiring 45L is supplied to n pixels 41 arranged in odd-numbered rows in the row direction. The potential of one wiring 45R is supplied to n pixels 41 arranged in even-numbered rows in the row direction. Such a configuration can halve the number of stages of the shift register, for example. Accordingly, the display apparatus can achieve higher speed, resolution, and definition, a narrower bezel, and a larger screen, for example.

Although not illustrated, for example, two second driver circuit portions 44 may be arranged to face each other across the display portion 42.

According to one embodiment of the present invention, for example, the display apparatus 40 can employ not only any of a variety of configurations described above but also include a sensor portion provided to overlap with the display portion 42 in a top view. The sensor portion can serve as, for example, a touch sensor, a near touch sensor, or a fingerprint sensor. Such a sensor can be a capacitive touch sensor or an optical touch sensor, for example.

In the display apparatus 40 provided with the sensor portion, the first driver circuit portion 43 (or the first driver circuit portions 43L and 43R) can include a circuit having a function of driving the sensor portion, for example. The second driver circuit portion 44 can include a circuit having a function of outputting a signal detected by the sensor portion to the outside of the display apparatus, for example.

According to one embodiment of the present invention, any of a variety of configurations can be employed for the display apparatus using the semiconductor device 20A, as described above. Specific configuration examples of the constituent circuit that can be used for peripheral driver circuit (for example, the gate driver and the source driver) in the display apparatus are described later.

<Driving Example of Display Apparatus>

Next, an operation of the display apparatus 40 is described.

Figure 13:
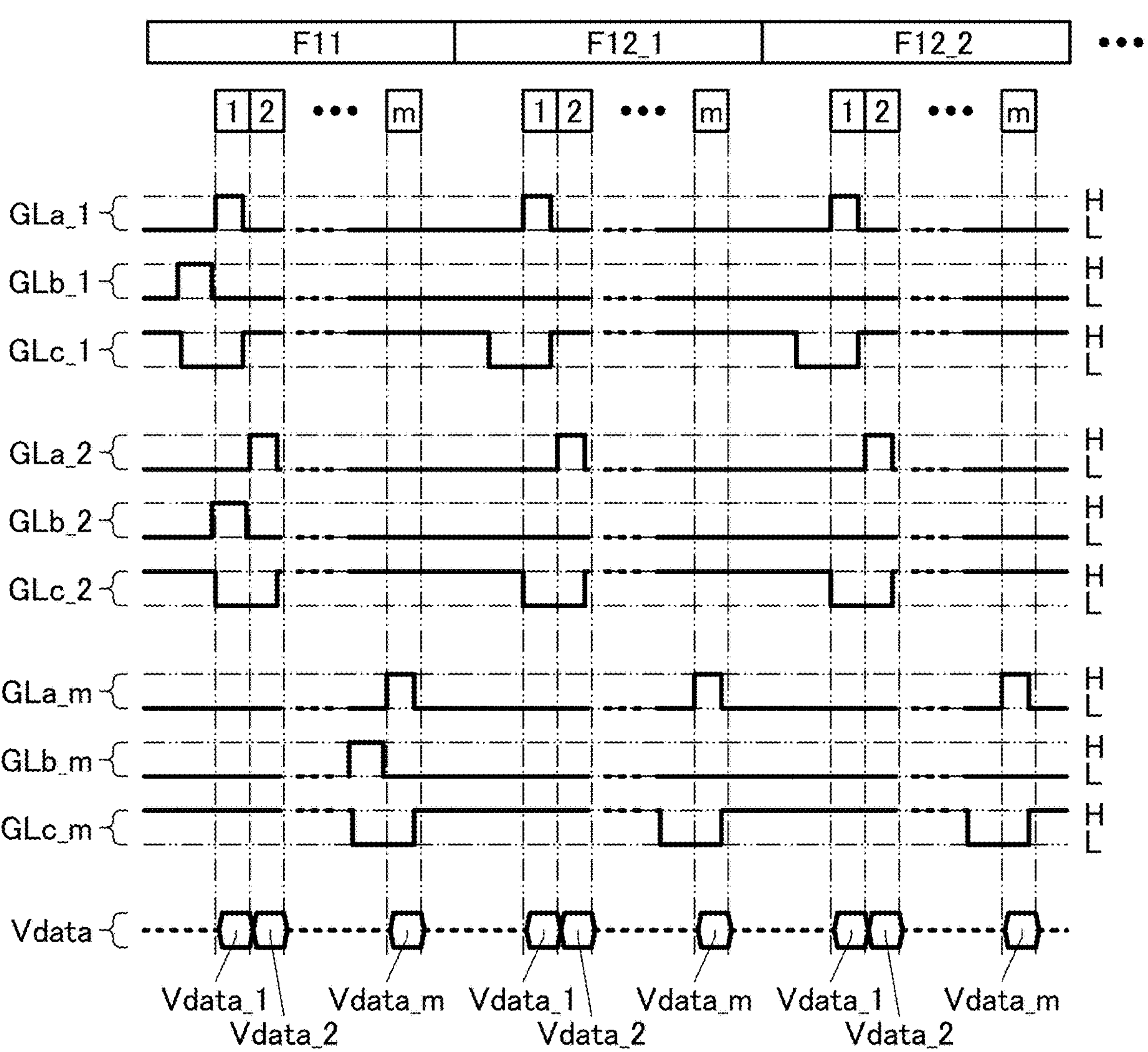
FIG. 13 is a timing chart showing a driving example of a display apparatus.

FIG. 13 is a timing chart showing a driving example of the display apparatus 40 using the above-described semiconductor device 20A as the pixel 41.

In the display apparatus, the semiconductor devices 20A in m rows are electrically connected to one wiring DL. In the case of driving of the display apparatus, for example, in one frame period, the semiconductor devices 20A in m rows are selected sequentially at least row by row and the semiconductor device 20A selected is subjected to the $V_{th}$ correction operation, data writing operation, and light emission operation described above. In the display apparatus, such an operation in one frame enables image display. When the frames are executed successively, moving image display is performed.

In the following description of the operation, the semiconductor device 20A in the u-th row is referred to as a semiconductor device 20A_*u* in some cases (u is an integer greater than or equal to 1 and less than or equal to m). The transistor M1 to the transistor M6 included in the semiconductor device 20A_*u* are referred to as a transistor M1_*u* to a transistor M6_*u*, respectively, in some cases. The capacitor C1 and the capacitor C2 included in the semiconductor device 20A_*u* are referred to as a capacitor C1_*u* and a capacitor C2_*u*, respectively, in some cases. The wiring GLa, the wiring GLb, and the wiring GLc electrically connected to the semiconductor device 20A_*u* are referred to as a wiring GLa_u, a wiring GLb_u, and a wiring GLc_u, respectively, in some cases. The node ND1 to the node ND3 included in the semiconductor device 20A_*u* are referred to as a node ND1_*u* to a node ND3_*u*, respectively, in some cases. The light-emitting element 32 included in the semiconductor device 20A_*u* is referred to as a light-emitting element 32_*u* in some cases. The data potential Vdata supplied to the semiconductor device 20A_*u* is referred to as a data potential Vdata_u in some cases. The correction voltage Vb with which the threshold voltage of the transistor M2_*u* can be regarded as 0 V is referred to as a correction voltage Vb_u in some cases.

In FIG. 13, "F11," "F12_1," and "F12_2" denote frames. Thus, the operation in Frame F11, the operation in Frame F12_1, and the operation in Frame F12_2 are performed in this order. In addition, "1," "2," and "m" for each frame represent periods (also referred to as row selection periods or horizontal periods) in which the semiconductor device 20A_1, the semiconductor device 20A_2, and the semiconductor device 20A_m are selected, respectively. Note that FIG. 13 does not show the operations of the semiconductor devices 20A_3 to 20A_*m*−1.

In the following description of the operation, in an initial state, the potentials of the wirings GLa_1 to GLa_m are each the potential L, the potentials of the wirings GLb_1 to GLb_m are each the potential L, and the potentials of the wirings GLc_1 to GLc_m are each the potential H.

In Frame F11, the semiconductor devices 20A in m rows are selected sequentially row by row and the semiconductor device 20A selected is subjected to the $V_{th}$ correction operation, the data writing operation, and the light emission operation. In this specification and the like, the frame in which these operations are performed is referred to as "frame with correction."

In the frame with correction, first, the potential H is supplied to the wiring GLb_1 (corresponding to Period T11 in FIG. 2). Next, the potential L is supplied to the wiring GLc_1, whereby the correction voltage Vb_1 for correction of the threshold voltage of the transistor M2_1 is obtained (corresponding to Period T12 in FIG. 2). Next, the potential L is supplied to the wiring GLb_1, whereby the correction voltage Vb_1 is retained in the capacitor C2_1 (corresponding to Period T13 in FIG. 2). Next, the potential H is supplied to the wiring GLa_1, whereby the data potential Vdata_1 is written to the transistor M2_1 (corresponding to Period T14 in FIG. 2). Then, the potential L is supplied to the wiring GLa_1 and the potential H is supplied to the wiring GLc_1, whereby the light-emitting element 32_1 emits light with emission intensity corresponding to the data potential Vdata_1 (corresponding to Periods T15 and T16 in FIG. 2).

Here, at the timing when the potential L is supplied to the wiring GLb_1, the potential H is supplied to the wiring GLb_2 (corresponding to Period T11 in FIG. 2). Next, the potential L is supplied to the wiring GLc_2, whereby the correction voltage Vb_2 for correction of the threshold voltage of the transistor M2_2 is obtained (corresponding to Period T12 in FIG. 2). Next, the potential L is supplied to the wiring GLb_2, whereby the correction voltage Vb_2 is retained in the capacitor C2_2 (corresponding to Period T13 in FIG. 2). Next, after the potential L is supplied to the wiring GLa_1, the potential H is supplied to the wiring GLa_2, whereby the data potential Vdata_2 is written to the transistor M2_2 (corresponding to Period T14 in FIG. 2). Then, the potential L is supplied to the wiring GLa_2 and the potential H is supplied to the wiring GLc_2, whereby the light-emitting element 32_2 emits light with emission intensity corresponding to the data potential Vdata_2 (corresponding to Periods T15 and T16 in FIG. 2).

Through such operations are repeated for m rows, the correction voltages Vb_1 to Vb_m for correction of the threshold voltages of the transistors M2_1 to M2_*m* are retained in the capacitors C2_1 to C2_*m*, respectively, and the light-emitting elements 32_1 to 32_*m* emit light with emission intensity based on the data potentials Vdata_1 to Vdata_m, respectively.

In Frames F12_1 and F12_2, the semiconductor devices 20A in m rows are selected sequentially row by row and the semiconductor device 20A selected is subjected to the data writing operation and the light emission operation. In this specification and the like, the frame in which these operations are performed is referred to as "frame without correction."

In the frame without correction, no $V_{th}$ correction operation is performed. Thus, the potentials of the wirings GLb_1 to GLb_m are each kept as the potential L. Accordingly, the correction voltages Vb_1 to Vb_m for correction of the threshold voltages of the transistors M2_1 to M2_*m* are retained in the capacitors C2_1 to C2_*m*, respectively. In other words, the state in which correction is performed such that the threshold voltages of the transistors M2_1 to M2_*m* each become 0 V is maintained.

Accordingly, the operation in the frame without correction is similar to that in the frame with correction except that the potentials of the wirings GLb_1 to GLb_*m* are each kept as the potential L.

In the driving example shown in FIG. 13, Frame F11 as the frame with correction, F12_1 as the frame without correction, and Frame F12_2 as the frame without correction are executed in this order after the display apparatus is started. Although not illustrated, one or more frame without corrections may be executed after Frame F12_2.

The frame with correction may be executed when necessary. For example, the frame with correction may be executed at every given time. The given time is, for example, 0.1 second or longer (i.e., 10 Hz or low), preferably 1 second or longer (i.e., 1 Hz or low), further preferably 10 seconds or longer (i.e., 0.1 Hz or low), still further preferably 100 seconds or longer (i.e., 0.01 Hz or low). For example, 10 minutes or longer, one hour or longer, or one day or longer is possible. For example, the frame with correction may be executed for a given number of times. The given number of times are, for example, twice or more, preferably 10 times or more, further preferably 60 times or more, still further preferably 600 times or more.

According to one embodiment of the present invention, in the display apparatus 40, the use of the OS transistor that features an extremely low off-state current enables the state of correction by the frame with correction to be maintained for a long period even when the frames without correction are repeatedly executed as described above. Accordingly, the execution frequency of the frame with correction can be lower than that of the frame without correction.

In other words, the frequency of the $V_{th}$ correction operation can be lower than that of the data writing operation in the semiconductor device 20A. It can also be said that the frequency of turning on the transistors M3 and M4 can be lower than that of turning on the transistors M1 and M6. It can also be said that the frequency of supplying the potential H to the wiring GLb can be lower than that of supplying the potential H to the wiring GLa.

Thus, in the display apparatus 40, the frame without correction can be executed at an increased frequency to extend the period during which the potential supplied to the wiring GLb is kept as the potential L. Thus, the power consumption of the peripheral driver circuit can be reduced. Consequently, power consumption of the display apparatus can be reduced.

Since the period during which the potential supplied to the wiring GLb is kept as the potential L can be extended, for example, it is possible to reduce the influence of noise on the sensor portion that is provided to overlap with the display portion 42 as described above.

One embodiment of the present invention is not limited to the aforementioned operation example of the display apparatus.

Figure 14:
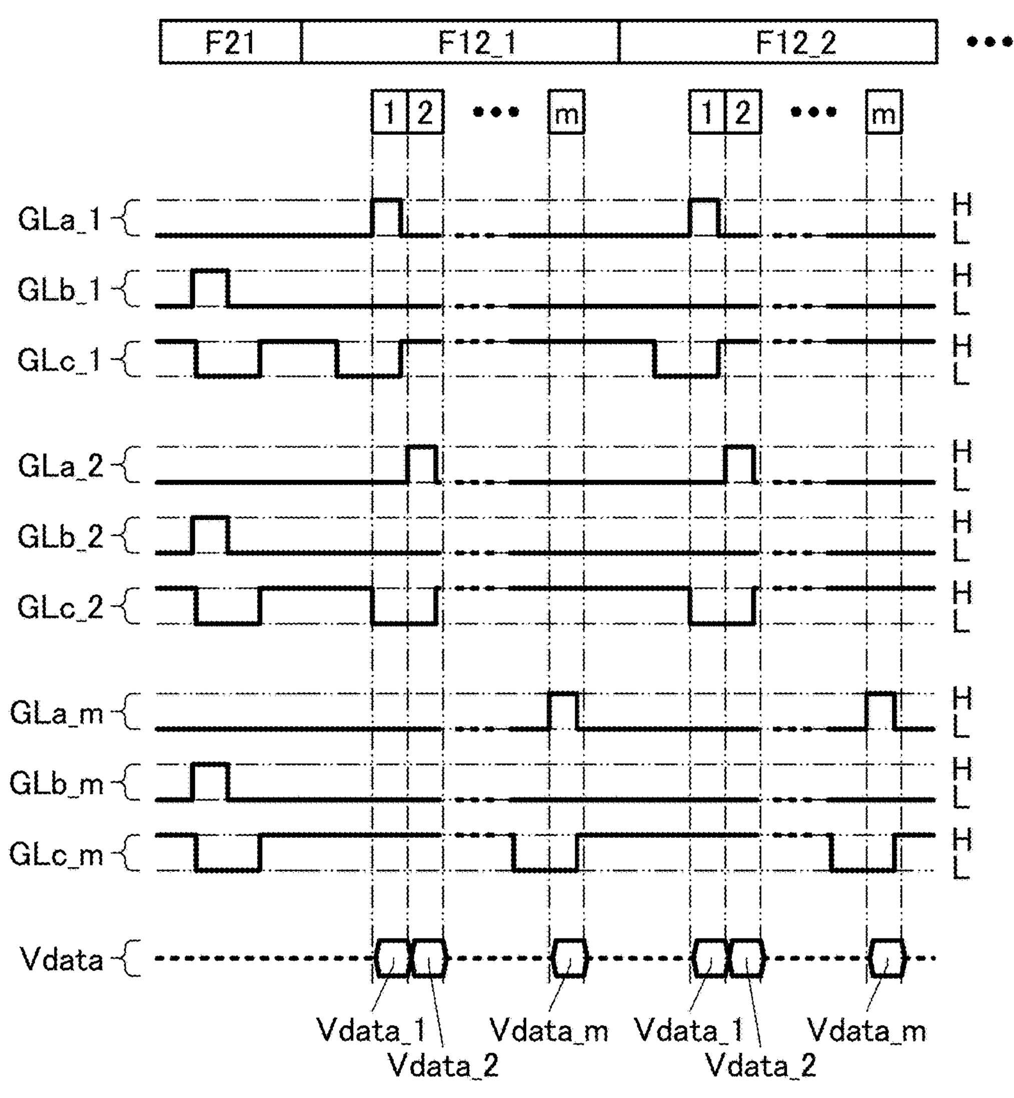
FIG. 14 is a timing chart showing a driving example of a display apparatus.

FIG. 14 is a timing chart showing a modification example of the frame with correction, in which Frame F21 replaces Frame F11 of FIG. 13. In Frame F21, the potentials of the wirings GLa_1 to GLa_m are each kept as the potential L. In other words, the data writing operation and the light emission operation are not performed and only the $V_{th}$ correction operation is performed. In Frame F21, $V_{th}$ correction operations for m rows are performed at the same timing. Frame F21 is executed after the display apparatus is started, for example.

Figure 15:
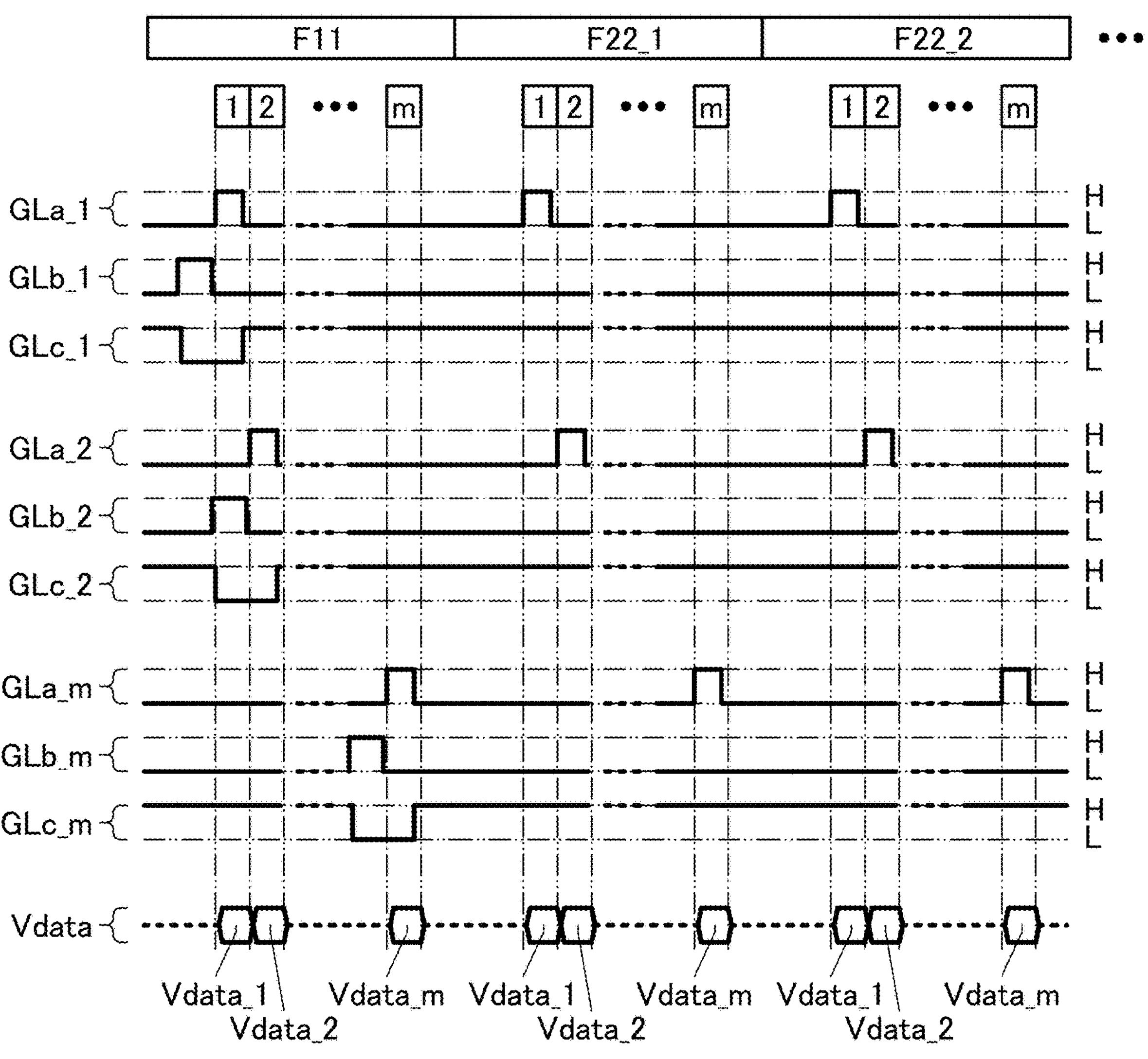
FIG. 15 is a timing chart showing a driving example of a display apparatus.

FIG. 15 is a timing chart showing a modification example of the frame without correction. Frame F22_1 and Frame F22_2 in FIG. 15 replace Frame F12_1 and Frame F12_2 in FIG. 13, respectively. In each of Frames F12_1 and F12_2, the potentials of the wirings GLc_1 to GLc_m are each kept as the potential H. Thus, the power consumption of the peripheral driver circuit can be reduced. Consequently, power consumption of the display apparatus can be reduced.

<Configuration Examples for Peripheral Driver Circuit>

Next, configuration examples of the constituent circuits that can be used for the peripheral driver circuit included in the display apparatus 40 are described.

[Shift Register]

FIGS. 16A to 16E and FIGS. 17A to 17E are circuit diagrams showing configuration examples of the semiconductor devices that can be used for the peripheral driver circuit. The semiconductor device can be used as a part of the gate driver or as a part of a shift register, for example.

A semiconductor device 70A illustrated in FIG. 16A includes m register portions 71 and m buffer portions 72. The semiconductor device 70A is electrically connected to m wirings GLa and m wirings GLb. The m register portions 71 are electrically connected to each other through m wirings SR. FIG. 16A illustrates a register portion 71_*u* to a register portion 71_*u*+2, a buffer portion 72_*u* to a buffer portion 72_*u*+2, a wiring SR_u−1 to a wiring SR_u+4, a wiring GLa_u to a wiring GLa_u+2, and a wiring GLb_u to a wiring GLb_u+2, which are components of the semiconductor device 70A. Note that m is an integer greater than or equal to 2 and corresponds to the number m of rows of the pixels 41 arranged in a matrix in the display apparatus 40 described above. In addition, u is an integer greater than or equal to 1 and less than or equal to m.

FIG. 16B is a circuit diagram illustrating a configuration example of the register portion 71 and the buffer portion 72. FIG. 16C illustrates a circuit block corresponding to the register portion 71 and the buffer portion 72. The register portion 71 can be used as each of a register portions 71_1 to a register portion 71_*m*. The buffer portion 72 can be used as each of a buffer portion 72_1 to a buffer portion 72_*m*. Thus, for example, in the register portion 71_*u*, a wiring IN21 is electrically connected to a wiring SR_u−1, a wiring IN22 is electrically connected to a wiring SR_u+2, and a wiring OUT21 is electrically connected to a wiring SR_u. For example, in the buffer portion 72_*u*, a wiring OUT31 is electrically connected to a wiring GLa_u and a wiring OUT32 is electrically connected to a wiring GLb_u. Note that the wirings IN21, IN31, IN32, VLD, and VLS are not illustrated in FIGS. 16A and 16C. The same applies to the register portion 71_1 to a register portion 71_*u*−1 and a register portion 71_*u*+1 to a register portion 71_*m*. The same applies to the buffer portion 72_1 to a buffer portion 72_*u*−1 and a buffer portion 72_*u*+1 to a buffer portion 72_*m*.

Specifically, in the semiconductor device 70A, the wiring OUT21 in the register portion 71_*u*−1 is electrically connected to the wiring IN21 in the register portion 71_*u* through the wiring SR_*u*−1, and the wiring OUT21 in the register portion 71_*u* is electrically connected to the wiring IN21 in the register portion 71_*u*+1 through the wiring SR_u. In such a configuration, the register portions 71_1 to 71_*m* are selected sequentially, and a desired potential can be supplied to each of the wirings GLa_u and GLb_u in the buffer portion 72_*u* electrically connected to the register portion 71_*u* selected. Note that the potential of the wiring VLS is supplied to each of the wirings GLa_u and GLb_u in the buffer portion 72_*u* electrically connected to the register portion 71_*u* that is not selected, in the semiconductor device 70A.

The register portion 71 illustrated in FIG. 16B includes a transistor M21, a transistor M22, a transistor M23, a transistor M24, a transistor M25, and a transistor M26. The transistor M21 has a function of establishing or breaking electrical continuity between the wiring VLD and a wiring NL21 in accordance with the potential of the wiring IN21. The transistor M22 has a function of establishing or breaking electrical continuity between the wiring VLD and a wiring NL22 in accordance with the potential of the wiring IN22. The transistor M23 has a function of establishing or breaking electrical continuity between the wiring VLS and the wiring NL21 in accordance with the potential of the wiring NL22. The transistor M24 has a function of establishing or breaking electrical continuity between the wiring VLS and the wiring NL22 in accordance with the potential of a wiring IN21. The transistor M25 has a function of establishing or breaking electrical continuity between the wiring IN23 and the wiring OUT21 in accordance with the potential the wiring NL21. The transistor M26 has a function of establishing or breaking electrical continuity between the wiring VLS and the wiring OUT21 in accordance with the potential of the wiring NL22.

The buffer portion 72 illustrated in FIG. 16B includes a transistor M31, a transistor M32, a transistor M33, and a transistor M34. The transistor M31 has a function of establishing or breaking electrical continuity between the wiring IN31 and the wiring OUT31 in accordance with the potential the wiring NL21. The transistor M32 has a function of establishing or breaking electrical continuity between the wiring IN32 and the wiring OUT32 in accordance with the potential the wiring NL21. The transistor M33 has a function of establishing or breaking electrical continuity between the wiring VLS and the wiring OUT31 in accordance with the potential the wiring NL22. The transistor M34 has a function of establishing or breaking electrical continuity between the wiring VLS and the wiring OUT32 in accordance with the potential of the wiring NL22.

FIG. 16D is a timing chart showing an operation example of the register portion 71 and the buffer portion 72 illustrated in FIG. 16B.

In the following description of the operation, the potential H is supplied to the wiring VLD and the potential L is supplied to the wiring VLS. The potential H or the potential L is supplied to each of the wirings IN21, IN22, IN23, IN31, and IN32.

The timing chart in FIG. 16D shows the potentials (H and L) supplied to the wirings IN21, IN22, IN23, IN31, and IN32 in the operation periods (Periods T71 to T73). In addition, changes in the potentials of the wirings NL21, NL22, OUT21, OUT31, and OUT32 are shown.

In Period T71, the potential L is supplied to the wirings IN21 and IN22. The potential of the wiring NL22 is the potential H. Accordingly, the potential L is supplied to the wiring NL21. Thus, the transistors M25, M31, and M32 are each turned off (brought into a non-conduction state) and the transistors M26, M33, and M34 are each turned on (brought into a conduction state). Accordingly, the potential L is supplied to each of the wirings OUT21, OUT31, and OUT32 regardless of the potential (H or L) of each of the wirings IN23, IN31, and IN32. Note that in the following description of the operation, unless otherwise specified, the potentials of the wirings supplied in the immediately preceding period are held.

In Period T72, the potential H is supplied to the wiring IN21, and accordingly, the potential of the wiring NL22 is changed to the potential L and the potential of the wiring NL21 is changed to the potential H. Thus, the transistors M25, M31, and M32 are each turned on and the transistors M26, M33, and M34 are each turned off. Accordingly, the potentials (H or L) of the wirings IN23, IN31, and IN32 are supplied to the wirings OUT21, OUT31, and OUT32 through the transistors M25, M31, and M32, respectively. After that, even if the potential L is supplied to the wiring IN21, the potentials of the wirings NL22 and NL21 are maintained.

In Period T73, the potential H is supplied to the wiring IN22, and accordingly, the potential of the wiring NL22 is changed to the potential H and the potential of the wiring NL21 is changed to the potential L. Thus, the transistors M25, M31, and M32 are each turned off and the transistors M26, M33, and M34 are each turned on. Accordingly, the potential L is supplied to each of the wirings OUT21, OUT31, and OUT32 regardless of the potential (H or L) of each of the wirings IN23, IN31, and IN32. After that, even if the potential L is supplied to the wiring IN22, the potentials of the wirings NL22 and NL21 are maintained.

FIG. 16E is a circuit diagram illustrating a modification example of the register portion 71 and the buffer portion 72. A register portion 71*a* and a buffer portion 72*a* illustrated in FIG. 16E are different from the register portion 71 and the buffer portion 72 in including bootstrap circuits. Specifically, the register portion 71*a* includes a transistor M27 and a capacitor C21 in addition to the register portion 71 while the buffer portion 72*a* includes a transistor M35, a transistor M36, a capacitor C31, and a capacitor C32 in addition to the buffer portion 72. Note that the capacitors C21, C31, and C32 are referred to as bootstrap capacitors in some cases.

A gate of the transistor M27 is electrically connected to the wiring VLD. A gate of the transistor M25 is electrically connected to the wiring NL21 through a source and a drain of the transistor M27. The gate of the transistor M25 is also electrically connected to the wiring OUT21 through the capacitor C21.

A gate of the transistor M35 is electrically connected to the wiring VLD. A gate of the transistor M31 is electrically connected to the wiring NL21 through a source and a drain of the transistor M35. The gate of the transistor M31 is also electrically connected to the wiring OUT31 through the capacitor C31.

A gate of the transistor M36 is electrically connected to the wiring VLD. A gate of the transistor M32 is electrically connected to the wiring NL21 through a source and a drain of the transistor M36. The gate of the transistor M32 is also electrically connected to the wiring OUT32 through the capacitor C32.

In the register portion 71, transmission of the potential H from the wiring IN23 to the wiring OUT21 causes a potential decrease depending on the threshold voltage in the transistor M25. Hence with the use of the bootstrap circuit like the register portion 71*a*, capacitive coupling between the bootstrap capacitors can maintain the on state in the transistor M25. In this manner, the potential H can be transmitted to the wiring OUT21 without causing the potential decrease depending on the threshold voltage.

In the buffer portion 72, similarly, transmission of the potential H from the wiring IN31 to the wiring OUT31 causes a potential decrease depending on the threshold voltage in the transistor M31 and transmission of the potential H from the wiring IN32 to the wiring OUT32 causes a potential decrease depending on the threshold voltage in the transistor M32. Hence with the use of the bootstrap circuit like the buffer portion 72*a*, capacitive coupling between the bootstrap capacitors can maintain the on state in each of the transistors M31 and M32. In this manner, the potential H can be transmitted to each of the wirings OUT31 and OUT32 without causing the potential decrease depending on the threshold voltage.

A semiconductor device 70B illustrated in FIG. 17A includes m register portions 71 and m buffer inverter portions 73. The semiconductor device 70B is electrically connected to m wirings GLc and m wirings SR. The m register portions 71 are electrically connected to each other through m wirings SR. FIG. 17A illustrates the register portions 71_*u* to 71_*u*+2, an inverter portion 73_*u* to a an inverter portion 73_*u*+2, the wirings SR_*u*−1 to SR_*u*+4, and a wiring GLc_u to a wiring GLc_u+2, which are components of the semiconductor device 70B.

FIG. 17B is a circuit diagram showing a configuration example of the inverter portion 73. FIG. 17C is a circuit block corresponding to the inverter portion 73. The inverter portion 73 can be employed as each of an inverter portion 73_1 to an inverter portion 73_*m*. Thus, for example, in the inverter portion 73_*u*, a wiring IN41 is electrically connected to the wiring SR_u, a wiring IN42 is electrically connected to the wiring SR_u+2, and a wiring OUT41 is electrically connected to the wiring GLc_u. Note that in FIGS. 17A and 17C, the wirings VLD and VLS are not illustrated. The same applies to the inverter portion 73_1 to an inverter portion 73_*u*−1 and an inverter portion 73_*u*+1 to the inverter portion 73_*m*.

Thus, in the semiconductor device 70B, the register portions 71_1 to 71_*m* are selected sequentially, and a desired potential can be supplied to the wiring GLc_u in the inverter portion 73_*u* electrically connected to the register portion 71_*u* selected, as in the semiconductor device 70A. Note that the potential of the wiring VLD is supplied to the wiring GLc_u in the inverter portion 73_*u* electrically connected to the register portion 71_*u* that is not selected, in the semiconductor device 70B.

The inverter portion 73 illustrated in FIG. 17B includes a transistor M41, a transistor M42, a transistor M43, and a transistor M44. The transistor M41 has a function of establishing or breaking electrical continuity between the wiring VLD and the wiring NL41 in accordance with the potential the wiring IN42. The transistor M42 has a function of establishing or breaking electrical continuity between the wiring VLS and the wiring NL41 in accordance with the potential the wiring IN41. The transistor M43 has a function of establishing or breaking electrical continuity between the wiring VLD and the wiring OUT41 in accordance with the potential the wiring NL41. The transistor M44 has a function of establishing or breaking electrical continuity between the wiring VLS and the wiring OUT41 in accordance with the potential of the wiring IN41.

FIG. 17D is a timing chart showing an operation example of the inverter portion 73 illustrated in FIG. 17B.

In the following description of the operation, the potential H is supplied to the wiring VLD and the potential L is supplied to the wiring VLS. The potential H or the potential L is supplied to each of the wirings IN41 and IN42.

The timing chart in FIG. 17D shows the potentials (H and L) supplied to the wirings IN41 and IN42 in the operation periods (Periods T74 to T76). In addition, changes in the potentials of the wirings NL41 and OUT41 are shown.

In Period T74, the potential L is supplied to the wirings IN41 and IN42. The potential of the wiring NL41 is the potential H. Consequently, the transistor M43 is in an on state (a conduction state) and the transistor M44 is in an off state (a non-conduction state). This allows the potential H to be supplied to the wiring OUT41. Note that in the following description of the operation, unless otherwise specified, the potentials of the wirings in the immediately preceding period are held.

In Period T75, the potential H is supplied to the wiring IN41, and accordingly the potential of the wiring NL41 is changed to the potential L. Then, the transistor M43 is turned off, and the transistor M44 is turned on. This allows the potential L to be supplied to the wiring OUT41. After that, the potential L is supplied to the wiring IN41 to turn off the transistor M44. At this time, the potentials of the wirings NL41 and OUT41 are maintained.

In Period T76, the potential H is supplied to the wiring IN42, and accordingly the potential of the wiring NL41 is changed to the potential H. Consequently, the transistor M43 is turned on. This allows the potential H to be supplied to the wiring OUT41. After that, even if the potential L is supplied to the wiring IN42, the potentials of the wirings NL41 and OUT41 are maintained.

FIG. 17E is a circuit diagram illustrating a modification example of the inverter portion 73. An inverter portion 73*a* illustrated in FIG. 17E is different from the inverter portion 73 in including a bootstrap circuit. Specifically, the inverter portion 73*a* includes a transistor M45 and a capacitor C41 in addition to the inverter portion 73. Note that the capacitor C41 is referred to as a bootstrap capacitor in some cases.

A gate of the transistor M45 is electrically connected to the wiring VLD. A gate of the transistor M43 is electrically connected to the wiring NL41 through a source and a drain of the transistor M45. The gate of the transistor M43 is also electrically connected to the wiring OUT41 through the capacitor C41.

In the inverter portion 73, transmission of the potential H from the wiring VLD to the wiring OUT41 causes a potential decrease depending on the threshold voltage in the transistor M43. Hence with the use of the bootstrap circuit like the inverter portion 73*a*, capacitive coupling between the bootstrap capacitor can maintain the on state in the transistor M43. In this manner, the potential H can be transmitted to the wiring OUT41 without causing the potential decrease depending on the threshold voltage.

According to one embodiment of the present invention, the semiconductor devices 70A and 70B can be used in the display apparatus 40. For example, the semiconductor devices 70A and 70B can be used as a part of the gate driver in the display apparatus 40. In that case, the wirings GLa_1 to GLa_m correspond to the wirings GLa in the pixels 41 that are arranged in the m rows and each employ the semiconductor device 20A. Similarly, the wirings GLb_1 to GLb_m correspond to the wirings GLb and the wirings GLc_1 to GLc_m correspond to the wirings GLc.

The above-described driving illustrated in FIG. 13, FIG. 14, and FIG. 15 can be achieved with the use of the semiconductor devices 70A and 70B in the display apparatus 40. Specifically, in the semiconductor device 70A, the frequency of supplying the potential H to the wirings GLb_1 to GLb_m can be lower than that of supplying the potential H to the wirings GLa_1 to GLa_m. In other words, the semiconductor device 70A has a function of outputting the potential H to the wirings GLb_1 to GLb_m less frequently than it outputs the potential H to the wirings GLa_1 to GLa_m. Consequently, power consumption of the display apparatus can be reduced.

According to one embodiment of the present invention, there is no limitation on the structures of the semiconductor devices 70A and 70B described above, and any structural modification is feasible as long as the operation of the display apparatus described above is achieved.

[Demultiplexer]

FIG. 18A to FIG. 18C are circuit diagrams showing a configuration example of the semiconductor device that can be used for the peripheral driver circuit. The semiconductor device can be used as a part of the source driver or as a part of a demultiplexer, for example.

A semiconductor device 80 illustrated in FIG. 18A includes n/2 selector portion(s) 81. The semiconductor device 80 is electrically connected to a wiring SMP1, a wiring SMP2, n/2 wiring(s) SL, and the n wirings DL. FIG. 18 illustrates a selector portion 81_1, a selector portion 812, a selector portion 81_*n*/2, the wirings SMP1 and SMP2, a wiring SL_1, a wiring SL_2, a wiring SL_n/2, a wiring DL_1 to a wiring DL_4, a wiring DL_n−1, and a wiring DL_n, which are components of the semiconductor device 80. Note that n is an integer greater than or equal to 2 and corresponds to the number n of columns of the pixels 41 arranged in a matrix in the display apparatus 40 described above.

FIGS. 18B and 18C are a circuit diagram and a block diagram, respectively, illustrating a configuration example of the selector portion 81. The selector portion 81 can be employed for each of the selector portion 81_1 to the selector portion 81_*n*/2. Thus, for example, in the selector portion 81_1, a wiring IN51 is electrically connected to the wiring SL_1, a wiring SW51 is electrically connected to the wiring SMP1, a wiring SW52 is electrically connected to the wiring SMP2, a wiring OUT51 is electrically connected to the wiring DL_1, and a wiring OUT52 is electrically connected to the wiring DL_2. For example, in the selector portion 81_*n*/2, the wiring IN51 is electrically connected to the wiring SL_n/2, the wiring SW51 is electrically connected to the wiring SMP1, the wiring SW52 is electrically connected to the wiring SMP2, the wiring OUT51 is electrically connected to the wiring DL_n−1, and the wiring OUT52 is electrically connected to the wiring DL_n. Note that the same applies to the selector portion 81_2 to the selector portion 81_*n*/2−1.

The selector portion 81 illustrated in FIG. 18B includes a transistor M51 and a transistor M52. The transistor M51 has a function of establishing or breaking electrical continuity between the wiring IN51 and the wiring OUT51 in accordance with the potential the wiring SW51. The transistor M52 has a function of establishing or breaking electrical continuity between the wiring IN51 and the wiring OUT52 in accordance with the potential the wiring SW52.

Thus, the selector portion 81 has a function of transmitting the potential of the wiring IN51 to any one of the wirings OUT51 and OUT52 in accordance with the potentials of the wirings SW51 and SW52. In other words, the selector portion 81 includes one input (wiring IN51) and two outputs (wirings OUT51 and OUT52).

According to one embodiment of the present invention, the semiconductor device 80 can be used in the display apparatus 40. For example, the semiconductor device 80 can be used as a part of the source driver in the display apparatus 40. In that case, the wirings DL_1 to DL_n correspond to the wirings DL in the pixels 41 that are arranged in the n columns and each employ the semiconductor device 20A.

With the use of the semiconductor device 80 in the display apparatus 40, a source driver IC with outputs fewer than n, which is the number of the columns of the pixels 41, can be used. For example, the source driver IC with n/2 outputs is used for the semiconductor device 80 described above. This leads to, for example, the reduced size and cost of the display apparatus. It can be said that it is possible to drive a display apparatus in which the number of the columns of the pixels is larger than the number of outputs of the source driver IC. Consequently, for example, the definition of the display apparatus can be increased.

The selector portion 81 in the semiconductor device 80 includes two outputs here but may three or more outputs. For example, the structure with three outputs permits the use of a source driver IC with n/3 outputs.

[Series Connection of Transistors]

Figures 19A, 19B, 19C:
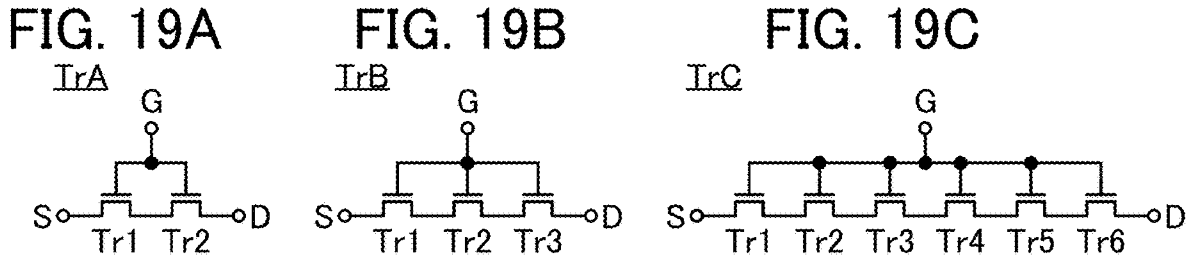
FIGS. 19A to 19C are circuit diagrams each showing a configuration example of a semiconductor device.

FIGS. 19A to 19C are circuit diagrams illustrating series connection of transistors.

In one embodiment of the present invention, the transistors included in the pixel circuit and the peripheral driver circuit may each be a single-gate transistor having one gate between a source and a drain, or a double-gate transistor. FIG. 19A illustrates a circuit symbol example of a double-gate transistor TrA.

The transistor TrA has a structure in which a transistor Tr and a transistor Tr2 are connected in series. In the transistor TrA in FIG. 19A, one of a source and a drain of the transistor Tr is electrically connected to a terminal S. The other of the source and the drain of the transistor Tr is electrically connected to one of a source and a drain of the transistor Tr2. The other of the source and the drain of the transistor Tr2 is electrically connected to a terminal D. In the transistor TrA in FIG. 19A, gates of the transistors Tr and Tr2 are electrically connected to each other and electrically connected to a terminal G.

The transistor TrA illustrated in FIG. 19A has a function of switching electrical continuity and discontinuity between the terminal S and the terminal D by changing the potential of the terminal G. Thus, the transistor TrA that is a double-gate transistor serves as one transistor including the transistor Tr and the transistor Tr2. That is, it can be said that in FIG. 19A, one of a source and a drain of the transistor TrA is electrically connected to the terminal S, the other of the source and the drain of the transistor TrA is electrically connected to the terminal D, and a gate of the transistor TrA is electrically connected to the terminal G.

The transistors included in the pixel circuit and the peripheral driver circuit may each be a triple-gate transistor. FIG. 19B illustrates a circuit symbol example of a triple-gate transistor TrB.

The transistor TrB has a structure in which the transistor Tr1, the transistor Tr2, and a transistor Tr3 are connected in series. In the transistor TrB in FIG. 19B, one of a source and a drain of the transistor Tr is electrically connected to a terminal S. The other of the source and the drain of the transistor Tr is electrically connected to one of a source and a drain of the transistor Tr2. The other of the source and the drain of the transistor Tr2 is electrically connected to one of a source and a drain of the transistor Tr3. The other of the source and the drain of the transistor Tr3 is electrically connected to the terminal D. In the transistor TrB in FIG. 19B, gates of the transistors Tr1, Tr2, and Tr3 are electrically connected to each other and electrically connected to the terminal G.

The transistor TrB illustrated in FIG. 19B has a function of switching electrical continuity and discontinuity between the terminal S and the terminal D by changing the potential of the terminal G. Thus, the transistor TrB that is a triple-gate transistor serves as one transistor including the transistors Tr1, Tr2, and Tr3. That is, it can be said that in FIG. 19B, one of a source and a drain of the transistor TrB is electrically connected to the terminal S, the other of the source and the drain of the transistor TrB is electrically connected to the terminal D, and a gate of the transistor TrB is electrically connected to the terminal G.

The transistors included in the pixel circuit and the peripheral driver circuit may each have a structure in which four or more transistors are connected in series. A transistor TrC illustrated in FIG. 19C is in a state in which six transistors (the transistor Tr to a transistor Tr6) are connected in series. In the transistor TrC in FIG. 19C, gates of the six transistors are electrically connected to each other and electrically connected to the terminal G.

The transistor TrC illustrated in FIG. 19C has a function of switching electrical continuity and discontinuity between the terminal S and the terminal D by changing the potential of the terminal G. Thus, the transistor TrC serves as one transistor including the transistors Tr to Tr6. That is, it can be said that in FIG. 19C, one of a source and a drain of the transistor TrC is electrically connected to the terminal S, the other of the source and the drain of the transistor TrC is electrically connected to the terminal D, and a gate of the transistor TrC is electrically connected to the terminal G.

Like the transistors TrA, TrB, and TrC, a transistor including a plurality of gates electrically connected to each other is referred to as a "multi-gate type transistor" or a "multi-gate transistor" in some cases.

According to one embodiment of the present invention, the use of any of the multi-gate transistors achieves a transistor having a substantially long channel length. This leads to lower off-state current and higher drain breakdown voltage (i.e., higher reliability). Furthermore, such a transistor can have the characteristics in which a change in drain current with respect to drain voltage is small in the saturation region (favorable saturation). The use of such a transistor having favorable saturation can offer, for example, an ideal current source circuit, an active load having an extremely high resistance, or the like. Accordingly, a differential circuit, a current mirror circuit, or the like having excellent properties can be obtained, for example.

In one embodiment of the present invention, a vertical OS transistor can be used as the transistor included in any of various constituent circuits described above. The use of vertical OS transistors as some or all of the transistors included in the constituent circuits can reduce the area occupied by the circuits. This leads to the narrower bezel, higher resolution, and higher definition of the display apparatus, for example.

The semiconductor device and the display apparatus according to one embodiment of the present invention are not limited to those described in this embodiment. At least part of the structure example and operation example exemplified in this embodiment, the corresponding drawings, and the like can be implemented in appropriate combination with other structure examples, other operation examples, other drawings, other embodiments, and the like described in this specification and the like.

Embodiment 2

In this embodiment, the semiconductor device of one embodiment of the present invention is described with reference to FIGS. 20A to 20C, FIGS. 21A and 21B, FIGS. 22A to 22C, FIGS. 23A and 23B, FIGS. 24A to 24C, FIG. 25, FIGS. 26A to 26C, and FIG. 27.

One embodiment of the present invention is a semiconductor device including a transistor and a first insulating layer.

The transistor includes a first conductive layer, a second conductive layer including a region overlapping with the first conductive layer with a first insulating layer therebetween, a semiconductor layer, a gate insulating layer, and a gate electrode. The second conductive layer includes a first opening in the region overlapping with the first conductive layer. The first insulating layer includes a second opening reaching the first conductive layer, in the region overlapping with the first opening. The semiconductor layer is in contact with an upper surface of the first conductive layer, a side surface of the first insulating layer, and a side surface of the second conductive layer, in the first and second openings. A gate insulating layer is provided over the semiconductor layer and a gate electrode is provided over the gate insulating layer. In this transistor, the first conductive layer serves as one of a source electrode and a drain electrode and the second conductive layer serves as the other of them. In the transistor, the source electrode, the semiconductor layer including a channel formation region, and the drain electrode can overlap with each other and the occupied area can be reduced accordingly. The region of the semiconductor layer in contact with the first insulating layer serves as the channel formation region. Consequently, the channel length of the transistor can be shorter than the resolution limit of a light exposure apparatus and the on-state current of the transistor can be high.

The semiconductor layer preferably contains a metal oxide. For the first insulating layer, a material releasing oxygen is preferably used. Thus, oxygen can be supplied from the first insulating layer to the semiconductor layer (channel formation region, in particular) to reduce oxygen vacancies ($V_O$) in the semiconductor layer.

In a transistor with a short channel length, the amount of oxygen supplied from the first insulating layer to the semiconductor layer is preferably as large as possible. In addition, the diffusion coefficient of oxygen in the first insulating layer is preferably high. Specifically, the diffusion coefficient of oxygen in the first insulating layer is preferably higher than or equal to $5\times10^{-12}$ $cm^2$/sec at 350° C. Under such conditions, oxygen is diffused into the first insulating layer at high speed and can be effectively supplied to the semiconductor layer. This allows even a transistor with a short channel length to achieve both excellent electrical characteristics and high reliability.

Structure Example 1

Figure 20A:
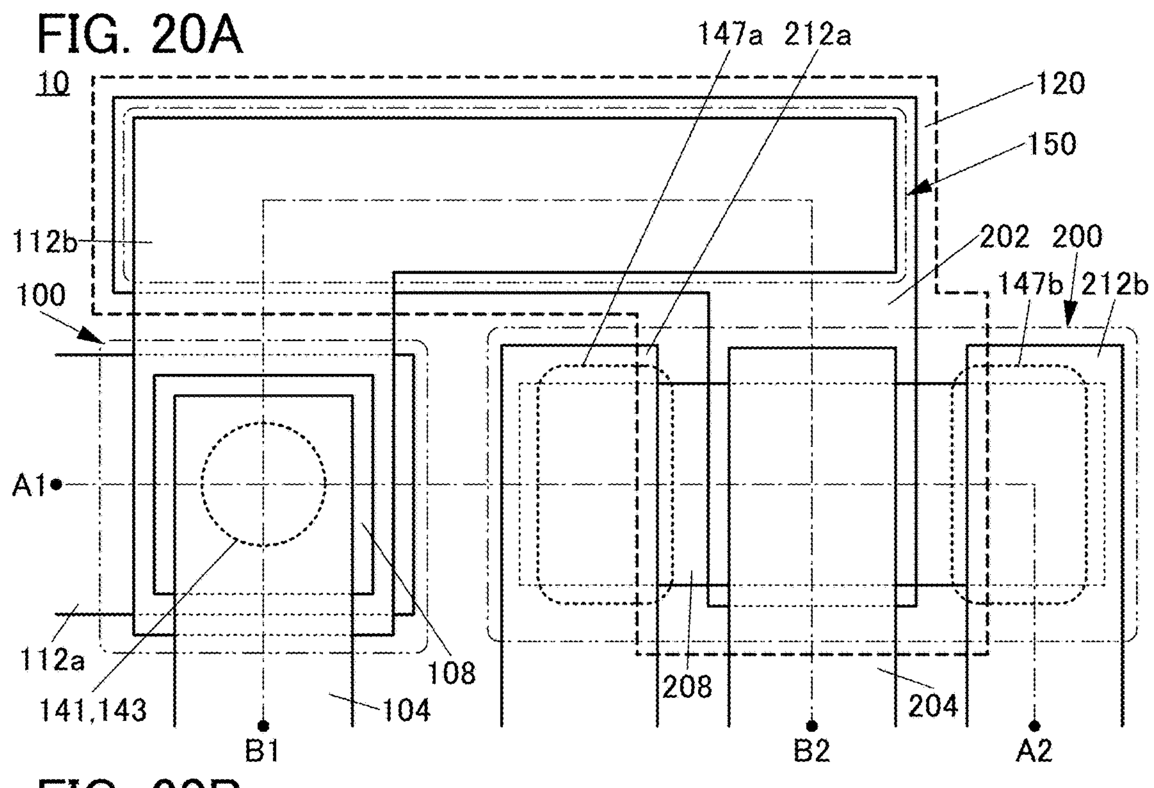
FIG. 20A is a top view showing a configuration example of a semiconductor device.
Figure 20B:
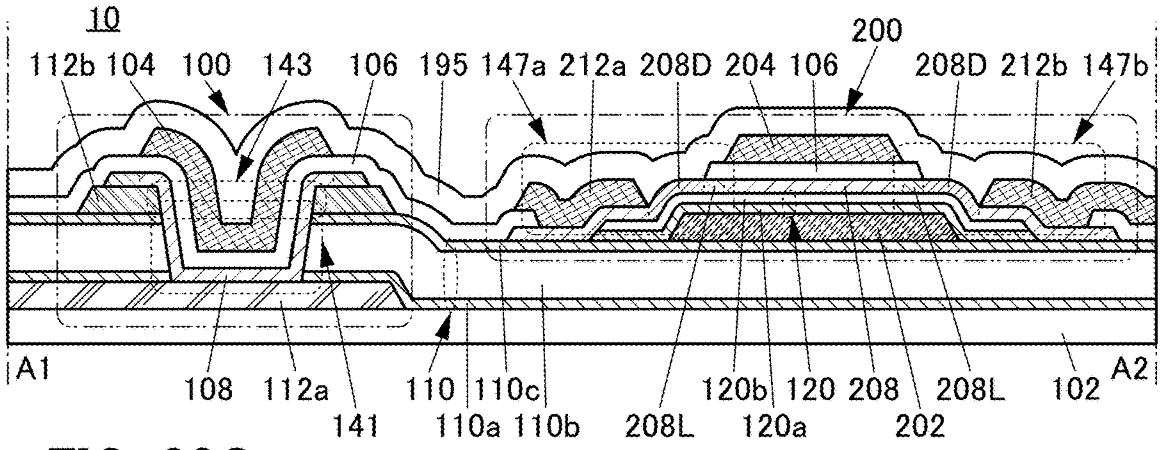
FIGS. 20B and 20C are cross-sectional views showing a structure example of the semiconductor device.
Figure 20C:
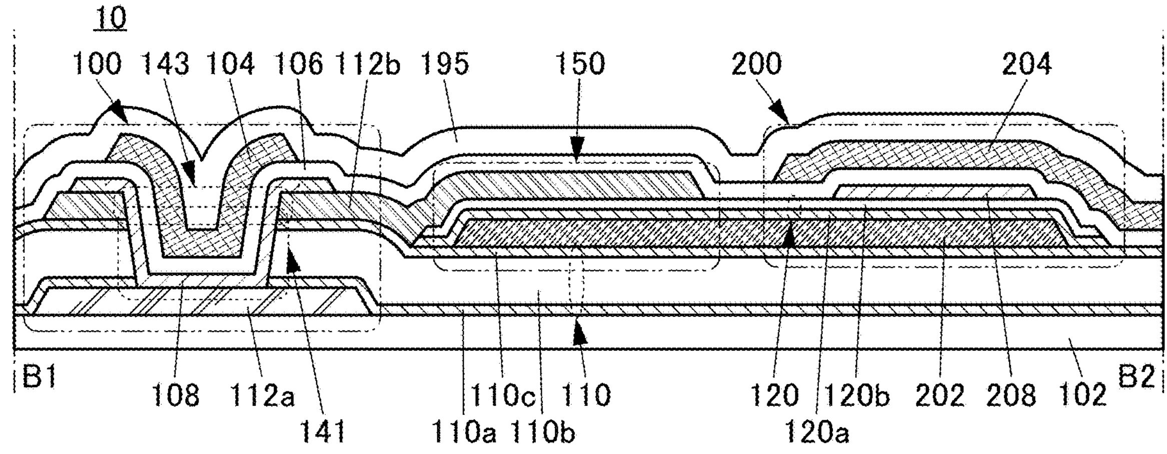

An example of a structure of a semiconductor device which is one embodiment of the present invention is described. FIG. 20A is a top view (also referred to as a plan view) of a semiconductor device 10. FIG. 20B is a cross-sectional view taken along the dashed-dotted line A1-A2 in FIG. 20A and FIG. 20C is a cross-sectional view taken along the dashed-dotted line B1-B2 in FIG. 20A. Note that in FIG. 20A, some components of the semiconductor device 10 (e.g., an insulating layer) are not illustrated. As in FIG. 20A, some components are not illustrated in top views of the semiconductor device described below.

The semiconductor device 10 includes a transistor 100, a transistor 200, a capacitor 150, and an insulating layer 110. The transistors 100 and 200 and the capacitor 150 are provided over a substrate 102. The transistor 100 has a structure different from the structure of the transistor 200. Some of the formation steps of the transistors 100 and 200 and the capacitor 150 can be the same.

The transistor 100 includes a conductive layer 104, an insulating layer 106, a semiconductor layer 108, a conductive layer 112*a*, and a conductive layer 112*b*. In the transistor 100, the conductive layer 104 serves as a gate electrode (also referred to as a first gate electrode), and part of the insulating layer 106 serves as a gate insulating layer (also referred to as a first gate insulating layer). The conductive layer 112*a* serves as one of a source electrode and a drain electrode, and the conductive layer 112*b* serves as the other. The layers constituting the transistor 100 may each have a single-layer structure or a stacked-layer structure.

The conductive layer 112*a* is provided over the substrate 102 and the insulating layer 110 is provided over the conductive layer 112*a*. The insulating layer 110 can be provided so as to cover an upper surface and a side surface of the conductive layer 112*a*. The insulating layer 110 has an opening 141 reaching the conductive layer 112*a*, in a region overlapping with the conductive layer 112*a*. It can be said that the conductive layer 112*a* is exposed in the opening 141.

The conductive layer 112*b* is provided over the insulating layer 110. The conductive layer 112*b* has a region overlapping with the conductive layer 112*a* with the insulating layer 110 therebetween. The conductive layer 112*b* has an opening 143 in a region overlapping with the conductive layer 112*a*. The opening 143 is provided in a region overlapping with the opening 141.

The semiconductor layer 108 is provided to cover the openings 141 and 143. The semiconductor layer 108 includes a region in contact with upper and side surfaces of the conductive layer 112*b*, a side surface of the insulating layer 110, and an upper surface of the conductive layer 112*a*. The semiconductor layer 108 is electrically connected to the conductive layer 112*a* through the openings 141 and 143. The semiconductor layer 108 has a shape along the shapes of the upper and side surfaces of the conductive layer 112*b*, the side surface of the insulating layer 110, and the upper surface of the conductive layer 112*a*. The conductive layer 108 has a region overlapping with the conductive layer 112*a* with the insulating layer 110 therebetween. The insulating layer 110 has a region interposed between the conductive layer 112*a* and the semiconductor layer 108. In other words, part of the semiconductor layer 108 is provided in the openings 141 and 143.

In the semiconductor layer 108, the region in contact with the conductive layer 112*a* serves as one of a source region and a drain region, and the region in contact with the conductive layer 112*b* serves as the other of the source region and the drain region. In the semiconductor layer 108, the channel formation region is provided between the source region and the drain region.

The insulating layer 106 is provided to cover the openings 141 and 143. The insulating layer 106 is provided over the semiconductor layer 108, the conductive layer 112*b*, and the insulating layer 110. The insulating layer 106 can include a region in contact with upper and side surfaces of the semiconductor layer 108, the upper and side surfaces of the conductive layer 112*b*, and the upper surface of the insulating layer 110. The insulating layer 106 can have a shape along the shapes of the upper and side surfaces of the semiconductor layer 108, the upper and side surfaces of the conductive layer 112*b*, and the upper surface of the insulating layer 110.

The conductive layer 104 is provided over the insulating layer 106 and includes a region in contact with the upper surface of the insulating layer 106. The conductive layer 104 has a region overlapping with the semiconductor layer 108 with the insulating layer 106 therebetween. The conductive layer 104 has a shape along the upper surface of the insulating layer 106.

The transistor 100 is a so-called top-gate transistor, in which the gate electrode is provided above the semiconductor layer 108. Furthermore, since a lower surface of the semiconductor layer 108 is in contact with the conductive layers 112*a* and 112*b* serving as the source and the drain electrodes, the transistor 100 can be referred to as a top-gate bottom-contact (TGBC) transistor. In the transistor 100, the source electrode and the drain electrode are positioned at different levels with respect to the surface of the substrate 102 as the formation surface, which causes drain current flow in the vertical direction (also referred to as the height direction, the depth direction in the top view, or the direction perpendicular to the formation surface (the surface of the substrate 102)). In other words, the channel length direction of the transistor 100 has a vertical component. Accordingly, a transistor such as the transistor 100 according to one embodiment of the present invention can be referred to as a "vertical transistor," a "vertical-channel transistor," a "vertical field-effect transistor (VFET)," or the like.

The channel length of the transistor 100 depends on the thickness of the insulating layer 110 (specifically, an insulating layer 110*b*) provided between the conductive layers 112*a* and 112*b*. Accordingly, a transistor with a channel length smaller than the resolution limit of a light exposure apparatus can be fabricated with high accuracy. Furthermore, variations in characteristics among the transistors 100 are also reduced. Accordingly, the operation of the semiconductor device including the transistor 100 can be stabilized and the reliability thereof can be improved. When the variations in characteristics is reduced, the circuit design flexibility of the semiconductor device is increased and the operation voltage can be reduced. As a result, power consumption of the semiconductor device can be reduced.

In the transistor 100, the source electrode, the semiconductor layer including the channel formation region, and the drain electrode can be provided to overlap with each other; thus, the occupied area can be significantly smaller than that of what is called a planar transistor in which the semiconductor layer including the channel formation region is formed into a planar shape.

The conductive layers 112*a*, 112*b*, and 104 can serve as wirings and the transistor 100 can be provided in the region where these wirings overlap with each other. That is, the areas occupied by the transistor 100 and the wirings can be reduced in the circuit including the transistor 100 and the wirings. Accordingly, the area occupied by the circuit can be reduced, which makes it possible to provide a small semiconductor device.

The transistor 200 includes a conductive layer 204, a conductive layer 212*a*, a conductive layer 212*b*, the insulating layer 106, a semiconductor layer 208, an insulating layer 120, and a conductive layer 202. In the transistor 200, the conductive layer 204 serves as a gate electrode (also referred to as a first gate electrode), and part of the insulating layer 106 serves as a gate insulating layer (also referred to as a first gate insulating layer). The conductive layer 202 serves as aback gate electrode (also referred to as a second gate electrode), and part of the insulating layer 120 serves as a back gate insulating layer (also referred to as a second gate insulating layer). The conductive layer 212*a* serves as one of a source electrode and a drain electrode, and the conductive layer 212*b* serves as the other. The layers constituting the transistor 200 may each have a single-layer structure or a stacked-layer structure. The transistor 200 does not necessarily include the conductive layer 202.

In the semiconductor layer 208, the whole region that is between the source electrode and the drain electrode and overlaps with the gate electrode with the gate insulating layer therebetween serves as a channel formation region. The semiconductor layer 208 includes a pair of regions 208L between which a channel formation region is interposed and a pair of regions 208D outside the pair of regions 208L.

The regions 208L and 208D are regions containing an impurity element. Examples of the impurity element include one or more of hydrogen, boron, carbon, nitrogen, fluorine, phosphorus, sulfur, arsenic, aluminum, magnesium, silicon, and a noble gas. Typical examples of the noble gas include helium, neon, argon, krypton, and xenon. It is particularly preferable to use one or more of boron, phosphorus, aluminum, magnesium, and silicon as the impurity element.

The impurity element is supplied (added or injected) to the semiconductor layer 208 with the use of the conductive layers 204, 212*a*, and 212*b* as masks. Thus, the regions 208D can be formed in regions of the semiconductor layer 208 that overlaps with none of the conductive layers 204, 212*a*, and 212*b* and the insulating layer 106, and the regions 208L can be formed in regions of the semiconductor layer 208 that overlaps with none of the conductive layers 204, 212*a*, and 212*b* and overlaps with the insulating layer 106.

In the semiconductor layer 208, a region in contact with the conductive layer 212*a* and the region 208D adjacent to the region serve as one of the source region and the drain region. In the semiconductor layer 208, a region in contact with the conductive layer 212*b* and the region 208D adjacent to the region serve as the other of the source region and the drain region.

The conductive layer 202 is provided over the insulating layer 110, and the insulating layer 120 is provided over the conductive layer 202. The insulating layer 120 is provided so as to cover an upper surface and a side surface of the conductive layer 202. The insulating layer 120 includes a portion protruding beyond an end portion of the conductive layer 202. The end portion of the insulating layer 120 is in contact with an upper surface of the insulating layer 110.

The semiconductor layer 208 is provided over and in contact with the insulating layer 120. The conductive layer 208 has a region overlapping with the conductive layer 202 with the insulating layer 120 therebetween. For the semiconductor layer 208, the same material as the semiconductor layer 108 can be used. The semiconductor layers 208 can be formed in the same step as the semiconductor layer 108. For example, a film to be the semiconductor layers 108 and 208 is formed and then processed, thereby forming the semiconductor layers 108 and 208.

The insulating layer 106 is provided over the semiconductor layer 208. One part of the insulating layer 106 serves as a gate insulating layer of the transistor 100 and another part of the insulating layer 106 serves as a gate insulating layer of the transistor 200. The insulating layer 106 includes an openings 147*a* and an opening 147*b* in regions overlapping with the semiconductor layer 208.

The conductive layers 204, 212*a*, and 212*b* are provided over the insulating layer 106. The conductive layer 204 includes a region overlapping with the semiconductor layer 208 with the insulating layer 106 therebetween. The conductive layer 204 includes a region overlapping with the conductive layer 202 with the semiconductor layer 208 therebetween. The conductive layers 212*a* and 212*b* are provided to cover the openings 147*a* and 147*b*, respectively. The conductive layer 212*a* is electrically connected to the semiconductor layer 208 in the opening 147*a* and the conductive layer 212*b* is electrically connected to the semiconductor layer 208 through the opening 147*b*. The conductive layers 204, 212*a*, and 212*b* can include the same material as the conductive layer 104. The conductive layers 204, 212*a*, and 212*b* can be formed in the same step as the conductive layer 104. For example, a film to be the conductive layers 104, 204, 212*a*, and 212*b* is formed and then processed, whereby the conductive layers 104, 204, 212*a*, and 212*b* can be formed.

The transistor 200 is a planar transistor in which the semiconductor layer 208 is formed into a planar shape. The transistor 200 is a so-called top-gate transistor, in which the gate electrode is provided above the semiconductor layer 208. For example, an impurity element is added to the semiconductor layer 208 with the conductive layer 204 serving as a gate electrode used as a mask, so that the regions 208D serving as the source region and the drain region can be formed in a self-aligned manner. The transistor 200 can be referred to as a top-gate self-aligned (TGSA) transistor.

The channel length of the transistor 200 depends on the length of the conductive layer 204. Accordingly, the channel length of the transistor 200 is greater than or equal to the resolution limit of a light exposure apparatus. The channel length of the transistor 200 can therefore be longer than that of the transistor 100. The transistor with a long channel length can have favorable saturation.

Note that in this specification and the like, the state where the change in drain current is small in the saturation region of the $I_d$-$V_d$ characteristics of a transistor is sometimes described using the expression "favorable saturation."

The transistor 100 with a short channel length and the transistor 200 with a long channel length can be formed over the same substrate by the formation steps some of which are shared. For example, the transistor 100 is used as the transistor required to have a high on-state current and the transistor 200 is used as the transistor required to have favorable saturation, thereby providing a high-performance semiconductor device.

When the semiconductor device of one embodiment of the present invention is used for a pixel circuit of a display apparatus, the area occupied by the pixel circuit can be reduced and the display apparatus can have high resolution, for example. When the semiconductor device of one embodiment of the present invention is used for a driver circuit (e.g., one or both of a gate line driver circuit and a source line driver circuit) of a display apparatus, the area occupied by the driver circuit can be reduced and the display apparatus can have a narrow bezel, for example.

The capacitor 150 includes the conductive layers 112*b* and 202 serving as a pair of electrodes and the insulating layer 120. The conductive layer 112*b* serves as the other of the source electrode and the drain electrode of the transistor 100 and as one of the pair of electrodes of the capacitor 150. The conductive layer 202 serves as the back gate electrode of the transistor 200 and as the other of the pair of electrodes of the capacitor 150. In the insulating layer 120, a region interposed between the conductive layers 112*b* and 202 serves as a dielectric of the capacitor 150. The conductive layers 112*b* and 202 that are formed by different steps can serve as the pair of electrodes forming the capacitor 150. The conductive layers 112*b* and 202 that are formed by different steps can employ different materials, offering a wider range of material choices.

Although the capacitor 150 is formed of the conductive layers 112*b* and 202 and the insulating layer 120 in FIG. 20A and the like, there is no limitation on the structure of the capacitor 150. Furthermore, the capacitor 150 is not necessarily included in the semiconductor device 10. In the case where the capacitor 150 including the conductive layers 112*b* and 202 and the insulating layer 120 is not provided, the conductive layers 112*b* and 202 may be formed in the same step.

Although the other of the source electrode and the drain electrode of the transistor 100 is electrically connected to one of the pair of electrodes of the capacitor 150 and one of a source electrode and a drain electrode of the transistor 200 is electrically connected to the other of the pair of electrodes of the capacitor 150 in FIG. 20A and the like, there is no limitation on the electrical connection relation between the transistor 100, the transistor 200, and the capacitor 150.

An insulating layer 195 is provided to cover the transistors 100 and 200 and the capacitor 150. The insulating layer 195 serves as a protective layer for the transistors 100 and 200 and the capacitor 150.

There is no particular limitation on the semiconductor material used for the semiconductor layers 108 and 208. For example, a single-element semiconductor or a compound semiconductor can be used. Examples of the single-element semiconductor include silicon and germanium. Examples of the compound semiconductor include gallium arsenide and silicon germanium. Other examples of the compound semiconductor include an organic semiconductor, a nitride semiconductor, and an oxide semiconductor. These semiconductor materials may contain an impurity as a dopant.

There is no particular limitation on the crystallinity of the semiconductor material used for the semiconductor layers 108 and 208, and any of an amorphous semiconductor, a single crystal semiconductor, and a semiconductor having other crystallinity than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

For each of the semiconductor layers 108 and 208, silicon can be used. Examples of silicon include single crystal silicon, polycrystalline silicon, microcrystalline silicon, and amorphous silicon. An example of polycrystalline silicon is low-temperature polysilicon (LTPS). The transistor including amorphous silicon in the channel formation region can be formed over a large-sized glass substrate, thereby reducing the manufacturing cost. The transistor including polycrystalline silicon in the channel formation region has high field-effect mobility and enables high-speed operation. The transistor including microcrystalline silicon in the channel formation region has higher field-effect mobility and enables higher speed operation than the transistor including amorphous silicon.

The semiconductor layers 108 and 208 preferably each include a metal oxide exhibiting semiconductor characteristics (also referred to as an oxide semiconductor).

The band gap of a metal oxide used for the semiconductor layers 108 and 208 is preferably 2.0 eV or more, further preferably 2.5 eV or more.

A transistor including an oxide semiconductor (hereinafter referred to as an OS transistor) has much higher field-effect mobility than a transistor including amorphous silicon. In addition, the OS transistor has an extremely low off-state current, and charge accumulated in a capacitor that is connected in series to the transistor can be held for a long period. Furthermore, a semiconductor device can have lower power consumption by including the OS transistor.

[Transistor 100]

Figures 21A, 21B:
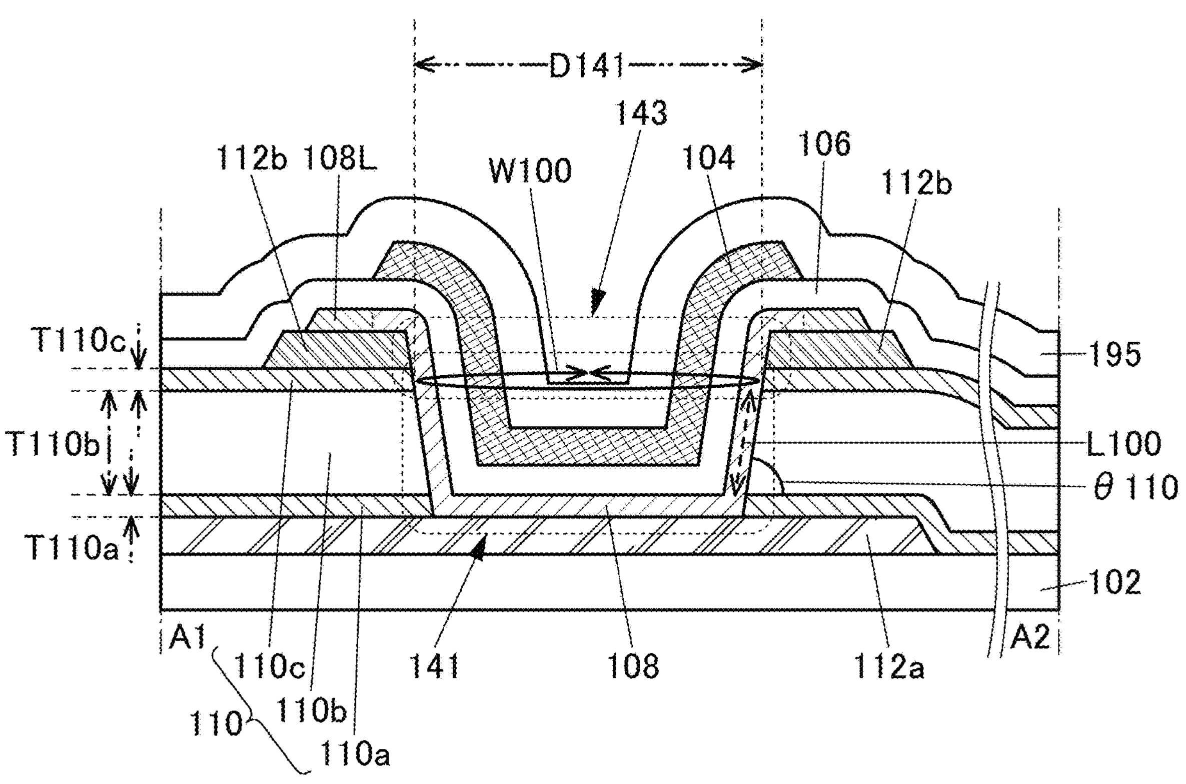
FIG. 21A is a top view showing a configuration example of a semiconductor device.
FIG. 21B is a cross-sectional view showing a structure example of the semiconductor device.

A detailed structure of the transistor 100 is described with reference to FIGS. 20A to 20C and FIGS. 21A and 21B. FIGS. 21A and 21B are enlarged views of the transistor 100 illustrated in FIGS. 20A and 20B.

The insulating layer 110 preferably includes one or more inorganic insulating films. Examples of a material that can be used for the inorganic insulating film include an oxide, a nitride, an oxynitride, and a nitride oxide. Examples of the oxide include silicon oxide, aluminum oxide, magnesium oxide, gallium oxide, germanium oxide, yttrium oxide, zirconium oxide, lanthanum oxide, neodymium oxide, hafnium oxide, tantalum oxide, cerium oxide, gallium zinc oxide, and hafnium aluminate. Examples of the nitride include silicon nitride and aluminum nitride. Examples of the oxynitride include silicon oxynitride, aluminum oxynitride, gallium oxynitride, yttrium oxynitride, and hafnium oxynitride film. Examples of the nitride oxide include silicon nitride oxide and aluminum nitride oxide.

Note that in this specification and the like, an oxynitride refers to a material in which an oxygen content is higher than a nitrogen content. A nitride oxide refers to a material in which a nitrogen content is higher than an oxygen content.

In the transistor 100, the insulating layer 110 includes a region in contact with the semiconductor layer 108. In the case where the semiconductor layer 108 is formed using a metal oxide, at least part of the region of the insulating layer 110 that is in contact with the semiconductor layer 108 preferably contains oxygen to improve the characteristics of the interface between the semiconductor layer 108 and the insulating layer 110. Specifically, the region of the insulating layer 110 that is in contact with the channel formation region in the semiconductor layer 108 preferably contains oxygen. One or more of an oxide and an oxynitride can be used for the region of the insulating layer 110 that is in contact with the channel formation region in the semiconductor layer 108.

The insulating layer 110 preferably has a stacked-layer structure. The insulating layer 110 illustrated in FIG. 20B and the like includes an insulating layer 110*a*, an insulating layer 110*b* over the insulating layer 110*a*, and an insulating layer 110*c* over the insulating layer 110*b*, for example.

The region of the semiconductor layer 108 that is in contact with the insulating layer 110*b* serves as the channel formation region. The insulating layer 110*b* preferably contains oxygen and is preferably formed using any one or more of the oxide and oxynitride described above. Specifically, one or both of silicon oxide and silicon oxynitride can be used for the insulating layer 110*b*.

It is further preferable that a film from which oxygen is released by heating be used for the insulating layer 110*b*. When the insulating layer 110*b* releases oxygen by being heated during the manufacturing process of the transistor 100, the oxygen can be supplied to the semiconductor layer 108. When oxygen is supplied from the insulating layer 110*b* to the semiconductor layer 108, particularly to the channel formation region, oxygen vacancies ($V_O$) can be repaired, resulting in reduced oxygen vacancies ($V_O$). Consequently, the transistor can have favorable electrical characteristics and high reliability.

For example, the insulating layer 110*b* can be supplied with oxygen when heat treatment or plasma treatment is performed in an oxygen-containing atmosphere. Alternatively, an oxide film may be formed over the upper surface of the insulating layer 110*b* by a sputtering method in an oxygen-containing atmosphere to supply oxygen. After that, the oxide film may be removed.

Hydrogen in the semiconductor layer 108, particularly in the channel formation region, is preferably reduced as much as possible. Hydrogen in the semiconductor layer 108 is bonded to an oxygen vacancy ($V_O$) to form a defect (also referred to as $V_OH$) generated by entry of hydrogen into the oxygen vacancy ($V_O$), and, as a result, transistor characteristics (e.g., $I_d$-$V_g$ characteristics of the transistor in the initial state or $I_d$-$V_g$ characteristics in a long-term reliability test) might be degraded. Hence, a material that releases little hydrogen is preferably used as a material surrounding the semiconductor layer 108, such as a material of the insulating layer (e.g., the insulating layer 110*a*, 110*b*, 110*c*, or 106) that is in contact with the semiconductor layer 108.

The insulating layer 110*b* is preferably formed by a film formation method such as a sputtering method or a plasma-enhanced chemical vapor deposition (PECVD) method. It is particularly preferable to employ a sputtering method, in which a hydrogen gas does not need to be used as a film formation gas, to form a film having an extremely low hydrogen content. In that case, supply of hydrogen to the channel formation region is inhibited and the electrical characteristics of the transistor 100 can be stabilized.

Preferably, a substance is easily diffused into the insulating layer 110*b*. In other words, the diffusion coefficient of a substance in the insulating layer 110*b* is preferably high. Preferably, oxygen in particular is easily diffused into the insulating layer 110*b*. That is, the diffusion coefficient of oxygen in the insulating layer 110*b* is preferably high. Oxygen contained in the insulating layer 110*b* is diffused into the insulating layer 110*b* and supplied to the semiconductor layer 108 through the interface between the insulating layer 110*b* and the semiconductor layer 108. The insulating layer 110*b* into which oxygen is easily diffused contributes to the efficient supply of oxygen contained in the insulating layer 110*b* to the semiconductor layer 108 (channel formation region, in particular).

The diffusion coefficient of oxygen in the insulating layer 110*b* at 350° C. is preferably higher than or equal to $5\times10^{-12}$ $cm^2$/sec, further preferably higher than or equal to $1\times10^{-11}$ $cm^2$/sec, further preferably higher than or equal to $5\times10^{-11}$ $cm^2$/sec, still further preferably higher than or equal to $1\times10^{-10}$ $cm^2$/sec. By the heat treatment, oxygen contained in the insulating layer 110*b* can be efficiently supplied to the semiconductor layer 108. Since the diffusion coefficient is preferably as high as possible, the upper limit thereof is not imposed. The diffusion coefficient may be calculated by, for example, thermal desorption spectroscopy (TDS) or secondary ion mass spectrometry (SIMS).

The use of a material having high electrical conductivity for the semiconductor layer 108 enables the transistor to have a high on-state current. However, the use of a material having high electrical conductivity facilitates the formation of oxygen vacancies ($V_O$); the increased oxygen vacancies ($V_O$) in the channel formation region shift the threshold voltage of the transistor, which might increase the drain current flowing at a gate voltage of 0 V (hereinafter, also referred to as cut-off current). For example, a shift of the threshold voltage in the negative direction might increase the cut-off current in the case of an n-channel transistor. The insulating layer 110*b* enables oxygen supply to at least the region of the semiconductor layer 108 that is in contact with the insulating layer 110*b*, i.e., the channel formation region, reducing the oxygen vacancies ($V_O$) in the channel formation region. This prevents the threshold voltage shift and allows the transistor to have both a low cut-off current and a high on-state current. Consequently, a semiconductor device that achieves low power consumption and high performance can be provided.

In the semiconductor layer 108, the region in contact with the conductive layer 112*a* serves as one of a source region and a drain region of the transistor 100, and the region in contact with the conductive layer 112*b* serves as the other thereof. The source and drain regions have lower electric resistance than the channel formation region. In other words, the source and drain regions have a higher carrier concentration or a higher oxygen vacancy density than the channel formation region.

The insulating layer 110*a* is provided between the insulating layer 110*b* and the conductive layer 112*a*. The insulating layer 110*c* is provided between the insulating layer 110*b* and the conductive layer 112*b*. Preferably, the insulating layers 110*a* and 110*c* release few impurities (e.g., hydrogen and water) and are unlikely to transmit impurities. Thus, the impurities contained in the insulating layers 110*a* and 110*c* can be prevented from being diffused into the channel formation region. Consequently, the transistor can have favorable electrical characteristics and high reliability.

For each of the insulating layers 110*a* and 110*c*, a film that does not easily transmit oxygen is preferably used. Accordingly, oxygen contained in the insulating layer 110*b* can be prevented from being diffused into the conductive layer 112*a* through the insulating layer 110*a*. Similarly, oxygen contained in the insulating layer 110*b* can be prevented from being diffused into the conductive layer 112*b* through the insulating layer 110*c*. As a result, an increase in the electric resistance of the conductive layers 112*a* and 112*b* can be prevented. At the same time, oxygen contained in the insulating layer 110*b* can be prevented from being diffused into the insulating layer 110*a* side and the insulating layer 110*c* side. These increase the amount of oxygen supplied to the channel formation region from the insulating layer 110*b*, reducing oxygen vacancies ($V_O$) and $V_OH$ in the channel formation region.

When a film that does not easily allow diffusion of oxygen is used for each of the insulating layers 110*a* and 110*c*, oxygen can be effectively supplied from the insulating layer 110*b* to the channel formation region. Note that one or both of the insulating layers 110*a* and 110*c* are not necessarily provided.

The insulating layers 110*a* and 110*c* each preferably contain nitrogen and are preferably formed using any one or more of the nitride and nitride oxide described above. For example, silicon nitride or silicon nitride oxide can be used for each of the insulating layers 110*a* and 110*c*. Alternatively, any one or more of oxide and oxynitride may be used for one or both of the insulating layers 110*a* and 110*c*. For example, aluminum oxide can be used for each of the insulating layers 110*a* and 110*c*. For the insulating layers 110*a* and 110*c*, the same material or different materials may be used.

Note that in this specification and the like, different materials mean materials, the constituent elements of which are partially or entirely different from each other, or materials having the same constituent element and different compositions.

For example, a thickness T110*a* of the insulating layer 110*a* can be greater than or equal to 3 nm, greater than or equal to 5 nm, greater than or equal to 10 nm, greater than or equal to 20 nm, greater than or equal to 50 nm, or greater than or equal to 70 nm and can be less than 1 m or less than or equal to 500 nm, less than or equal to 400 nm, less than or equal to 300 nm, less than or equal to 200 nm, less than or equal to 150 nm, or less than or equal to 120 nm. The thickness T110*a* can be the shortest distance between the formation surface of the insulating layer 110*a* (the upper surface of the conductive layer 112*a* here) and the lower surface of the insulating layer 110*b* in a cross-sectional view, as shown in FIG. 21B.

If the thickness T110*a* of the insulating layer 110*a* is large, more impurities might be released from the insulating layer 110*a*, resulting in an increase in impurities diffused into the channel formation region. Meanwhile, if the thickness T110*a* is small, oxygen contained in the insulating layer 110*b* might be diffused into the conductive layer 112*a* side through the insulating layer 110*a*, resulting in a reduction in oxygen supplied to the channel formation region. As long as thickness T110*a* is set within the above-described range, the oxygen vacancies ($V_O$) and $V_OH$ in the channel formation region can be reduced. Furthermore, the conductive layer 112*a* can be prevented from being oxidized by oxygen contained in the insulating layer 110*b* and from having higher electric resistance.

For example, a thickness T110*c* of the insulating layer 110*c* can be greater than or equal to 3 nm, greater than or equal to 5 nm, greater than or equal to 10 nm, greater than or equal to 15 nm, or greater than or equal to 20 nm and can be less than or equal to 1 μm or less than or equal to 500 nm, less than or equal to 300 nm, less than or equal to 200 nm, less than or equal to 150 nm, or less than or equal to 120 nm, or less than or equal to 100 nm. The thickness T110*c* can be the shortest distance between the formation surface of the insulating layer 110*c* (the upper surface of the conductive layer 110*b* here) and the lower surface of the insulating layer 112*b* in a cross-sectional view, as shown in FIG. 21B.

If the thickness T110*c* of the insulating layer 110*c* is large, more impurities might be released from the insulating layer 110*c*, resulting in an increase in impurities diffused into the channel formation region. Meanwhile, if the thickness T110*c* is small, oxygen contained in the insulating layer 110*b* might be diffused into the conductive layer 112*b* side through the insulating layer 110*c*, resulting in a reduction in oxygen supplied to the channel formation region. As long as thickness T110*c* is set within the above-described range, the oxygen vacancies ($V_O$) and $V_OH$ in the channel formation region can be reduced. Furthermore, the conductive layer 112*b* can be prevented from being oxidized by oxygen contained in the insulating layer 110*b* and from having higher electric resistance.

In the semiconductor layer 108, at least one of the region in contact with the insulating layer 110*a* and the region in contact with the insulating layer 110*c* may be a region having lower electric resistance than the channel formation region (hereinafter, also referred to as a low-resistance region). In other words, the region has a higher carrier concentration or a higher oxygen vacancy density than the channel formation region. When a material that releases impurities (e.g., water and hydrogen) is used for the insulating layer 110*a*, the region in contact with the insulating layer 110*a* can be a low-resistance region. In the semiconductor layer 108, the low-resistance region can be formed between the channel formation region and the region in contact with the conductive layer 112*a* (one of the source region and the drain region). Similarly, when a material that releases impurities is used for the insulating layer 110*c*, the region in contact with the insulating layer 110*c* can be a low-resistance region. In the semiconductor layer 108, the low-resistance region can be formed between the channel formation region and the region in contact with the conductive layer 112*b* (the other of the source region and the drain region). The low-resistance region can serve as a buffer region for relieving a drain electric field. Note that the low-resistance region may serve as the source region or the drain region.

The low-resistance region between the drain region and the channel formation region inhibits generation of a high electric field in the vicinity of the drain region, so that generation of hot carriers is inhibited to prevent the degradation of the transistor. For example, in the case where the conductive layer 112*a* serves as the drain electrode and the conductive layer 112*b* serves as the source electrode, the region of the semiconductor layer 108 that is in contact with the insulating layer 110*a* is made to serve as the low-resistance region. In such a case, a high electric field is not easily generated in the vicinity of the drain region, fewer hot carriers are generated, and the transistor are less likely to deteriorate. In the case where the conductive layer 112*a* serves as the source electrode and the conductive layer 112*b* serves as the drain electrode, the region of the semiconductor layer 108 that is in contact with the insulating layer 110*c* is made to serve as the low-resistance region. In such a case, a high electric field is not easily generated in the vicinity of the drain region, fewer hot carriers are generated, and the transistor are less likely to deteriorate.

As described above, an excessive amount of impurities released from the insulating layers 110*a* and 110*c* might be diffused into the channel formation region. Even when a material that releases impurities is used for the insulating layers 110*a* and 110*c*, the amount of released impurities is preferably small.

The insulating layer 110 preferably includes at least the insulating layer 110*b*. For example, one or both of the insulating layers 110*a* and 110*c* are not necessarily provided. The insulating layer 110 may have a single-layer structure or a stacked-layer structure of two layers or four or more layers.

There is no limitation on the top-view shapes of the opening 141 and the opening 143, and the top-view shapes can each be a circle, an ellipse, a polygon such as a triangle, a quadrangle (including a rectangle, a rhombus, and a square), or a pentagon, or any of these polygons whose corners are rounded, for example. Note that the polygon may be a concave polygon (a polygon at least one of the interior angles of which is greater than 180°) or a convex polygon (a polygon all the interior angles of which are less than or equal to 180°). The top-view shapes of the opening 141 and the opening 143 are preferably circles as shown in FIG. 20A and the like. When the top-view shapes of the openings are circles, processing accuracy at the time of formation of the openings can be high, whereby the openings can be formed to have minute sizes. Note that in this specification and the like, a circle is not necessarily a perfect circle.

In this specification and the like, the top-view shape of the opening 141 refers to the shape of the end portion of the upper surface of the insulating layer 110 on the opening 141 side. The top-view shape of the opening 143 refers to the shape of the end portion of the lower surface of the conductive layer 112*b* on the opening 143 side.

As shown in FIG. 20A and the like, the opening 141 and the opening 143 can have the same top-view shape or substantially the same top-view shapes. In that case, it is preferable that the end portion of the bottom surface of the conductive layer 112*b* on the opening 143 side be aligned with or substantially aligned with the end portion of the upper surface of the insulating layer 110 on the opening 141 side as shown in FIGS. 20B and 20C and the like. The lower surface of the conductive layer 112*b* refers to the surface thereof on the insulating layer 110 side. The upper surface of the insulating layer 110 refers to the surface thereof on the conductive layer 112*b* side.

Note that the opening 141 and the opening 143 do not necessarily have the same top-view shape. In the case where the opening 141 and the opening 143 have circular top-view shapes, the opening 141 and the opening 143 may be, but not necessarily, concentrically arranged.

The channel length and channel width of the transistor 100 are described with reference to FIGS. 21A and 21B. FIGS. 21A and 21B are the enlarged views of the transistor 100 illustrated in FIGS. 20A and 20B.

In FIG. 21B, a channel length L100 of the transistor 100 is indicated by the dashed double-headed arrow. The channel length L100 of the transistor 100 corresponds to the length of the side surface of the insulating layer 110*b* on the opening 141 side in a cross-sectional view. In other words, the channel length L100 depends on the thickness T110*b* of the insulating layer 110*b* and the angle θ110 formed by the side surface of the insulating layer 110*b* on the opening 141 side and the formation surface of the insulating layer 110*b* (which is the upper surface of the insulating layer 110*a* here). Thus, the channel length L100 can be a value smaller than that of the resolution limit of a light-exposure apparatus, which enables the transistor to have a minute size. Specifically, it is possible to obtain a transistor with an extremely short channel length that cannot be easily obtained with the use of a conventional light-exposure apparatus for mass production of flat panel displays (the minimum line width: approximately 2 μm or approximately 1.5 μm, for example). Moreover, it is also possible to obtain a transistor with a channel length shorter than 10 nm without using an extremely expensive light-exposure apparatus used in the latest LSI technology.

The channel length L100 can be, for example, greater than or equal to 5 nm, greater than or equal to 7 nm, or greater than or equal to 10 nm and less than 3 m, less than or equal to 2.5 m, less than or equal to 2 m, less than or equal to 1.5 m, less than or equal to 1.2 m, less than or equal to 1 m, less than or equal to 500 nm, less than or equal to 300 nm, less than or equal to 200 nm, less than or equal to 100 nm, less than or equal to 50 nm, less than or equal to 30 nm, or less than or equal to 20 nm. For example, the channel length L100 can be greater than or equal to 100 nm and less than or equal to 1 μm.

When the channel length L100 is small, the transistor 100 can have a high on-state current. With the use of the transistor 100, a circuit capable of high-speed operation can be manufactured. Furthermore, the area occupied by the circuit can be reduced. Therefore, a semiconductor device with a small size can be obtained. The application of the semiconductor device of one embodiment of the present invention to a large-sized or high-resolution display apparatus would reduce signal delay in wirings and reduce display unevenness if the number of wirings is increased, for example. In addition, since the area occupied by the circuit can be reduced, the bezel of the display apparatus can be narrowed.

By adjusting the thickness T110*b* of the insulating layer 110*b* and the angle θ110, the channel length L100 can be controlled. Note that in FIG. 21B, the thickness T110*b* of the insulating layer 110*b* is indicated by the dashed-dotted double-headed arrow.

The thickness T110*b* of the insulating layer 110*b* can be, for example, greater than or equal to 5 nm, greater than or equal to 7 nm, or greater than or equal to 10 nm and less than 3 m, less than or equal to 2.5 m, less than or equal to 2 m, less than or equal to 1.5 m, less than or equal to 1.2 m, less than or equal to 1 m, less than or equal to 500 nm, less than or equal to 300 nm, less than or equal to 200 nm, less than or equal to 100 nm, less than or equal to 50 nm, less than or equal to 30 nm, or less than or equal to 20 nm.

The side surface of the insulating layer 110 on the opening 141 side preferably has a vertical shape or a tapered shape. The angle θ110 is preferably less than or equal to 90°. When the angle θ110 is small, the coverage with the layer provided over the insulating layer 110 (e.g., the semiconductor layer 108) can be increased. The smaller the angle θ110 is, the larger the channel length L100 is. The larger the angle θ110 is, the smaller the channel length L100 is.

The angle θ110 can be, for example, greater than or equal to 30°, greater than or equal to 35°, greater than or equal to 40°, greater than or equal to 45°, greater than or equal to 50°, greater than or equal to 55°, greater than or equal to 60°, greater than or equal to 65°, or greater than or equal to 700 and less than or equal to 90°, less than or equal to 85°, or less than or equal to 80°. The angle θ110 may be less than or equal to 75°, less than or equal to 70°, less than or equal to 65°, or less than or equal to 60°.

Although FIG. 21B and the like illustrate a structure in which the side surface of the insulating layer 110 on the opening 141 side is linear in a cross-sectional view, one embodiment of the present invention is not limited thereto. In a cross-sectional view, the side surface of the insulating layer 110 on the opening 141 side may be curved or include both a linear region and a curved region.

The conductive layer 112*b* is preferably absent in the opening 141. Specifically, it is preferable that the conductive layer 112*b* not include a region that is in contact with the side surface of the insulating layer 110 on the opening 141 side. If the conductive layer 112*b* is present inside the opening 141, the channel length L100 of the transistor 100 is shorter than the length of the side surface of the insulating layer 110*b* and is difficult to control in some cases. Accordingly, the opening 143 preferably has the same top-view shape as the opening 141 or covers the opening 141 completely in the top view.

In FIGS. 21A and 21B, a width D141 of the opening 141 is indicated by the dashed-two dotted double-headed arrow. In the example in FIG. 21A, the top surface shape of the opening 141 is a circle. In this case, the channel width D141 corresponds to the diameter of the circle and a channel width W100 of the transistor 100 is the length of the circumference of the circle. That is, the channel width W100 is π×D141. In the case where the opening 141 has a circular top-view shape as described above, the channel width W100 of the transistor can be smaller than in the case where the opening 141 has any other shape.

The width D141 of the opening 141 sometimes varies in the depth direction. As the width D141 of the opening 141, for example, the average value of the following three diameters can be used: the diameter at the highest level of the insulating layer 100*b* (or the insulating layer 110) in a cross-sectional view, the diameter at the lowest level of the insulating layer 100*b* (or the insulating layer 110) in a cross-sectional view, and the diameter at the midpoint between these levels. For another example, any of the diameter at the highest level of the insulating layer 110*b* (or the insulating layer 110) in a cross-sectional view, the diameter at the lowest level of the insulating layer 110*b* (or the insulating layer 110) in a cross-sectional view, and the diameter at the midpoint between these levels can be used as the diameter of the opening 141.

In the case where the opening 141 is formed by a photolithography method, the width D141 of the opening 141 is larger than or equal to the resolution limit of a light-exposure apparatus. The width D141 can be, for example, greater than or equal to 200 nm, greater than or equal to 300 nm, greater than or equal to 400 nm, or greater than or equal to 500 nm and less than 5 m, less than or equal to 4.5 m, less than or equal to 4 m, less than or equal to 3.5 m, less than or equal to 3 m, less than or equal to 2.5 m, less than or equal to 2 m, less than or equal to 1.5 m, or less than or equal to 1 m.

With the transistor 100 having the short channel length L100, materials for the insulating layers 110*a* and 110*c* are each preferably selected such that the amount of hydrogen released from the insulating layers 110*a* and 110*c* can be as small as possible. In the case where the materials used for the insulating layers 110*a* and 110*c* release even a small amount of hydrogen, their thicknesses are preferably small. For example, when the channel length L100 is less than or equal to 100 nm, the thickness T110*a* of the insulating layer 110*a* and the thickness T110*c* of the insulating layer 110*c* are each preferably greater than or equal to 1 nm, greater than or equal to 3 nm, or greater than or equal to 5 nm and less than or equal to 50 nm, less than or equal to 40 nm, less than or equal to 30 nm, less than or equal to 20 nm, less than or equal to 15 nm, or less than or equal to 10 nm. Accordingly, the amount of impurities diffused into the channel formation region can be reduced, and the transistor can have favorable electrical characteristics and high reliability even with the short channel length L100.

Although the structure in which the region of the semiconductor layer 108 that is in contact with the insulating layer 110*b* serves as the channel formation region is described as an example, one embodiment of the present invention is not limited thereto. The region of the semiconductor layer 108 that is in contact with the insulating layer 110*a* serves as the channel formation region. The region that is in contact with the insulating layer 110*c* also serves as the channel formation region.

Although the semiconductor layer 108, the insulating layer 106, and the conductive layer 104 cover the openings 141 and 143 in the transistor 100 in FIG. 20B and the like, for example, one embodiment of the present invention is not limited thereto. A step may be formed between the insulating layer 110 and the conductive layer 112*a*, and the semiconductor layer 108, the insulating layer 106, and the conductive layer 104 may be provided along with the step.

[Transistor 200]

A detailed structure of the transistor 200 is described with reference to FIGS. 22A to 22C. FIGS. 22A to 22C are enlarged views of the transistor 200 illustrated in FIGS. 20A to 20C.

The channel length of the transistor 200 is the length of a region between the pair of regions 208D where the semiconductor layer 208 and the conductive layer 204 overlap with each other. In FIGS. 22A and 22B, a channel length L200 of the transistor 200 is indicated by the dashed double-headed arrow. The channel length L200 of the transistor 200 is determined by the length of the conductive layer 204, which is greater than or equal to the resolution limit of a light exposure apparatus. For example, the channel length L200 can be greater than or equal to 1.5 μm. The transistor with a long channel length can have favorable saturation.

The conductive layer 202 serving as the back electrode gate of the transistor 200 preferably extends beyond the end portion of the channel formation region. Specifically, the conductive layer 202 preferably has a portion that protrudes beyond the end portion of the conductive layer 204 in the channel length direction.

For easy explanation in this specification and the like, a portion of the semiconductor layer 208 that overlaps with the conductive layer 204 is sometimes referred to as a channel formation region in the following description; however, a channel can also be actually formed in a portion that does not overlap with the conductive layer 204 but overlaps with the conductive layer 202.

The channel width of the transistor 200 is the width of the region where the semiconductor layer 208 overlaps with the conductive layer 204 in the direction perpendicular to the channel length direction. In FIGS. 22A and 22C, a channel width W200 of the transistor 200 is indicated by the dashed-dotted double-headed arrow.

As described above, the channel length L100 of the transistor 100 can have a smaller value than the resolution limit of the light exposure apparatus and the channel length L200 of the transistor 200 can have a value larger than or equal to the resolution limit of the light exposure apparatus. For example, the transistor 100 is used as the transistor required to have a high on-state current and the transistor 200 is used as the transistor required to have favorable saturation, thereby providing the high-performance semiconductor device 10. Some of the formation steps of the transistors 100 and 200 can be the same. Specifically, the semiconductor layers 108 and 208 can be formed in the same step. One part of the insulating layer 106 serves as the gate insulating layer of the transistor 100 and another part of the insulating layer 106 serves as the gate insulating layer of the transistor 200. The conductive layers 104, 204, 212*a*, and 212*b* can be formed in the same step. Consequently, the semiconductor device 10 can be manufactured with higher productivity at lower cost.

As illustrated in FIGS. 22A and 22C, the conductive layers 204 and 202 preferably extend beyond an end portion of the semiconductor layer 208 in the channel width direction of the transistor 200. In that case, as shown in FIG. 22C, the semiconductor layer 208 in the channel width direction is wholly covered with the conductive layers 204 and 202 with the insulating layer 106 between the semiconductor layer 208 and the conductive layer 204 and with the insulating layer 120 between the semiconductor layer 208 and the conductive layer 202. In such a structure, the semiconductor layer 208 can be electrically surrounded by electric fields generated by the pair of gate electrodes.

In the example in FIGS. 22A and 22C, there is no electrical connection between the conductive layer 204 (i.e., gate electrode) and the conductive layer 202 (i.e., back gate electrode). A constant potential may be supplied to one of the gate electrode and the backgate electrode, and a signal for driving the transistor 200 may be supplied to the other. In that case, when the transistor 200 is driven with the signal supplied to the other of the gate and backgate electrodes, the potential supplied to one of the gate and backgate electrodes enables control of the threshold voltage.

The conductive layer 204 is electrically connected to the conductive layer 202. In the case where the same potential is supplied to the gate and backgate electrodes, an electric field for inducing a channel can be effectively applied to the semiconductor layer 208, whereby the on-state current of the transistor 200 can be increased. This also permits miniaturization of the transistor 200. For example, an opening reaching the conductive layer 202 is provided in the insulating layers 106 and 120 and the conductive layer 204 can be formed to cover the opening.

The conductive layer 202 may be electrically connected to the conductive layer 212*a* or 212*b* (i.e., source or drain electrode). For example, an opening reaching the conductive layer 202 is provided in the insulating layer 120 and the conductive layer 212*a* or 212*b* can be formed to cover the opening.

Any of the materials that can be used for the insulating layer 110 can be used for the insulating layer 120 in contact with the top and side surfaces of the conductive layer 202.

The insulating layer 120 preferably has a stacked-layer structure. FIG. 22B and the like illustrate a structure in which the insulating layer 120 has a stacked-layer structure of an insulating layer 120*a* and an insulating layer 120*b* over the insulating layer 120*a*. For each of the insulating layers 120*a* and 120*b*, the material that can be used for the insulating layer 110 can be used.

As the insulating layer 120*b* in contact with the channel formation region in the semiconductor layer 208, a film from which oxygen is released by heating is further preferably used. When the insulating layer 120*b* releases oxygen by being heated during the manufacturing process of the transistor 200, the oxygen can be supplied to the semiconductor layer 208, particularly the channel formation region in the semiconductor layer 208. Oxygen contained in the insulating layer 120*b* is diffused into the insulating layer 120*b* and supplied to the semiconductor layer 208 through the interface between the insulating layer 120*b* and the semiconductor layer 208. When oxygen is supplied from the insulating layer 120*b* to the semiconductor layer 208, particularly to the channel formation region, oxygen vacancies ($V_O$) can be repaired, resulting in reduced oxygen vacancies ($V_O$). Consequently, the transistor can have favorable electrical characteristics and high reliability.

The diffusion coefficient of oxygen in the insulating layer 120$b$ at 350° C. is preferably higher than or equal to $1\times10^{-12}$ $cm^2$/sec, further preferably higher than or equal to $5\times10^{-12}$ $cm^2$/sec.

For the insulating layer 120$b$, the material that can be used for the insulating layer 110$b$ can be used. The insulating layer 120$b$ preferably contains oxygen and is preferably formed using any one or more of an oxide and an oxynitride. Specifically, silicon oxide or silicon oxynitride can be suitably used for the insulating layer 120$b$.

The electrical characteristics of the transistor 200 with a longer channel length are less affected by the oxygen vacancies ($V_O$) and $V_O$H in the channel formation region than those of the transistor 100 with a shorter channel length. Accordingly, the amount of oxygen supplied from the insulating layer 120$b$ to the semiconductor layer 208 may be smaller than that of oxygen supplied from the insulating layer 110$b$ to the semiconductor layer 108. The amount of oxygen released from the insulating layer 120$b$ may be smaller than that of oxygen released from the insulating layer 110$b$.

The diffusion coefficient of a substance in the insulating layer 110$b$ is preferably higher than that in the insulating layer 120$b$. In particular, the diffusion coefficient of oxygen in the insulating layer 110$b$ is preferably higher than that in the insulating layer 120$b$. This allows the transistor 100 having a short channel length to have favorable electrical characteristics and high reliability.

A material that is less likely to diffuse a metal element contained in the conductive layer 202 is preferably used as the insulating layer 120$a$ in contact with the conductive layer 202. This inhibits the metal element contained in the conductive layer 202 from being diffused into the channel formation region in the semiconductor layer 208 through the insulating layer 120.

For the insulating layer 120$a$, a material that can be used for the insulating layer 110$a$ or 110$c$ is preferably used. The insulating layer 120$a$ preferably contains nitrogen and is preferably formed using any one or more of the nitride and nitride oxide. Specifically, silicon oxide or silicon oxynitride can be suitably used for the insulating layer 120$a$, for example. Alternatively, any one or more of an oxide and an oxynitride may be used for the insulating layer 120$a$. For the insulating layer 120$a$, aluminum oxide can be used, for example. For the insulating layers 120$a$, 110$a$, and 110$c$, the same material or different materials may be used.

The amount of impurities (e.g., water and hydrogen) released from the insulating layer 120$a$ itself is preferably small. This inhibits the impurities contained in the insulating layer 120$a$ from being diffused into the channel formation region in the semiconductor layer 208 through the insulating layer 120$b$, whereby the transistor can have excellent electrical characteristics and high reliability.

Note that although the insulating layer 120 has a two-layer structure here, one embodiment of the present invention is not limited to this. The insulating layer 120 may have a single-layer structure or a stacked-layer structure of three or more layers.

Preferably, the insulating layer 120 is provided in a region in contact with at least the channel formation region in the semiconductor layer 208 to cover the top and side surfaces of the conductive layer 202. In FIG. 22B and the like, the semiconductor layer 208 includes a portion protruding beyond the end portion of the insulating layer 120. The semiconductor layer 208 includes a region in contact with the side surface of the insulating layer 120. Part of the end portion of the semiconductor layer 208 is in contact with the upper surface of the insulating layer 120 and another part of the end portion is in contact with the upper surface of the insulating layer 110. In other words, part of the lower surface of the semiconductor layer 208 is in contact with the upper surface of the insulating layer 120 and another part of the lower surface is in contact with the upper surface of the insulating layer 110. Alternatively, the insulating layer 120 may be provided in a region where the semiconductor layer 208 is provided such that the lower surface of the semiconductor layer 208 is entirely in contact with the upper surface of the insulating layer 120.

Although the thickness of the semiconductor layer 208 is entirely uniform in FIG. 22B and the like, one embodiment of the present invention is not limited to this example. The thickness of the semiconductor layer 208 in the region overlapping with the insulating layer 106 may be different from the thickness of the semiconductor layer 208 in the region not overlapping with the insulating layer 106. For example, when the openings 147$a$ and 147$b$ are formed, the semiconductor layer 208 in the region not overlapping with the insulating layer 106 is sometimes partly removed to have a smaller thickness than the semiconductor layer 208 in the region overlapping with the insulating layer 106. Alternatively, the semiconductor layer 208 in the region overlapping with any of the insulating layer 106 and the conductive layers 212$a$ and 212$b$ may differ in thickness from the semiconductor layer 208 in the region not overlapping with any of them. For example, when the conductive layers 212$a$ and 212$b$ are formed, the semiconductor layer 208 in the region not overlapping with any of the insulating layer 106 and the conductive layers 212$a$ and 212$b$ is sometimes partly removed to have a smaller thickness than the semiconductor layer 208 in the region overlapping with any of them. Alternatively, there may be a difference in the thickness of the semiconductor layer 208 among the region overlapping with the insulating layer 106, the region overlapping with any of the insulating layer 106 and the conductive layers 212$a$ and 212$b$, and the region overlapping with none of them.

In the semiconductor layer 208, the region 208D has lower electric resistance than the channel formation region. In other words, the region 208D has a higher carrier concentration, a higher oxygen vacancy density, or a higher impurity concentration than the channel formation region.

The region 208L is a region whose electric resistance is substantially equal to or higher than that of the channel formation region. In other words, the region 208L has a carrier concentration, an oxygen vacancy density, or an impurity concentration substantially equal to or higher than that of the channel formation region. The region 208L is a region whose electric resistance is substantially equal to or higher than that of the region 208D. The region 208L has a carrier concentration, an oxygen vacancy density, or an impurity concentration substantially equal to or higher than that of the region 208D.

The region 208L serves as a buffer region for relieving a drain electric field. The region 208L does not overlap with the conductive layer 204 and is thus a region where a channel is hardly formed by application of gate voltage to the conductive layer 204. The region 208L preferably has a higher carrier concentration than the channel formation region. Thus, the region 208L can serve as a lightly doped drain (LDD) region. The region 208L serving as the LDD region is provided between the channel formation region and the region 208D, whereby the transistor 200 can have a high drain breakdown voltage.

The carrier concentration in the semiconductor layer 208 preferably has a distribution such that the carrier concentration is increased in the following order: the region 208L and the region 208D. Providing the region 208L between the channel formation region and the region 208D can keep the carrier concentration of the channel formation region extremely low even when impurities such as hydrogen diffuse from the region 208D during the manufacturing process.

The carrier concentration is not necessarily uniform in the region 208L; in some cases, the carrier concentration has a falling gradient from the region 208D side toward the channel formation region. For example, one or both of the hydrogen concentration and the oxygen vacancy ($V_O$) concentration in the region 208L may have a gradient that decreases from the region 208D side to the channel formation region side.

When an impurity element is added to the semiconductor layer 208 to form the regions 208L and 208D, the impurity element may be supplied to the semiconductor layer 108 through the insulating layer 106 with the use of the conductive layer 104 as a mask. Consequently, a region 108L is formed in the region of the semiconductor layer 108 not overlapping with the conductive layer 104. Note that in the transistor 100, a region of the semiconductor layer 108 in contact with the conductive layer 112*b* serves as the source region or the drain region. The region 108L is formed in part of the source region or the drain region. Note that the concentration of the impurity element in the region 108L may be different from that in the region 208L. The region 108L is not necessarily formed. For example, in the case where the conductive layer 104 is extended to cover the end portion of the semiconductor layer 108, the conductive layer 104 masks the whole semiconductor layer 108 to preclude the supply of the impurity element to the semiconductor layer 108, and the region 108L is not formed.

As illustrated in FIGS. 22A and 22B, parts of the end portions of the conductive layers 212*a* and 212*b* are preferably positioned on the inner sides of the openings 147*a* and 147*b*, respectively. In other words, parts of the end portions of the conductive layers 212*a* and 212*b* are preferably in contact with the semiconductor layer 208 in the openings 147*a* and 147*b*, respectively. Accordingly, the region in contact with the conductive layer 212*a* can be adjacent to one of the pair of regions 208D and the region in contact with the conductive layer 212*b* can be adjacent to the other of the pair of regions 208D.

There is no limitation on the top surface shapes of the openings 147*a* and 147*b*. As the top surface shapes of the openings 147*a* and 147*b*, the shapes that can be used for the openings 141 and 143 can be employed. Although the top surface shapes of the openings 147*a* and 147*b* are quadrangles with rounded corners unlike the top surface shapes of the openings 141 and 143 in FIG. 22A and the like, one embodiment of the present invention is not limited to this. Note that the top surface shapes of the openings 147*a* and 147*b* may be the same as those of the openings 141 and 143.

Although the conductive layers 212*a* and 212*b* are formed in the same process as the conductive layer 204 here, one embodiment of the present invention is not limited to this. The formation steps of the conductive layers 212*a* and 212*b* may be different from that of the conductive layer 204. For example, the conductive layers 104 and 204 are formed over the insulating layer 106 and an impurity element is supplied to the semiconductor layer 208 with the use of the conductive layer 204 as a mask, whereby the source region and the drain region are formed. The insulating layer 195 is formed over the conductive layers 104 and 204, an opening reaching the source region and an opening reaching the drain region are formed in the insulating layer 106 and the insulating layer 195, and the conductive layers 212*a* and 212*b* can be formed to cover the openings.

[Semiconductor Layers 108 and 208]

Here, metal oxides applicable to the semiconductor layers 108 and 208 are specifically described. Examples of the metal oxide include indium oxide, gallium oxide, and zinc oxide. The metal oxide preferably contains at least indium or zinc. The metal oxide preferably contains two or three selected from indium, an element M, and zinc. The element M is a metal element or metalloid element that has a high bonding energy with oxygen, such as a metal element or metalloid element whose bonding energy with oxygen is higher than that of indium. Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably one or more of the above elements, further preferably one or more selected from aluminum, gallium, tin, and yttrium, and still further preferably one or more of gallium and tin. In this specification and the like, a metal element and a metalloid element may be collectively referred to as a “metal element” and a “metal element” in this specification and the like may refer to a metalloid element.

For example, the semiconductor layers 108 and 208 can each be formed using indium zinc oxide (also referred to as In—Zn oxide), indium tin oxide (In—Sn oxide or ITO), indium titanium oxide (In—Ti oxide), indium gallium oxide (In—Ga oxide), indium tungsten oxide (In—W oxide or IWO), indium gallium aluminum oxide (In—Ga—Al oxide), indium gallium tin oxide (In—Ga—Sn oxide), gallium zinc oxide (also referred to as Ga—Zn oxide or GZO), aluminum zinc oxide (also referred to as Al—Zn oxide or AZO), indium aluminum zinc oxide (also referred to as In—Al—Zn oxide or IAZO), indium tin zinc oxide (also referred to as In—Sn—Zn oxide or ITZO (registered trademark)), indium titanium zinc oxide (In—Ti—Zn oxide), indium gallium zinc oxide (also referred to as In—Ga—Zn oxide or IGZO), indium gallium tin zinc oxide (also referred to as In—Ga—Sn—Zn oxide or IGZTO), or indium gallium aluminum zinc oxide (also referred to as In—Ga—Al—Zn oxide, IGAZO, IGZAO, or IAGZO). Alternatively, indium tin oxide containing silicon (also referred to as ITSO), gallium tin oxide (Ga—Sn oxide), aluminum tin oxide (Al—Sn oxide), or the like can be used.

By increasing the proportion of the number of indium atoms in the total number of atoms of all the metal elements included in the metal oxide, the field-effect mobility of the transistor can be increased. In addition, the transistor can have a high on-state current.

Instead of indium or in addition to indium, the metal oxide may contain one or more kinds of metal elements whose period number in the periodic table is large. The larger the overlap between orbits of metal elements is, the more likely it is that the metal oxide will have high carrier conductivity. Thus, when a metal element with a large period number is included in the metal oxide, the field-effect mobility of the transistor can be increased in some cases. As examples of the metal element with a large period number, the metal elements belonging to Period 5 and those belonging to Period 6 are given. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds selected from nonmetallic elements. By containing a non-metallic element, the metal oxide sometimes has an increased carrier concentration, a reduced band gap, or the like, in which case the transistor can have increased field-effect mobility. Examples of the nonmetallic element include carbon, nitrogen, phosphorus, sulfur, selenium, fluorine, chlorine, bromine, and hydrogen.

By increasing the proportion of the number of zinc atoms in the total number of atoms of all the metal elements included in the metal oxide, the metal oxide has high crystallinity, so that diffusion of impurities in the metal oxide can be inhibited. Consequently, a change in electrical characteristics of the transistor is suppressed and the transistor can have high reliability.

By increasing the proportion of the number of element M atoms in the total number of atoms of all the metal elements included in the metal oxide, oxygen vacancies ($V_O$) can be inhibited from being formed in the metal oxide. Accordingly, generation of carriers due to oxygen vacancies ($V_O$) is inhibited, which makes the off-state current of the transistor low. Furthermore, changes in the electrical characteristics of the transistor can be reduced to improve the reliability of the transistor.

The composition of the metal oxide used for the semiconductor layers 108 and 208 affects the electrical characteristics and reliability of the transistor. Therefore, by determining the composition of the metal oxide in accordance with the electrical characteristics and reliability required for the transistor, the semiconductor device can have both excellent electrical characteristics and high reliability.

When the metal oxide is an In—M—Zn oxide, the proportion of the number of In atoms is preferably higher than or equal to that of the number of M atoms in the In—M—Zn oxide. For example, an In—M—Zn oxide with metal elements in any of the following atomic ratios can be used: In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:1, In:M:Zn=10:1:3, In:M:Zn=10:1:4, In:M:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, or the vicinity thereof. Note that a composition in the neighborhood of an atomic ratio includes ±30% of an intended atomic ratio. By increasing the proportion of the number of indium atoms in the metal oxide, the on-state current, field-effect mobility, or the like of the transistor can be improved.

The proportion of the number of In atoms may be less than that of the number of M atoms in the In—M—Zn oxide. Examples of the atomic ratio of the metal elements of such an In—M—Zn oxide include In:M:Zn=1:3:2, In:M:Zn=1:3:3, and In:M:Zn=1:3:4 and a composition in the neighborhood of any of these atomic ratios. By increasing the proportion of the number of M atoms in the metal oxide, generation of oxygen vacancies ($V_O$) can be suppressed.

In the case where a plurality of metal elements are contained as the element M, the sum of the proportions of the numbers of atoms of these metal elements can be used as the proportion of the number of element M atoms.

In this specification and the like, the proportion of the number of indium atoms in the total number of atoms of all the metal elements contained is sometimes referred to as indium content percentage. The same applies to other metal elements.

The use of a material with a high indium content for the semiconductor layers 108 and 208 enables an increase in the on-state current or field-effect mobility of the transistors and the like. Furthermore, the element M included in the semiconductor layers 108 and 208 can inhibit generation of oxygen vacancies ($V_O$). The content of the element M (the proportion of the number of atoms of the element M in the total number of atoms of all the metal elements contained) is preferably higher than or equal to 0.1% and lower than or equal to 3%, further preferably higher than or equal to 0.1% and lower than or equal to 2%. Accordingly, it is possible to form a transistor having favorable electric characteristics. For example, a metal oxide with In:M:Zn of 40:1:10 or the vicinity thereof is preferably used. The element M included is preferably one or more of the above elements, further preferably one or more selected from aluminum, gallium, tin, and yttrium. Specifically, a metal oxide with In:Sn:Zn of 40:1:10 or the vicinity thereof can be used. Alternatively, a metal oxide with In:Al:Zn of 40:1:10 or the vicinity thereof can be used.

In the case where a metal oxide having a polycrystalline structure is used for the semiconductor layers 108 and 208, the grain boundary becomes a recombination center and captures carriers and thus decreases the on-state current and field-effect mobility of the transistors, in some cases. A metal oxide with a composition that tends to form a polycrystalline structure is preferably used together with an element that hinders crystallization. For example, indium tin oxide containing silicon (ITSO) is less likely to form a polycrystalline structure than indium tin oxide (ITO) and can be used for the semiconductor layers 108 and 208. In the case where ITSO is used, the content of the element M (the proportion of the number of silicon atoms of in the total number of atoms of all the metal elements contained) is preferably higher than or equal to 1% and lower than or equal to 20%, further preferably higher than or equal to 3% and lower than or equal to 20%, further preferably higher than or equal to 3% and lower than or equal to 15%, still further preferably higher than or equal to 5% and lower than or equal to 15%. Specifically, a metal oxide with In:Sn:Si of 45:5:4 or 95:5:8 or the vicinity thereof can be used.

Analysis of the composition of the semiconductor layers 108 and 208 can be performed by energy dispersive X-ray spectrometry (EDX), X-ray photoelectron spectrometry (XPS), inductively coupled plasma-mass spectrometry (ICP-MS), inductively coupled high-frequency plasma-atomic emission spectrometry (ICP-AES), or the like, for example. Alternatively, these methods may be combined as appropriate to be employed for analysis. Note that as for an element whose content is low, the actual content may be different from the content obtained by analysis because of the influence of the analysis accuracy. In the case where the content of the element M is low, for example, the content of the element M obtained by analysis may be lower than the actual content.

A sputtering method or an atomic layer deposition (ALD) method can be used for forming a film of the metal oxide. Note that in the case where the metal oxide is formed by a sputtering method, the atomic ratio of the deposited metal oxide may be different from the atomic ratio of a sputtering target. In particular, the zinc content of the deposited metal oxide may be reduced to approximately 50% of that of the sputtering target.

The semiconductor layers 108 and 208 may each have a stacked-layer structure of two or more metal oxide layers. The two or more metal oxide layers included in the semiconductor layers 108 and 208 may each have the same composition or substantially the same compositions. Employing a stacked-layer structure of metal oxide layers having the same composition can reduce the manufacturing cost because the metal oxide layers can be formed using the same sputtering target.

The two or more metal oxide layers included in each of the semiconductor layers 108 and 208 may have different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be employed. In particular, gallium, aluminum, or tin is preferably used as the element M. The elements M in the first metal oxide layer and the second metal oxide layer may be the same or different. For example, the first metal oxide layer and the second metal oxide layer may be IGZO layers having different compositions.

For example, a stacked-layer structure of a first metal oxide layer having In:Zn=4:1 [atomic ratio] or a composition in the neighborhood thereof and a second metal oxide layer having In:M:Zn=1:1:1 [atomic ratio] or a composition in the neighborhood thereof and being formed over the first metal oxide layer can be employed.

A stacked-layer structure of one selected from indium oxide, indium gallium oxide, and IGZO, and one selected from IAZO, IAGZO, and ITZO (registered trademark) may be employed, for example.

In the case where the first metal oxide layer containing a first metal oxide and the second metal oxide layer containing a second metal oxide form a stacked-layer structure and have the same or substantially the same compositions, the boundary (interface) between the first metal oxide layer and the second metal oxide layer cannot clearly be observed in some cases.

It is preferable that the semiconductor layers 108 and 208 include a metal oxide layer having crystallinity. Examples of the structure of a metal oxide having crystallinity include a c-axis aligned crystalline (CAAC) structure, a polycrystalline structure, and a nano-crystal (nc) structure. By using a metal oxide layer having crystallinity, the density of defect states in the semiconductor layers 108 and 208 can be reduced, which enables the semiconductor device to have high reliability.

The use of a metal oxide having high crystallinity in a channel formation region can reduce the density of defect states in the channel formation region. By contrast, the use of a metal oxide having low crystallinity makes it possible that a high current flows in the transistor.

In the case where the metal oxide is formed by a sputtering method, the higher the substrate temperature in the formation is, the higher the crystallinity of the metal oxide can be. For example, the substrate temperature in formation can be adjusted by the temperature of the stage where the substrate is placed in formation. The crystallinity of the metal oxide can be increased as the proportion of a flow rate of an oxygen gas to the whole formation gas (also referred to as oxygen flow rate ratio) used in formation or the oxygen partial pressure in the treatment chamber is higher.

The crystallinity of the semiconductor layers 108 and 208 can be analyzed with an X-ray diffraction (XRD) pattern, a transmission electron microscope (TEM) image, or an electron diffraction (ED) pattern, for example. Alternatively, these methods may be combined as appropriate to be employed for analysis.

In the case where a metal oxide is used for the semiconductor layers 108 and 208, the amount of $V_OH$ in the channel formation region is preferably reduced as much as possible so that each semiconductor layer becomes a highly purified intrinsic or substantially highly purified intrinsic semiconductor layer. It is important to remove impurities such as water and hydrogen in a metal oxide (sometimes described as dehydration or dehydrogenation treatment) and to repair oxygen vacancies ($V_O$) by supplying oxygen to the metal oxide to obtain an oxide semiconductor whose $V_OH$ is reduced enough. When a metal oxide in which impurities such as $V_OH$ are sufficiently reduced is used for a channel formation region in a transistor, the transistor can have stable electrical characteristics. Note that repairing oxygen vacancies ($V_O$) by supplying oxygen to a metal oxide semiconductor is sometimes referred to as oxygen adding treatment.

When a metal oxide is used for the semiconductor layers 108 and 208, the carrier concentration in the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet still further preferably lower than $1\times10^{13}$ $cm^{-3}$, yet still further preferably lower than $1\times10^{12}$ $cm^{-3}$. The minimum carrier concentration in the channel formation region can be $1\times10^{9}$ $cm^{-3}$, for example.

A change in electrical characteristics of an OS transistor due to irradiation with radiation is small, i.e., an OS transistor has high resistance to radiation; thus, an OS transistor can be used even in an environment where radiation can enter. It can also be said that an OS transistor has high reliability against radiation. For example, an OS transistor can be used for a pixel circuit of an X-ray flat panel detector. Moreover, an OS transistor can be used for a semiconductor device used in space. Examples of radiation include electromagnetic radiation (e.g., X-rays and gamma rays) and particle radiation (e.g., alpha rays, beta rays, a proton beam, and a neutron beam).

The semiconductor layers 108 and 208 may each include a layered material functioning as a semiconductor. The layered material generally refers to a group of materials having a layered crystal structure. In the layered crystal structure, layers formed by covalent bonding or ionic bonding are stacked with bonding such as the van der Waals binding, which is weaker than covalent bonding or ionic bonding. The layered material has high electrical conductivity in a monolayer, that is, high two-dimensional electrical conductivity. When a material that serves as a semiconductor and has high two-dimensional electrical conductivity is used for the channel formation region, the transistor can have a high on-state current.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for the channel formation region of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

[Conductive Layers 112*a*, 112*b*, 104, 204, 212*a*, 212*b*, and 202]

The conductive layers 112*a*, 112*b*, 104, 204, 212*a*, 212*b*, and 202 may each have a single-layer structure or a stacked-layer structure of two or more layers. The conductive layers 112*a*, 112*b*, 104, 204, 212*a*, 212*b*, and 202 can each be formed using, for example, one or more of chromium, copper, aluminum, gold, silver, zinc, tantalum, titanium, tungsten, manganese, nickel, iron, cobalt, molybdenum, and niobium, or an alloy containing one or more of these metals as its components. For the conductive layers 112*a*, 112*b*, 104, 204, 212*a*, 212*b*, and 202, a conductive material with low resistance that contains one or more of copper, silver, gold, and aluminum can be suitably used. Copper or aluminum is particularly preferable because of its high mass-productivity.

For the conductive layers 112*a*, 112*b*, 104, 204, 212*a*, 212*b*, and 202, a conductive metal oxide (also referred to as an oxide conductor) can be used. Examples of an oxide conductor (OC) include indium oxide, zinc oxide, In—Sn oxide (ITO), In—Zn oxide, In—W oxide, In—W—Zn oxide, In—Ti oxide, In—Ti—Sn oxide, In—Sn—Si oxide (also referred to as ITO containing silicon or ITSO), zinc oxide to which gallium is added, and In—Ga—Zn oxide. A conductive oxide containing indium is particularly preferable because of its high conductivity.

When an oxygen vacancy ($V_O$) is formed in a metal oxide having semiconductor characteristics and hydrogen is added to the oxygen vacancy ($V_O$), a donor level is formed in the vicinity of the conduction band. As a result, the conductivity of the metal oxide is increased, and thus, the metal oxide becomes a conductor. The metal oxide having become a conductor can be referred to as an oxide conductor.

The conductive layers 112*a*, 112*b*, 104, 204, 212*a*, 212*b*, and 202 may each have a stacked-layer structure of a conductive film containing the above-described oxide conductor (metal oxide) and a conductive film containing a metal or an alloy. The use of the conductive film containing a metal or an alloy can reduce the wiring resistance.

A Cu—X alloy film (X is Mn, Ni, Cr, Fe, Co, Mo, Ta, or Ti) may be used for the conductive layers 112*a*, 112*b*, 104, 204, 212*a*, 212*b*, and 202. The use of a Cu—X alloy film results in lower manufacturing cost because the film can be processed by wet etching.

Note that the conductive layers 112*a*, 112*b*, 104, 204, 212*a*, 212*b*, and 202 may be formed using the same material or different materials.

Each of the conductive layers 112*a* and 112*b* includes a region that is in contact with the semiconductor layer 108. When the semiconductor layer 108 is formed using a metal oxide and the conductive layers 112*a* and 112*b* are formed using a metal that is likely to be oxidized such as aluminum, an insulating oxide (e.g., aluminum oxide) is formed between the conductive layer 112*a* and the semiconductor layer 108 and between the conductive layer 112*b* and the semiconductor layer 108, which might inhibit continuity between the conductive layer 112*a* or 112*b* and the semiconductor layer 108. Therefore, the conductive layers 112*a* and 112*b* are preferably formed using a conductive material that is less likely to be oxidized, a conductive material that maintains low electric resistance even when oxidized, or an oxide conductive material.

For the conductive layers 112*a* and 112*b*, for example, titanium, tantalum nitride, titanium nitride, a nitride containing titanium and aluminum, a nitride containing tantalum and aluminum, ruthenium, ruthenium oxide, ruthenium nitride, an oxide containing strontium and ruthenium, or an oxide containing lanthanum and nickel is preferably used. These materials are preferable because they are conductive materials that are less likely to be oxidized or materials that maintain low electric resistance even when oxidized. Note that in the case where the conductive layer 112*a* has a stacked-layer structure, at least the layer thereof that is in contact with the semiconductor layer 108 is preferably formed using a conductive material that is less likely to be oxidized.

The conductive layers 112*a* and 112*b* can each be formed using any of the above-described oxide conductors. Specifically, a conductive oxide such as indium oxide, zinc oxide, ITO, In—Zn oxide, In—W oxide, In—W—Zn oxide, In—Ti oxide, In—Ti—Sn oxide, In—Sn oxide containing silicon, or zinc oxide to which gallium is added can be used.

For the conductive layers 112*a* and 112*b*, a nitride conductor may be used. Examples of the nitride conductor include tantalum nitride and titanium nitride.

In the capacitor 150, the conductive layer 112*b* is provided over the insulating layer 120*b*. As described above, the conductive layer 112*b* is preferably formed using a conductive material that is less likely to be oxidized, a conductive material that maintains low electric resistance even when oxidized, or an oxide conductive material. The amount of oxygen released from the insulating layer 120*b* is smaller than that of oxygen released from the insulating layer 110*b*. Accordingly, oxidization of the conductive layer 112*b* including the region in contact with the insulating layer 120*b* to increase the electric resistance of the conductive layer 112*b* is less likely to occur.

The conductive layers 112*a*, 112*b*, and 104 may each have a stacked-layer structure. For example, the conductive layer 112*a* may have a two-layer structure. Specifically, for example, the conductive layer 112*a* may have a stacked-layer structure of the conductive layer 112*a*_1 (not illustrated) and the conductive layer 112*a*_2 (not illustrated) over the conductive layer 112*a*_1.

The conductive layer 112*a*_2 including a region in contact with the semiconductor layer 108 is preferably formed using a conductive material that is less likely to be oxidized, a conductive material that maintains low electric resistance even when oxidized, or an oxide conductive material. The description of the conductive layer 112*a* can be referred to for the material that can be used for the conductive layer 112*a*_2.

The conductive layer 112*a*_1 does not have a region in contact with the semiconductor layer 108 and there is no limitation on the material. For example, for the conductive layer 112*a*_1, a material having lower electrical resistivity than the conductive layer 112*a*_2 is preferably used. Consequently, the electric resistance of the conductive layers 112*a* can be reduced. For example, In—Sn—Si oxide (ITSO) is used for the conductive layer 112*a*_2 and copper or tungsten can be used for the conductive layer 112*a*_1.

The thicknesses of the conductive layers 112*a*_1 and 112*a*_2 may be the same, substantially the same, or different. For example, the conductive layer 112*a*_1 may contain a material having lower resistance and have a larger thickness than the conductive layer 112*a*_2, whereby the conductive layers 112*a* has reduced electric resistance.

The end portions of the conductive layers 112*a*_1 and 112*a*_2 may be aligned or substantially aligned with each other or are not necessarily aligned with each other. For instance, the conductive layer 112*a*_2 can be provided to cover the conductive layer 112$a$_1. In this case, the conductive layer 112$a$_2 is in contact with the top and side surfaces of the conductive layer 112$a$_1; that is, the conductive layer 112$a$_2 includes a portion protruding beyond the end portion of the conductive layer 112$a$_1.

The above-described structure of the insulating layer 112$a$ can be applied to other structure examples.

[Insulating Layer 106]

The insulating layer 106 may have a single-layer structure or a stacked-layer structure of two or more layers. The insulating layer 106 preferably includes one or more inorganic insulating films. Examples of a material that can be used for the inorganic insulating film include an oxide, a nitride, an oxynitride, and a nitride oxide. For the insulating layer 106, a material that can be used for the insulating layer 110 can be used.

The insulating layer 106 includes regions that are in contact with the semiconductor layers 108 and 208. In the case where the semiconductor layers 108 and 208 are each formed using an oxide semiconductor, at least the films of the insulating layer 106 that are in contact with the semiconductor layers 108 and 208 are preferably formed using any of the above-described oxide and oxynitride. A film from which oxygen is released by heating is further preferably used for the insulating layer 106.

Specifically, in the case where the insulating layer 106 has a single-layer structure, the insulating layer 106 is preferably formed using an oxide or an oxynitride. Specifically, silicon oxide or silicon oxynitride can be suitably used for the insulating layer 106.

In the case of the insulating layer 106 having a stacked-layer structure, preferably, oxide or oxynitride is contained in the insulating film in contact with the semiconductor layers 108 and 208 while nitride or nitride oxide is contained in the insulating film in contact with the conductive layers 104 and 204. As the oxide or the oxynitride, for example, silicon oxide or silicon oxynitride can be used. As the nitride or the nitride oxide, silicon nitride or silicon nitride oxide can be used.

Silicon nitride and silicon nitride oxide can be used for the insulating layer 106 because they release fewer impurities (e.g., water and hydrogen) and are less likely to transmit oxygen and hydrogen. Inhibiting diffusion of impurities from the insulating layer 106 to the semiconductor layers 108 and 208 results in favorable electrical characteristics and high reliability of the transistor.

A miniaturized transistor including a thin gate insulating layer may have a high gate leakage current. When a high dielectric constant material (also referred to as a high-k material) is used for the gate insulating layer, the voltage at the time of operation of the transistor can be reduced while the physical thickness is maintained. Examples of the high-k material usable for the insulating layer 106 include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

[Insulating Layer 195]

The insulating layer 195 serving as a protective layer for the transistors 100 and 200 and the capacitor 150 preferably contains a material into which an impurity is not easily diffused. Providing the insulating layer 195 can effectively inhibit diffusion of impurities into the transistors from the outside and increase the reliability of the semiconductor device. Examples of the impurities include water and hydrogen.

The insulating layer 195 can be an insulating layer including an inorganic material or an insulating layer including an organic material. For example, an inorganic insulating material such as an oxide, an oxynitride, a nitride oxide, or a nitride can be used for the insulating layer 195. Specifically, the insulating layer 195 can be formed using one or more of silicon nitride, silicon nitride oxide, silicon oxynitride, aluminum oxide, aluminum oxynitride, aluminum nitride, hafnium oxide, and hafnium aluminate. One or both of an acrylic resin and a polyimide resin, which are organic materials, can be used. As an organic material, for example, one or both of an acrylic resin and a polyimide resin can be used. As an organic material, a photosensitive material may be used. A stack including two or more of the above insulating films may also be used. The insulating layer 195 may have a stacked-layer structure of an insulating layer including an inorganic material and an insulating layer including an organic material.

[Substrate 102]

There is no particular limitation on the properties of the material of the substrate 102 as long as the material has heat resistance high enough to withstand at least heat treatment to be performed later. For example, a single crystal semiconductor substrate or a polycrystalline semiconductor substrate of silicon or silicon carbide, a compound semiconductor substrate containing silicon germanium or the like as a material, an SOI substrate, a glass substrate, a ceramic substrate, a quartz substrate, a sapphire substrate, a ceramic substrate, or an organic resin substrate may be used as the substrate 102. The substrate 102 may be provided with a semiconductor element. Note that the shape of the semiconductor substrate and an insulating substrate may be circular or square.

A flexible substrate may be used as the substrate 102, and the transistor 100 and the like may be formed directly on the flexible substrate. Alternatively, a separation layer may be provided between the substrate 102 and the transistor 100 and the like. The separation layer can be used for separation of part or the whole of a semiconductor device completed thereover from the substrate 102 and transferring the part or the whole of the semiconductor device onto another substrate. In that case, the transistor 100 and the like can be transferred onto a substrate having low heat resistance or a flexible substrate as well.

According to one embodiment of the present invention, a vertical transistor such as the transistor 100 is preferably used as any of the transistors M1 and M3 to M6 in the semiconductor device 20A described in Embodiment 1, for example. For example, the transistor 200 may be used as the transistor M2 and the capacitor 150 may be used as any of the capacitors C1 and C2. As the capacitors C1 and C2, a capacitor C11 (see FIG. 33B) described later in Embodiment 3 and a capacitor C12 (see FIG. 33A) may be used.

Structure Example 2

Figure 23A:
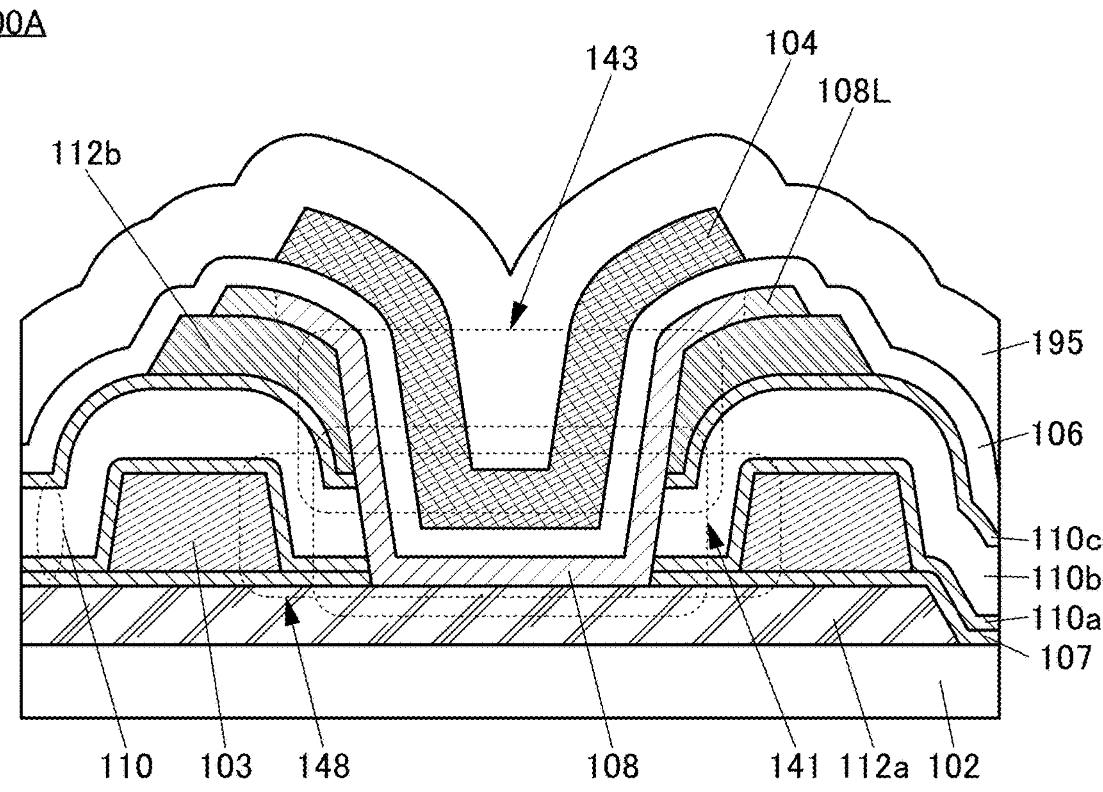
FIGS. 23A and 23B are cross-sectional views each showing a structure example of a semiconductor device.

FIG. 23A is a cross-sectional view of a transistor 100A that can be used in the semiconductor device of one embodiment of the present invention. The transistor 100A is different from the transistor 100 illustrated in FIG. 20B and the like in including a back gate. The above description can be referred to for the transistor 100; thus, the detailed description thereof is omitted.

The transistor 100A includes the conductive layers 112$a$, 103, 112$b$, and 104, the insulating layers 107 and 110, 106, and the semiconductor layer 108. The layers constituting the transistor 100A may each have a single-layer structure or a stacked-layer structure.

The conductive layer 112*a* is provided over the substrate 102. The conductive layer 112*a* serves as one of a source electrode and a drain electrode of the transistor 100A.

The insulating layer 107 is positioned over the conductive layer 112*a*. The insulating layer 107 is provided so as to cover the upper and side surfaces of the conductive layer 112*a*.

The conductive layer 103 is positioned over the insulating layer 107. The conductive layer 112*a* and the conductive layer 103 are electrically insulated from each other by the insulating layer 107. In the conductive layer 103, an opening 148 reaching the insulating layer 107 is provided in a region overlapping with the conductive layer 112*a*.

The insulating layer 110 is provided over the insulating layer 107 and the conductive layer 103. The insulating layer 110 is provided so as to cover an upper surface and a side surface of the conductive layer 103 and an upper surface of the insulating layer 107.

The insulating layer 110 preferably has a stacked-layer structure. The insulating layer 110 illustrated in FIG. 23A has a stacked-layer structure of the insulating layer 110*a*, the insulating layer 110*b* over the insulating layer 110*a*, and the insulating layer 110*c* over the insulating layer 110*b*, for example.

The insulating layer 110*a* is provided over the insulating layer 107 and the conductive layer 103. The insulating layer 110*a* is provided to cover the upper and side surfaces of the conductive layer 103. The insulating layer 110*a* is provided to cover part of the opening 148. The insulating layer 110*a* is in contact with the insulating layer 107 in the opening 148.

The insulating layer 110*b* is provided over the insulating layer 110*a*, and the insulating layer 110*c* is provided over the insulating layer 110*b*. The insulating layers 107 and 110 include the opening 141 reaching the conductive layer 112*a*.

The conductive layer 112*b* is positioned over the insulating layer 110*c*. The conductive layer 112*b* includes the opening 143 overlapping with the opening 141. A conductive layer 112*b* serves as the other of the source electrode and the drain electrode of the transistor 100A. The conductive layer 112*a* has a region overlapping with the conductive layer 112*b* with the insulating layers 107 and 110 therebetween.

In this specification and the like, the top-view shape of the opening 148 refers to the shape of the end portion of the upper or lower surface of the conductive layer 103 on the opening 148 side. Note that there is no limitation on the top-view shape of the opening 148 as in the cases of the openings 141 and 143.

When the top-view shape of each of the openings 141 and 148 is a circle, the openings 141 and 148 are preferably provided concentrically. This equalizes the shortest distances from the semiconductor layer 108 to the conductive layer 103 on the left and right sides of the opening 141 to each other in the cross-sectional view. The openings 141 and 148 are not concentrically provided in some cases.

The semiconductor layer 108 is in contact with the upper surface of the conductive layer 112*a*, a side surface of the insulating layer 107, the side surface of the insulating layer 110, and the upper and side surfaces of the conductive layer 112*b*. The semiconductor layer 108 is provided to cover the openings 141 and 143. The semiconductor layer 108 is provided in contact with the side surfaces of the insulating layers 107 and 110 on the opening 141 side and the end portion of the conductive layer 112*b* on the opening 143 side (i.e., part of the upper surface of the conductive layer 112*b* and the side surface of the conductive layer 112*b* on the opening 143 side). The semiconductor layer 108 is in contact with the conductive layer 112*a* through the openings 141 and 143.

Although the end portion of the semiconductor layer 108 is in contact with the upper surface of the conductive layer 112*b* in the example shown in FIG. 23A, one embodiment of the present invention is not limited to this example. The semiconductor layer 108 may cover the end portion of the conductive layer 112*b*, and the end portion of the semiconductor layer 108 may be in contact with the upper surface of the insulating layer 110*c*.

The insulating layer 106 is positioned over the insulating layer 110*c*, the semiconductor layer 108, and the conductive layer 112*b*. The insulating layer 106 is provided to cover the openings 141 and 143 with the semiconductor layer 108 between the insulating layer 106 and the openings. Part of the insulating layer 106 serves as a gate insulating layer of the transistor 100A.

The conductive layer 104 is positioned over the insulating layer 106. The conductive layer 104 overlaps with the semiconductor layer 108 with the insulating layer 106 therebetween. The conductive layer 104 serves as the gate electrode of the transistor.

In the transistor 100A, a region of the semiconductor layer 108 overlaps with the conductive layer 104 with the insulating layer 106 provided between the region and the conductive layer 104 and overlaps with the conductive layer 103 with part (specifically, the insulating layers 110*a* and 110*b*) of the insulating layer 110 provided between the region and the conductive layer 103. In other words, the region of the semiconductor layer 108 is interposed between the conductive layer 104 and the conductive layer 103 with the insulating layer 106 provided between the region and the conductive layer 104 and with part (specifically, the insulating layers 110*a* and 110*b*) of the insulating layer 110 provided between the region and the conductive layer 103.

The conductive layer 103 serves as a back gate electrode of the transistor 100A. Part of the insulating layer 110 serves as a back gate insulating layer of the transistor 100A.

Since the transistor 100A includes the back gate electrode, the potential of a back channel side of the semiconductor layer 108 can be fixed, so that the saturation of the $I_d$-$V_d$ characteristics of the transistor 100A can be improved.

Since the back gate electrode makes it possible to fix the potential of the back channel side of the semiconductor layer 108, a shift of the threshold voltage of the transistor 100A can be inhibited. A shift in the threshold voltage of the transistor might increase the drain current flowing at a gate voltage of 0 V (hereinafter, also referred to as cut-off current). When the threshold voltage shift of the transistor 100A is inhibited, the cut-off current can be reduced. Note that a low cut-off current is sometimes referred to as normally-off characteristics.

Although the semiconductor layer 108, the insulating layer 106, and the conductive layer 104 cover the openings 141 and 143 in FIG. 23A, for example, one embodiment of the present invention is not limited thereto. A step may be formed between the conductive layer 112*a* and the insulating layers 107 and 110 and the conductive layer 112*b*, and the semiconductor layer 108, the insulating layer 106, and the conductive layer 104 may be provided along with the step.

Structure Example 3

Figure 23B:
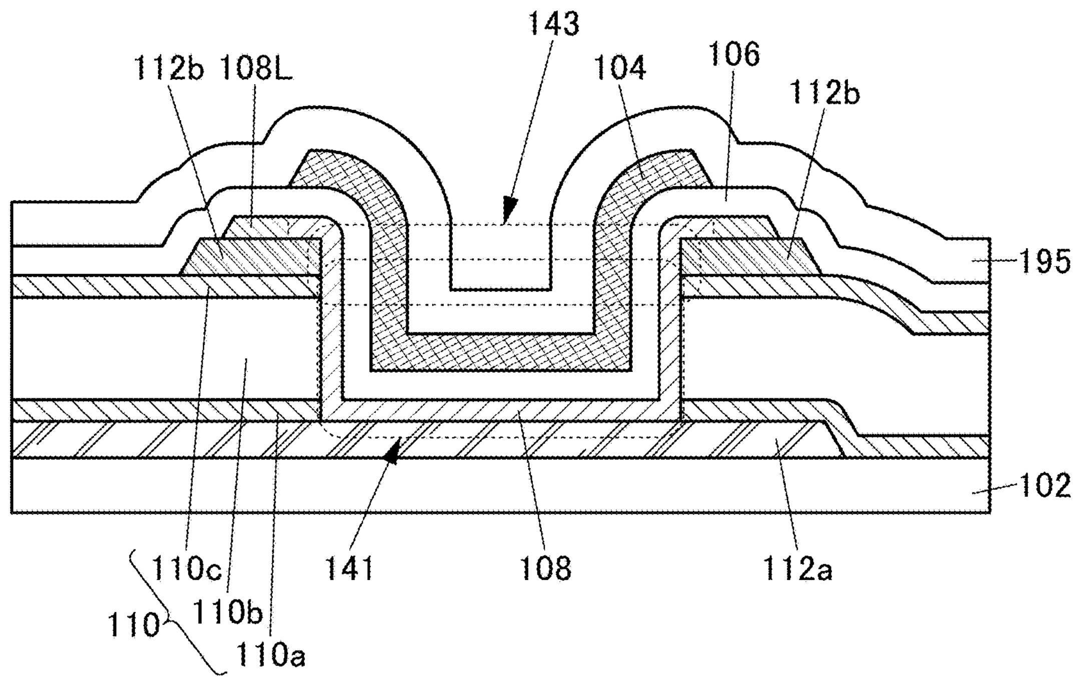

FIG. 23B is a cross-sectional view of a transistor 100B that can be used in the semiconductor device of one embodiment of the present invention. The transistor 100B is different from the transistor 100 illustrated in FIG. 20B and the like mainly in that the side surface of the insulating layer 110 on the opening 141 side has a vertical shape. In other words, the transistor 100B has a structure in which the angle θ110 in FIG. 21B is 90°. The above description can be referred to for the transistor 100; thus, the detailed description thereof is omitted.

Structure Example 4

FIG. 24A is an equivalent circuit diagram of a transistor 100C that can be used in the semiconductor device of one embodiment of the present invention. The transistor 100C is a transistor group including a transistor 100_1 to a transistor 100_*p* (p is an integer greater than or equal to 2). The transistor 100C can be regarded as one transistor, in which the transistors 100_1 to 100_*p* are connected in parallel.

The gate electrodes of the transistors 100_1 to 100_*p* are electrically connected to each other. The source electrodes of the transistors 100_1 to 100_*p* are electrically connected to each other. The drain electrodes of the transistors 100_1 to 100_*p* are electrically connected to each other.

Figure 25:
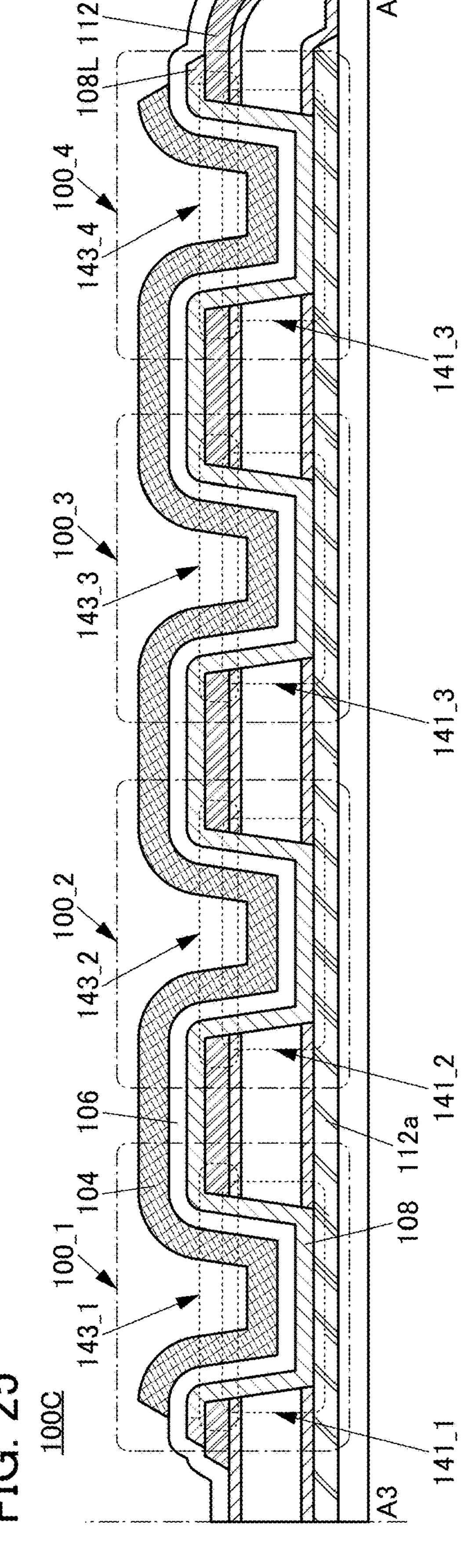
FIG. 25 is a cross-sectional view showing a structure example of a semiconductor device.

Although the transistors 100_1 to 100_*p* are shown as n-channel transistors in FIG. 24A, one embodiment of the present invention is not limited to this example. The transistors 100_1 to 100_*p* may be p-channel transistors The case where p is 4 is specifically described as an example. FIG. 24B is an equivalent circuit diagram of a transistor 100C that can be used in the semiconductor device of one embodiment of the present invention. FIG. 24C is a top view of the transistor 100C. FIG. 25 shows a cross-sectional view taken along the dashed-dotted line A3-A4 in FIG. 24C.

The transistor 100C includes the transistor 100_1 to a transistor 100_4. The transistors 100_1 to 100_4 can each employ the above-described structure of the transistor 100. Although the transistor 100 is described as an example here, one embodiment of the present invention is not limited thereto. The transistors 100_1 to 100_4 may each employ either of the transistors 100A and 100B.

Although the transistors 100_1 to 100_4 are arranged in two rows and two columns in FIG. 24C and the like, there is no limitation on the transistor arrangement. For example, the transistors 100_1 to 100_4 may be arranged in one row and four columns. The transistors may be arranged in a matrix or other ways.

The transistors 100_1 to 100_4 each include the conductive layer 104, the insulating layer 106, the semiconductor layer 108, and the conductive layers 112*a* and 112*b*. The conductive layer 104 serves as a gate electrode of each of the transistors 100_1 to 100_4. Part of the insulating layer 106 serves as a gate insulating layer of each of the transistors 100_1 to 100_4. The conductive layer 112*b* serves as one of a source electrode and a drain electrode and the conductive layer 112*a* serves as the other thereof in each of the transistors 100_1 to 100_4.

Since the description of the openings 141 and 143 can be referred to for the openings 141_1 to 141_4 and 143_1 to 143_4 included in each of the transistors 100_1 to 1004, the detailed description thereof is omitted.

The channel width of the transistor 100C regarded as one transistor is the sum of the channel widths of the transistors 100_1 to 100_4. For example, in the case where the top-view shape of each of the openings 141_1 to 141_4 is a circle, the transistor 100C can be regarded as having a channel width of "D141×π×4," where D141 denotes the width of each opening (see FIGS. 21A and 21). The transistor 100C composed of p transistors can be regarded as having a channel width of "D141×π×p." Note that the transistor 100C can be regarded as having a channel length L100 (see FIG. 21B). A plurality of transistors connected in parallel can have a larger channel width and a higher on-state current. The channel width can be changed by a change in the number (p) of the transistors connected in parallel. The number (p) of the transistors connected in parallel can be determined so that the desired on-state current can be obtained.

In FIG. 24C and the like, the semiconductor layer 108 is shared by the transistors 100_1 to 100_4. With the semiconductor layer 108 shared by the transistors 100_1 to 1004, the channel width can be increased while an increase in the area occupied by the transistors is inhibited. Note that one embodiment of the present invention is not limited to the above, and the semiconductor layer 108 may be divided for each of the transistors 100_1 to 100_4.

The structure of the transistor 100C described in Structure example 4 can be applied to any of the other structure examples. For example, the transistor 100C may be used as one or more of the transistors included in the semiconductor devices in FIGS. 20A to 20C, FIGS. 21A and 21B, FIGS. 22A to 22C, and FIGS. 23A and 23B.

Structure Example 5

Figure 26A:
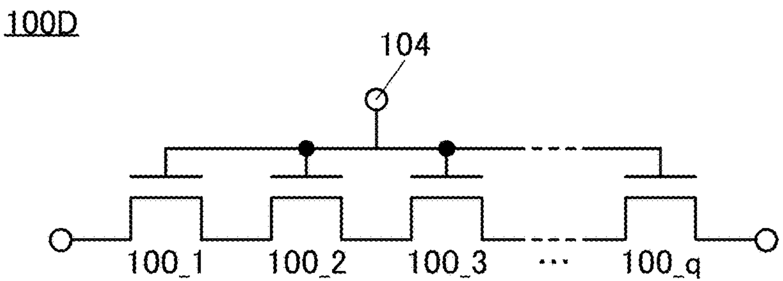
FIGS. 26A and 26B are circuit diagrams showing a configuration example of a semiconductor device.

FIG. 26A is an equivalent circuit diagram of a transistor 100D that can be used in the semiconductor device of one embodiment of the present invention. The transistor 100D is a transistor group including the transistor 100_1 to a transistor 100_*q* (q is an integer greater than or equal to 2). The transistor 100D can be regarded as one transistor, in which the transistors 100_1 to 100_*q* are connected in series.

Although the transistors 100_1 to 100_*q* are shown as n-channel transistors in FIG. 26A, one embodiment of the present invention is not limited to these examples. The transistors 100_1 to 100_*q* may be a p-channel transistors.

Figure 26B:
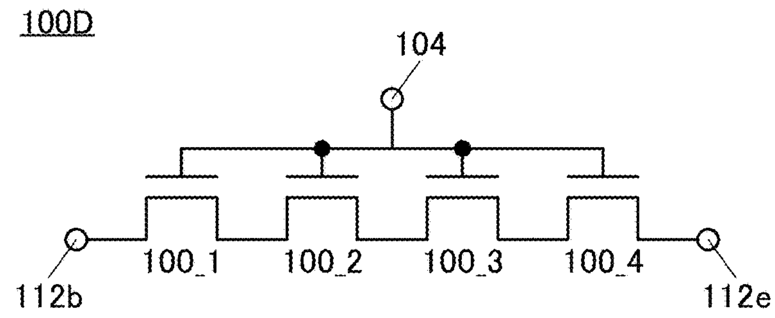
Figure 26C:
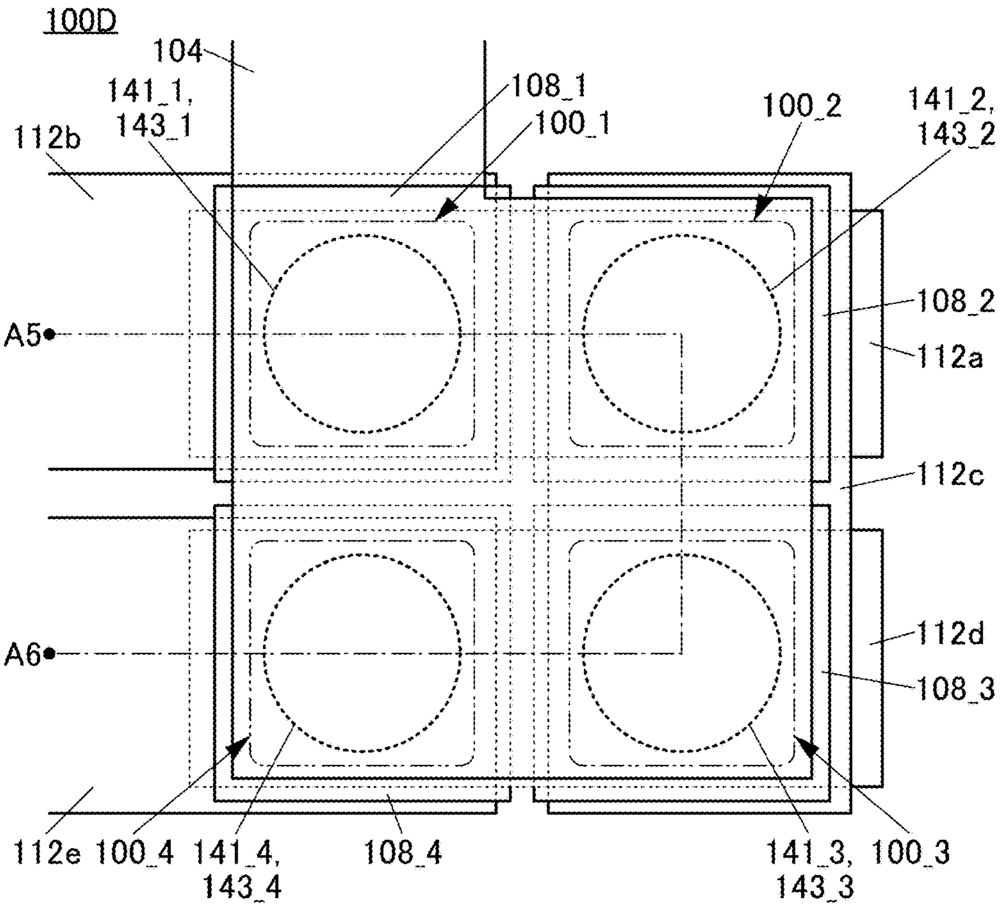
FIG. 26C is a top view showing a structure example of the semiconductor device.
Figure 27:
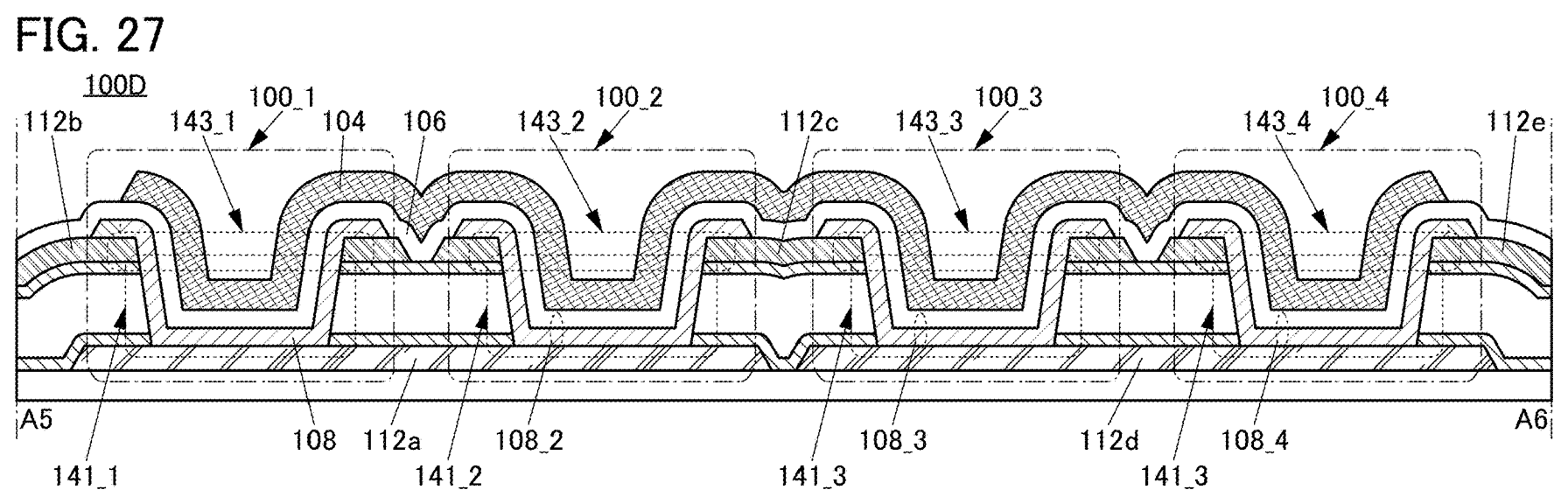

The case where q is 4 is specifically described as an example. FIG. 26B is an equivalent circuit diagram of a transistor 100D that can be used in the semiconductor device of one embodiment of the present invention. FIG. 26C is a top view of the transistor 100D. FIG. 27 shows a cross-sectional view taken along the dashed-dotted line A5-A6 in FIG. 26C.

The transistor 100D includes the transistor 100_1 to a transistor 100_4. The transistors 100_1 to 100_4 can each employ the above-described structure of the transistor 100. Although the transistor 100 is described as an example here, one embodiment of the present invention is not limited thereto. The transistors 100_1 to 100_4 may each employ either of the transistors 100A and 100B.

Although the transistors 100_1 to 100_4 are arranged in two rows and two columns in FIG. 26C and the like, there is no limitation on the transistor arrangement. For example, the transistors 100_1 to 100_4 may be arranged in one row and four columns. The transistors may be arranged in a matrix or other ways.

The transistor 100_1 includes the conductive layer 104, the insulating layer 106, a semiconductor layer 108_1, and the conductive layers 112*a* and 112*b*. The conductive layer 112*a* serves as one of a source electrode and a drain electrode of the transistor 100_1, and the conductive layer 112*b* serves as the other.

The transistor 100_2 includes the conductive layer 104, the insulating layer 106, a semiconductor layer 1082, and the conductive layers 112*a* and 112*c*. The conductive layer 112*a* serves as one of a source electrode and a drain electrode of the transistor 100_2, and the conductive layer 112*c* serves as the other. The conductive layer 112*a* is shared by the transistors 100_1 and 100_2.

The transistor 100_3 includes the conductive layer 104, the insulating layer 106, a semiconductor layer 1083, and the conductive layer 112*c*, and a conductive layer 112*d*. The conductive layer 112*c* serves as one of a source electrode and a drain electrode of the transistor 1003, and the conductive layer 112*d* serves as the other. The conductive layer 112*c* is shared by the transistors 100_2 and 100_3.

The transistor 100_4 includes the conductive layer 104, the insulating layer 106, a semiconductor layer 1084, and the conductive layer 112*d*, and a conductive layer 112*e*. The conductive layer 112*d* serves as one of a source electrode and a drain electrode of the transistor 100_4, and the conductive layer 112*e* serves as the other. The conductive layer 112*d* is shared by the transistors 100_3 and 100_4.

Since the description of the openings 141 and 143 can be referred to for the openings 141_1 to 141_4 and 143_1 to 143_4 included in each of the transistors 100_1 to 1004, the detailed description thereof is omitted.

The one of the source electrode and the drain electrode of the transistor 100_1 is electrically connected to the one of the source electrode and the drain electrode of the transistor 100_2. The other of the source electrode and the drain electrode of the transistor 100_2 is electrically connected to the one of the source electrode and the drain electrode of the transistor 100_3. The other of the source electrode and the drain electrode of the transistor 100_3 is electrically connected to the one of the source electrode and the drain electrode of the transistor 100_4.

The channel length of the transistor 100D assumed one transistor is the sum of the channel lengths of the transistors 100_1 to 100_4. For example, the transistor 100D can be regarded as having a channel length of "L100×4," where L100 denotes the channel length of each of the transistors 100_1 to 1004 (see FIG. 21B). The transistor 100D composed of q transistors can be regarded as having a channel length of "L100×π×q." Note that the transistor 100D can be regarded as having the channel width W100 (see FIGS. 21A and 21). A plurality of transistors connected in parallel can have a larger channel length and better saturation. The channel length can be changed by a change in the number (q) of the transistors connected in series. The number (q) of the transistors connected in series can be determined so that the desired saturation can be obtained.

In FIG. 26C and the like, the continuous semiconductor layer 108 may be shared by the transistors 100_2 and 100_3. This structure can inhibit an increase in the area occupied by the transistors 100_2 and 100_3.

The structure of the transistor 100D described in Structure example 5 can be applied to any of the other structure examples. For example, the transistor 100D may be used as one or more of the transistors included in the semiconductor devices in FIGS. 20A to 20C, FIGS. 21A and 21B, FIGS. 22A to 22C, and FIGS. 23A and 23B.

The transistor 100D may be used as each transistor included in the transistor 100C. The groups of transistors connected in parallel can further be connected in series (hereinafter, also referred to as series-parallel connection). The transistor 100C may be used as each transistor included in the transistor 100D. The groups of transistors connected in series can further be connected in parallel (hereinafter, also referred to as parallel-series connection).

According to one embodiment of the present invention, for example, the transistors 100C and 100D can be used as the transistor included in the peripheral driver circuit of the display apparatus 40 described in Embodiment 1.

The structures and the like described in this embodiment can be used in combination with any of the structures and the like described in the other embodiments as appropriate. In this specification and the like, in the case where a plurality of structure examples are shown in one embodiment, the structure examples can be combined as appropriate.

Embodiment 3

In this embodiment, display apparatuses of embodiments of the present invention are described with reference to FIGS. 28A to 28F, FIG. 29, FIG. 30, FIG. 31, FIG. 32, FIGS. 33A and 33B, FIGS. 34A to 34C, FIGS. 35A to 35C, FIGS. 36A and 36B, and FIGS. 37A and 37B. The display apparatus of one embodiment of the present invention can be a high-definition display apparatus or a large-sized display apparatus, for example. The display apparatus of one embodiment of the present invention can be a high-resolution display apparatus, for example.

The semiconductor device of one embodiment of the present invention can be used for a display apparatus or a module including the display apparatus. Examples of the module including the display apparatus are a module in which a connector such as a flexible printed circuit board (FPC) or a tape carrier package (TCP) is attached to the display apparatus, a module which is mounted with an integrated circuit (IC) by a chip on glass (COG) method, a chip on film (COF) method, or the like, and the like.

The display apparatus of one embodiment of the present may have a function of a touch panel. The display apparatus can employ any of a variety of sensor elements that can sense proximity or touch of a sensing target such as a finger, for example.

For example, a variety of types such as a capacitive type, a resistive type, a surface acoustic wave type, an infrared type, an optical type, and a pressure-sensitive type can be used for the sensor.

Examples of the capacitive touch sensor are a surface capacitive touch sensor and a projected capacitive touch sensor. Examples of the projected capacitive touch sensing device include a self-capacitive touch sensing device and a mutual capacitive touch sensing device. The use of a mutual capacitive touch sensor is preferable because multiple points can be sensed simultaneously.

Examples of a touch panel include an out-cell touch type, an on-cell type, and an in-cell type. An in-cell touch panel has a structure in which an electrode included in a sensor element is provided on one or both of a substrate supporting a display element (also referred to as a display apparatus) and a counter substrate.

Structure Example 1 of Display Apparatus

Figure 28A:
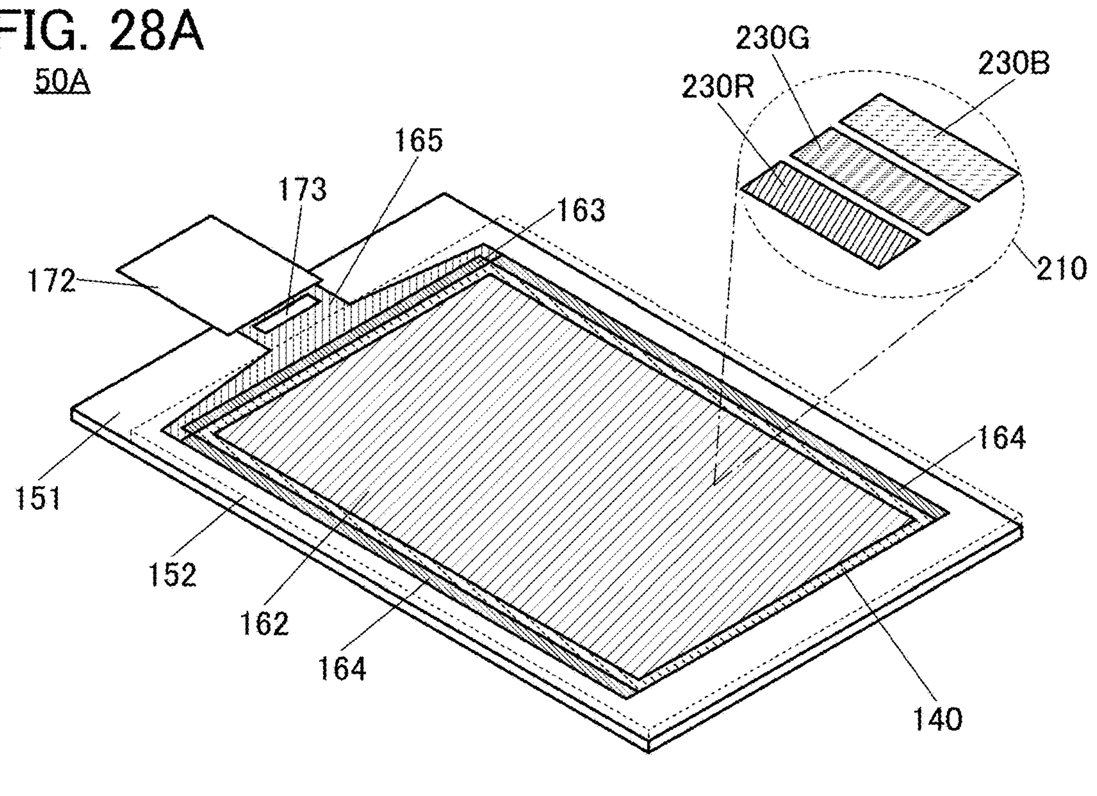
FIG. 28A is a perspective view showing a structure example of a display apparatus.
Figures 28B, 28C, 28D:
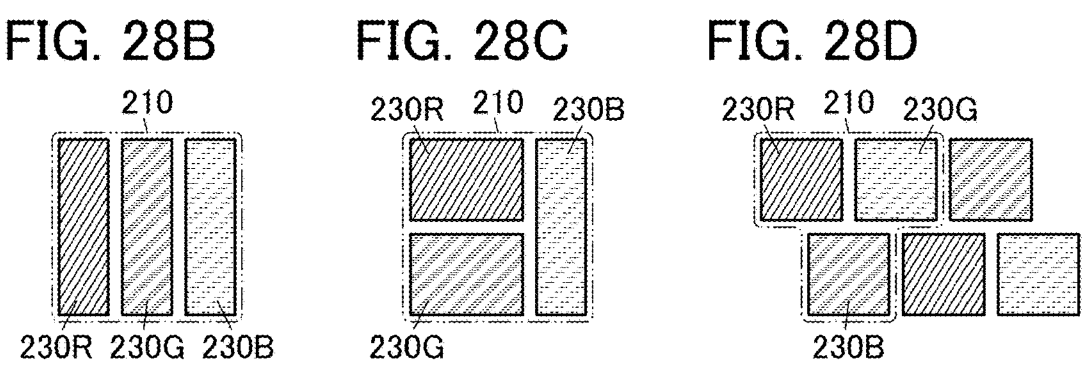
FIGS. 28B to 28F are top views showing examples of pixel arrangement.
Figures 28E, 28F:
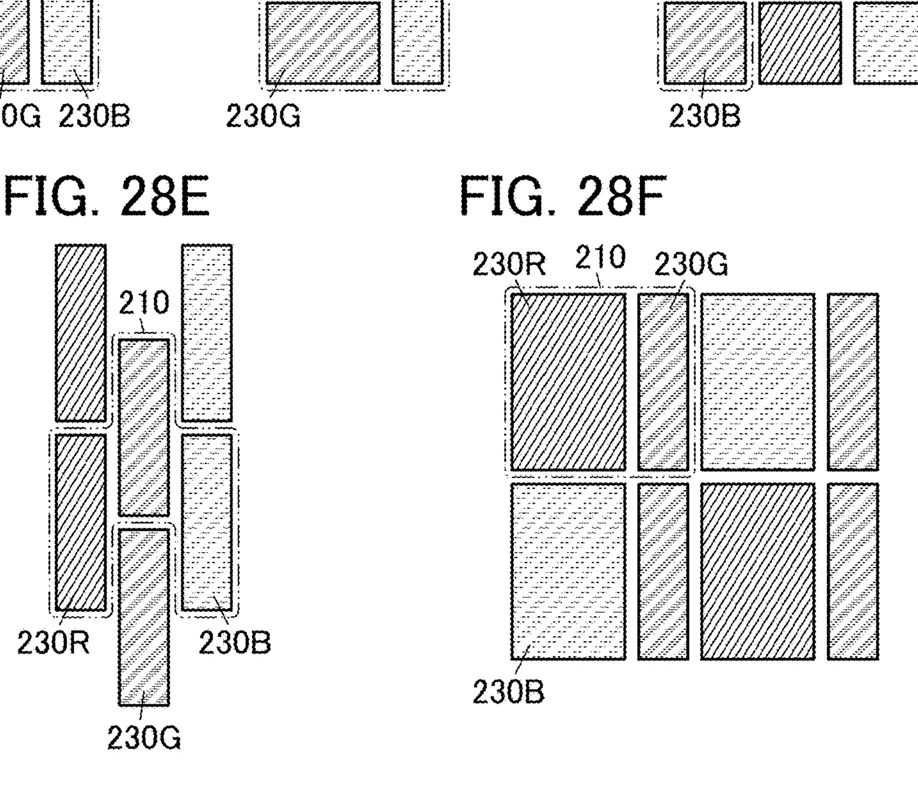

FIG. 28A is a perspective view of a display apparatus 50A.

In the display apparatus 50A, a substrate 152 and a substrate 151 are bonded to each other. In FIG. 28A, the substrate 152 is indicated by a dashed line.

The display apparatus 50A includes a display portion 162, a connection portion 140, a circuit portion 164, a circuit portion 163, a conductive layer 165, and the like. FIG. 28A illustrates an example where an IC 173 and an FPC 172 are implemented onto the display apparatus 50A. Thus, the structure illustrated in FIG. 28A can be regarded as a display module including the display apparatus 50A, the IC, and the FPC.

The connection portion 140 is provided outside the display portion 162. The connection portion 140 can be provided along one or more sides of the display portion 162. The number of connection portions 140 may be one or more. FIG. 28A illustrates an example where the connection portion 140 is provided to surround the four sides of the display portion. In the connection portion 140, a common electrode of a display element is electrically connected to a conductive layer so that a potential can be supplied to the common electrode.

The circuit portion 164 includes a scan line driver circuit (also referred to as a gate driver or a scan driver), for example. The circuit portion 163 includes a scan line driver circuit (also referred to as a source driver or a data driver), for example.

The conductive layer 165 has a function of supplying a signal and power to the display portion 162 and the circuit portions 163 and 164. The signal and power are input to the conductive layer 165 from the outside of the display apparatus 50A through the FPC 172 or from the IC 173.

FIG. 28A illustrates an example where the IC 173 is provided on the substrate 151 by a COG method, a COF method, or the like. An IC including one or both of a scan line driver circuit and a signal line driver circuit can be used as the IC 173, for example. Note that the display apparatus 50A and the display module are not necessarily provided with an IC. The IC may be mounted on the FPC by a COF method or the like.

One or both of the IC 173 and the circuit portion 164 may construct the scan line driver circuit, in which case the IC 173 may be referred to as a gate driver IC. One or both of the IC 173 and the circuit portion 163 may construct the signal line driver circuit, in which case the IC 173 may be referred to as a source driver IC.

The semiconductor device of one embodiment of the present invention can be used for at least part of the display portion 162 and the circuit portions 163 and 164 of the display apparatus 50A, for example.

When the semiconductor device of one embodiment of the present invention is used for a pixel circuit of a display apparatus, the area occupied by the pixel circuit can be reduced and the display apparatus can have high resolution, for example. For example, the resolution of the display apparatus can be higher than or equal to 300 ppi, higher than or equal to 500 ppi, higher than or equal to 1000 ppi, higher than or equal to 2000 ppi, or higher than or equal to 3000 ppi.

When the semiconductor device of one embodiment of the present invention is used for a driver circuit (e.g., one or both of a scan line driver circuit and a signal line driver circuit) of a display apparatus, the area occupied by the driver circuit can be reduced and the display apparatus can have a narrow bezel, for example.

Since the semiconductor device of one embodiment of the present invention has favorable electrical characteristics, a display apparatus can have increased reliability by using the semiconductor device.

According to one embodiment of the present invention, the display apparatus 40 described in Embodiment 1, for example, can be used as the display apparatus 50A. In that case, the display portion 162 corresponds to the display portion 42, the circuit portion 164 corresponds to the first driver circuit portion 43, and the circuit portion 163 corresponds to the second driver circuit portion 44.

The display portion 162 of the display apparatus 50A is a region where an image is to be displayed, and includes a plurality of pixels 210 that are periodically arranged. FIG. 28A shows an enlarged view of one of the pixels 210.

The pixel 210 illustrated in FIG. 28A includes a pixel 230R that emits red (R) light, a pixel 230G that emits green (G) light, and a pixel 230B that emits blue (B) light. One pixel 230R, one pixel 230G, and one pixel 230B form one pixel 210, which achieves full-color display. The pixels 230R, 230G, and 230B each serve as a subpixel. In the display apparatus 50A illustrated in FIG. 28A, the pixels 230R, 230B, and 230G serving as subpixels are arranged in a stripe pattern, for example. The number of subpixels forming one pixel 210 is not limited to three, and may be four or more. For example, one pixel 210 may include four subpixels which emit light of four colors, R, G, B, and white (W). Alternatively, one pixel 210 may include four subpixels which emit light of four colors, R, G, B, and yellow (Y).

In the description in this specification and the like, identification signs such as "R," "G," and "B" are sometimes used to indicate the components related to red light, green light, and blue light, respectively. Such identification signs are sometimes omitted in the description common to the components. For example, a plurality of pixels 230 are sometimes shown individually as the pixel 230R, the pixel 230G, and the pixel 230B when they need to be distinguished from each other. For example, the pixels 230R, 230G, and 230B are sometimes shown simply as the pixel 230 when there is no need to distinguish between them.

The pixels 230R, 230G, and 230B each include a display element and a circuit (a pixel circuit) controlling the driving of the display element.

In the display apparatus of one embodiment of the present invention, there is no particular limitation on the arrangement of pixels and a variety of arrangements can be employed as illustrated in FIGS. 28B to 28F. Examples of the arrangement of pixels include a stripe arrangement (see FIG. 28B), an S-stripe arrangement (see FIG. 28C), a delta arrangement (see FIG. 28D), a zigzag arrangement (see FIG. 28E), and a PenTile arrangement (see FIG. 28F). Other examples include a mosaic arrangement, a diamond arrangement, and a Bayer arrangement.

Furthermore, examples of the top-view shape of each subpixel (pixels 230R, 230G, or 230B) in FIGS. 28B to 28F include polygons such as a triangle, a tetragon (including a rectangle and a square), and a pentagon, polygons with rounded corners, an ellipse, and a circle. Here, a top-view surface shape of the subpixel corresponds to a top-view surface shape of a display region of the display element included in the subpixel. In this manner, the top-view shapes and sizes of the subpixels can be determined independently. Note that the positions of the pixels 230R, 230G, and 230B may be interchanged with each other as appropriate. The arrangement of the display elements and the arrangement of the pixel circuits may be the same or different.

Since a PenTile arrangement is a unique pixel arrangement that increases resolution in a pseudo manner, for example, a stripe arrangement is preferred for the display apparatus. According to one embodiment of the present invention, for example, the structure of the transistor 100 described in Embodiment 2 or the like is employed for some or all of the transistors included in the pixel circuit, whereby the area occupied by the pixel circuit can be reduced. This permits the employment of a stripe arrangement or the like, not a PenTile arrangement, without involving a reduction in resolution.

Any of a variety of elements can be used as the display element, and a liquid crystal element or a light-emitting element can be used, for example. Alternatively, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used. Alternatively, a quantum-dot LED (QLED) employing a light source and color conversion technology using quantum dot materials may be used.

As examples of a display apparatus that includes a liquid crystal element, a transmissive liquid crystal display apparatus, a reflective liquid crystal display apparatus, and a transflective liquid crystal display apparatus can be given.

Examples of the mode applied to the display apparatus using a liquid crystal element include a vertical alignment (VA) mode, a fringe field switching (FFS) mode, an in-plane-switching (IPS) mode, a twisted nematic (TN) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, and a guest-host mode. Examples of the VA mode include a multi-domain vertical alignment (MVA) mode, a patterned vertical alignment (PVA) mode, and an advanced super view (ASV) mode.

Examples of the liquid crystal material that can be used for the liquid crystal element include a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, and an anti-ferroelectric liquid crystal. Such a liquid crystal material exhibits a cholesteric phase, a smectic phase, a cubic phase, a chiral nematic phase, an isotropic phase, a blue phase, or the like depending on conditions. As the liquid crystal material, either a positive liquid crystal or a negative liquid crystal may be used.

As the light-emitting element, a self-luminous light-emitting element such as a light-emitting diode (LED), an organic electroluminescent (EL) element (also referred to as an Organic LED (OLED)), or a semiconductor laser can be used. Examples of the LED include a mini LED and a micro LED.

Examples of a light-emitting substance contained in the light-emitting element include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (e.g., a quantum dot material).

The light-emitting element can emit infrared, red, green, blue, cyan, magenta, yellow, or white light, for example. When the light-emitting element has a microcavity structure, higher color purity can be achieved.

One of the pair of electrodes of the light-emitting element serves as an anode, and the other electrode serves as a cathode.

In this embodiment, the case where a light-emitting element is used as the display element is mainly described as an example. In particular, the case where an organic EL element is used as a light-emitting element is described as an example. Thus, one embodiment of the present invention is a display apparatus using an organic EL element.

The display apparatus of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

Since the occupied area can be reduced with the use of the semiconductor device of one embodiment of the present invention, the aperture ratio of a pixel can be increased in a display apparatus having a bottom-emission structure. For example, the aperture ratio can be higher than or equal to 50%, higher than or equal to 55%, or higher than or equal to 60% in the display apparatus.

In this specification and the like, the aperture ratio refers to a proportion of the area of the region, where light is transmitted, to the area of a pixel.

Structure Example of Pixel Circuit

Figure 29:
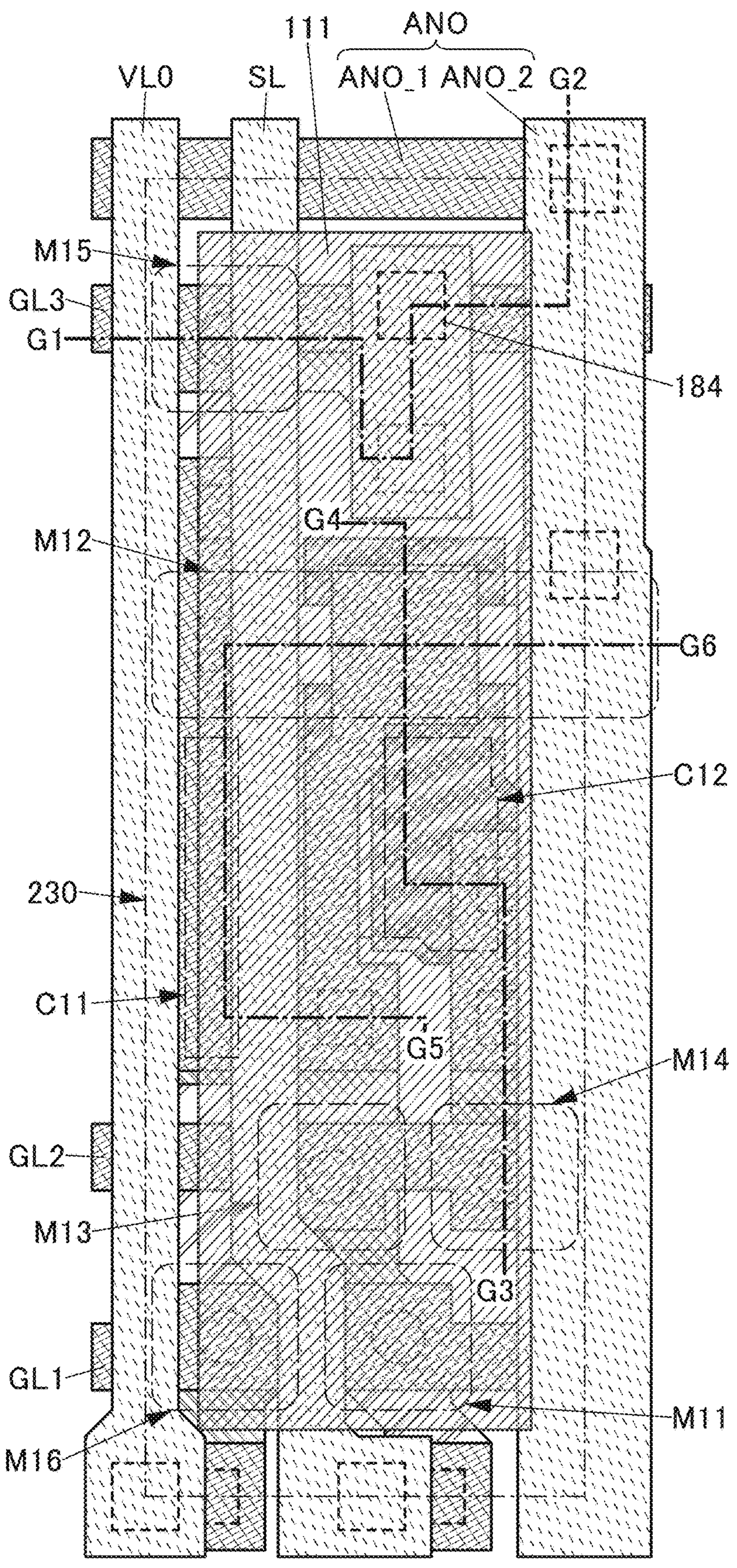
FIG. 29 is a top view showing a layout example of a pixel.
Figure 30:
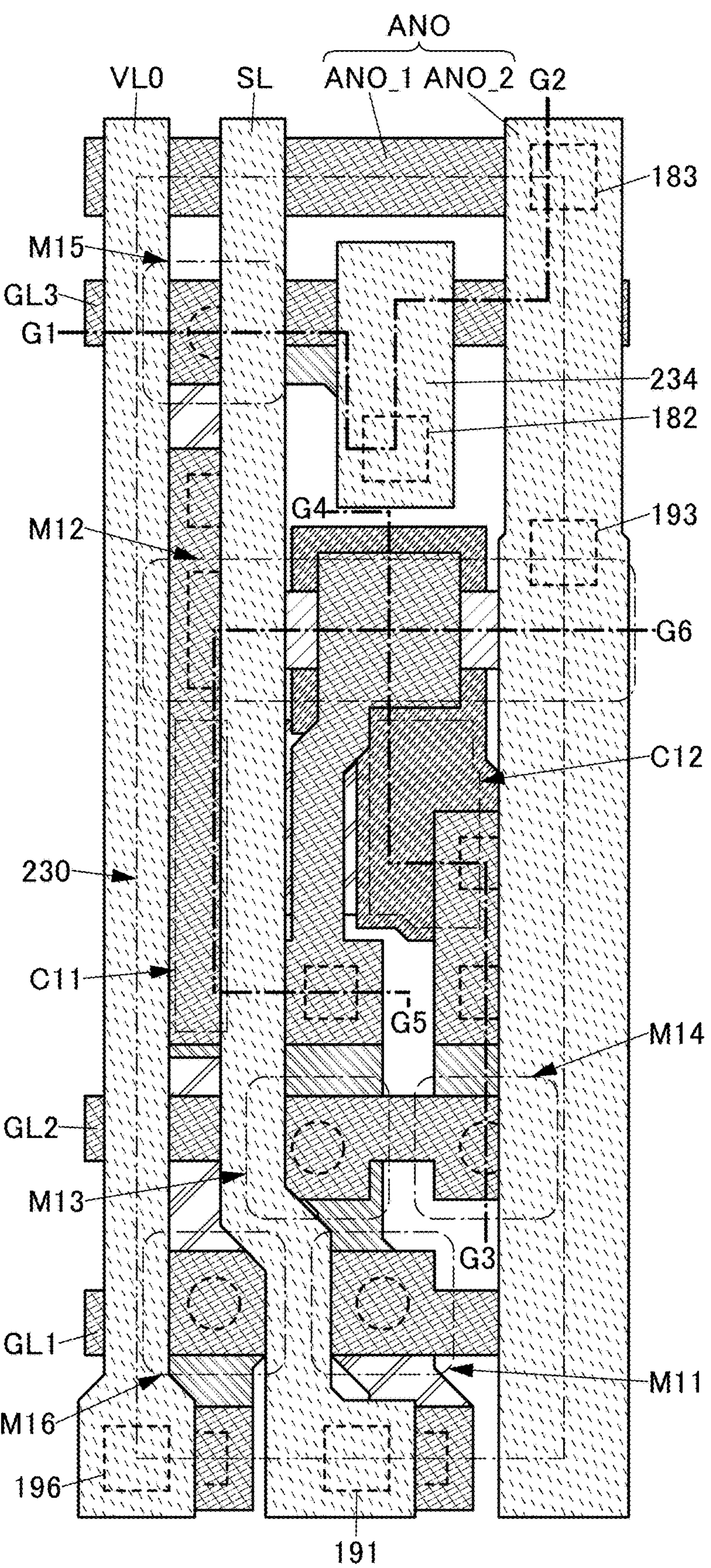
FIG. 30 is a top view showing a layout example of a pixel.
Figure 31:
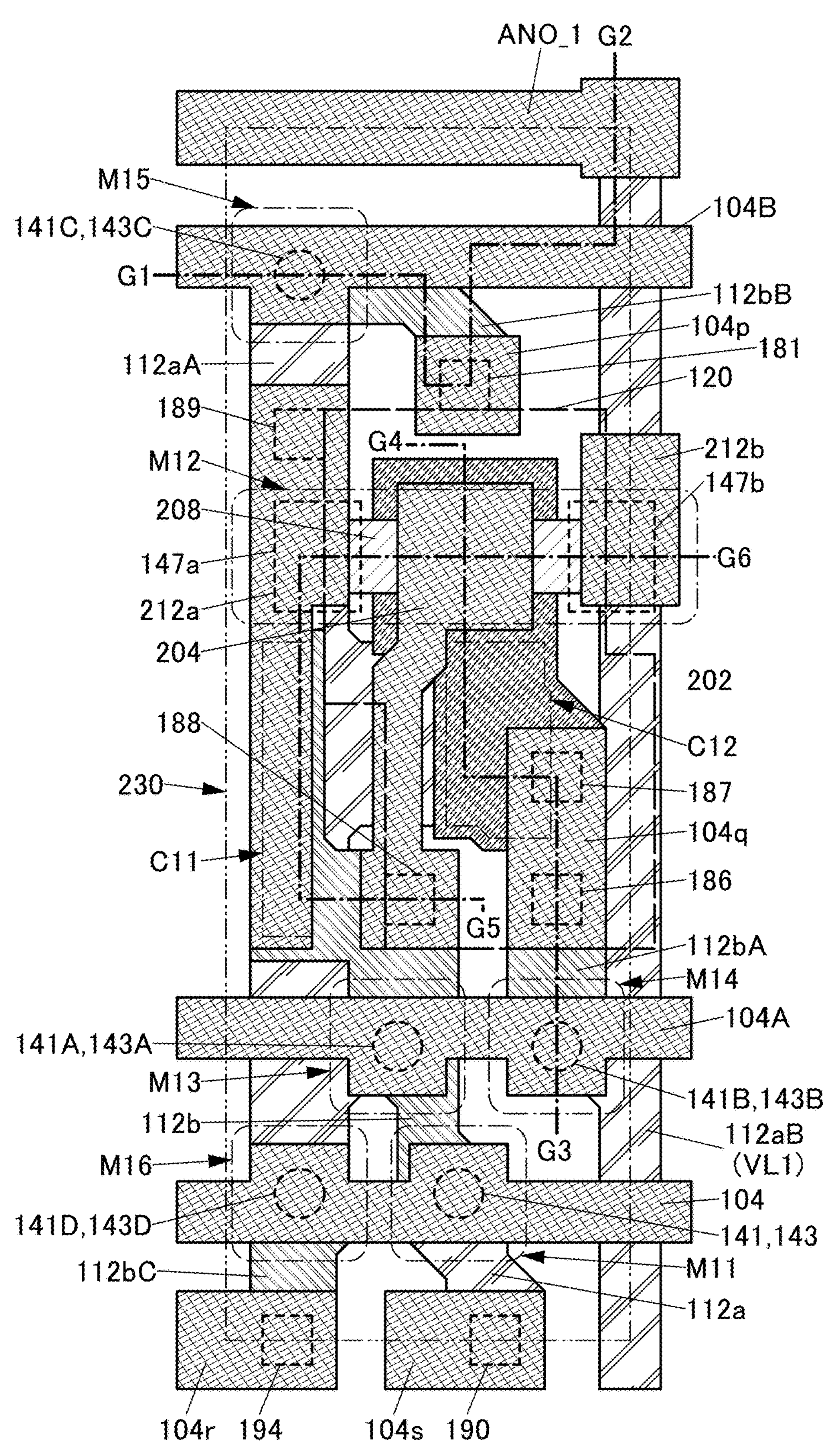
FIG. 31 is a top view showing a layout example of a pixel.

A structure example of the layout in the pixel 230 is shown in FIG. 29, FIG. 30, and FIG. 31. FIG. 29 is a top view corresponding to the semiconductor device 20A described in Embodiment 1 (the circuit diagram in FIG. 1). FIG. 29 illustrate a transistor M11 corresponding to the transistor M1, a transistor M12 corresponding to the transistor M2, a transistor M13 corresponding to the transistor M3, a transistor M14 corresponding to the transistor M4, a transistor M15 corresponding to the transistor M5, a transistor M16 corresponding to the transistor M6, a capacitor C11 corresponding to the capacitor C1, a capacitor C12 corresponding to the capacitor C2, a wiring GL1 corresponding to the wiring GLa, a wiring GL2 corresponding to the wiring GLb, a wiring GL3 corresponding to the wiring GLc, the wiring SL corresponding to the wiring DL, a wiring VL0 corresponding to the wiring 23, a wiring ANO corresponding to the wiring 21, and a pixel electrode 111 electrically connected to one electrode of the light-emitting element 32. Note that in FIG. 29, hatching of the pixel electrode 111 is illustrated transparently so that components under the pixel electrode 111 are clearly shown. The wiring ANO includes a wiring ANO_1 and a wiring ANO_2. The wirings ANO_1 and ANO_2 are electrically connected to each other and serve as the wiring ANO. Note that in FIG. 29, the wirings 22 and 24 are omitted. The wiring 22 corresponds to a common electrode 115 described later. The wiring 24 corresponds to a conductive layer 112*aB* (wiring VL1) described later.

FIG. 30 is a top view where the pixel electrode 111 is removed from FIG. 29. FIG. 31 is a top view where the wirings VL0, SL, and ANO_2 are further removed from FIG. 30. In FIG. 31, the wiring VL1 corresponding to the wiring 24 is illustrated. Note that in FIG. 29, FIG. 30, and FIG. 31, the area of one pixel 230 is indicated by a dashed double-dotted line.

Figure 32:
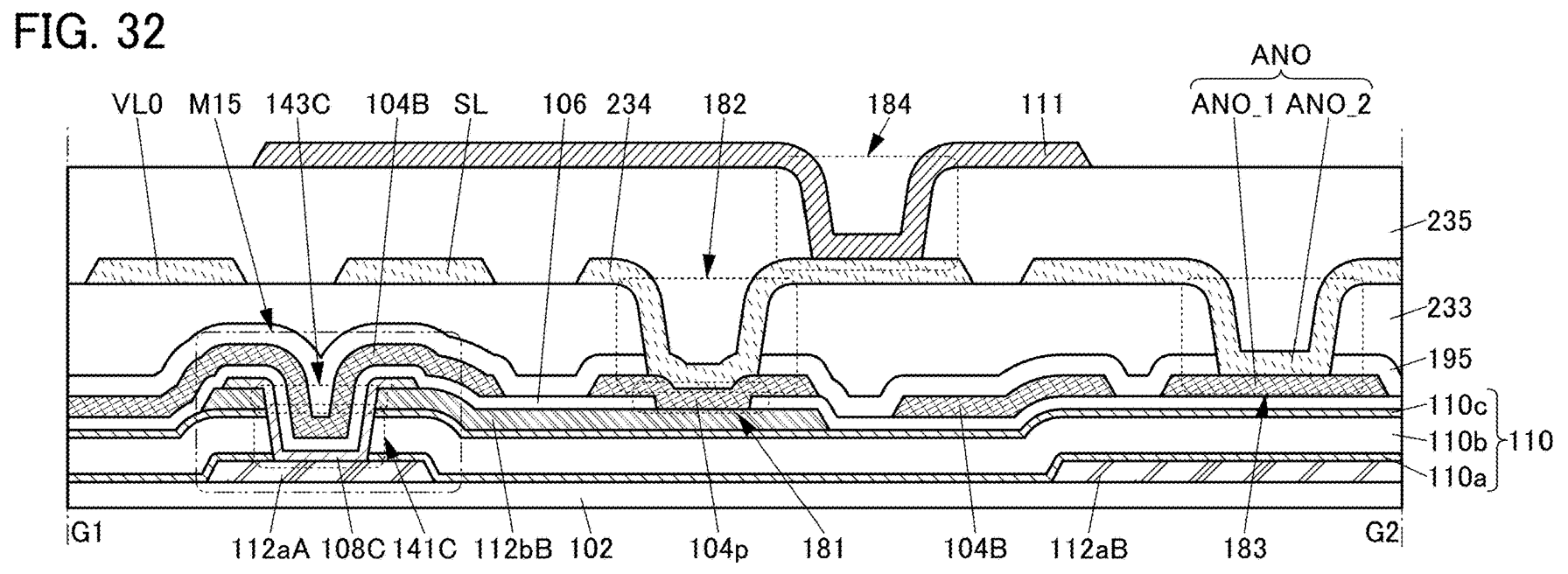
Figures 33A, 33B:
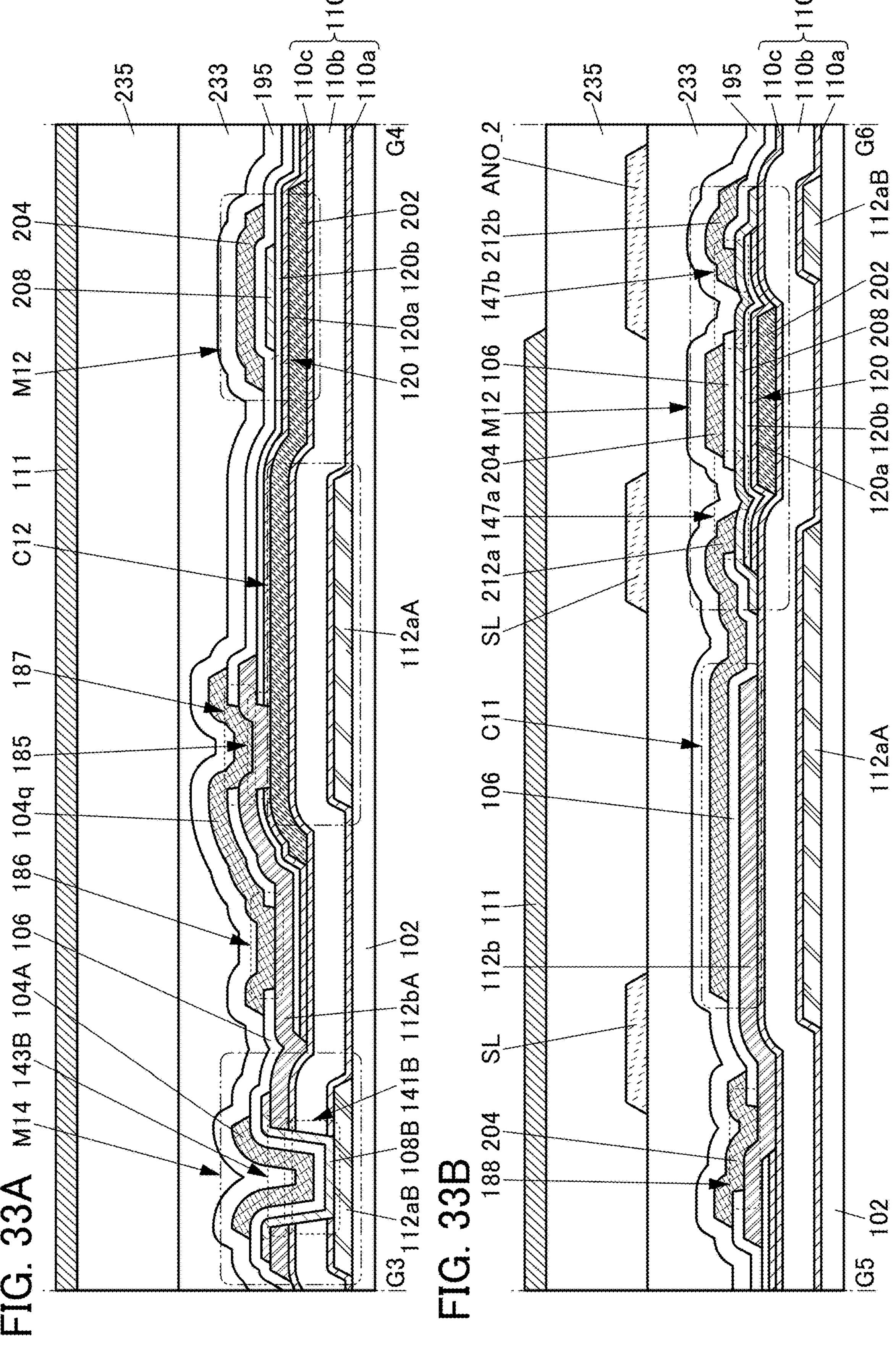
FIGS. 33A and 33B are cross-sectional views showing a layout example of a pixel.

FIG. 32 is a cross-sectional view taken along the dashed-dotted line G1-G2 in FIG. 29, FIG. 33A is a cross-sectional view taken along the dashed-dotted line B3-G4 in FIG. 29, and FIG. 33B is a cross-sectional view taken along the dashed-dotted line G5-G6 in FIG. 29.

In the example in FIG. 29, FIG. 30, FIG. 31, FIG. 32, and FIGS. 33A and 33B, the structure of the transistor 100 illustrated in FIG. 20B and the like described in Embodiment 2 is employed for the transistors M11, M13, M14, M15, and M16, and the structure of the transistor 200 is employed for the transistor M12.

The transistor M11 includes the conductive layers 112*a*, 112*b*, and 104, the semiconductor layer 108, and the insulating layer 106. In the transistor M11, the conductive layer

112*b* serves as one of a source electrode and a drain electrode and the conductive layer 112*a* serves as the other. Part of the insulating layer 106 serves as a gate insulating layer, and the conductive layer 104 serves as a gate electrode. In addition, the conductive layer 104 serves as the wiring GL1.

The conductive layer 112*b* and the insulating layer 110 have the openings 141 and 143 in a region overlapping with the conductive layer 112*a*. The semiconductor layer 108 is provided to cover the openings 141 and 143. The insulating layer 106 is provided over the semiconductor layer 108, and the conductive layer 104 is provided over the insulating layer 106.

The transistor M12 includes the conductive layers 202, 204, 212*a*, and 212*b*, the insulating layers 120 and 106, and the semiconductor layer 208. In the transistor M12, the conductive layer 204 serves as a gate electrode (also referred to as a first gate electrode), and part of the insulating layer 106 serves as a gate insulating layer (also referred to as a first gate insulating layer). The conductive layer 202 serves as a back gate electrode (also referred to as a second gate electrode), and part of the insulating layer 120 serves as a back gate insulating layer (also referred to as a second gate insulating layer). The conductive layer 212*a* serves as one of a source electrode and a drain electrode, and the conductive layer 212*b* serves as the other.

The conductive layer 202 is provided over the insulating layer 110, and the insulating layer 120 is provided to cover the conductive layer 202. The semiconductor layer 208 is provided over the insulating layer 120, and the insulating layer 106 is provided to cover the semiconductor layer 208. The conductive layers 204, 212*a*, and 212*b* are provided over the insulating layer 106. The insulating layer 106 includes the openings 147*a* and 147*b* reaching the semiconductor layer 208, and the conductive layers 212*a* and 212*b* are in contact with the semiconductor layer 208 through the openings 147*a* and 147*b*.

The insulating layer 106 includes an opening 188 reaching the conductive layer 112*b*, and the conductive layer 204 is provided to cover the opening 188. The conductive layer 204 is electrically connected to the conductive layer 112*b* through the opening 188.

Figures 34A, 34B, 34C:
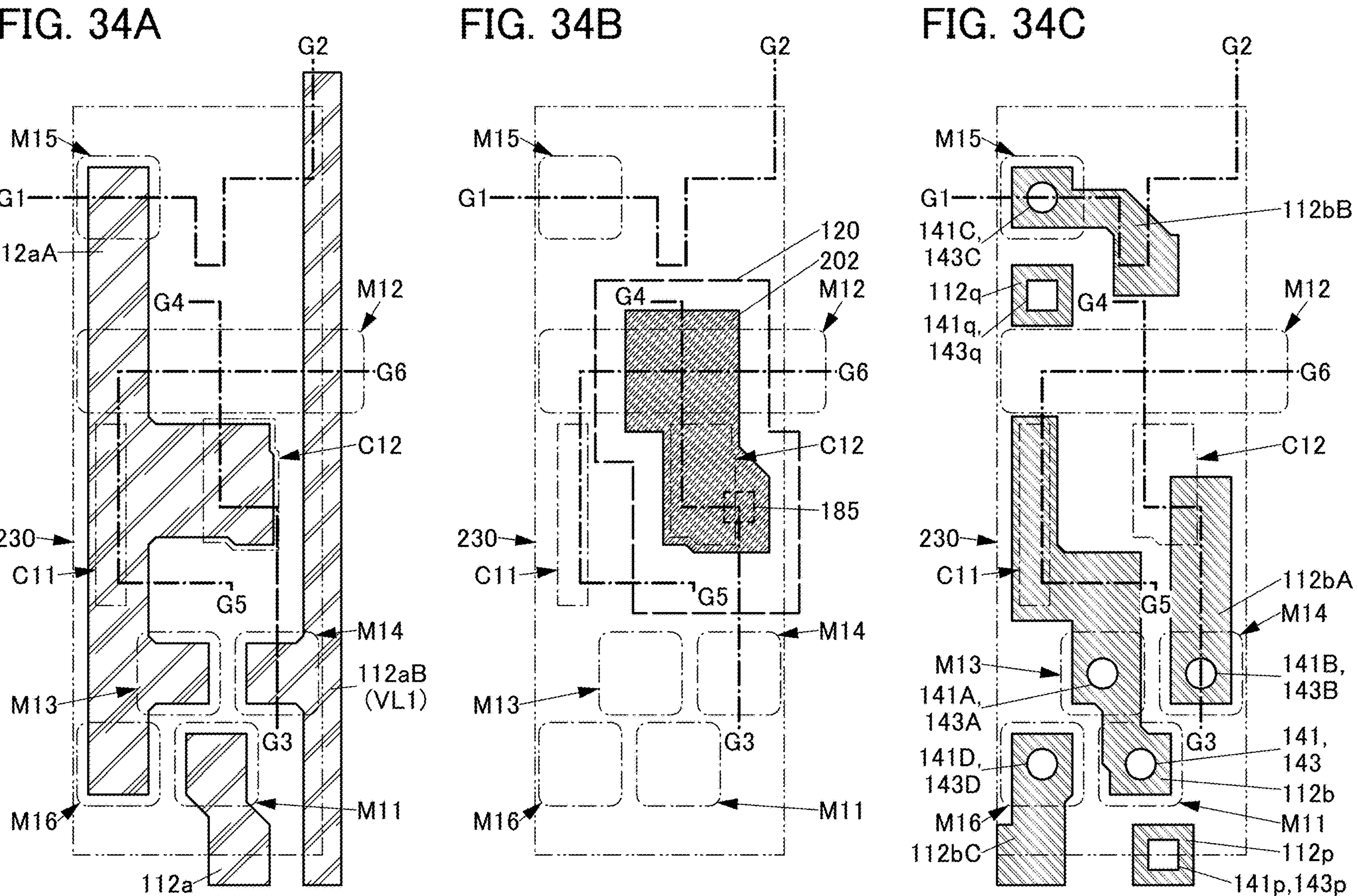
FIGS. 34A to 34C are top views showing a layout example of a pixel.

FIG. 34A is a top view of the conductive layer 112*a*. FIG. 34A illustrates, in addition to the conductive layer 112*a*, a conductive layer 112*aA* and a conductive layer 112*aB*, which can be formed in the same step. The conductive layer 112*aB* serves as the wiring VL1. The conductive layer 112*aB* (wiring VL1) extends in the column direction.

The horizontal direction in a drawing is the row direction and the vertical direction is the column direction; however, one embodiment of the present invention is not limited thereto and the row direction and the column direction can be replaced with each other.

FIG. 34B is a top view of the conductive layer 202 and the insulating layer 120. In FIG. 34B, the outline of the insulating layer 120 is denoted by the dashed line.

FIG. 34C is a top view of the conductive layer 112*b*. FIG. 34C illustrates, in addition to the conductive layer 112*b*, a conductive layer 112*bA*, a conductive layer 112*bB*, a conductive layer 112*bC*, a conductive layer 112*p*, and a conductive layer 112*q*, which can be formed in the same step. In the conductive layer 112*b*, an opening 143A of the transistor M13 is provided in addition to the opening 143 of the transistor M11. In the conductive layer 112*bA*, an opening 143B of the transistor M14 is provided. In the conductive layer 112*bB*, an opening 143C of the transistor M15 is provided. In the conductive layer 112*bC*, an opening 143D of the transistor M16 is provided. An opening 143*p* is provided in the conductive layer 112*p*, and an opening 143*q* is provided in the conductive layer 112*q*. The openings 143 and 143A to 143D, 143*p*, and 143*q* can be formed in the same step. Although the top-view shape of the openings 143*p* and 143*q* are different from those of the openings 143 and 143A to 143D in FIG. 34C, there is no limitation on the top-view shapes of the openings 143*p* and 143*q*. The top-view shapes of the openings 143 and 143A to 143D, 143*p*, and 143*q* can each be a circle, for example. Moreover, the opening 141, an opening 141A to an opening 141D, an opening 141*p*, and an opening 141*q* are provided in regions of the insulating layer 110 which overlap with the openings 143 and 143A to 143D, 143*p*, and 143*q*.

Figures 35A, 35B, 35C:
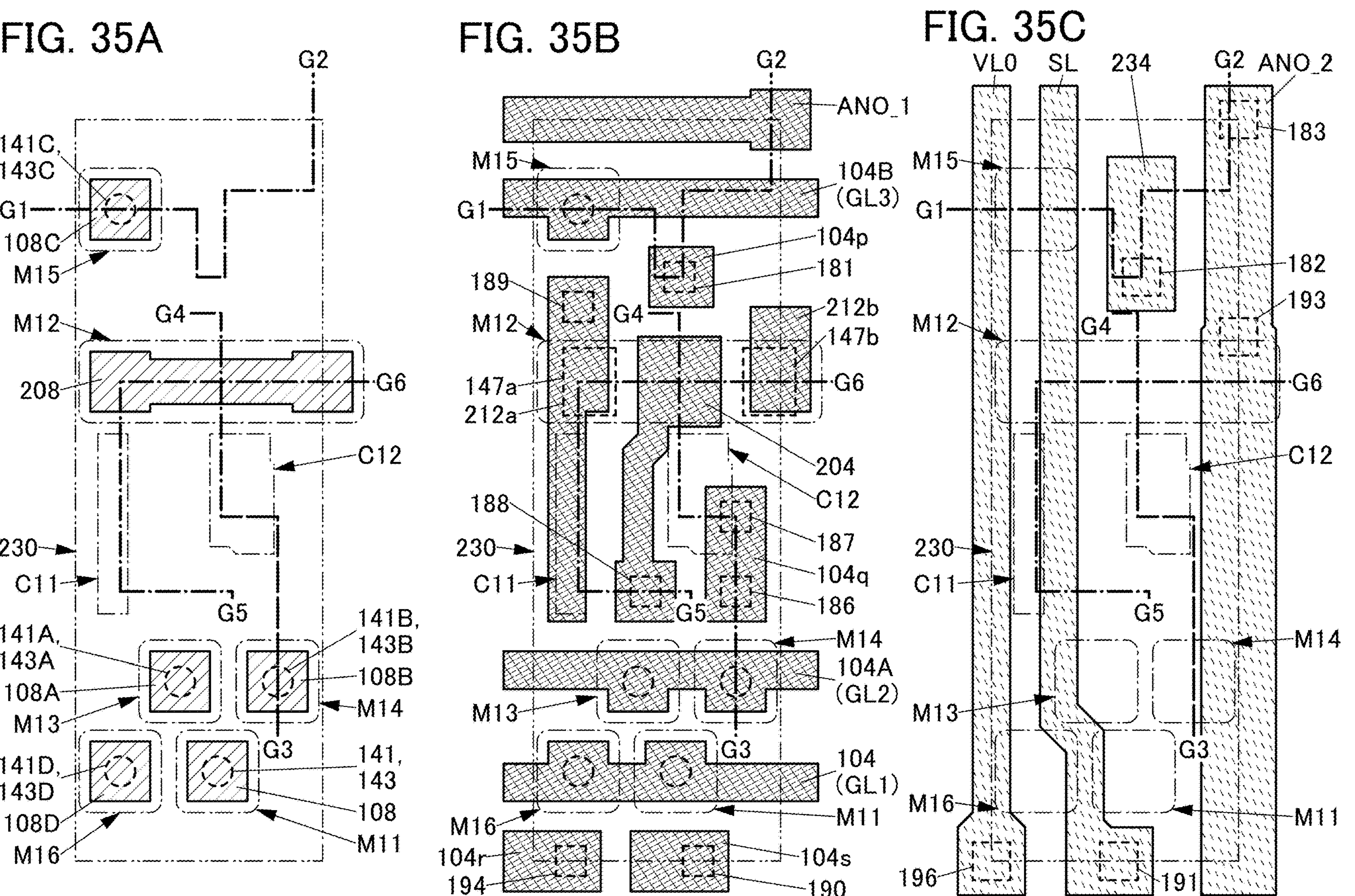
FIGS. 35A to 35C are top views showing a layout example of a pixel.

FIG. 35A is a top view of the semiconductor layers 108 and 208. FIG. 35A illustrates, in addition to the semiconductor layers 108 and 208, a semiconductor layer 108A, a semiconductor layer 108B, a semiconductor layer 108C, and a semiconductor layer 108D, which can be formed in the same step.

FIG. 35B is atop view of the conductive layers 104, 204, 212*a*, and 212*b*. FIG. 35B illustrates, in addition to the conductive layers 104, 204, 212*a*, and 212*b*, a conductive layer 104A, a conductive layer 104B, a conductive layer 104*p*, a conductive layer 104*q*, a conductive layer 104*r*, a conductive layer 104*s*, and a wiring ANO_1, which can be formed in the same step. The conductive layer 104 serves as the wiring GL1, the conductive layer 104A serves as the wiring GL2, and the conductive layer 104B serves as the wiring GL3. The conductive layer 104 (wiring GL1), the conductive layer 104A (wiring GL2), the conductive layer 104B (wiring GL3), and the wiring ANO_1 extend in the row direction.

FIG. 35C is a top view of the wirings VL0, SL, and ANO_2. FIG. 35C illustrates, in addition to the wirings VL0, SL, and ANO_2, a conductive layer 234, which can be formed in the same step. The wirings VL0, SL, and ANO_2 extend in the column direction.

As illustrated in FIG. 32, the insulating layer 195 and an insulating layer 233 are provided over the wiring ANO_1. The insulating layers 195 and 233 include an opening 183 reaching the wiring ANO_1, and the wiring ANO_2 is provided to cover the opening 183. The wirings ANO_1 and ANO_2 are electrically connected to each other through the opening 183 and serve as the wiring ANO.

The conductive layer 112*a* included in the transistor M11 is electrically connected to the wiring SL through the conductive layer 104*s*. The conductive layer 104*s* is electrically connected to the conductive layer 112*a* through an opening 190 and the openings 143*p* and 141*p*. The opening 141*p* reaching the conductive layer 112*a* is provided in the insulating layer 110, and the conductive layer 112*p* including the opening 143*p* is provided over the insulating layer 110. The insulating layer 106 is provided over the conductive layer 112*p*, and the opening 190 is provided in a region of the insulating layer 106 which overlaps with the opening 143*p*. The conductive layer 104*s* is provided to cover the openings 190, 143*p*, and 141*p*. The insulating layers 195 and 233 are provided over the conductive layer 104*s*, an opening 191 is provided in a region of the insulating layers 195 and 233 which overlaps with the conductive layer 104*s*, and the wiring SL is provided to cover the opening 191.

The conductive layer 212*a* included in the transistor M12 is electrically connected to the conductive layer 112*aA* through an opening 189, the opening 143*q*, and the opening 141*q*. The opening 141*q* reaching the conductive layer 212*a* is provided in the insulating layer 110, and the conductive layer 112*q* including the opening 143*q* is provided over the insulating layer 110. The insulating layer 106 is provided over the conductive layer 112*q*, and the opening 189 is provided in a region of the insulating layer 106 which overlaps with the opening 143*q*. The conductive layer 212*a* is provided to cover the openings 189, 143*q*, and 141*q*.

The transistor M13 includes the conductive layers 112*aA* and 112*b*, the semiconductor layer 108A, the insulating layer 106, and the conductive layer 104A. In the transistor M13, the conductive layer 112*aA* serves as one of a source electrode and a drain electrode and the conductive layer 112*b* serves as the other. Part of the insulating layer 106 serves as a gate insulating layer, and the conductive layer 104A serves as a gate electrode. The conductive layer 112*b* serves as the one of the source electrode and the drain electrode of the transistor M11 and also as the other of the source electrode and the drain electrode of the transistor M13.

The conductive layer 112*b* and the insulating layer 110 have an opening 141A and an opening 143A in a region overlapping with the conductive layer 112*aA*. The semiconductor layer 108A is provided to cover the openings 141A and 143A. The insulating layer 106 is provided over the semiconductor layer 108A, and the conductive layer 104A is provided over the insulating layer 106.

The transistor M14 includes the conductive layers 112*aB* and 112*bA*, the semiconductor layer 108B, the insulating layer 106, and the conductive layer 104A. In the transistor M14, the conductive layer 112*bA* serves as one of a source electrode and a drain electrode and the conductive layer 112*aB* serves as the other. Part of the insulating layer 106 serves as a gate insulating layer, and the conductive layer 104A serves as a gate electrode. The conductive layer 104A serves as the gate electrode of the transistor M13 and also as the gate electrode of the transistor M14.

The conductive layer 112*bA* and the insulating layer 110 have an opening 141B and an opening 143B in a region overlapping with the conductive layer 112*aB*. The semiconductor layer 108B is provided to cover the openings 141B and 143B. The insulating layer 106 is provided over the semiconductor layer 108B, and the conductive layer 104A is provided over the insulating layer 106.

The transistor M15 includes the conductive layers 112*aA* and 112*bB*, the semiconductor layer 108C, the insulating layer 106, and the conductive layer 104B. In the transistor M15, the conductive layer 112*bB* serves as one of a source electrode and a drain electrode and the conductive layer 112*aA* serves as the other. Part of the insulating layer 106 serves as a gate insulating layer, and the conductive layer 104B serves as a gate electrode. The conductive layer 112*aA* serves as the one of the source electrode and the drain electrode of the transistor M13 and also as the other of the source electrode and the drain electrode of the transistor M15.

The conductive layer 112*bB* and the insulating layer 110 have the openings 143C and 141C in a region overlapping with the conductive layer 112*aA*. The semiconductor layer 108C is provided to cover the openings 143C and 141C. The insulating layer 106 is provided over the semiconductor layer 108C, and the conductive layer 104B is provided over the insulating layer 106.

As illustrated in FIG. 32, the conductive layer 112*bB* included in the transistor M15 is electrically connected to the pixel electrode 111 through the conductive layers 104*p* and 234. The insulating layer 106 includes an opening 181 reaching the conductive layer 112*bB*, and the conductive layer 104*p* is provided to cover the opening 181. The insulating layers 195 and 233 are provided over the conductive layer 104*p*. The insulating layers 195 and 233 include an opening 182 reaching the conductive layer 104*p*, and the conductive layer 234 is provided to cover the opening 182. An insulating layer 235 is provided over the conductive layer 234. The insulating layer 235 includes an opening 184 reaching the conductive layer 234, and the pixel electrode 111 is provided to cover the opening 184.

The transistor M16 includes the conductive layers 112*aA* and 112*bC*, the semiconductor layer 108D, the insulating layer 106, and the conductive layer 104. In the transistor M16, the conductive layer 112*aA* serves as one of a source electrode and a drain electrode and the conductive layer 112*bC* serves as the other. Part of the insulating layer 106 serves as a gate insulating layer, and the conductive layer 104 serves as a gate electrode. The conductive layer 112*aA* serves as the one of the source electrode and the drain electrode of the transistor M13, as the other of the source electrode and the drain electrode of the transistor M15, and as one of a source electrode and a drain electrode of the transistor M16. The conductive layer 104 serves as the gate electrode of the transistor M11 and also as the gate electrode of the transistor M16.

The conductive layer 112*bC* and the insulating layer 110 have the openings 143D and 141D in a region overlapping with the conductive layer 112*aA*. The semiconductor layer 108D is provided to cover the openings 143D and 141D. The insulating layer 106 is provided over the semiconductor layer 108D, and the conductive layer 104 is provided over the insulating layer 106.

As illustrated in FIG. 33A, the capacitor C12 includes the conductive layers 112*aA* and 202 and the insulating layer 110 interposed between the conductive layers 112*aA* and 202. The insulating layer 120 is provided over the conductive layer 202. The insulating layer 120 includes an opening 185 reaching the conductive layer 202, and the conductive layer 112*bA* is provided to cover the opening 185. Note that there is no limitation on the top-view shape of the opening 185. The insulating layer 106 is provided over the conductive layer 112*bA*, and the conductive layer 104*q* is provided over the insulating layer 106. The conductive layer 104*q* is electrically connected to the conductive layer 112*bA* through an opening 186 and an opening 187 in the insulating layer 106. The conductive layer 104*q* can be formed in the same process as the conductive layers 104 and 204. For example, the conductive layer 104*q*, a material having lower resistance than the conductive layer 112*bA* is preferably used. Accordingly, wiring resistance between the capacitor C12 and the transistor M14 can be reduced. Note that the conductive layer 104*q* is not necessarily provided. Although the conductive layers 112*bA* and 202 are electrically connected by the region where they are in contact with each other in this structure, one embodiment of the present invention is not limited to this. The conductive layers 112*bA* and 202 may be electrically connected through the conductive layer 104*q* without the region where the conductive layers 112*bA* and 202 are in contact with each other. Specifically, the conductive layer 104*q* may be provided to cover the openings 185 and 187 while the conductive layer 112*bA* is not provided in the opening 185.

As illustrated in FIG. 33B, the capacitor C11 includes the conductive layers 112*b* and 212*a* and the insulating layer 106 interposed between the conductive layers 112*b* and 212*a*.

The conductive layer 112*a* serving as the other of the source electrode and the drain electrode of the transistor M11 is electrically connected to the wiring SL through the conductive layer 104*s*. The opening 190 reaching the conductive layer 112*a* is provided in the insulating layers 110 and 106, and the conductive layer 104*s* is provided to cover the opening 190. The insulating layers 195 and 233 are provided over the conductive layer 104*s*, the opening 191 reaching the conductive layer 104*s* is provided in a region of the insulating layers 195 and 233, and the wiring SL is provided to cover the opening 191.

The conductive layer 212*b* serving as the other of the source electrode and the drain electrode of the transistor M12 is electrically connected to the wiring ANO_2 through an opening 193. The opening 193 reaching the conductive layer 212*b* is provided in the insulating layers 195 and 233, and the wiring ANO_2 is provided to cover the opening 193.

The conductive layer 112*bC* serving as the other of the source electrode and the drain electrode of the transistor M16 is electrically connected to the wiring VL0 through the conductive layer 104*r*. An opening 194 reaching the conductive layer 112*bC* is provided in the insulating layer 106, and the conductive layer 104*r* is provided to cover the opening 194. The insulating layers 195 and 233 are provided over the conductive layer 104*r*, the opening 196 reaching the conductive layer 104*r* is provided in the insulating layers 195 and 233, and the wiring VL0 is provided to cover the opening 196.

In the layout example of the pixel 230 in FIG. 29, FIG. 30, and FIG. 31 and the like, the wirings ANO_1 and ANO_2 are wirings that supply current flowing through the light-emitting element (such as the light-emitting element 32) electrically connected to the pixel electrode 111 and preferably have low resistivity. The wiring ANO_1 therefore preferably has a larger width than each of the wirings GL1, GL2, and GL3, for example. The wiring ANO_2 preferably has a larger width than each of the wirings SL, VL0, and VL1, for example.

In the layout example of the pixel 230 in FIG. 29, FIG. 30, and FIG. 31 and the like, one of the wirings ANO_1 and ANO_2 may be provided while the other is not provided. For example, providing no wiring ANO_1 enables a reduction in the parasitic capacitance of the wiring SL and accordingly the display apparatus including the pixel 230 can be operated at higher speed. For example, providing no wiring ANO_2 enables a reduction in the parasitic capacitance of each of the wirings GL1, GL2, and GL3 and accordingly the display apparatus including the pixel 230 can be operated at higher speed.

In the layout example of the pixel 230 in FIG. 29, FIG. 30, and FIG. 31 and the like, the pixel electrode 111 overlaps with neither the wiring ANO_1 nor the wiring VL0. Although part of the pixel electrode 111 overlaps with part of the wiring ANO_2, the pixel electrode 111 may be provided not to overlap with the wiring ANO_2. The region where the pixel electrode 111 overlaps with any of the wirings ANO_1, ANO_2, and VL0 can be downsized or omitted, whereby the parasitic capacitance of the pixel electrode 111 can be reduced. Consequently, in the pixel 230, the electrostatic capacitance of each of the capacitors C11 and C12 can increasingly contribute to the parasitic capacitance of the pixel electrode 111. This stabilizes the operation of the pixel 230 and the display apparatus including the pixel 230.

In the layout example of the pixel 230 in FIG. 29, FIG. 30, and FIG. 31 and the like, vertical transistors like the transistor 100 in FIGS. 21A and 21B are used as the transistors M11 and M13 to M16, and a so-called planar transistor like the transistor 200 in FIGS. 22A to 22C is used as the transistor M12.

Each of the transistors M11 and M13 to M16 preferably has a high on-state current in order to serve as a switch. This can increases the operation speed of the display apparatus including the pixel 230. An example of a way of increasing the on-state current of a transistor is reducing the channel length. For example, the channel length of each of the transistors M11 and M13 to M16 is rendered shorter than that of the transistor M12. For example, the use of a vertical transistor as each of the transistors M11 and M13 to M16 makes their channel length shorter than the resolution limit of a light exposure apparatus (i.e., less than the minimum feature size of each of the conductive layers, insulating layers, semiconductor layers, and the like in the pixel 230). The use of a vertical transistor also permits a reduction in occupied area and an increase in the resolution of the display apparatus.

The transistor M12 preferably has favorable saturation to serve as a driving transistor that controls the amount of current flowing through the light-emitting element (such as the light-emitting element 32) electrically connected to the pixel electrode 111. Accordingly, current can flow through the light-emitting element stably, leading to stable emission intensity of the display apparatus including the pixel 230. The saturation of a transistor is increased by an increase in channel length, for example. For example, the channel length of the transistor M12 is rendered longer than that of each of the transistors M11 and M13 to M16. For example, a planar transistor is used as the transistor M12, in which case the channel length can be long.

Although not illustrated, the wirings GL1, GL2, GL3, and ANO_1 each extend in the horizontal direction of the drawing and are shared by the pixels 230 aligned in the horizontal direction in the case where the pixels 230 are arranged in a matrix in the display apparatus. In addition, the wirings SL, VL0, VL1, and ANO_2 each extend in the vertical direction of the drawing and are shared by the pixels 230 aligned in the vertical direction. In this case, the layout of adjacent pixels 230 is preferably inverted.

For example, the layout of pixel 230 placed immediately to the right of the pixel 230 illustrated in FIG. 29, FIG. 30, FIG. 31, and the like is inverted horizontally, whereby the wirings ANO_2 and VL1, the openings 183 and 193, and the like can be shared by the adjacent pixels 230. Consequently, the area occupied by the pixels 230 can be reduced and the resolution of the display apparatus including the pixels 230 can be increased.

For example, the layout of pixel 230 placed immediately to the left of the pixel 230 illustrated in FIG. 29, FIG. 30, FIG. 31, and the like is inverted horizontally, whereby the wiring VL0, the opening 196, and the like can be shared by the adjacent pixels 230. Consequently, the area occupied by the pixels 230 can be reduced and the resolution of the display apparatus including the pixels 230 can be increased.

For example, the layout of pixel 230 placed above and immediately to the pixel 230 illustrated in FIG. 29, FIG. 30, FIG. 31, and the like is inverted vertically, whereby the wiring ANO_1, the opening 183, and the like can be shared by the adjacent pixels 230. Consequently, the area occupied by the pixels 230 can be reduced and the resolution of the display apparatus including the pixels 230 can be increased.

For example, the layout of pixel 230 placed below and immediately to the pixel 230 illustrated in FIG. 29, FIG. 30, FIG. 31, and the like is inverted vertically, whereby the conductive layers 104*s* and 104*r*, the openings 190, 191, 194, and 196, and the like can be shared by the adjacent pixels 230. Consequently, the area occupied by the pixels

230 can be reduced and the resolution of the display apparatus including the pixels 230 can be increased.

Structure examples different from the aforementioned display apparatus are described.

Structure Example 2 of Display Apparatus

Figures 36A, 36B:
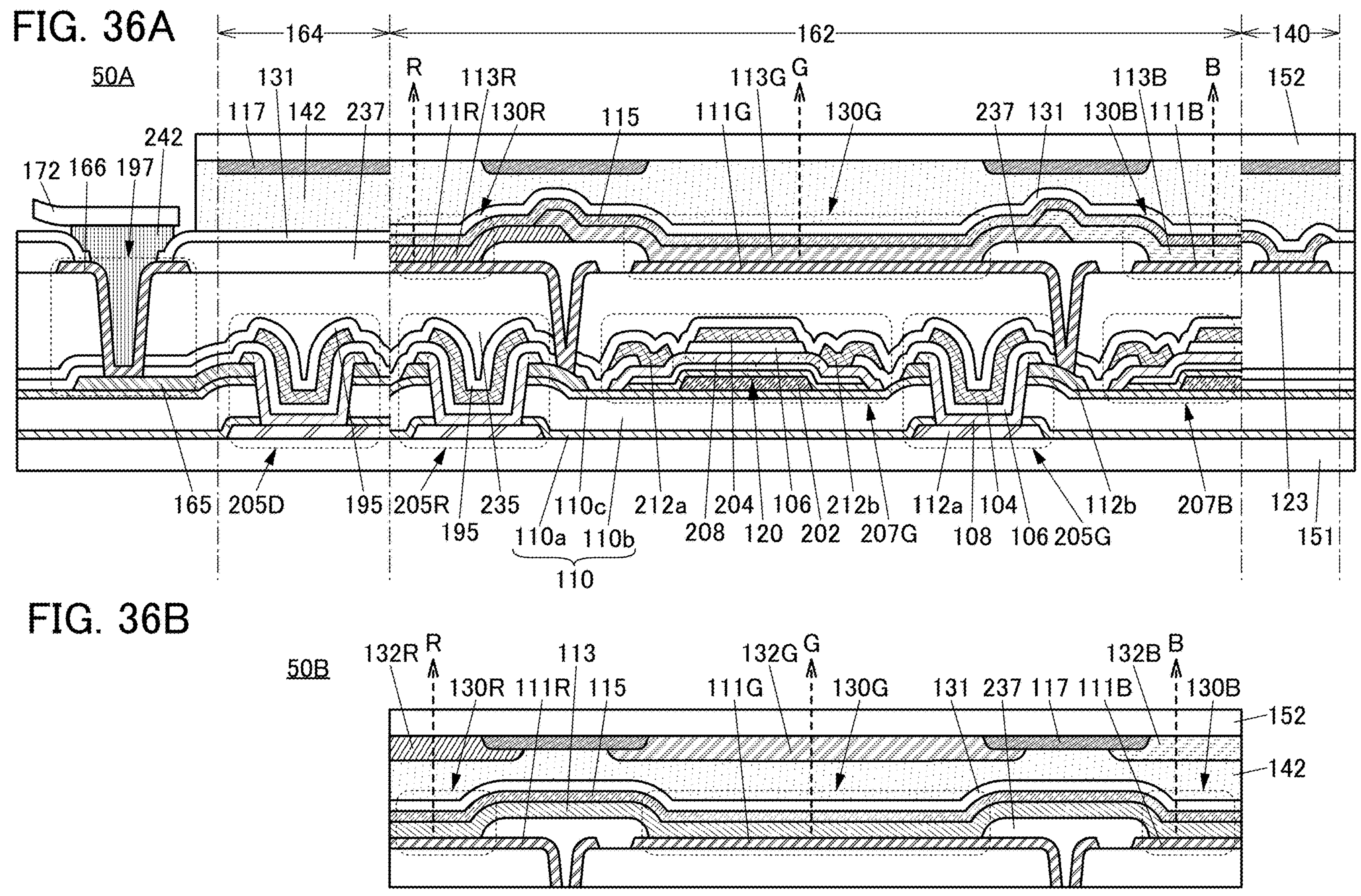
FIGS. 36A and 36B are cross-sectional views each showing structure examples of a display apparatus.

FIG. 36A illustrates an example of cross sections of part of a region including the FPC 172, part of the circuit portion 164, part of the display portion 162, part of the connection portion 140, and part of a region including the end portion of the display apparatus 50A. The description of the circuit portion 164 can be referred to for the circuit portion 163.

The display apparatus 50A illustrated in FIG. 36A includes transistors 205D, 205R, 205G, 207G, and 207B, light-emitting elements 130R, 130G, and 130B, and the like between the substrates 151 and 152. The light-emitting elements 130R, 130G, and 130B are display elements included in the pixel 230R that emits red light, the pixel 230G that emits green light, and the pixel 230B that emits blue light, respectively. Note that the "light-emitting element 130" is merely stated in some cases describing a matter common to the light-emitting elements 130R, 130G, and 130B.

The display apparatus 50A employs a side-by-side (SBS) structure. The SBS structure can optimize materials and structures of light-emitting elements and thus can extend freedom of choice of materials and structures, whereby the emission intensity and the reliability can be easily improved.

The display apparatus 50A has a top-emission structure. The aperture ratio of pixels in a top-emission structure can be higher than that of pixels in a bottom-emission structure because a transistor and the like can be provided so as to overlap with a light-emitting region of a light-emitting element in the top-emission structure.

All of the transistors 205D, 205R, 205G, 207G, and 207B are formed over the substrate 151. Some of the formation steps of these transistors can be the same.

Any one or more of the above-described transistors 100, 100A, 100B, 100C, 100D, and 200 can be used as one or more of the transistors 205D, 205R, 205G, 207G, and 207B. FIG. 36A shows a structure example in which the above-described transistor 100 is used as each of the transistors 205D, 205R, and 205G and the above-described transistor 200 is used as each of the transistors 207G and 207B.

The use of any one or more of the above-described transistors 100, 100A, 100B, 100C, and 100D as the transistor provided in the display portion 162 allows the display apparatus to have a high resolution. The transistor 200 having favorable saturation can be used as a driving transistor for the light-emitting element 130. Consequently, the display apparatus can be highly reliable.

The use of any one or more of the above-described transistors 100, 100A, 100B, 100C, and 100D as the transistor provided in the circuit portion 164 allows the display apparatus to have a high operation speed. The transistor provided in the circuit portion 164 is sometimes required to have a higher on-state current than that provided in the display portion 162. The circuit portion 164 preferably employs a transistor with a short channel length. For example, any one or more of the above-described transistors 100, 100A, 100B, 100C, and 100D as the transistor provided in the circuit portion can be used for the circuit portion 164. The use of any one or more of the above-described transistors 100, 100A, 100B, 100C, and 100D as the transistor provided in the circuit portion 164 can reduce the area occupied by the pixel circuit and the display apparatus can have a narrow bezel. Note that the transistor 200 may be used in the circuit portion 164.

Note that the transistor included in the display apparatus of this embodiment is not limited to the transistor included in the semiconductor device of one embodiment of the present invention. For example, the transistor included in the semiconductor device of one embodiment of the present invention may be combined with a transistor having another structure in combination. The display apparatus of this embodiment may include one or more of a planar transistor, a staggered transistor, and an inverted staggered transistor. A transistor included in the display apparatus may have a top-gate structure or a bottom-gate structure. Gates may be provided above and below a semiconductor layer where a channel is formed.

OS transistors can be used as the transistors 205D, 205R, 205G, 207G, and 207B.

A Si transistor may be included in the display apparatus of this embodiment.

To increase the emission intensity of the light-emitting element included in the pixel circuit, it is necessary to increase the amount of current flowing through the light-emitting element. For this, it is necessary to increase the drain-source voltage of a driving transistor included in the pixel circuit. Since an OS transistor has a higher breakdown voltage between the source and the drain than a Si transistor, a high voltage can be applied between the source and the drain of the OS transistor. Thus, with the use of an OS transistor as a driving transistor included in the pixel circuit, the amount of current flowing through the light-emitting element can be increased, resulting in an increase in emission intensity of the light-emitting element.

When transistors operate in a saturation region, a change in current flowing from the drain to the source relative to a change in gate-source voltage can be smaller in an OS transistor than in a Si transistor. Accordingly, when an OS transistor is used as the driving transistor included in the pixel circuit, a current flowing from the drain to the source can be set minutely by a change in gate-source voltage; hence, the amount of current flowing through the light-emitting element can be controlled. Consequently, the number of gray levels in the pixel circuit can be increased.

Regarding saturation characteristics of a current flowing when a transistor operates in a saturation region, a current (saturation current) can flow more stably in an OS transistor than in a Si transistor even when the drain-source voltage gradually increases. Thus, with the use of an OS transistor as a driving transistor, a current can be made to flow stably through the light-emitting element, for example, even when a variation in current-voltage characteristics of the light-emitting element occurs. In other words, when the OS transistor operates in the saturation region, the current flowing from the drain to the source hardly changes with a change in drain-source voltage; hence, the emission luminance of the light-emitting element can be stable.

The transistor included in the circuit portion 164 and the transistor included in the display portion 162 may have the same structure or different structures. One structure or two or more kinds of structures may be employed for a plurality of transistors included in the circuit portion 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure in which an LTPS transistor and an OS transistor are used in combination is referred to as LTPO in some cases. For example, a structure is given in which an OS transistor is used as a transistor functioning as a switch for controlling electrical continuity and discontinuity between wirings and an LTPS transistor is used as a transistor for controlling a current.

For example, one transistor included in the display portion 162 serves as a transistor for controlling a current flowing through the light-emitting element and can also be referred to as a driving transistor. One of a source and a drain of the driving transistor is electrically connected to a pixel electrode of the light-emitting element. An LTPS transistor can be used as the driving transistor. In that case, the amount of current flowing through the light-emitting element can be increased in the pixel circuit.

By contrast, another transistor included in the display portion 162 serves as a switch for controlling selection or non-selection of a pixel and can also be referred to as a selection transistor. A gate of the selection transistor is electrically connected to a gate line (scan line), and one of a source and a drain thereof is electrically connected to a source line (signal line). An OS transistor is preferably used as the selection transistor. Accordingly, the gray level of the pixel can be maintained even with an extremely low refresh rate (e.g., 1 Hz or lower); thus, power consumption can be reduced by stopping the driver (driver circuit) in displaying a still image.

An insulating layer 195 is provided to cover the transistors 205D, 205R, 205G, 207G, and 207B and an insulating layer 235 is provided over the insulating layer 195.

The light-emitting elements 130R, 130G, and 130B are provided over the insulating layer 235.

The light-emitting element 130R includes the pixel electrode 111R over the insulating layer 235, an EL layer 113R over the pixel electrode 111R, and a common electrode 115 over the EL layer 113R. The light-emitting element 130R illustrated in FIG. 36A emits red (R) light. The EL layer 113R includes a light-emitting layer that emits red light.

The light-emitting element 130G includes the pixel electrode 111G over the insulating layer 235, an EL layer 113G over the pixel electrode 111G, and the common electrode 115 over the EL layer 113G. The light-emitting element 130G illustrated in FIG. 36A emits green (G) light. The EL layer 113G includes a light-emitting layer that emits green light.

The light-emitting element 130B includes the pixel electrode 111B over the insulating layer 235, an EL layer 113B over the pixel electrode 111B, and the common electrode 115 over the EL layer 113B. The light-emitting element 130B illustrated in FIG. 36A emits blue (B) light. The EL layer 113B includes a light-emitting layer that emits blue light.

Although the EL layers 113R, 113G, and 113B have the same thickness in FIG. 36A, one embodiment of the present invention is not limited thereto. The EL layers 113R, 113G, and 113B may have different thicknesses. For example, the thicknesses of the EL layers 113R, 113G, and 113B are preferably set to match an optical path length that intensifies light emitted from each EL layer. In that case, a microcavity structure is obtained, and the color purity of light emitted from each light-emitting element can be improved.

The pixel electrode 111R is electrically connected to the conductive layer 112*b* included in the transistor 205R through an opening provided in the insulating layers 106, 195, and 235. In a similar manner, the pixel electrode 111G is electrically connected to the conductive layer 112*b* included in the transistor 205G and the pixel electrode 111B is electrically connected to the conductive layer 112*b* included in the transistor 205B (not illustrated).

End portions of the pixel electrodes 111R, 111G, and 111B are covered with an insulating layer 237. The insulating layer 237 serves as a partition. The insulating layer 237 can have a single-layer structure or a stacked-layer structure including one or both of an inorganic insulating material and an organic insulating material. A material that can be used for the insulating layer 195 and a material that can be used for the insulating layer 235 can be used for the insulating layer 237, for example. The insulating layer 237 can electrically isolate the pixel electrode and the common electrode. Furthermore, the insulating layer 237 can electrically isolate light-emitting elements adjacent to each other.

The insulating layer 237 is provided in at least the display portion 162. The insulating layer 237 may be provided in not only the display portion 162 but also the connection portion 140 and the circuit portion 164. The insulating layer 237 may be provided to extend to the end portion of the display apparatus 50A.

The common electrode 115 is one continuous film shared by the light-emitting elements 130R, 130G, and 130B. The common electrode 115 shared by the light-emitting elements is electrically connected to a conductive layer 123 provided in the connection portion 140. The conductive layer 123 is preferably formed using a conductive layer formed using the same material through the same process as the pixel electrodes 111R, 111G, and 111B.

In the display apparatus of one embodiment of the present invention, a conductive film that transmits visible light is preferably used for the electrode through which light is extracted, which is either the pixel electrode or the common electrode. A conductive film reflecting visible light is preferably used for the electrode through which light is not extracted.

A conductive film that transmits visible light may be used also for the electrode through which light is not extracted. In that case, this electrode is preferably provided between a reflective layer and the EL layer. In other words, light emitted by the EL layer may be reflected by the reflective layer to be extracted from the display apparatus.

As the material of the pair of electrodes of the light-emitting element, a metal, an alloy, an electrically conductive compound, a mixture thereof, or the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Other examples of the material include indium tin oxide (also referred to as In—Sn oxide or ITO), In—Si—Sn oxide (also referred to as ITSO), indium zinc oxide (In—Zn oxide), and In—W—Zn oxide. Other examples of the material include an alloy containing aluminum (aluminum alloy), such as an alloy of aluminum, nickel, and lanthanum (Al—Ni—La), and an alloy containing silver, such as an alloy of silver and magnesium and an alloy of silver, palladium, and copper (also referred to as Ag—Pd—Cu or APC). Other examples of the material include an element belonging to Group 1 or Group 2 of the periodic table that is not described above (e.g., lithium, cesium, calcium, or strontium), a rare earth metal such as europium or ytterbium, an alloy containing an appropriate combination of any of these elements, and graphene.

The light-emitting element preferably employs a microcavity structure. Therefore, one of the pair of electrodes of the light-emitting element preferably includes an electrode having properties of transmitting and reflecting visible light (a transflective electrode), and the other preferably includes an electrode having a property of reflecting visible light (a reflective electrode). When the light-emitting element has a microcavity structure, light obtained from the light-emitting layer can be resonated between the electrodes, whereby light emitted from the light-emitting element can be intensified.

The transparent electrode has a light transmittance higher than or equal to 40%. For example, an electrode having a visible light (light with wavelengths greater than or equal to 400 nm and less than 750 nm) transmittance higher than or equal to 40% is preferably used as the transparent electrode of the light-emitting element. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than 100%, preferably higher than or equal to 70% and lower than 100%. These electrodes preferably have a resistivity lower than or equal to $1\times10^{-2}$ Ωcm.

The EL layers 113R, 113G, and 113B are each provided to have an island shape. In FIG. 36A, end portions of the EL layers 113R and 113G adjacent to each other overlap with each other, end portions of the EL layers 113G and 113B adjacent to each other overlap with each other, and end portions of the EL layers 113R and 113B adjacent to each other overlap with each other. When island-shaped EL layers are formed using a metal mask (or a fine metal mask), end portions of the EL layers adjacent to each other may overlap with each other as illustrated in FIG. 36A; however, the present invention is not limited thereto. That is, it is also possible that the EL layers adjacent to each other do not overlap with each other and are apart from each other. It is also possible that the display apparatus includes both a portion where the EL layers adjacent to each other overlap with each other and a portion where the EL layers adjacent to each other do not overlap with each other and are apart from each other.

Each of the EL layers 113R, 113G, and 113B includes at least a light-emitting layer. The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

The light-emitting layer may contain one or more kinds of organic compounds (e.g., a host material or an assist material) in addition to the light-emitting substance (a guest material). As one or more kinds of organic compounds, one or both of a substance with a good hole-transport property (a hole-transport material) and a substance with a good electron-transport property (an electron-transport material) can be used. As the one or more kinds of organic compounds, a substance with a bipolar property (a substance with a good electron-transport property and a good hole-transport property) or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (the phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In addition to the light-emitting layer, the EL layer can include one or more of a layer containing a substance having a good hole-injection property (a hole-injection layer), a layer containing a hole-transport material (a hole-transport layer), a layer containing a substance having a good electron-blocking property (an electron-blocking layer), a layer containing a substance having a good electron-injection property (an electron-injection layer), a layer containing an electron-transport material (an electron-transport layer), and a layer containing a substance having a good hole-blocking property (a hole-blocking layer). The EL layer may further include one or both of a bipolar substance and a TADF material.

Either a low molecular compound or a high molecular compound can be used in the light-emitting element, and an inorganic compound may also be included. Each layer included in the light-emitting element can be formed by any of the following methods: an evaporation method (including a vacuum evaporation method), a transfer method, a printing method, an inkjet method, a coating method, and the like.

The light-emitting element may employ a single structure (a structure including only one light-emitting unit) or a tandem structure (a structure including a plurality of light-emitting units). The light-emitting unit includes at least one light-emitting layer. In a tandem structure, a plurality of light-emitting units are connected in series with a charge-generation layer therebetween. The charge-generation layer has a function of injecting electrons into one of two light-emitting units and injecting holes to the other when a voltage is applied between the pair of electrodes. A tandem structure enables a light-emitting element capable of emitting light with high emission intensity. Furthermore, the amount of current needed for obtaining a predetermined emission intensity can be lower in a tandem structure than in a single structure; thus, a tandem structure enables higher reliability. A tandem structure may be referred to as a stack structure.

In the case of using a tandem light-emitting element in FIG. 36A, the EL layer 113R preferably includes a plurality of light-emitting units that emit red light, the EL layer 113G preferably includes a plurality of light-emitting units that emit green light, and the EL layer 113B preferably includes a plurality of light-emitting units that emit blue light.

A protective layer 131 is provided over the light-emitting elements 130R, 130G, and 130B. The protective layer 131 and the substrate 152 are bonded to each other with an adhesive layer 142. The substrate 152 is provided with a light-blocking layer 117. A solid sealing structure, a hollow sealing structure, or the like can be employed to seal the light-emitting elements. In FIG. 36A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In that case, the adhesive layer 142 may be provided not to overlap with the light-emitting element. Alternatively, the space may be filled with a resin other than the frame-shaped adhesive layer 142.

The protective layer 131 is provided at least in the display portion 162, and preferably provided to cover the entire display portion 162. The protective layer 131 is preferably provided to cover not only the display portion 162 but also the connection portion 140 and the circuit portion 164. It is further preferable that the protective layer 131 be provided to extend to the end portion of the display apparatus 50A. Meanwhile, a connection portion 197 has a portion not provided with the protective layer 131 so that the FPC 172 and a conductive layer 166 are electrically connected to each other.

By providing the protective layer 131 over the light-emitting elements 130R, 130G, and 130B, the reliability of the light-emitting elements can be increased.

The protective layer 131 may have a single-layer structure or a stacked-layer structure of two or more layers. There is no limitation on the conductivity of the protective layer 131. For the protective layer 131, at least one of an insulating film, a semiconductor film, and a conductive film can be used.

The protective layer 131 including an inorganic film can inhibit deterioration of the light-emitting elements by preventing oxidation of the common electrode 115 and inhibiting entry of impurities (e.g., moisture and oxygen) into the light-emitting elements, for example; thus, the reliability of the display apparatus can be improved.

An inorganic insulating film can be used as the protective layer 131. Examples of the material that can be used for the inorganic insulating film include an oxide, a nitride, an oxynitride, and a nitride oxide. Specific examples of these inorganic insulating films are as described above. In particular, the protective layer 131 preferably includes a nitride or a nitride oxide, and further preferably includes a nitride.

An inorganic film containing ITO, In—Zn oxide, Ga—Zn oxide, Al—Zn oxide, IGZO, or the like can be used for the protective layer 131. The inorganic film preferably has high resistance, specifically, higher resistance than the common electrode 115. The inorganic film may further contain nitrogen.

When light emitted from the light-emitting element is extracted through the protective layer 131, the protective layer 131 preferably has a good visible-light-transmitting property. For example, ITO, IGZO, and aluminum oxide are preferable because they are inorganic materials having a good visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. For example, the protective layer 131 may include both an organic film and an inorganic film. Examples of an organic film that can be used for the protective layer 131 include organic insulating films that can be used for the insulating layer 235.

The connection portion 197 is provided in a region of the substrate 151 not overlapping with the substrate 152. In the connection portion 197, the conductive layer 165 is electrically connected to the FPC 172 through the conductive layer 166 and a connection layer 242. In this example, the conductive layer 165 is a single-layer conductive layer obtained by processing the same conductive film as the conductive layer 112*b*. In this example, the conductive layer 166 is a single-layer conductive layer obtained by processing the same conductive film as the pixel electrodes 111R, 111G, and 111B. On the upper surface of the connection portion 197, the conductive layer 166 is exposed. Thus, the connection portion 197 and the FPC 172 can be electrically connected to each other through the connection layer 242.

The display apparatus 50A has a top-emission structure. Light from the light-emitting element is emitted toward the substrate 152. For the substrate 152, a material having a good visible-light-transmitting property is preferably used. The pixel electrodes 111R, 111G, and 111B contain a material that reflects visible light, and the counter electrode (the common electrode 115) contains a material that transmits visible light.

The light-blocking layer 117 is preferably provided on the surface of the substrate 152 on the substrate 151 side. The light-blocking layer 117 can be provided over a region between adjacent light-emitting elements, in the connection portion 140, in the circuit portion 164, and the like.

A coloring layer such as a color filter may be provided on the surface of the substrate 152 on the substrate 151 side or over the protective layer 131. When the color filter is provided so as to overlap with the light-emitting element, the color purity of light emitted from the pixel can be increased.

The coloring layer is a colored layer that selectively transmits light in a specific wavelength range and absorbs light in the other wavelength ranges. For example, a red (R) color filter for transmitting light in the red wavelength range, a green (G) color filter for transmitting light in the green wavelength range, a blue (B) color filter for transmitting light in the blue wavelength range, or the like can be used. Each coloring layer can be formed using one or more of a metal material, a resin material, a pigment, and a dye. Each coloring layer is formed in a desired position by a printing method, an ink-jet method, an etching method using a photolithography method, or the like.

Moreover, a variety of optical members can be provided on the outer surface of the substrate 152 (the surface opposite to the substrate 151). Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 152. For example, a glass layer or a silica layer ($SiO_x$ layer) is preferably provided as the surface protective layer to inhibit the surface contamination and damage. The surface protective layer may be formed using diamond like carbon (DLC), aluminum oxide ($AlO_x$), a polyester-based material, a polycarbonate-based material, or the like. For the surface protective layer, a material having a high visible light transmittance is preferably used. The surface protective layer is preferably formed using a material with high hardness.

For each of the substrates 151 and 152, glass, quartz, ceramic, sapphire, a resin, a metal, an alloy, a semiconductor, or the like can be used. The substrate on the side from which light from the light-emitting element is extracted is formed using a material that transmits the light. The use of a material having flexibility for each of the substrates 151 and 152 can increases the flexibility of the display apparatus and can offer a flexible display (e.g., a bendable display, a foldable display, a rollable display, a slidable display, or a stretchable display). Furthermore, a polarizing plate may be used as at least one of the substrates 151 and 152.

For each of the substrates 151 and 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as at least one of the substrates 151 and 152.

In the case where a circularly polarizing plate overlaps with the display apparatus, for example, a highly optically isotropic substrate can be used as the substrate included in the display apparatus. A highly optically isotropic substrate has a low birefringence (in other words, a small amount of birefringence). Examples of the film having high optical isotropy include a triacetyl cellulose (TAC, also referred to as cellulose triacetate) film, a cycloolefin polymer (COP) film, a cycloolefin copolymer (COC) film, and an acrylic film.

The adhesive layer 142 can be formed using any of a variety of curable adhesives, e.g., a reactive curable adhesive, a thermosetting curable adhesive, an anaerobic adhesive, or a photocurable adhesive such as an ultraviolet curable adhesive. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

For the connection layer 242, an anisotropic conductive film (ACF), an anisotropic conductive paste (ACP), or the like can be used.

For manufacture of the light-emitting elements, a vacuum process such as an evaporation method and a solution process such as a spin coating method or an inkjet method can be used in one embodiment of the present invention. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., ink-jetting, screen printing (stencil), offset printing (planography), flexography (relief printing), gravure printing, or micro-contact printing), or the like.

Structure Example 3 of Display Apparatus

FIG. 36B shows an example of a cross section of the display portion 162 of a display apparatus 50B. The display apparatus 50B is different from the display apparatus 50A mainly in that the subpixels of different colors include respective coloring layers (color filters or the like) and the light-emitting elements that share an EL layer 113. The structure illustrated in FIG. 36B can be combined with the structure of the region including the FPC 172, the circuit portion 164, the stacked-layer structure from the substrate 151 to the insulating layer 235 in the display portion 162, the connection portion 140, and the end portion, which is illustrated in FIG. 36A. Note that in the following description of display apparatuses, the description of portions similar to those of the above-described display apparatus may be omitted.

In the display apparatus 50B illustrated in FIG. 36B, the light-emitting elements 130R, 130G, and 130B, the coloring layer 132R transmitting red light, the coloring layer 132G transmitting green light, the coloring layer 132B transmitting blue light, and the like are provided.

The light-emitting element 130R includes the pixel electrode 111R, the EL layer 113 over the pixel electrode 111R, and the common electrode 115 over the EL layer 113. Light emitted from the light-emitting element 130R is extracted as red light to the outside of the display apparatus 50B through the coloring layer 132R.

The light-emitting element 130G includes the pixel electrode 111G, the EL layer 113 over the pixel electrode 111G, and the common electrode 115 over the EL layer 113. Light emitted from the light-emitting element 130G is extracted as green light to the outside of the display apparatus 50B through the coloring layer 132G.

The light-emitting element 130B includes the pixel electrode 111B, the EL layer 113 over the pixel electrode 111B, and the common electrode 115 over the EL layer 113. Light emitted from the light-emitting element 130B is extracted as blue light to the outside of the display apparatus 50B through the coloring layer 132B.

The EL layer 113 and the common electrode 115 are shared between the light-emitting elements 130R, 130G, and 130B. The number of manufacturing steps can be smaller in the case where the EL layer 113 is shared between the subpixels of different colors than the case where the subpixels of different colors include different EL layers.

The light-emitting elements 130R, 130G, and 130B illustrated in FIG. 36B emit white light, for example. When white light emitted from the light-emitting elements 130R, 130G, and 130B passes through the coloring layers 132R, 132G, and 132B, light of desired colors can be obtained.

In the light-emitting element that emits white light, two or more light-emitting layers are preferably included. When two light-emitting layers are used to obtain white light, two light-emitting layers that emit light of complementary colors are selected. For example, when the emission colors of the first light-emitting layer and the second light-emitting layer are made complementary, the light-emitting element can be configured to emit white light as a whole. In the case where three or more light-emitting layers are used to obtain white light, the light-emitting element is configured to emit white light as a whole by combining emission colors of the three or more light-emitting layers.

For example, the EL layer 113 preferably includes a light-emitting layer containing a light-emitting substance that emits blue light and a light-emitting layer containing a light-emitting substance that emits visible light having a longer wavelength than blue light. The EL layer 113 preferably includes a light-emitting layer that emits yellow light and a light-emitting layer that emits blue light, for example. Alternatively, the EL layer 113 preferably includes a light-emitting layer that emits red light, a light-emitting layer that emits green light, and a light-emitting layer that emits blue light, for example.

A light-emitting element that emits white light preferably has a tandem structure. Specific examples include the following structures: a two-unit tandem structure including a light-emitting unit that emits yellow (Y) light and a light-emitting unit that emits blue (B) light; a two-unit tandem structure including a light-emitting unit that emits red (R) light and green (G) light and a light-emitting unit that emits blue light; a three-unit tandem structure in which a light-emitting unit that emits blue light, a light-emitting unit that emits yellow, yellow-green, or green light, and a light-emitting unit that emits blue light are stacked in this order; and a three-unit tandem structure in which a light-emitting unit that emits blue light, a light-emitting unit that emits yellow, yellow-green, or green light and red light, and a light-emitting unit that emits blue light are stacked in this order. Examples of the number of stacked light-emitting units and the order of colors from the anode side include the following structures: a two-unit structure of B and Y; a two-unit structure of B and X (a light-emitting unit X); a three-unit structure of B, Y, and B; a three-unit structure of B, X, and B; a two-unit structure of R and Y; a two-unit structure of R and G; a two-unit structure of G and R; a three-unit structure of G, R, and G; and a three-unit structure of R, G, and R. Another layer may be provided between two light-emitting layers.

In the case where the light-emitting element configured to emit white light has a microcavity structure, light with a specific wavelength (e.g., red, green, or blue) is sometimes intensified to be emitted.

Alternatively, the light-emitting elements 130R, 130G, and 130B illustrated in FIG. 36B emit blue light, for example. In this case, the EL layer 113 includes one or more light-emitting layers that emit blue light. In the pixel 230B that emits blue light, blue light emitted from the light-emitting element 130B can be extracted. In each of the pixel 230R that emits red light and the pixel 230G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. In some cases, part of light emitted from the light-emitting element is transmitted through the color conversion layer without being converted. When light transmitted through the color conversion layer is extracted through the coloring layer, light other than light of the intended color can be absorbed by the coloring layer, and color purity of light exhibited by a subpixel can be improved.

Structure Example 4 of Display Apparatus

Figures 37A, 37B:
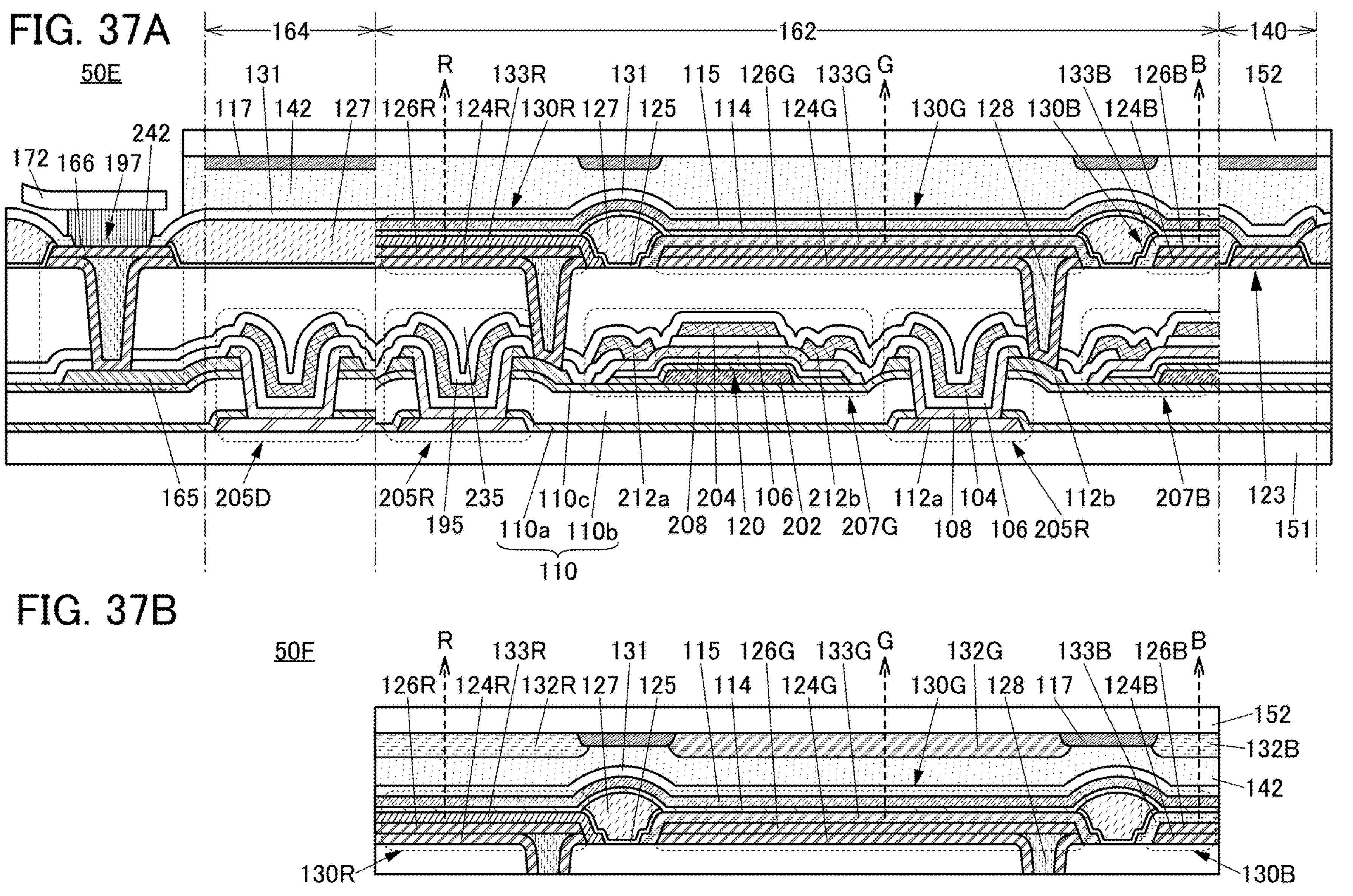
FIGS. 37A and 37B are cross-sectional views each showing structure examples of a display apparatus.

A display apparatus 50E illustrated in FIG. 37A is an example of a display apparatus having a metal maskless (MML) structure. In other words, the display apparatus 50E includes a light-emitting element that is formed without using a metal mask (or a fine metal mask). The stacked-layer structure from the substrate 151 to the insulating layer 235 and the stacked-layer structure from the protective layer 131 to the substrate 152 are similar to those in the display apparatus 50A; therefore, description thereof is omitted.

A light-emitting element having the MML structure can be manufactured without using a metal mask. Such a light-emitting element can achieve a display apparatus passing the restrictions on resolution that are attribute to the alignment accuracy with a metal mask. Furthermore, the manufacturing facilities and washing process for metal masks can be unnecessary. This enables mass production of display apparatuses.

Furthermore, the display apparatus employing the MML (metal maskless) structure enables the display apparatus in which minute light-emitting elements are integrated. Without a pseudo improvement in resolution by employing a unique pixel arrangement such as a PenTile arrangement, the display apparatus can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe arrangement where R, G, and B are arranged in one direction.

In the light-emitting element having a MML structure, a layer including the light-emitting layer is formed by deposition on the entire surface and processing by a photolithography method, not by using a fine metal mask. Accordingly, a high-resolution display apparatus or a display apparatus with a high aperture ratio, which has been difficult to be formed so far, can be obtained. Moreover, light-emitting layers can be formed separately for the respective colors, enabling the display apparatus to perform extremely clear display with high contrast and high display quality. Moreover, providing a sacrificial layer over the light-emitting layer can reduce damage to the light-emitting layer in the manufacturing process of the display apparatus, resulting in an increase in reliability of the light-emitting element.

For example, in the case where the display apparatus includes three kinds of light-emitting elements, which are a light-emitting element that emits blue light, a light-emitting element that emits green light, and a light-emitting element that emits red light, three kinds of island-shaped light-emitting layers can be formed by forming a light-emitting layer and performing processing three times by photolithography.

In FIG. 37A, the light-emitting elements 130R, 130G, and 130B are provided over the insulating layer 235.

The light-emitting element 130R includes a conductive layer 124R over the insulating layer 235, a conductive layer 126R over the conductive layer 124R, a layer 133R over the conductive layer 126R, a common layer 114 over the layer 133R, and the common electrode 115 over the common layer 114. The light-emitting element 130R illustrated in FIG. 37A emits red (R) light. The layer 133R includes a light-emitting layer that emits red light. In the light-emitting element 130R, the layer 133R and the common layer 114 can be collectively referred to as an EL layer. One or both of the conductive layer 124R and the conductive layer 126R can be referred to as a pixel electrode.

The light-emitting element 130G includes a conductive layer 124G over the insulating layer 235, a conductive layer 126G over the conductive layer 124G, a layer 133G over the conductive layer 126G, the common layer 114 over the layer 133G, and the common electrode 115 over the common layer 114. The light-emitting element 130G illustrated in FIG. 37A emits green (G) light. The layer 133G includes a light-emitting layer that emits green light. In the light-emitting element 130G, the layer 133G and the common layer 114 can be collectively referred to as an EL layer. One or both of the conductive layer 124G and the conductive layer 126G can be referred to as a pixel electrode.

The light-emitting element 130B includes a conductive layer 124B over the insulating layer 235, a conductive layer 126B over the conductive layer 124B, a layer 133B over the conductive layer 126B, the common layer 114 over the layer 133B, and the common electrode 115 over the common layer 114. The light-emitting element 130B illustrated in FIG. 37A emits blue (B) light. The layer 133B includes a light-emitting layer that emits blue light. In the light-emitting element 130B, the layer 133B and the common layer 114 can be collectively referred to as an EL layer. One or both of the conductive layer 124B and the conductive layer 126B can be referred to as a pixel electrode.

In this specification and the like, in the EL layers included in the light-emitting elements, the island-shaped layer provided in each light-emitting element is referred to as the layer 133B, the layer 133G, or the layer 133R, and the layer shared by the light-emitting elements is referred to as the common layer 114. Note that in this specification and the like, only the layers 133R, 133G, and 133B are sometimes referred to as island-shaped EL layers, EL layers formed in an island shape, or the like, in which case the common layer 114 is not included in the EL layer.

The layers 133R, 133G, and 133B are isolated from each other. When the EL layer is provided to have an island shape for each light-emitting element, a leakage current between adjacent light-emitting elements can be inhibited. This can prevent crosstalk-induced unintended light emission, so that a display apparatus with extremely high contrast can be obtained.

Although the layers 133R, 133G, and 133B have the same thickness in FIG. 37A, the present invention is not limited thereto. The layers 133R, 133G, and 133B may have different thicknesses.

The conductive layer 124R is electrically connected to the conductive layer 112*b* included in the transistor 205R through an opening provided in the insulating layers 106, 195, and 235. In a similar manner, the conductive layer 124G is electrically connected to the conductive layer 112*b* included in the transistor 205G and the conductive layer 124B is electrically connected to the conductive layer 112*b* included in the transistor 205B.

The conductive layers 124R, 124G, and 124B are formed to cover the openings provided in the insulating layer 235. A layer 128 is embedded in each of the depressions of the conductive layers 124R, 124G, and 124B.

The layer 128 has a function of filling the depressions of the conductive layers 124R, 124G, and 124B. The conductive layers 126R, 126G, and 126B electrically connected to the conductive layers 124R, 124G, and 124B, respectively, are provided over the conductive layers 124R, 124G, and 124B and the layer 128. Thus, regions overlapping with the depressions of the conductive layers 124R, 124G, and 124B can also be used as the light-emitting regions, increasing the aperture ratio of the pixels. The conductive layer 124R and the conductive layer 126R each preferably include a conductive layer functioning as a reflective electrode.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 237 can be used, for example.

Although FIG. 37A illustrates an example where the upper surface of the layer 128 includes a flat portion, the shape of the layer 128 is not particularly limited. The upper surface of the insulating layer 128 may include at least one of a convex surface, a concave surface, and a flat surface.

The level of the upper surface of the layer 128 and the level of the upper surface of the conductive layer 124R may be the same or substantially the same, or may be different from each other. For example, the level of the upper surface of the layer 128 may be either lower or higher than the level of the upper surface of the conductive layer 124R.

An end portion of the conductive layer 126R may be aligned with an end portion of the conductive layer 124R or may cover the side surface of the end portion of the conductive layer 124R. The end portions of the conductive layers 124R and 126R each preferably have a tapered shape. Specifically, the end portions of the conductive layers 124R and 126R each preferably have a tapered shape with a taper angle greater than 0° and less than 90°. In the case where the end portions of the pixel electrodes have a tapered shape, the layer 133R provided along the side surfaces of the pixel electrodes has an inclined portion. When the side surface of the pixel electrode has a tapered shape, coverage with an EL layer provided along the side surface of the pixel electrode can be improved.

Since the conductive layers 124G and 126G and the conductive layers 124B and 126B are similar to the conductive layers 124R and 126R, the detailed description thereof is omitted.

The upper and side surfaces of the conductive layer 126R are covered with the layer 133R. Similarly, the upper and side surfaces of the conductive layers 126G are covered with the layer 133G, and the upper and side surfaces of the conductive layers 126B are covered with the layer 133B. Accordingly, regions provided with the conductive layers 126R, 126G, and 126B can be entirely used as the light-emitting regions of the light-emitting elements 130R, 130G, and 130B, thereby increasing the aperture ratio of the pixels.

The side surface and part of the upper surface of each of the layers 133R, 133G, and 133B are covered with the insulating layers 125 and 127. The common layer 114 is provided over the layers 133R, 133G, and 133B and the insulating layers 125 and 127, and the common electrode 115 is provided over the common layer 114. The common layer 114 and the common electrode 115 are each one continuous film shared by a plurality of light-emitting elements.

In FIG. 37A, the insulating layer 237 illustrated in FIG. 36A or the like is not provided between the conductive layer 126R and the layer 133R. That is, an insulating layer (also referred to as a partition wall, a bank, a spacer, or the like) covering and in contact with an upper end portion of the pixel electrode is not provided in the display apparatus 50E. Thus, the interval between adjacent light-emitting elements can be extremely shortened. Accordingly, the display apparatus can have high resolution or high definition. In addition, a mask (e.g., a photomask) for forming the insulating layer is not needed, which leads to a reduction in manufacturing cost of the display apparatus.

As described above, the layers 133R, 133G, and 133B each include the light-emitting layer. The layers 133R, 133G, and 133B each preferably include the light-emitting layer and a carrier-transport layer (an electron-transport layer or a hole-transport layer) over the light-emitting layer. Alternatively, the layers 133R, 133G, and 133B each preferably include a light-emitting layer and a carrier-blocking layer (a hole-blocking layer or an electron-blocking layer)

over the light-emitting layer. Alternatively, the layers 133R, 133G, and 133B each preferably include a light-emitting layer, a carrier-blocking layer over the light-emitting layer, and a carrier-transport layer over the carrier-blocking layer. Since surfaces of the layers 133R, 133G, and 133B are exposed in the manufacturing process of the display apparatus, providing one or both of the carrier-transport layer and the carrier-blocking layer over the light-emitting layer inhibits the light-emitting layer from being exposed on the outermost surface, so that damage to the light-emitting layer can be reduced. Thus, the reliability of the light-emitting element can be increased.

The common layer 114 includes, for example, an electron-injection layer or a hole-injection layer. Alternatively, the common layer 114 may be a stack of an electron-transport layer and an electron-injection layer, or may be a stack of a hole-transport layer and a hole-injection layer. The common layer 114 is shared by the light-emitting elements 130R, 130G, and 130B.

The side surfaces of the layers 133R, 133G, and 133B are each covered with the insulating layer 125. The insulating layer 127 covers the side surfaces of the layers 133R, 133G, and 133B with the insulating layer 125 therebetween.

The side surfaces (and part of the upper surfaces) of the layers 133R, 133G, and 133B are covered with at least one of the insulating layer 125 and the insulating layer 127, so that the common layer 114 (or the common electrode 115) can be inhibited from being in contact with the side surfaces of the pixel electrodes and the layers 133R, 133G, and 133B, leading to inhibition of a short circuit of the light-emitting elements. Thus, the reliability of the light-emitting element can be increased.

The insulating layer 125 is preferably in contact with the side surfaces of the layers 133R, 133G, and 133B. The insulating layer 125 in contact with the layers 133R, 133G, and 133B can prevent film separation of the layers 133R, 133G, and 133B, whereby the reliability of the light-emitting element can be increased.

The insulating layer 127 is provided over the insulating layer 125 to fill a depression of the insulating layer 125. The insulating layer 127 preferably covers at least part of the side surface of the insulating layer 125.

The insulating layers 125 and 127 can fill a gap between adjacent island-shaped layers, whereby the formation surface of the layers (e.g., the carrier-injection layer and the common electrode) provided over the island-shaped layers can have higher flatness with small unevenness. Consequently, coverage with the carrier-injection layer, the common electrode, and the like can be improved.

The common layer 114 and the common electrode 115 are provided over the layer 133R, the layer 133G, the layer 133B, the insulating layer 125, and the insulating layer 127. Before the insulating layers 125 and 127 are provided, a step is generated due to a level difference between a region where the pixel electrode and the island-shaped EL layer are provided and a region where neither the pixel electrode nor the island-shaped EL layer is provided (a region between the light-emitting elements). In the display apparatus of one embodiment of the present invention, the insulating layers 125 and 127 can eliminate the level difference and improve the coverage with the common layer 114 and the common electrode 115 can be improved. Thus, connection defects caused by step disconnection can be inhibited. In addition, an increase in electric resistance, which is caused by local thinning of the common electrode 115 due to the step, can be inhibited.

The upper surface of the insulating layer 127 preferably has a shape with high flatness. The upper surface of the insulating layer 127 may include at least one of a flat surface, a convex surface, and a concave surface. For example, the upper surface of the insulating layer 127 preferably has a smooth convex shape with a large radius of curvature.

An inorganic insulating film can be used for the insulating layer 125. Examples of the inorganic material that can be used for the inorganic insulating film include an oxide, a nitride, an oxynitride, and a nitride oxide. Specific examples of these inorganic insulating films are as described above. The insulating layer 125 may have a single-layer structure or a stacked-layer structure. In particular, aluminum oxide is preferably used because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film is formed by an ALD method as the insulating layer 125, the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. The insulating layer 125 preferably has a function of inhibiting diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer, entry of impurities (typically, at least one of water and oxygen) that would be diffused into the light-emitting elements from the outside can be inhibited. With this structure, a highly reliable light-emitting element and a highly reliable display apparatus can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, the insulating layer 125 preferably has a sufficiently low hydrogen concentration or a sufficiently low carbon concentration, and further preferably has both a sufficiently low hydrogen concentration and a sufficiently low carbon concentration.

The insulating layer 127 provided over the insulating layer 125 has a function of filling large unevenness of the insulating layer 125, which is formed between the adjacent light-emitting elements. In other words, the insulating layer 127 has an effect of improving the planarity of the formation surface of the common electrode 115.

As the insulating layer 127, an insulating layer containing an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic polymer in a broad sense in some cases.

Alternatively, the insulating layer 127 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used as the photosensitive resin. As the photosensitive organic resin, either a positive-type material or a negative-type material may be used.

The insulating layer 127 may be formed using a material absorbing visible light. When the insulating layer 127 absorbs light emitted from the light-emitting element, light leakage (stray light) from the light-emitting element to the adjacent light-emitting element through the insulating layer 127 can be suppressed. Thus, the display quality of the display apparatus can be improved. Since no polarizing plate is required to improve the display quality of the display apparatus, the weight and thickness of the display apparatus can be reduced.

Examples of the material absorbing visible light include a material containing a pigment of black or any other color, a material containing a dye, a light-absorbing resin material (e.g., polyimide), and a resin material that can be used for color filters (a color filter material). Using a resin material obtained by stacking or mixing color filter materials of two or three or more colors is particularly preferred to enhance the effect of blocking visible light. In particular, mixing color filter materials of three or more colors enables the formation of a black or nearly black resin layer.

Structure Example 5 of Display Apparatus

FIG. 37B shows an example of a cross section of the display portion 162 of a display apparatus 50F. The display apparatus 50F is different from the display apparatus 50E mainly in that the subpixels of different colors include light-emitting elements including the layers 133R, 133G, and 133B and respective coloring layers (color filters or the like). The structure illustrated in FIG. 37B can be combined with the structure of the region including the FPC 172, the circuit portion 164, the stacked-layer structure from the substrate 151 to the insulating layer 235 in the display portion 162, the connection portion 140, and the end portion, which is illustrated in FIG. 37A.

In the display apparatus 50F illustrated in FIG. 37B, the light-emitting elements 130R, 130G, and 130B, the coloring layer 132R transmitting red light, the coloring layer 132G transmitting green light, the coloring layer 132B transmitting blue light, and the like are provided.

Light emitted from the light-emitting element 130R is extracted as red light to the outside of the display apparatus 50F through the coloring layer 132R. Similarly, light emitted from the light-emitting element 130G is extracted as green light to the outside of the display apparatus 50F through the coloring layer 132G. Light emitted from the light-emitting element 130B is extracted as blue light to the outside of the display apparatus 50F through the coloring layer 132B.

The light-emitting elements 130R, 130G, and 130B include the layers 133R, 133G, and 133B, respectively. The layers 133R, 133G, and 133B are formed using the same material in the same step. The layers 133R, 133G, and 133B are isolated from each other. When the EL layer is provided to have an island shape for each light-emitting element, a leakage current between adjacent light-emitting elements can be inhibited. This can prevent crosstalk-induced unintended light emission, so that a display apparatus with extremely high contrast can be obtained.

The light-emitting elements 130R, 130G, and 130B illustrated in FIG. 37B emit white light, for example. When white light emitted from the light-emitting elements 130R, 130G, and 130B passes through the coloring layers 132R, 132G, and 132B, light of desired colors can be obtained.

Alternatively, the light-emitting elements 130R, 130G, and 130B illustrated in FIG. 37B emit blue light, for example. In this case, the layers 133R, 133G, and 133B each include one or more light-emitting layers that emit blue light. In the pixel 230B that emits blue light, blue light emitted from the light-emitting element 130B can be extracted. In each of the pixel 230R that emits red light and the pixel 230G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. When light transmitted through the color conversion layer is extracted through the coloring layer, light other than light of the intended color can be absorbed by the coloring layer, and color purity of light exhibited by a subpixel can be improved.

This embodiment can be combined with any of the other embodiments as appropriate.

Embodiment 4

In this embodiment, a transistor including an oxide semiconductor in a channel formation region (OS transistor) is described. In the description of the OS transistor, comparison with a transistor including silicon in a channel formation region (also referred to as a Si transistor) is also described simply.

[OS Transistor]

An oxide semiconductor having a low carrier concentration is preferably used for the OS transistor. For example, the carrier concentration in a channel formation region of an oxide semiconductor is lower than or equal to $1\times10^{18}$ $cm^{-3}$, preferably lower than $1\times10^{17}$ $cm^{-3}$, further preferably lower than $1\times10^{16}$ $cm^{-3}$, still further preferably lower than $1\times10^{13}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases. Charge trapped by the trap states in the oxide semiconductor takes a long time to disappear and might behave like fixed charge. Thus, a transistor whose channel formation region is formed in an oxide semiconductor having a high density of trap states has unstable electrical characteristics in some cases.

In order to obtain stable electrical characteristics of the transistor, reducing the impurity concentration in the oxide semiconductor is effective. In order to reduce the impurity concentration in the oxide semiconductor, the impurity concentration in a film that is adjacent to the oxide semiconductor is preferably reduced. Examples of the impurity include hydrogen and nitrogen. Note that an impurity in an oxide semiconductor refers to, for example, elements other than the main components of the oxide semiconductor. For example, an element with a concentration lower than 0.1 atomic % is regarded as an impurity.

When impurities and oxygen vacancies are in a channel formation region of an oxide semiconductor in an OS transistor, electrical characteristics of the OS transistor easily vary and the reliability thereof might worsen. In some cases, the OS transistor has a defect that is an oxygen vacancy in the oxide semiconductor into which hydrogen enters (hereinafter sometimes referred to as $V_OH$), which generates an electron serving as a carrier. In the OS transistor, formation of $V_OH$ in the channel formation region increases the donor concentration in the channel formation region in some cases. The increased donor concentration in the channel formation region causes variation in the threshold voltage of the OS transistor in some cases. Thus, the oxygen vacancies in the channel formation region of the oxide semiconductor allow the OS transistor to easily have normally-on characteristics (to cause the drain current to flow at a gate voltage 0 V). Therefore, the impurities, oxygen vacancies, and $V_OH$ are preferably reduced as much as possible in the channel formation region of the oxide semiconductor.

The band gap of the oxide semiconductor is preferably larger than the band gap of silicon (typically 1.1 eV), further preferably larger than or equal to 2 eV, still further preferably larger than or equal to 2.5 eV, yet still further preferably larger than or equal to 3.0 eV. With the use of an oxide semiconductor having a larger band gap than silicon, the off-state current (also referred to as Ioff) of the transistor can be reduced.

In a Si transistor, a short-channel effect (also referred to as SCE) appears as scaling down of the transistor proceeds. Thus, it is difficult to scale down the Si transistor. One factor in causing the short-channel effect is a small band gap of silicon. By contrast, the OS transistor includes an oxide semiconductor that is a semiconductor material having a large band gap, and thus can suppress the short-channel effect. In other words, the OS transistor does not cause or hardly causes the short-channel effect.

The short-channel effect refers to degradation of electrical characteristics that becomes obvious along with scaling down (a decrease in channel length) of a transistor. Specific examples of the short-channel effect include a decrease in threshold voltage, an increase in subthreshold swing (sometimes referred to as S value), and an increase in leakage current. Here, the S value means the amount of change in gate voltage in the subthreshold region when the drain voltage is constant and the drain current is changed by one order of magnitude.

The characteristic length is widely used as an indicator of resistance to a short-channel effect. The characteristic length is an indicator of curving of potential in a channel formation region. As the characteristic length is shorter, the potential rises more sharply, which means that the resistance to a short-channel effect is high.

The OS transistor is an accumulation-type transistor and the Si transistor is an inversion-type transistor. Thus, the OS transistor has a shorter characteristic length between the channel formation region and each of the source region and the drain region than the Si transistor has. Accordingly, the OS transistor has higher resistance to a short-channel effect than the Si transistor has. That is, the OS transistor is more suitable than the Si transistor in the case where a short-channel transistor is to be formed.

Even in the case where the carrier concentration in the oxide semiconductor is reduced until the channel formation region becomes an i-type or substantially i-type region, the conduction band minimum of the channel formation region in a short-channel transistor decreases because of the conduction band lowering (CBL) effect; thus, there is a possibility that a difference in energy of the conduction band minimum between the channel formation region and the source region or the drain region is as small as 0.1 eV or more and 0.2 eV or less. Accordingly, the OS transistor can be regarded as having an $n^+/n^-/n^+$ accumulation-type junction-less transistor structure or an $n^+/n^-/n^+$ accumulation-type non-junction transistor structure in which the channel formation region becomes an $n^-$-type region and the source region and the drain region become $n^+$-type regions in the OS transistor.

The above-described structure enables the OS transistor to have excellent electrical characteristics even when the OS transistors are scaled down or highly integrated. For example, excellent electrical characteristics can be obtained even when the gate length of the OS transistor is less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. By contrast, it is sometimes difficult for the Si transistor to have a gate length less than or equal to 20 nm or less than or equal to 15 nm because of a short-channel effect. Thus, the OS transistor can be more used as a short-channel transistor than the Si transistor. Note that the gate length refers to the length of a gate electrode in a direction in which carriers move inside a channel formation region during operation of the transistor and to the width of a bottom surface of the gate electrode in a plan view of the transistor.

Scaling down of the OS transistor can improve the frequency characteristics of the transistor. Specifically, the cutoff frequency of the transistor can be improved. When the gate length of the OS transistor is within the above range, the cutoff frequency of the transistor can be greater than or equal to 50 GHz, preferably greater than or equal to 100 GHz, further preferably greater than or equal to 150 GHz at room temperature, for example.

The above comparison of the OS transistor with the Si transistor demonstrates that the OS transistor is advantageous over the Si transistor in that the off-state current is low and a short-channel transistor can be formed.

The structures and the like described in this embodiment can be used in combination with any of the structures and the like described in the other embodiments and the like as appropriate.

Embodiment 5

In this embodiment, electronic devices of embodiments of the present invention will be described with reference to FIGS. 38A to 38D, FIGS. 39A to 39F, and FIGS. 40A to 40G.

In the electronic device of this embodiment, a display portion includes the display apparatus of one embodiment of the present invention or the display apparatus using the semiconductor device of one embodiment of the present invention. The display apparatus of one embodiment of the present invention can be easily increased in resolution and definition. Thus, the display apparatus of one embodiment of the present invention can be used for a display portion of a variety of electronic devices.

A semiconductor device of one embodiment of the present invention can also be applied to any other portion of an electronic device than a display portion. For example, the semiconductor device of one embodiment of the present invention is preferably used for a control portion or the like of an electronic device to enable lower power consumption.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the display apparatus of one embodiment of the present invention can have a high resolution, and thus can be used for an electronic device having a relatively small display portion. Examples of such an electronic device include wearable devices such as watch-type and bracelet-type information terminal devices capable of being worn on a wrist, wearable devices capable of being worn on a head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, still further preferably 500 ppi or higher, yet still further preferably 1000 ppi or higher, yet still further preferably 2000 ppi or higher, yet still further preferably 3000 ppi or higher, yet still further preferably 5000 ppi or higher, yet still further preferably 7000 ppi or higher. The use of the display apparatus having one or both of such high definition and high resolution can further increase realistic sensation, sense of depth, and the like. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 38A to 38D. The wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 38A:
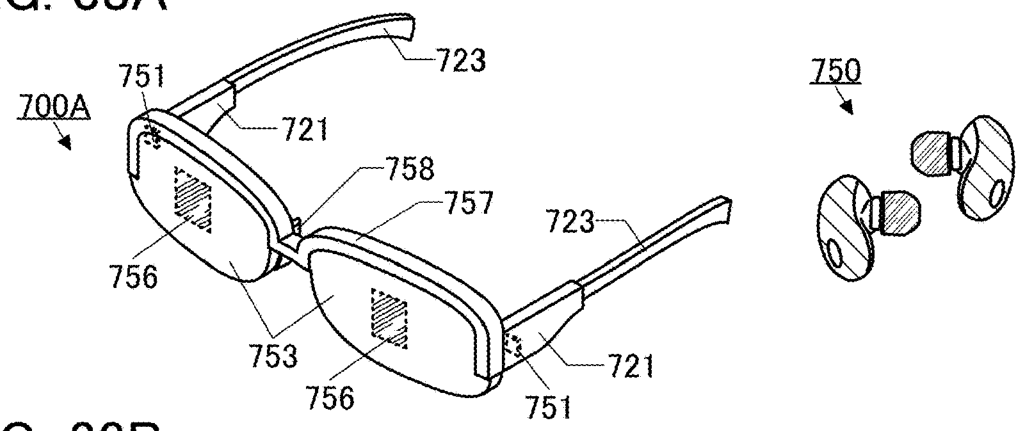
FIGS. 38A to 38D each show an example of an electronic device.
Figure 38B:
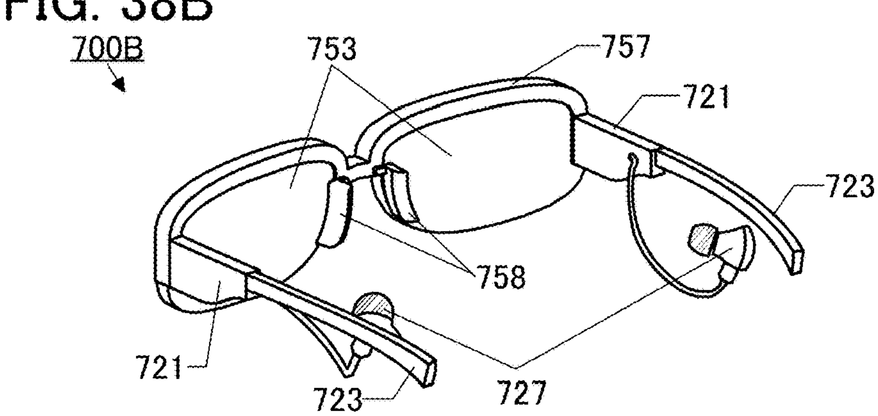

An electronic device 700A illustrated in FIG. 38A and an electronic device 700B illustrated in FIG. 38B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are each provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element can be used as a light-receiving element. One or both of an inorganic semiconductor and an organic semiconductor can be used for an active layer of the photoelectric conversion element.

Figure 38C:
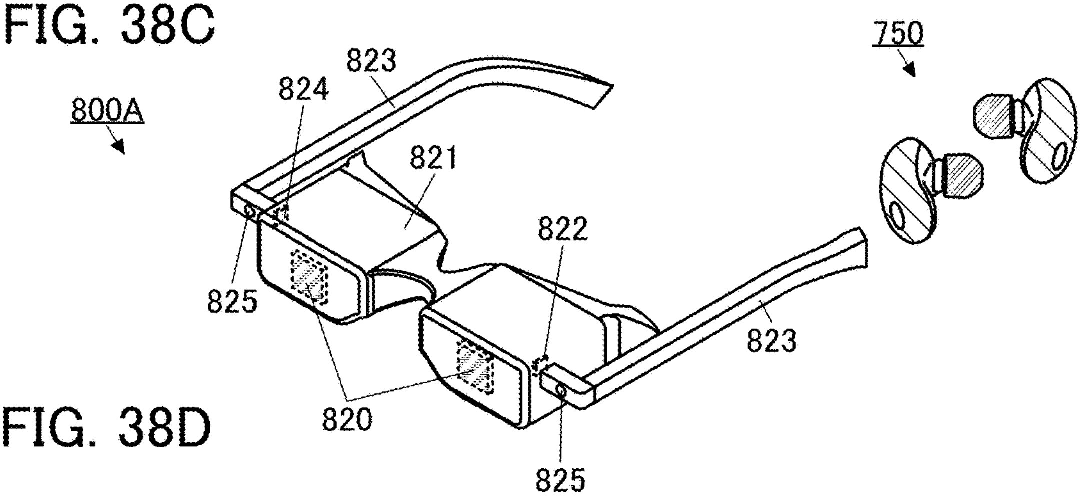
Figure 38D:
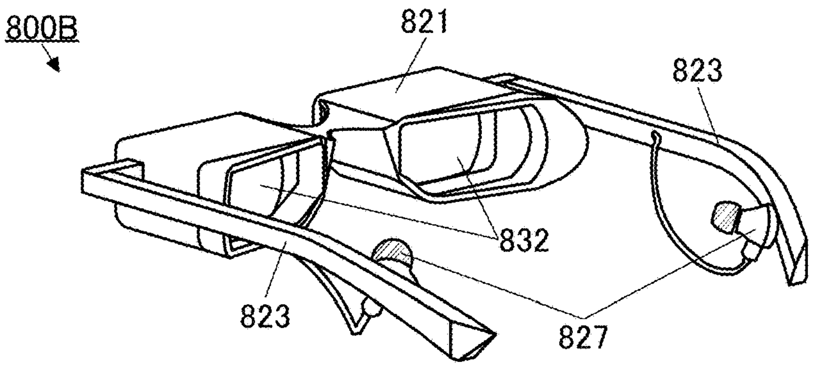

An electronic device 800A illustrated in FIG. 38C and an electronic device 800B illustrated in FIG. 38D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide a high sense of immersion to the user.

The display portions 820 are positioned inside the housing 821 so as to be seen through the lenses 832. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 38C and the like illustrate examples where the wearing portion 823 has a shape like a temple of glasses; however, one embodiment of the present invention is not limited thereto. The wearing portion 823 may have any shape with which the user can wear the electronic device, such as a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portion 825 is provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that serves as a bone-conduction earphone. For example, at least one of the display portion 820, the housing 821, and the wearing portion 823 can include the vibration mechanism. Thus, without additionally requiring an audio device such as headphones, earphones, or a speaker, the user can enjoy images and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A in FIG. 38A has a function of transmitting information to the earphones 750 with the wireless communication function. As another example, the electronic device 800A in FIG. 38C has a function of transmitting information to the earphones 750 with the wireless communication function.

The electronic device may include an earphone portion. The electronic device 700B in FIG. 38B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 38D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

An electronic device 6500 illustrated in FIG. 39A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

FIG. 39B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. In that case, an extremely lightweight electronic device can be obtained. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be obtained.

FIG. 39C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 39C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (only from a transmitter to a receiver) or two-way (between a transmitter and a receiver or between receivers, for example) data communication can be performed.

FIG. 39D illustrates an example of a notebook personal computer. The notebook personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

FIGS. 39E and 39F illustrate examples of digital signage.

Digital signage 7300 illustrated in FIG. 39E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 39F illustrates digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIGS. 39E and 39F.

A larger area of the display portion 7000 can increase the amount of information that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIGS. 39E and 39F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 40A to 40G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

In FIGS. 40A to 40G, the display apparatus of one embodiment of the present invention can be used in the display portion 9001.

The electronic devices illustrated in FIGS. 40A to 40G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices in FIGS. 40A to 40G will be described in detail below.

FIG. 40A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 40A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 40B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 40C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the lower surface of the housing 9000.

FIG. 40D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIGS. 40E to 40G are perspective views of a foldable portable information terminal 9201. FIG. 40E is a perspective view illustrating the portable information terminal 9201 that is opened. FIG. 40G is a perspective view illustrating the portable information terminal 9201 that is folded. FIG. 40F is a perspective view illustrating the portable information terminal 9201 that is shifted from one of the states in FIGS. 40E and 40G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

The structures described and the like in this embodiment can be used in combination with any of the structures and the like described in the other embodiments and the like as appropriate.

Example 1

In this example, an actually fabricated OLED panel (also referred to as an OLED display, an organic EL panel, or an organic EL display) is described. Vertical OS transistors each having a channel length less than 1 μm were used to fabricate the OLED panel with a resolution of 513 ppi that included pixels in an RGB stripe arrangement and an internal correction circuit. The OLED panel employed at least part of the semiconductor device and display apparatus described in the above embodiment and the like.

Thus, the description of the components is omitted in some cases in this example because the above embodiment and the like can be referred to as appropriate.

<Vertical OS Transistor>

The vertical OS transistor (OS VFET) used in the fabricated OLED panel is described.

An OS VFET like the transistor 100 illustrated in FIGS. 21A and 21B was formed. A metal oxide having an nc structure was used in a semiconductor layer of the formed OS VFET (nc OS VFET). The channel length was 0.5 μm and the channel width was 2πμm (approximately 6.3 μm). The layout width of the OS VFET was 4 μm, which was almost equal to the size of the contact hole, in consideration of margins for a gate electrode, a source electrode, a drain electrode, and the like. Note that the layout area of the OS VFET was approximately one-third of that of a so-called planar transistor like the transistor 200 illustrated in FIGS. 22A to 22C.

[$I_D$-$V_G$ Characteristics]

Figure 41:
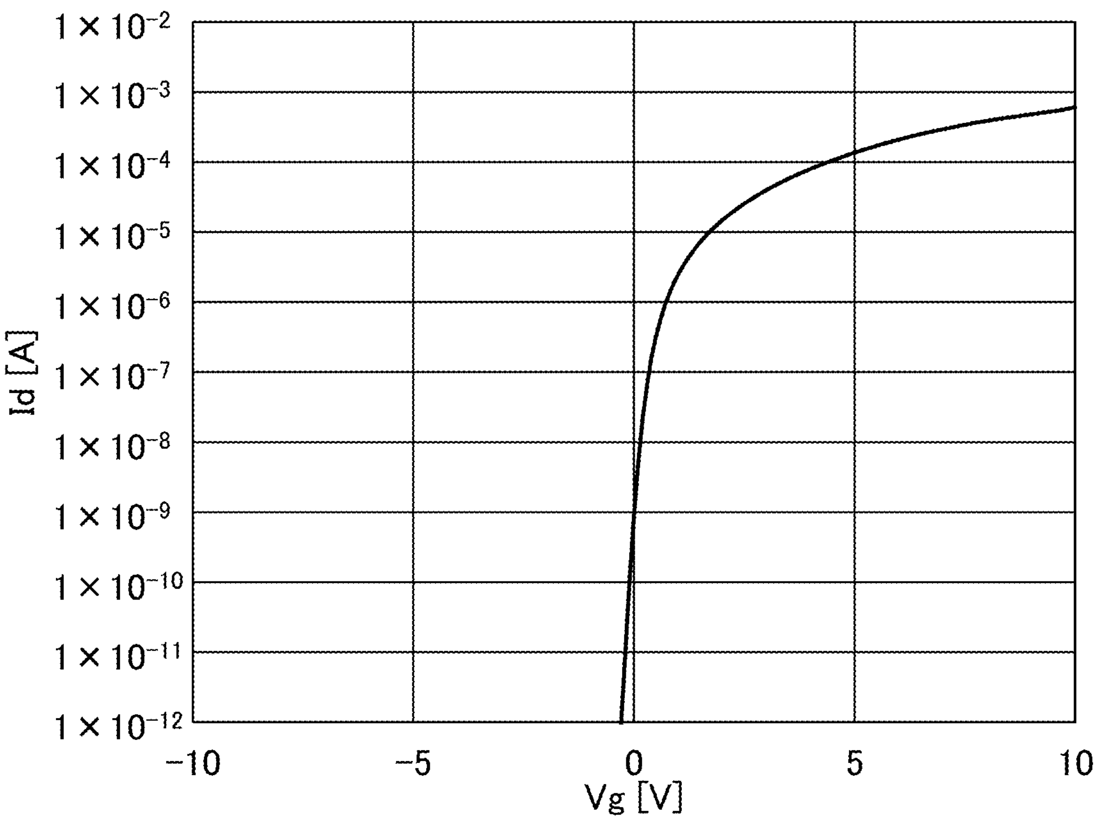
FIG. 41 shows evaluation results of $I_d$-$V_g$ characteristics of a transistor.

FIG. 41 is a graph showing evaluation results of $I_d$-$V_g$ characteristics of the formed OS VFET. In FIG. 41, the horizontal axis represents the voltage between the gate and the source (gate voltage $V_g$) and the vertical axis represents the current flowing from the drain to the source (drain current $I_d$). FIG. 41 shows a drain current $I_d$ measured in a room temperature environment while the gate voltage $V_g$ was varied from −10 V to 10 V and the voltage between the drain and the source (drain voltage $V_d$) was set to 10 V.

The $I_d$-$V_g$ characteristics shown in FIG. 41 indicate the favorable features of the formed OS VFET. The on-state current of the OS VFET is 55.4 μA/μm at a $V_g$ of 10 V and a $V_d$ of 5.1 V, which is approximately 30 times as high as that of a so-called planar transistor with a channel length of 4 μm. The on-state current of the OS VFET is also higher than that of an LTPS transistor with a general channel length. Thus, the OS VFET achieves high current capability with the reduced footprint (occupied area).

The formed OS VFET normally operated even after 10 V was applied as each of the drain voltage $V_d$ and the gate voltage $V_g$. This reveals that the OS VFET has a sufficient breakdown voltage.

[Off-State Current]

The off-state current of the formed OS VFET was so low that it reached the lower measurement limit. Thus, 2500 OS VFETs each having a channel length of 0.5 μm and a channel width of 4πμm (approximately 12.6 μm) were connected in parallel so that the substantial channel width was 10π mm (approximately 3.1 cm) for evaluation of $I_d$-$V_g$ characteristics.

Figure 42:
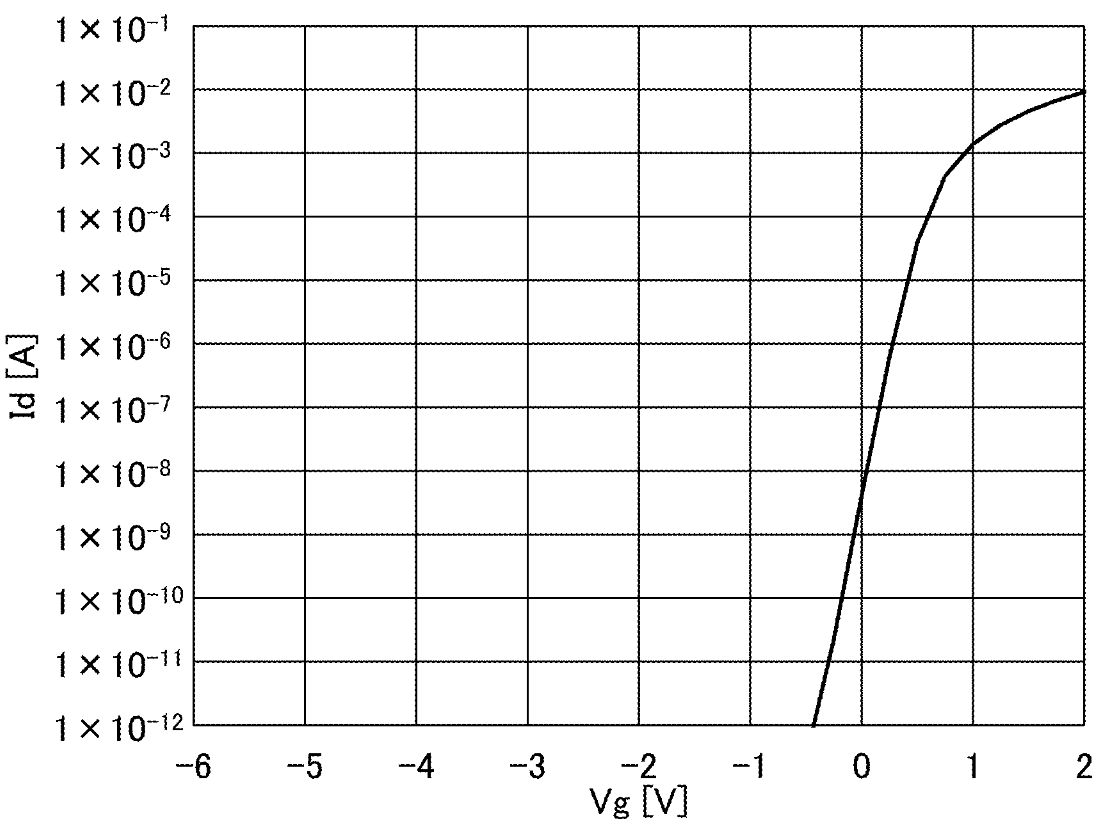
FIG. 42 shows evaluation results of $I_d$-$V_g$ characteristics of a transistor.

FIG. 42 is a graph showing evaluation results of $I_d$-$V_g$ characteristics of the OS VFET with the increased substantial channel width. FIG. 42 shows a drain current $I_d$ measured in a 125° C. environment while the gate voltage $V_g$ was varied from −6 V to 2 V and the drain voltage $V_d$ was 5.1 V.

According to the $I_d$-$V_g$ characteristics shown in FIG. 42, the off-state current of the OS VFET, in which the substantial channel width was increased to 10π mm (approximately 3.1 cm), was also so low that it reached the lower measurement limit.

Figure 43:
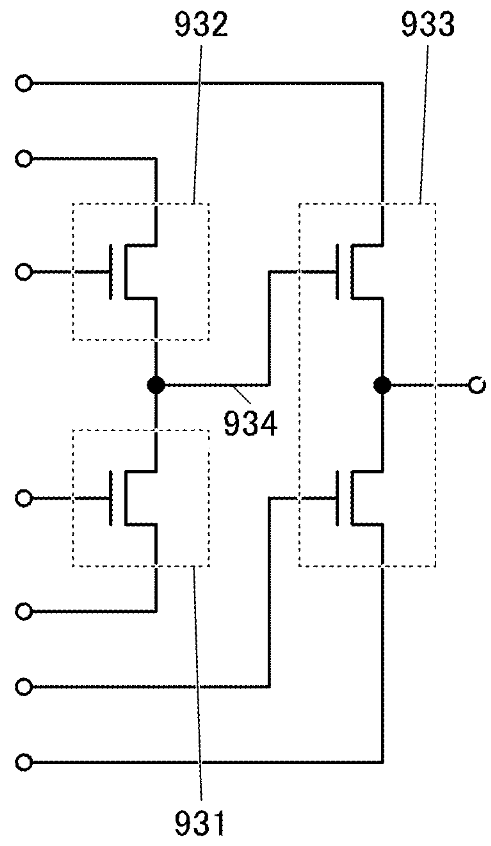
FIG. 43 illustrates a method of evaluating the off-state current of a transistor.

FIG. 43 is a circuit diagram of a test element group (TEG) used for quantitative evaluation of the off-state current of the OS VFET. With the use of the TEG, the off-state current was calculated from the time in which the potential of a floating node connected to the drain of the OS VFET in an off state changed.

As in FIG. 43, the OS VFET to be evaluated (device under test: DUT) was connected to a circuit portion 931 and turned off. Next, a transistor in a circuit portion 932 was turned on; consequently, the potential of a wiring 934 to be a floating node was initialized to a predetermined potential and then the transistor was turned off to bring the wiring into a floating state. Accordingly, the off-state current of the OS VFET, or the DUT, gradually changed the potential of the floating node. This potential change was observed with a source follower of a circuit portion 933, which enabled the calculation of the off-state current of the OS VFET, or the DUT.

The formed OS VFET, or the DUT, had a channel length of 0.5 m and a substantial channel width of 8π mm (approximately 2.5 cm), consisting of 4000 parallel-connected OS VFETs each having a channel width of 2π μm (approximately 6.3 μm). Prepared were the following two types of OS VFETs differing in the crystallinity of a metal oxide in the semiconductor layer: an OS VFET using a metal oxide with a CAAC structure in the semiconductor layer (an OS VFET having a CAAC structure) and an OS VFET having an nc structure.

The OS VFET, or the DUT, was turned off by application of −3 V to the gate, and the off-state current was calculated from the change in the potential of the floating node initialized to 1.2 V.

Figure 44:
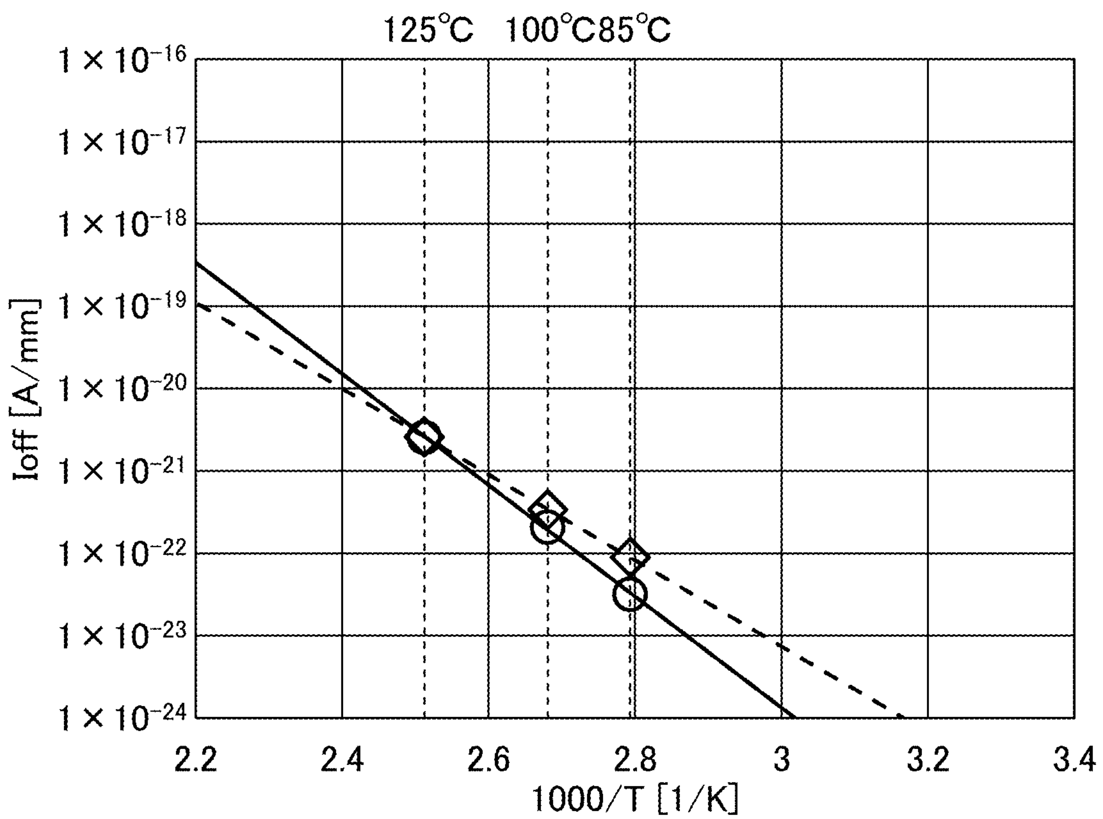
FIG. 44 shows evaluation results of the off-state currents of transistors.

FIG. 44 shows Arrhenius plots showing the evaluation results of the off-state currents of the formed OS VFETs. In FIG. 44, the horizontal axis represents the inverse of temperature T (1000/T) and the vertical axis represents off-state current Ioff per micrometer of channel width. In FIG. 44, the calculated values of the off-state currents in the environments at 125° C., 100° C., and 85° C. are plotted. The calculated values of the off-state currents of the OS VFET having a CAAC structure are plotted as circles and the solid line is a regression line obtained from these calculated values. The calculated values of the off-state currents of the OS VFET having an nc structure are plotted as rhombi and the dashed line is a regression line obtained from these calculated values.

The Arrhenius plots in FIG. 44 reveal that, in the 85° C. environment, the formed OS VFETs having a CAAC structure and an nc structure each exhibit an off-state current of approximately 100 yA/μm ($100\times10^{-24}$ A/μm), which is substantially the same as the off-state current of a so-called planar transistor, 135 yA/μm ($135\times10^{-24}$ A/μm). The extremely low off-state currents of the OS VFETs are thus revealed.

[Parasitic Capacitance]

The estimation results of the parasitic capacitances of an OS VFET are listed in Table 1. Table 1 shows the parasitic capacitance between the gate and drain electrodes (Gate-drain parasitic capacitance) and the parasitic capacitance between the gate and source electrodes (Gate-source parasitic capacitance) estimated from the OS VFET layout. Note that the parasitic capacitances of the OS VFET (Vertical) in Table 1 was obtained with the parasitic capacitance of a so-called planar OS transistor (Planar) assumed to be one for comparison.

TABLE 1

| Transistor structure | Gate-drain parasitic capacitance [a.u.] | Gate-source parasitic capacitance [a.u.] |
|---|---|---|
| Planar | 1 | 1 |
| Vertical | 23 | 81 |

According to the estimation results in Table 1, the parasitic capacitances of the OS VFET is higher than that of the so-called planar transistor. This indicates the possibility of a reduction in the amount of current flowing through a light-emitting element due to parasitic capacitance in an OLED panel employing the OS VFET for a pixel circuit. However, the OS VFET has a sufficient breakdown voltage as described above and accordingly countermeasures were taken by increasing a data potential.

<OLED Panel>

The above-described OS VFETs were used to fabricate the OLED panel with a resolution of 513 ppi that included pixels in an RGB stripe arrangement and an internal correction circuit.

Table 2 shows specifications of the fabricated OLED panel.

TABLE 2

| | Specifications |
|---|---|
| Screen diagonal | 5.72 inches |
| Resolution | 1440 (H) × RGB × 2560 (V) |
| Pixel size | 49.5 μm (H) × 49.5 μm (V) |
| Pixel density | 513 ppi |
| Pixel arrangement | RGB stripe |
| Pixel circuit | 6 Tr (Transistors) + 2 C (Capacitors) |
| Aperture ratio | 39% |
| Coloring method | White tandem OLED + CF (Color filter) |
| Emission type | Top emission |
| Source driver | External IC |
| Demultiplexer | Two-divided |
| Scan driver | Integrated |

Figure 45:
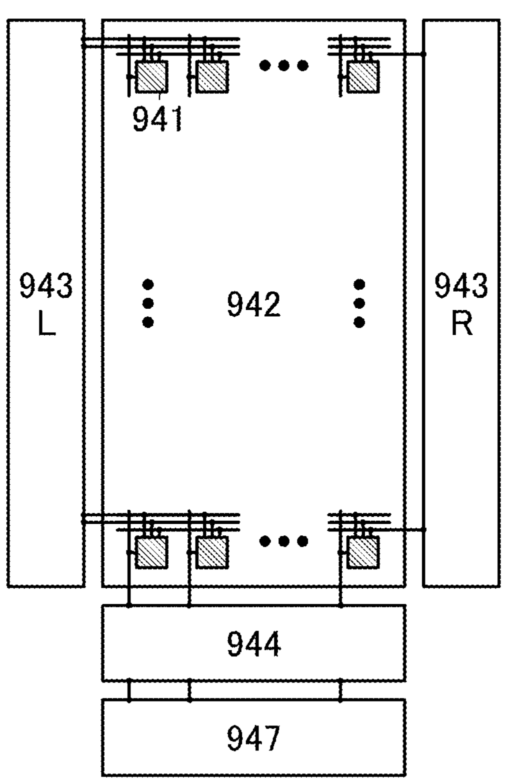
FIG. 45 illustrates a configuration of a display apparatus.
Figure 46:
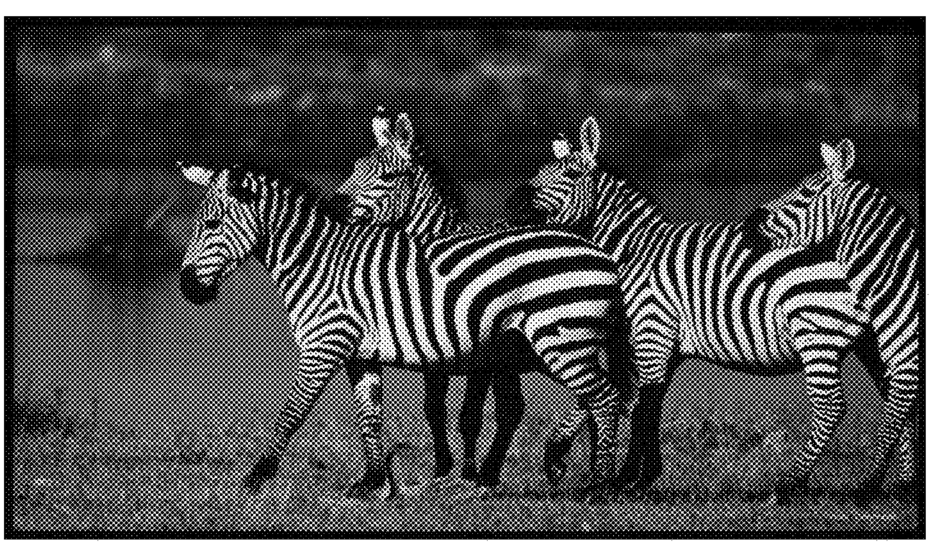
FIG. 46 shows an evaluation result of a display apparatus.
Figure 47:
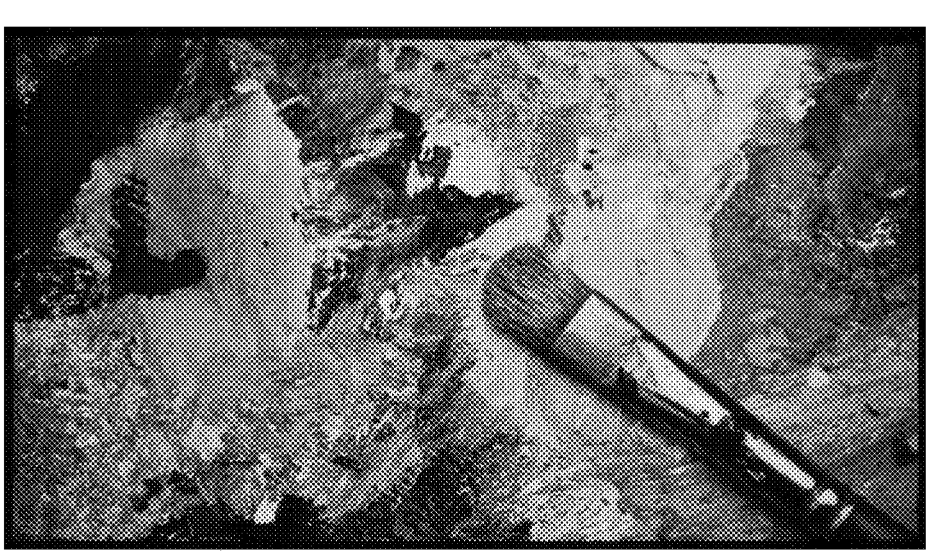
FIG. 47 shows an evaluation result of a display apparatus.
Figure 48:
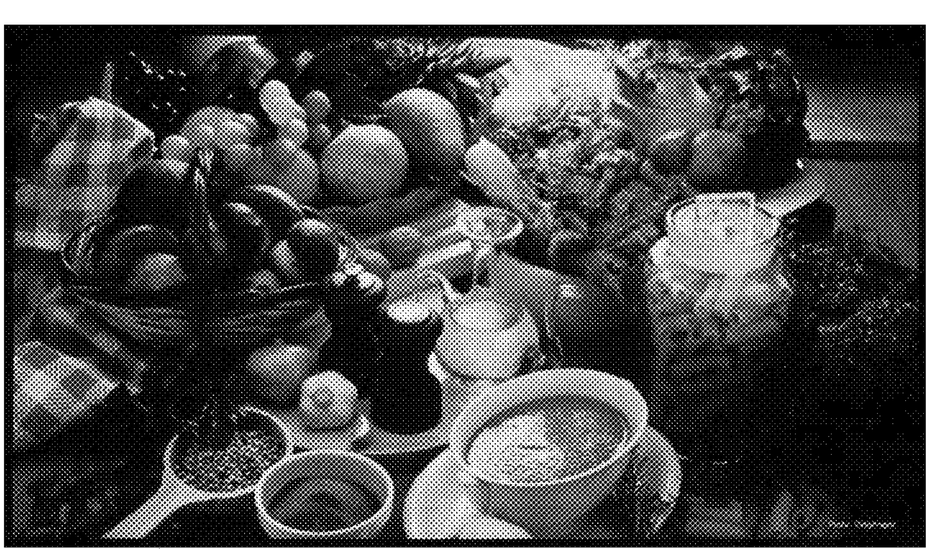
FIG. 48 shows an evaluation result of a display apparatus.
Figure 49:
FIG. 49 shows an evaluation result of a display apparatus.

The fabricated OLED panel has a configuration illustrated in FIG. 45. In FIG. 45, a plurality of pixels 941 are arranged in a matrix of 2560 rows and 1440×3 columns in a display portion 942 with a diagonal of 5.72 inches. In the display portion 942, the pixels 941 in each row are sequentially selected by a gate driver portion 943L and a gate driver portion 943R, and a data potential is supplied to the selected pixels 941 from a source driver IC 947 through a demultiplexer portion 944.

The configuration illustrated in FIG. 45 corresponds to that illustrated in FIG. 12C (or FIG. 28A). In other words, the display portion 942 corresponds to the display portion 42 (or the display portion 162). The pixel 941 corresponds to the pixel 41 (or the pixel 230). The gate driver portion 943L and the gate driver portion 943R correspond to, respectively, the first driver circuit portion 43L and the first driver circuit portion 43R (or the circuit portion 164). The source driver IC 947 and the demultiplexer portion 944 correspond to the second driver circuit portion 44 (or the IC 173 and the circuit portion 163). Thus, the configuration of the semiconductor device 70A illustrated in FIG. 16A or the semiconductor device 70B illustrated in FIG. 17A in which m was 2560 was employed in this example so that m corresponded to the number of rows of the pixels 941. Furthermore, the configuration of the semiconductor device 80 illustrated in FIG. 18A in which n was 4320 (1440×3) was employed so that n corresponded to the pixels 941.

The OLED panel employed a pixel circuit having a configuration like the configuration in FIG. 1 (the configuration using six transistors and two capacitors). The employment of the OS VFET in the pixel circuit enabled the layout of six transistors within the area of one subpixel (16.5 μm×49.5 μm), as illustrated in FIG. 29, FIG. 30, and FIG. 31.

The OLED panel had a top-emitting structure and the aperture ratio of the pixel was 39%.

The OLED panel employed a gate driver (also referred to as a scan driver) having a configuration as illustrated in FIG. 16A and FIG. 17A. The employment of the OS VFET in the gate driver led to a narrow bezel with a 1.8 mm width, which achieved a decrease by approximately 42% from 3.1 mm which is the width of the bezel using a so-called planar transistor.

The OLED panel employed a demultiplexer (DeMUX) with two outputs as illustrated in FIG. 18A. The employment of the OS VFET in the DeMUX enabled the layout of a plurality of transistors forming the DeMUX within the width of one subpixel (16.5 μm).

In the fabricated OLED panel, a white OLED having a tandem structure (White tandem OLED) was used as a light-emitting element and a color filter (CF) was used for color display. Although the tandem structure requires high voltage application to the transistors included in the pixel circuit and the gate driver, there was no problem in operation because the OS VFET has a sufficient breakdown voltage as described above.

The fabricated OLED panel had a top-emitting structure and the aperture ratio of the pixel was 39%.

The OLED panel having such a structure was fabricated and operated by a driving method as in FIG. 2 and FIG. 13.

FIG. 46, FIG. 47, FIG. 48, and FIG. 49 show photographs of display on the fabricated OLED panel. It was confirmed that the pixel circuit, gate driver, and DeMUX included in the OLED panel each operated without any problems and various images were displayed.

Figure 50:
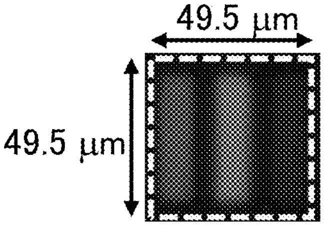
FIG. 50 shows an evaluation result of a display apparatus.

FIG. 50 is an enlarged photograph of one pixel region (49.5 μm×49.5 μm), showing the result of normal light emission of the pixels arranged in an RGB stripe arrangement. The use of the OS VFET enabled an OLED panel employing an RGB stripe arrangement, which raises the possibility of achieving higher image quality than an OLED panel employing a PenTile arrangement.

The evaluation results of power consumption of the OLED panel are shown in Table 3. Table 3 shows power consumption of the gate driver measured with the OLED panel operated at a refresh rate of 60 Hz in the following two ways of driving: the 60 Hz compensation driving in which the threshold voltage is corrected at a frequency of 60 Hz (once in each frame); and the 0.2 Hz compensation driving in which the threshold voltage is corrected at a frequency of 0.2 Hz (once in five seconds). In Table 3, the estimation results by simulation (Simulated values) and the measurement results of the fabricated OLED panel (Measured values) are shown.

TABLE 3

| | Simulated values | Measured values |
|---|---|---|
| 60 Hz compensation driving | 27.0 mW | 29.3 mW |
| 0.2 Hz compensation driving | 19.7 mW | 22.5 mW |
| Reduction rate | 27% | 23% |

According to Table 3, the simulated values show that the threshold voltage correction at a 0.2 Hz frequency achieves a 27% reduction in power consumption from that at a 60 Hz frequency. The measured values show a 23% reduction.

The OLED panel according to this example can be used in combination with any of the structures described in the above embodiments as appropriate, for example. The OLED panel thus can be applied to any of a variety of electronic devices including mobile devices such as smartphones and tablets and wearable devices such as VR and AR devices, for example.

Example 2

In this example, on the assumption that the above-described OLED panel of Example 1 incorporated a touch sensor and a circuit driving the touch sensor, the behavior of the touch sensor was verified by simulation.

Figure 51:
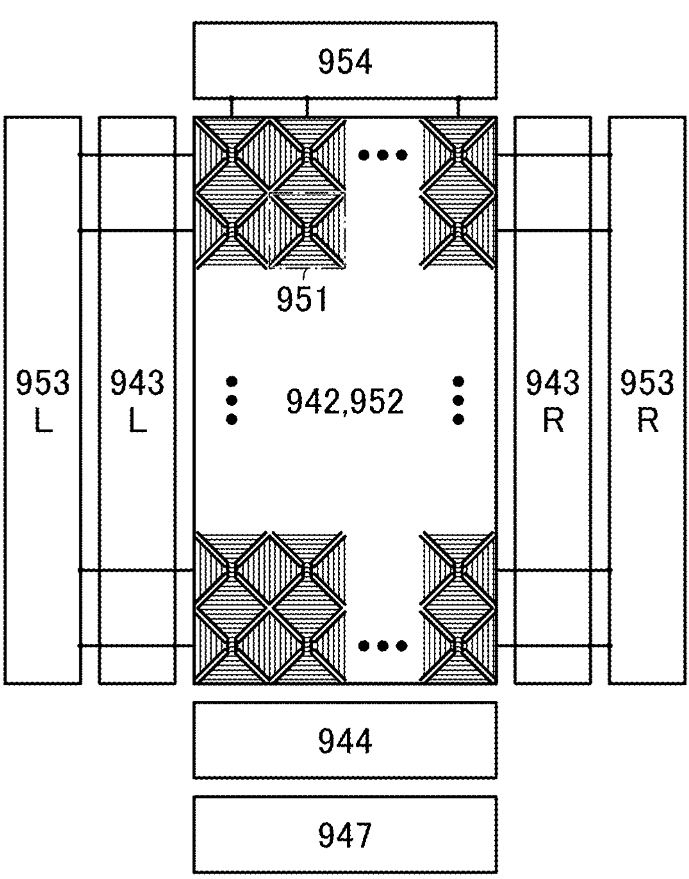
FIG. 51 illustrates a configuration of a display apparatus.

FIG. 51 is a block diagram illustrating the configuration of the OLED panel incorporating the touch sensor used for the simulation. Table 4 shows specifications of the OLED panel.

TABLE 4

| | Specifications |
|---|---|
| Screen diagonal | 5.72 inches |
| Resolution | 1440 (H) × RGB × 2560 (V) |
| Pixel size | 49.5 μm (H) × 49.5 μm (V) |
| Pixel density | 513 ppi |
| Pixel arrangement | RGB stripe |
| Pixel circuit | 6 Tr (Transistors) + 2 C (Capacitors) |
| Vth compensation | Internal |
| Aperture ratio | 39% |
| Coloring method | White tandem OLED + CF (Color filter) |
| Emission type | Top emission |
| Source driver | External IC |
| Demultiplexer | Two-divided |
| Scan driver | Integrated |
| Row driver | Integrated |
| Readout circuit | Integrated |

As illustrated in FIG. 51, the OLED panel used for the simulation employs the configuration in FIG. 45 and includes a sensor portion 952 provided to overlap with the display portion 942. In the sensor portion 952, a plurality of sensor units 951 are provided in a matrix of 32 rows and 18 columns. Note that a mutual-capacitive touch sensor, which is a kind of projected capacitive touch sensor, is employed. That is, the sensor units 951 each include a capacitor.

A row driver portion 953L and a row driver portion 953R are provided as transmission circuits and a reading circuit portion 954 is provided as a reception circuit. The row driver portions 953L and 953R are electrically connected to the reading circuit portion 954 through the capacitor included in the sensor unit 951. The row driver portions 953L and 953R sequentially transmit signals to the sensor units 951 row by row. The signal is received by the reading circuit portion 954 through the capacitors included in the sensor units 951 and output to the outside of the OLED panel through the reading circuit portion 954.

The row driver portions 953L and 953R each had a configuration similar to those of the gate driver portions 943L and 943R. Thus, the configuration of the semiconductor device 70A illustrated in FIG. 16A in which m was 32 was employed in this example so that m corresponded to the number of rows of the sensor units 951.

The reading circuit portion 954 had a configuration in which a source follower was provided for each column of the sensor units 951.

Figure 52:
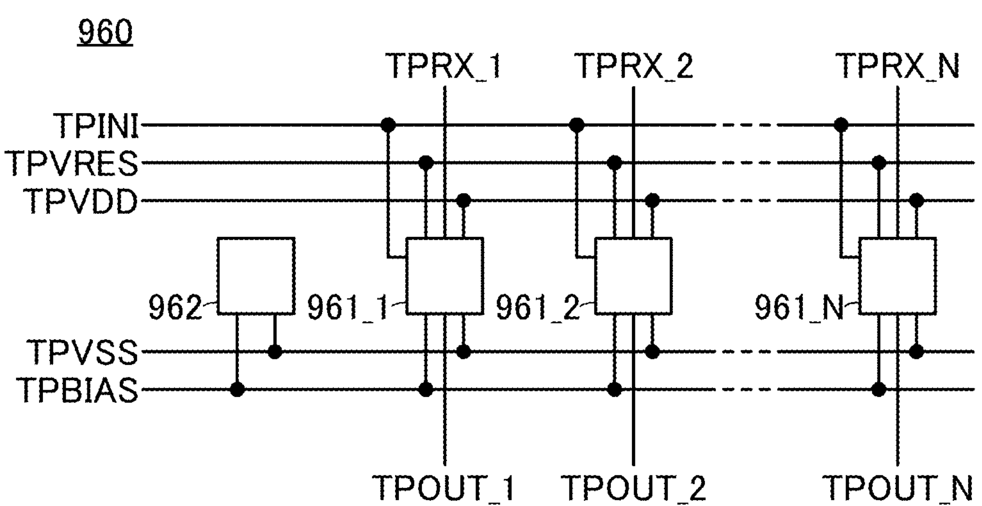
FIG. 52 illustrates a configuration of a display apparatus.

FIG. 52 is a block diagram illustrating a configuration of a semiconductor device 960 included in the reading circuit portion 954. The semiconductor device 960 includes a source follower portion 961_1 to a source follower portion 961_N and a bias portion 962 for the sensor units 951 in N columns (Nis an integer greater than or equal to 2). In this example, N was 18, in which case the semiconductor device 960 illustrated in FIG. 52 included the source follower portions 961_1 to 961_18 for the sensor units 951 in 18 columns. In the semiconductor device 960, the source follower portions are supplied with a high power supply potential TPVDD, a low power supply potential TPVSS, and a bias potential TPBIAS to operate as the source followers. In the semiconductor device 960, an initialization signal TPINI and an initialization potential TPVRES are supplied for a reading operation.

The row driver portions 953L and 953R and the reading circuit portion 954 are assumed to be fabricated with the vertical OS transistor of one embodiment of the present invention in the same step as the gate driver portions 943L and 943R and the demultiplexer portion 944.

Figure 53:
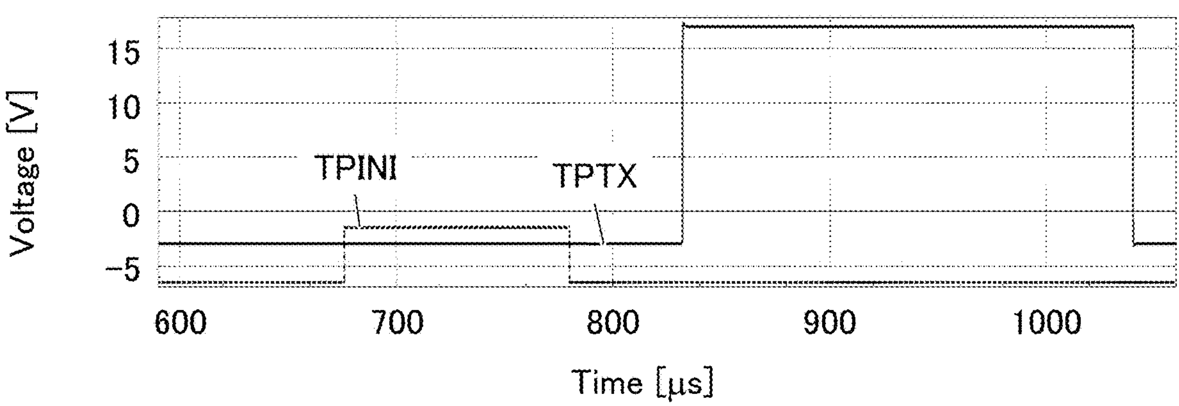
FIG. 53 shows simulation results for a display apparatus.
Figure 53:
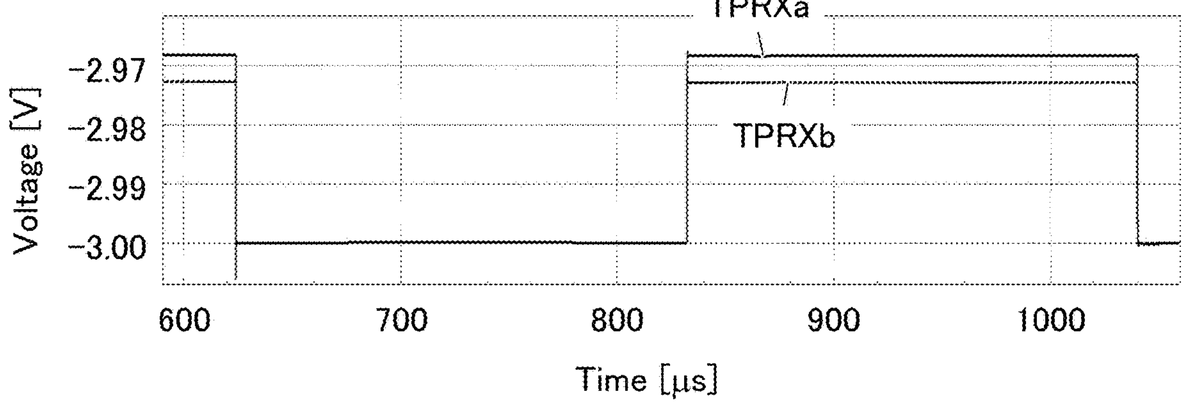
Figure 53:
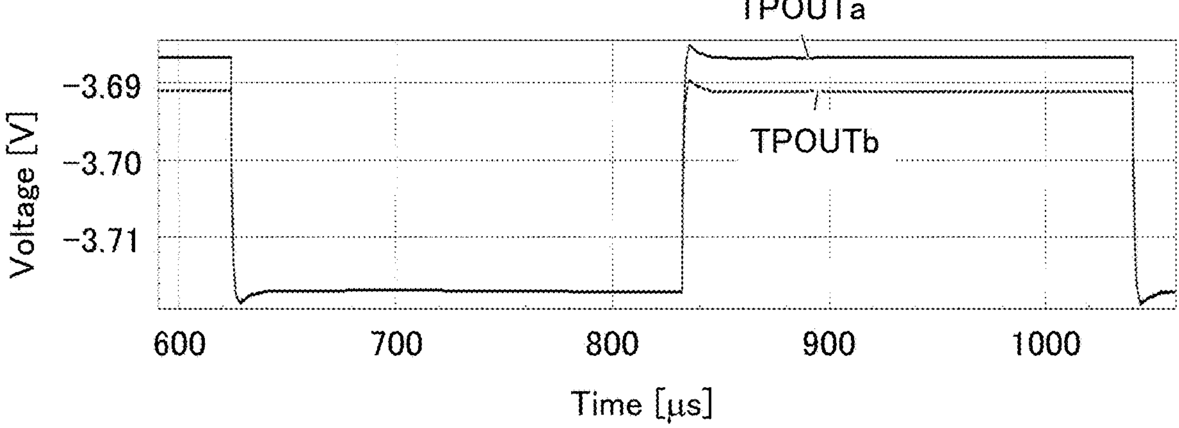

FIG. 53 shows the results of the behavior of the touch sensor verified by simulation. In the simulation, after the initialization signal TPINI is supplied for initialization to the initialization potential TPVRES in the reading circuit portion 954, transmission signals TPTX of approximately 20 V are transmitted by the row driver portions 953L and 953R. Then, in the reading circuit portion 954, a signal of approximately 32 mV (a reception signal TPRXa or a reception signal TPRXb) is received through the capacitor included in the sensor unit 951, and a signal of approximately 30 mV (an output signal TPOUTa or an output signal TPOUTb) is output through the reading circuit portion 954. At that time, the difference between the reception signal TPRXa in the case of no touch and the reception signal TPRXb in the case of a touch is approximately 4.5 mV Furthermore, the difference between the output signal TPOUTa in the case without a touch and the output signal TPOUTb in the case with a touch is approximately 4.3 mV.

This example suggests the possibility of achieving the OLED panel with a built-in touch sensor. The OLED panel with a built-in touch sensor according to this example can be used in combination with any of the structures described in the above embodiments as appropriate, for example. With the use of the driving method of the display apparatus of one embodiment of the present invention, the touch sensor can be less likely to be affected by noise, for example.

Example 3

This example describes an OLED panel fabricated using a light-emitting element different in structure from the light-emitting element described above in Example 1.

Table 5 shows specifications of the fabricated OLED panel.

TABLE 5

| | Specifications |
|---|---|
| Screen diagonal | 5.72 inches |
| Resolution | 1440 (H) × RGB × 2560 (V) |
| Pixel size | 49.5 um (H) × 49.5 um (V) |
| Pixel density | 513 ppi |
| Pixel arrangement | RGB stripe |
| Pixel circuit | 6 Tr (Transistors) + 2 C (Capacitors) |
| Aperture ratio | 39% |
| Coloring method | MML-SBS |
| Emission type | Top emission |
| Source driver | External IC |
| Demultiplexer | Two-divided |
| Scan driver | Integrated |

In the fabricated OLED panel, an OLED having a side-by-side (SBS) structure is employed as a light-emitting element for color display. In that structure, an MIL structure was employed for the fabrication of the OLED.

Since the light-emitting element having the MIL structure is formed by a photolithography method without using a fine metal mask, resolution and aperture ratio of the OLED panel can be increased. Consequently, the increased luminance of the OLED panel (e.g., higher than or equal to 500 cd/m$^2$, higher than or equal to 1000 cd/m$^2$, or higher than or equal to 2000 cd/m$^2$) can be easily achieved.

In some cases, a technology using the MML structure that enables the higher aperture ratio, lower power consumption, and higher color purity of an OLED panel or an OLED panel based on the technique is referred to as high aperture ratio patterned organic semiconductor (HarPOS) (registered trademark).

Figure 54:
FIG. 54 shows an evaluation result of a display apparatus.
Figure 57:
FIG. 57 shows an evaluation result of a display apparatus.

FIG. 54 and FIG. 57 show photographs of display on the fabricated OLED panel. It was confirmed that various images were displayed on the OLED panel employing the MML structure.

Figure 55:
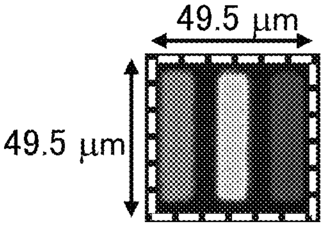
FIG. 55 shows an evaluation result of a display apparatus.

FIG. 55 shows an enlarged photograph of one pixel region (49.5 μm×49.5 μm). Normal light emission with an RGB stripe arrangement was confirmed with the OLED panel employing the MML structure.

This example suggests the possibility of achieving an OLED panel with high resolution and high aperture ratio owing to the MML structure.

Example 4

This example describes the $I_d$-$V_g$ characteristics of an OS VFET having a CAAC structure.

The OS VFET having a CAAC structure was fabricated. The fabricated OS VFET has the same structure as the OS VFET having an nc structure described above in Example 1 except for the crystallinity of the metal oxide. The channel length was 0.5 m and the channel width was 2π μm (approximately 6.3 μm).

Figure 56:
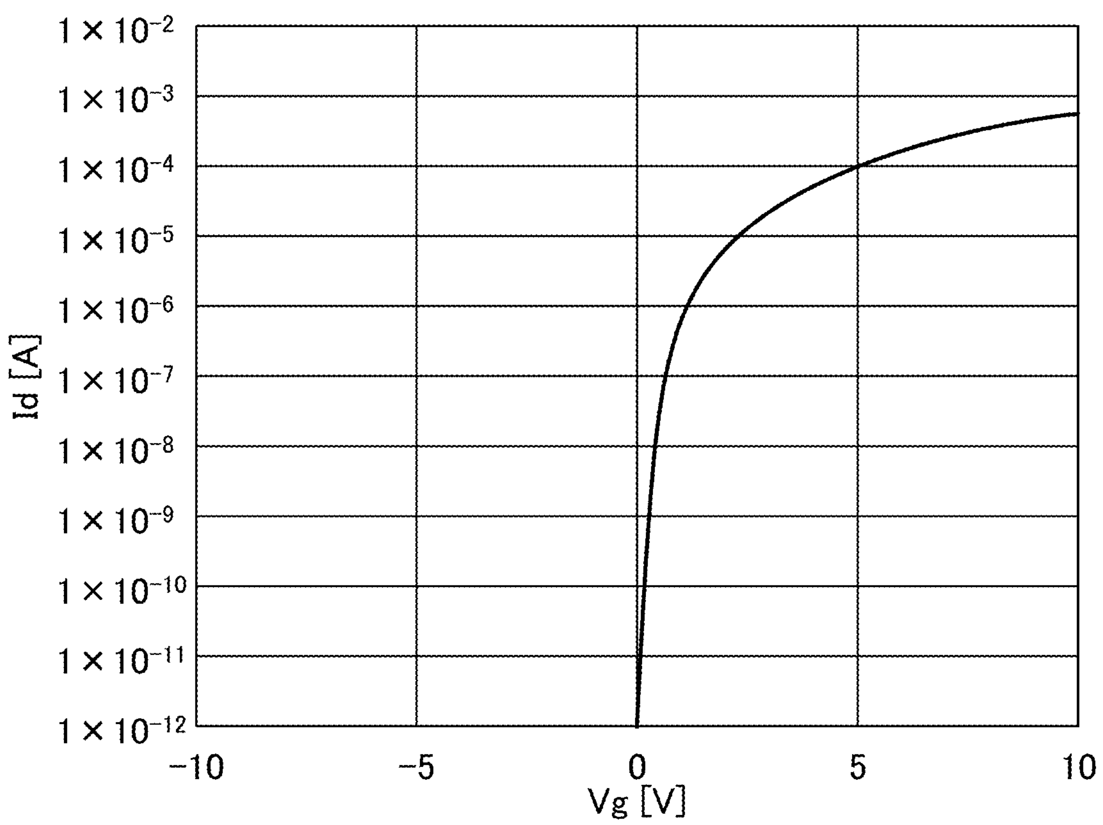
FIG. 56 shows evaluation results of $I_d$-$V_g$ characteristics of a transistor.

FIG. 56 is a graph showing evaluation results of $I_d$-$V_g$ characteristics of the formed OS VFET. In FIG. 56, the horizontal axis represents the voltage between the gate and the source (gate voltage $V_g$) and the vertical axis represents the current flowing from the drain to the source (drain current $I_d$). FIG. 56 shows a drain current $I_d$ measured in a room temperature environment while the gate voltage $V_g$ was varied from −10 V to 10 V and the voltage between the drain and the source (drain voltage $V_d$) was set to 10 V.

According to the $I_d$-$V_g$ characteristics shown in FIG. 56, the OS VFET fabricated in this example had excellent characteristics like the OS VFET described above in Example 1. The on-state current of the fabricated OS VFET was 46.7 μA/μm when $V_g$ was 10 V and $V_d$ was 5.1 V.

This example suggests the possibility of achieving OLED panels with OS VFETs having various crystal structures.

(Notes on the Description in this Specification and the Like)

The following are notes on the description of the above embodiments and structures in the embodiments.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

The expression "X and Y are electrically connected" means the case where electric signals can be transmitted and received between X and Y when an object having any electric action exists between X and Y. For example, in the case where X and Y are electrically connected, one or more elements that allow(s) electrical connection between X and Y (e.g., a switch, a transistor, a capacitor element, an inductor, a resistor element, a diode, a display device, a light-emitting device, or a load) can be connected between X and Y.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (sometimes called one of a first terminal and a second terminal in this specification and the like) of a transistor, and a drain (sometimes called the other of the first terminal and the second terminal in this specification and the like) of the transistor are electrically connected to each other, and X, the source of the transistor, the drain of the transistor, and Y are electrically connected to each other in this order." Alternatively, it can be expressed as "a source of a transistor is electrically connected to X; a drain of the transistor is electrically connected to Y; and X, the source of the transistor, the drain of the transistor, and Y are electrically connected to each other in this order." Alternatively, it can be expressed as "X is electrically connected to Y through a source and a drain of a transistor, and X, the source of the transistor, the drain of the transistor, and Y are provided in this connection order." When the connection order in a circuit structure is defined by an expression similar to the above examples, a source and a drain of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also serves as an electrode, one conductive film has functions of both components: a function of the wiring and a function of the electrode. Thus, electrical connection in this specification and the like includes, in its category, such a case where one conductive film has functions of a plurality of components.

In this specification and the like, a "resistor element" can be, for example, a circuit element, a wiring, or the like having a resistance higher than 0Ω. Therefore, in this specification and the like, a "resistor element" includes a wiring having a resistance, a transistor in which a current flows from the drain to the source, a diode, and a coil, for example. Thus, the term "resistor element" can be replaced with the terms "resistor," "load," or "region having a resistance"; conversely, the terms "resistor," "load," or "region having a resistance" can be sometimes replaced with the term "resistor element," for example. The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance may be higher than or equal to 1Ω and lower than or equal to $1\times10^{9}$Ω.

In the case where a wiring is used as a resistor, the resistivity is sometimes determined depending on the length of the wiring. Alternatively, a conductor with resistivity different from that of a conductor used as a wiring is sometimes used as a resistor. Alternatively, in the case where a semiconductor is used as a resistor, the resistivity of the resistor is sometimes determined by doping a semiconductor with an impurity.

In this specification and the like, a "capacitor element" can be, for example, a circuit element having an electrostatic capacitance higher than 0° F., a region of a wiring having an electrostatic capacitance higher than 0° F., parasitic capacitance, or gate capacitance of a transistor. Therefore, a "capacitor" in this specification and the like is not limited to a circuit element that has a pair of electrodes and a dielectric between the electrodes. The "capacitor" includes parasitic capacitance generated between wirings or gate capacitance generated between a gate and one of a source and a drain in a transistor, for example. The terms "capacitor element," "parasitic capacitance," or "gate capacitance" can be replaced with the term "capacitor," for example; conversely, the term "capacitor" can be replaced with the terms "capacitor element," "parasitic capacitance," or "gate capacitance,"

for example. The term “a pair of electrodes” of a capacitor can be replaced with the terms “a pair of conductors,” “a pair of conductive region,” or “a pair of regions,” for example. Note that the electrostatic capacitance can be greater than or equal to 0.05 fF and less than or equal to 10 pF, for example. As another example, the electrostatic capacitance may be greater than or equal to 1 pF and less than or equal to 10 μF.

A transistor in this specification and the like has at least three terminals including a gate (also referred to as a gate terminal, a gate region, or a gate electrode), a source (also referred to as a source terminal, a source region, or a source electrode), and a drain (also referred to as a drain terminal, a drain region, or a drain electrode). The transistor has a region where a channel is formed (also referred to as a channel formation region) between the drain and the source. The transistor can enables current to flow between the source and the drain through the channel formation region. The channel formation region refers to a region through which the current mainly flows. The gate is a control terminal controlling the amount of current flowing through the channel formation region between the source and the drain. Two terminals serving as the source and the drain are input/output terminals of the transistor.

Functions of the two input/output terminals of the transistor depend on the conductivity type (n-channel type or p-channel type) of the transistor and the levels of potentials applied to the three terminals of the transistor, and one of the two terminals serves as a source and the other serves as a drain. In some cases, functions of the source and the drain are replaced with each other when the direction of current flow is changed in circuit operation, for example. Therefore, the terms “source” and “drain” can be used interchangeably in this specification and the like. In this specification and the like, the terms “one of a source and a drain” (or a first electrode or a first terminal) and “the other of the source and the drain” (or a second electrode or a second terminal) are used to describe the connection relation of a transistor.

Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms “gate” and “back gate” can be replaced with each other in one transistor. In the case where a transistor includes three or more gates, the gates may be referred to as a first gate, a second gate, and a third gate, for example, in this specification and the like.

In this specification and the like, a transistor with a multi-gate structure having two or more gate electrodes can be used as a transistor. The transistor with a multi-gate structure has a structure in which a plurality of transistors are connected in series because the channel formation regions are connected in series. The transistor with a multi-gate structure thus enables the lower off-state current and the higher withstand voltage (improved reliability). In the transistor with a multi-gate structure, the current between the drain and the source does not change much even if the voltage between the drain and the source changes at the time of operation in a saturation region, so that a flat slope of voltage-current characteristics can be obtained. A transistor having the voltage-current characteristics with a flat slope can achieve an ideal current source circuit or an active load having an extremely high resistance. Accordingly, the transistor having the voltage-current characteristics with a flat slope can be used to achieve a differential circuit, a current mirror circuit, or the like having excellent properties.

In this specification and the like, a single circuit element shown in a circuit diagram may include a plurality of circuit elements. For example, a single resistor shown in a circuit diagram may be two or more resistors electrically connected to each other in series. For another example, a single capacitor shown in a circuit diagram may be two or more capacitors electrically connected to each other in parallel. For another example, a single transistor shown in a circuit diagram may be two or more transistors which are electrically connected to each other in series and whose gates are electrically connected to each other. For another example, a single switch shown in a circuit diagram may be a switch including two or more transistors which are electrically connected to each other in series or in parallel and whose gates are electrically connected to each other.

In this specification and the like, a node can be referred to as a “terminal,” a “wiring,” an “electrode,” a “conductive layer,” a “conductor,” or an “impurity region” depending on the circuit configuration and the device structure, for example. For example, a “terminal,” a “wiring,” or the like can be referred to as a “node.”

In this specification and the like, “voltage” and “potential” can be replaced with each other as appropriate. The term “voltage” refers to a potential difference from a reference potential. When the reference potential is a ground potential, for example, “voltage” can be replaced with “potential.” Note that the ground potential does not necessarily mean 0 V. Moreover, potentials are relative values. In other words, a potential supplied to a wiring, a potential applied to a circuit and the like, or a potential output from a circuit and the like, for example, changes depending on the reference potential.

In this specification and the like, the terms “high-level potential” (also referred to as H potential or H) and “low-level potential” (also referred to as L potential or L) do not represent a particular potential. For example, in the case where two wirings are both described as “functioning as a wiring for supplying a high-level potential,” the levels of the high-level potentials that these wirings supply are not necessarily equal to each other. Similarly, in the case where two wirings are both described as “functioning as a wiring for supplying a low-level potential,” the levels of the low-level potentials that these wirings supply are not necessarily equal to each other.

In this specification and the like, “current” means a charge transfer (electrical conduction). For example, the expression “electrical conduction of positively charged particles is caused” can be rephrased as “electrical conduction of negatively charged particles is caused in the opposite direction.” Therefore, unless otherwise specified, a current in this specification and the like refers to an electric charge transfer (electrical conduction) caused by carrier movement. Examples of the carrier here include an electron, a hole, an anion, a cation, and a complex ion. Note that the type of the carrier differs between systems where current flows (e.g., a semiconductor, a metal, an electrolyte solution, and a vacuum). The “direction of a current” in a wiring or the like, for example, refers to the direction in which a positive carrier moves, and the amount of a current is expressed as a positive value. In other words, the direction in which a negative carrier moves is opposite to the direction of current, and is expressed as a negative current amount. Thus, in the case where the polarity of a current (or the direction of a current) is not specified in this specification and the like, the expression “a current flows from an element A to an element B” can be replaced with “a current flows from an element B to an element A,” for example. The expression “a current is input to an element A" can be replaced with "a current is output from an element A," for example, Ordinal numbers such as "first," "second," and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments, claims, or the like. For another example, a "first" component in one embodiment in this specification and the like can be omitted in other embodiments, claims, or the like.

In this specification and the like, terms for describing arrangement, such as "over," "under," "above," and "below," are sometimes used for convenience to describe the positional relation between components with reference to drawings, for example. The positional relation between components is changed as appropriate in accordance with the direction from which each component is described. Thus, the positional relation is not limited to that described with a term used in this specification and can be explained with other terms as appropriate depending on the situation. For example, the expression "an insulator over (on) an upper surface of a conductor" can be replaced with the expression "an insulator on a lower surface of a conductor" when the direction of a diagram showing these components is rotated by 180°. Moreover, the expression "an insulator over (on) an upper surface of a conductor" can be replaced with the expression "an insulator on a left surface (or a right surface) of a conductor" when the direction of a diagram showing these components is rotated by 90°.

The terms such as "over," "above," "under," and "below" do not necessarily mean that a component is placed directly on or under and directly in contact with another component. For example, the expression "electrode B over insulating layer A" does not necessarily mean that the electrode B is on and in direct contact with the insulating layer A, and can mean the case where another component is provided between the insulating layer A and the electrode B.

In this specification and the like, components arranged in a matrix and their positional relation are sometimes described using terms such as "row" and "column," for example. The positional relation between components is changed as appropriate in accordance with the direction from which each component is described. Thus, for example, the terms such as "row" and "column" are not limited to those described in this specification and the like and can be explained with another term as appropriate depending on the situation. For example, the term "row direction" can be replaced with the term "column direction" when the direction of the diagram is rotated by 90°.

The term "overlap," for example, in this specification and the like does not limit a state such as the stacking order of components. For example, the expression "the electrode B overlapping with the insulating layer A" is not limited to the state where the electrode B is formed over the insulating layer A. For example, the expression "electrode B overlapping with insulating layer A" includes the case where the electrode B is formed under the insulating layer A and the case where the electrode B is formed on the right (or left) side of the insulating layer A.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and can mean the case where another component is provided between the insulating layer A and the electrode B.

In this specification and the like, the terms "film" and "layer," for example, can be interchanged with each other depending on circumstances. For example, the term "conductive layer" can be changed to the term "conductive film" in some cases. For example, the term "insulating film" can be changed into the term "insulating layer" in some cases. For example, the term "film" or "layer" can be replaced with a word not including the term depending on the case or circumstances in some cases. For example, the term "conductive layer" or "conductive film" can be changed into the term "conductor" in some cases. Furthermore, the term "conductor" can be changed into the term "conductive layer" or "conductive film" in some cases. For example, in some cases, the term "insulating layer" or "insulating film" can be changed into the term "insulator" in some cases. Furthermore, the term "insulator" can be changed into the term "insulating layer" or "insulating film" in some cases.

In this specification and the like, for example, the terms "electrode," "wiring," and "terminal" do not have functional limitations. For example, an "electrode" is used as part of a wiring in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case where a plurality of "electrodes," "wirings," "terminals," and the like are formed in an integrated manner, for example. Hence, for example, an "electrode" can be part of a "wiring" or a "terminal" and a "terminal" can be part of a "wiring" or an "electrode." Moreover, the terms "electrode," "wiring," or "terminal" is sometimes replaced with the term "region," for example.

In this specification and the like, for example, the terms "wiring," "signal line," "power supply line," and the like can be interchanged with each other depending on the case or the situation. For example, the term "wiring" can be changed into the term "signal line" in some cases. Also, for example, the term "wiring" can be changed into the term "power supply line" in some cases. Inversely, for example, the term "signal line," "power supply line," or the like can be changed into the term "wiring" in some cases. For example, the term "power supply line" or the like can be changed into the term "signal line" or the like in some cases. Inversely, for example, the term "signal line" or the like can be changed into the term "power source line" or the like in some cases. For example, the term "potential" that is applied to a wiring can be changed into the term "signal" or the like depending on the case or in accordance with circumstances. Inversely, for example, the term "signal" or the like can be changed into the term "potential" in some cases.

In this specification and the like, a "switch" includes a plurality of terminals and has a function of switching (selecting) electrical continuity and discontinuity between the terminals. For example, in the case where a switch includes two terminals and electrical continuity is established between the two terminals, the switch is in a "conduction state" or an "on state." In the case where electrical continuity is not established between the two terminals, the switch is in a "non-conduction state" or an "off state." Note that switching to one of a conduction state and a non-conduction state or maintaining one of a conduction state and a non-conduction state by the switch is sometimes referred to as "controlling a conduction state".

That is, a switch has a function of controlling whether current flows therethrough or not. Alternatively, a switch has a function of selecting and changing a current path. As the switch, an electrical switch or a mechanical switch can be used, for example. That is, a switch can be any element capable of controlling current, and is not limited to a particular element. That is, a switch is not limited to a certain element and can be any element capable of controlling a current.

A switch where the terminals are normally disconnected and are connected by being operated is sometimes referred to as “Form A contact.” Another switch where the terminals are normally connected and are disconnected by being operated is sometimes referred to as “Form B contact.”

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction or non-conduction is selected with movement of the electrode.

The “channel length” of a transistor in this specification and the like sometimes refers to the distance between the source and the drain in a region where the channel is formed or a region where the gate overlaps with the semiconductor (or a portion of the semiconductor where current flows when the transistor is on), for example.

The “channel width” of a transistor in this specification and the like sometimes refers to the length of a portion where the source and the drain face each other in a region where the channel is formed or a region where the gate overlaps with the semiconductor (or a portion of the semiconductor where current flows when the transistor is on), for example.

In this specification and the like, the terms “substrate,” “wafer,” “die,” and the like does not limit a function of a component, for example. The terms “substrate,” “wafer,” “die,” and the like can be interchanged with each other depending on the case or circumstances, for example.

In this specification and the like, the term “parallel” does not necessarily refer to the case where components are exactly parallel. Hence, for example, the term “parallel” can be replaced with the term “substantially parallel,” “roughly parallel,” “practically parallel,” or the like as appropriate. These terms may be applied to the case where the angle between two straight lines or planes is greater than or equal to −5° and less than or equal to 5°, greater than or equal to −10° and less than or equal to 10°, or greater than or equal to −30° and less than or equal to 30°. Accordingly, “parallel” sometimes refers to “parallel or roughly parallel,” for example. Similarly, the term “perpendicular” does not necessarily refer to the case where components are exactly perpendicular to each other. Furthermore, the term “perpendicular” does not necessarily refer to the case where components are exactly perpendicular. Hence, for example, the term “perpendicular” can be replaced with the term “substantially perpendicular,” “roughly perpendicular,” “practically perpendicular,” or the like as appropriate. These terms may be applied to the case where the angle between two straight lines or planes is greater than or equal to 85° and less than or equal to 95°, greater than or equal to 80° and less than or equal to 100°, or greater than or equal to 60° and less than or equal to 120°. Accordingly, “perpendicular” sometimes refers to “perpendicular or roughly perpendicular,” for example. Similarly, the term “perpendicular” does not necessarily refer to the case where components are exactly perpendicular to each other.

The term “level or substantially level with” in this specification and the like means a structure having the same level from a reference surface (e.g., a flat surface such as a substrate surface) in a cross-sectional view. For example, in a manufacturing process of a semiconductor device, planarization treatment is performed, whereby the surface(s) of a single layer or a plurality of layers are exposed in some cases. In this case, the surfaces on which the planarization treatment is performed are at the same level from the reference surface. However, the surfaces of the plurality of layers on which the planarization treatment is performed are at the levels that are not exactly the same depending on a treatment apparatus, a treatment method, or a material of the surfaces, used for the planarization treatment in some cases. This case is also the structure meant by the term “level or substantially level with” in this specification and the like. For example, the term “level or substantially level with” also means a structure where two layers (a first layer and a second layer here) at different levels from the reference surface have top-surface levels differing by 20 nm or less.

In this specification and the like, the expression “an end portion is aligned or substantially with another end portion” means that at least outlines of stacked layers partly overlap with each other in a top view. For example, in a manufacturing process of a semiconductor device, the case of patterning or partly patterning an upper layer and a lower layer with the use of the same mask pattern is included in the expression. The expression “an end portion is aligned with another end portion” also includes the case where the outlines do not completely overlap with each other; for instance, the outline of the upper layer may be positioned inward or outward from the outline of the lower layer. This case is also the structure meant by expression “an end portion is aligned or substantially with another end portion” in this specification and the like.

In this specification and the like, the terms “identical,” “the same,” “equal,” “uniform,” and the like (including synonyms thereof) used in describing, for example, calculation values and measurement values or in describing objects, methods, events, and the like that can be converted into calculation values or measurement values allow for a margin of error of ±20% unless otherwise specified.

In this specification and the like, an impurity in a semiconductor refers to, for example, an element other than the main component of the semiconductor. For example, an element with a concentration lower than 0.1 atomic % is an impurity. By containing an impurity, a semiconductor may have increased density of defect states, decreased carrier mobility, or decreased crystallinity, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include (contained also in water), lithium, sodium, silicon, boron, phosphorus, carbon, and nitrogen. Entry of an impurity may cause oxygen vacancies in an oxide semiconductor, for example.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like, for example. For example, a metal oxide used as a semiconductor in a channel formation region of a transistor is referred to as an oxide semiconductor in some cases. That is, a metal oxide included in a channel formation region of a transistor that has at least one of an amplifying function, a rectifying function, and a switching function can be referred to as a metal oxide semiconductor. The term "OS transistor" can be replaced with a transistor including a metal oxide or an oxide semiconductor.

In this specification and the like, a metal oxide containing nitrogen is also called a metal oxide in some cases. In addition, a metal oxide containing nitrogen may be referred to as a metal oxynitride.

In the drawings for this specification and the like, arrows indicating an X direction, a Y direction, and a Z direction are illustrated in some cases. In this specification and the like, the "X direction" is a direction along the X axis, and unless otherwise specified, the forward direction and the reverse direction are not distinguished in some cases. The same applies to the "Y direction" and the "Z direction." The X direction, the Y direction, and the Z direction are directions intersecting with each other. For example, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

This application is based on Japanese Patent Application Serial No. 2022-192744 filed with Japan Patent Office on Dec. 1, 2022, Japanese Patent Application Serial No. 2023-041008 filed with Japan Patent Office on Mar. 15, 2023, and Japanese Patent Application Serial No. 2023-079277 filed with Japan Patent Office on May 12, 2023, the entire contents of which are hereby incorporated by reference.

What is claimed is:

1. A semiconductor device comprising:

a first transistor;

a second transistor;

a third transistor;

a fourth transistor;

a first capacitor;

a light-emitting element; and an insulating layer, wherein a gate of the second transistor is electrically connected to one of a source and a drain of the first transistor and one of a source and a drain of the third transistor, wherein the second transistor comprises a back gate, wherein the back gate of the second transistor is electrically connected to one of a source and a drain of the fourth transistor and one terminal of the first capacitor, wherein one of a source and a drain of the second transistor is electrically connected to the other of the source and the drain of the third transistor, the other terminal of the first capacitor, and one terminal of the light-emitting element, wherein the first transistor comprises a first semiconductor layer, wherein part of the first semiconductor layer is in a first opening in the insulating layer, wherein the third transistor comprises a second semiconductor layer, wherein part of the second semiconductor layer is in a second opening in the insulating layer, wherein the fourth transistor comprises a third semiconductor layer, and wherein part of the third semiconductor layer is in a third opening in the insulating layer.

2. The semiconductor device according to claim 1, wherein the first semiconductor layer, the second semiconductor layer, and the third semiconductor layer each comprise an oxide semiconductor.

3. The semiconductor device according to claim 1, wherein the second transistor comprises a fourth semiconductor layer, and wherein the fourth semiconductor layer is over the insulating layer.

4. The semiconductor device according to claim 3, wherein the first semiconductor layer, the second semiconductor layer, the third semiconductor layer, and the fourth semiconductor layer are formed in a same step.

5. The semiconductor device according to claim 1, further comprising:

a second capacitor;

a fifth transistor; and a sixth transistor, wherein the gate of the second transistor is electrically connected to one terminal of the second capacitor, wherein the one of the source and the drain of the second transistor is electrically connected to the other terminal of the second capacitor, one of a source and a drain of the fifth transistor, and one of a source and a drain of the sixth transistor, and wherein the other of the source and the drain of the fifth transistor is electrically connected to the one terminal of the light-emitting element.

6. A display apparatus comprising:

the semiconductor device according to claim 1; and a driver circuit, wherein the driver circuit comprises a seventh transistor and an eighth transistor, wherein the seventh transistor comprises a fifth semiconductor layer, wherein part of the fifth semiconductor layer is in a fourth opening in the insulating layer, wherein the eighth transistor comprises a sixth semiconductor layer, wherein part of the sixth semiconductor layer is in a fifth opening in the insulating layer, and wherein the driver circuit is configured to output a potential turning on or off the first transistor through the seventh transistor and to output a potential turning on or off the fourth transistor through the eighth transistor.

7. The display apparatus according to claim 6, wherein the driver circuit is configured to output a potential turning on the fourth transistor less frequently than a potential turning on the first transistor.

8. A semiconductor device comprising:

a first transistor;

a second transistor;

a third transistor;

a fourth transistor; and a light-emitting element, wherein a gate of the second transistor is electrically connected to one of a source and a drain of the first transistor, wherein the second transistor comprises a back gate, wherein the back gate of the second transistor is electrically connected to one of a source and a drain of the fourth transistor, wherein the second transistor is configured to control the amount of current flowing through the light-emitting element in accordance with a potential supplied to the gate of the second transistor and to change a threshold voltage of the second transistor in accordance with a potential supplied to the back gate of the second transistor, and wherein a frequency of turning on the fourth transistor is lower than a frequency of turning on the first transistor.

9. The semiconductor device according to claim 8, wherein the semiconductor device further comprises an insulating layer, wherein the first transistor comprises a first semiconductor layer, wherein part of the first semiconductor layer is in a first opening in the insulating layer, wherein the fourth transistor comprises a third semiconductor layer, and wherein part of the third semiconductor layer is in a third opening in the insulating layer.

10. The semiconductor device according to claim 9, wherein the first semiconductor layer and the third semiconductor layer each comprise an oxide semiconductor.

11. The semiconductor device according to claim 9, wherein the second transistor comprises a fourth semiconductor layer, and wherein the fourth semiconductor layer is over the insulating layer.

12. The semiconductor device according to claim 11, wherein the first semiconductor layer, the third semiconductor layer, and the fourth semiconductor layer are formed in a same step.

13. The semiconductor device according to claim 11, further comprising:

a driver circuit, wherein the driver circuit is configured to output a potential turning on the fourth transistor less frequently than a potential turning on the first transistor.

* * * * *